United States Patent
Kwong et al.

(10) Patent No.: US 9,324,949 B2
(45) Date of Patent: Apr. 26, 2016

(54) ORGANIC ELECTROLUMINESCENT MATERIALS AND DEVICES

(71) Applicant: Universal Display Corporation, Ewing, NJ (US)

(72) Inventors: Raymond Kwong, Fo Tan (HK); Chuanjun Xia, Lawrenceville, NJ (US); Scott Joseph, Ewing, NJ (US); Siu Tung Lam, Apleichau (HK); Chi Hang Lee, Chaiwan (HK)

(73) Assignee: Universal Display Corporation, Ewing, NJ (US)

( * ) Notice: Subject to any disclaimer, the term of this patent is extended or adjusted under 35 U.S.C. 154(b) by 283 days.

(21) Appl. No.: 13/942,879

(22) Filed: Jul. 16, 2013

(65) Prior Publication Data

US 2015/0021555 A1    Jan. 22, 2015

(51) Int. Cl.
*H01L 51/50*   (2006.01)
*H01L 51/00*   (2006.01)
*C09K 11/06*   (2006.01)

(52) U.S. Cl.
CPC ............ *H01L 51/0061* (2013.01); *C09K 11/06* (2013.01); *H01L 51/0071* (2013.01); *H01L 51/0072* (2013.01); *H01L 51/0073* (2013.01); *H01L 51/0074* (2013.01); *H01L 51/5016* (2013.01)

(58) Field of Classification Search
None
See application file for complete search history.

(56) References Cited

U.S. PATENT DOCUMENTS

| | | | |
|---|---|---|---|
| 4,769,292 A | 9/1988 | Tang et al. |
| 5,061,569 A | 10/1991 | VanSlyke et al. |
| 5,247,190 A | 9/1993 | Friend et al. |
| 5,703,436 A | 12/1997 | Forrest et al. |
| 5,707,745 A | 1/1998 | Forrest et al. |
| 5,834,893 A | 11/1998 | Bulovic et al. |
| 5,844,363 A | 12/1998 | Gu et al. |
| 6,013,982 A | 1/2000 | Thompson et al. |
| 6,087,196 A | 7/2000 | Sturm et al. |
| 6,091,195 A | 7/2000 | Forrest et al. |
| 6,097,147 A | 8/2000 | Baldo et al. |
| 6,294,398 B1 | 9/2001 | Kim et al. |
| 6,303,238 B1 | 10/2001 | Thompson et al. |
| 6,337,102 B1 | 1/2002 | Forrest et al. |
| 6,468,819 B1 | 10/2002 | Kim et al. |
| 6,528,187 B1 | 3/2003 | Okada |
| 6,687,266 B1 | 2/2004 | Ma et al. |

(Continued)

FOREIGN PATENT DOCUMENTS

| EP | 0650955 | 5/1995 |
| EP | 1725079 | 11/2006 |

(Continued)

OTHER PUBLICATIONS

Adachi, Chihaya et al., "Organic Electroluminescent Device Having a Hole Conductor as an Emitting Layer," Appl. Phys. Lett., 55(15): 1489-1491 (1989).

(Continued)

*Primary Examiner* — Gregory Clark
(74) *Attorney, Agent, or Firm* — Duane Morris LLP

(57) ABSTRACT

Luminescent materials including donor-acceptor compounds with a high triplet energy heteropolyaromatic system, namely, dibenzofuran, dibenzothiophene and dibenzoselenophene with one or multiple nitrogens in the ring as the electron acceptor for use as emitters in organic light emitting diodes is disclosed.

23 Claims, 3 Drawing Sheets

(56) References Cited

U.S. PATENT DOCUMENTS

| | | |
|---|---|---|
| 6,835,469 B2 | 12/2004 | Kwong et al. |
| 6,921,915 B2 | 7/2005 | Takiguchi et al. |
| 7,087,321 B2 | 8/2006 | Kwong et al. |
| 7,090,928 B2 | 8/2006 | Thompson et al. |
| 7,154,114 B2 | 12/2006 | Brooks et al. |
| 7,250,226 B2 | 7/2007 | Tokito et al. |
| 7,279,704 B2 | 10/2007 | Walters et al. |
| 7,332,232 B2 | 2/2008 | Ma et al. |
| 7,338,722 B2 | 3/2008 | Thompson et al. |
| 7,393,599 B2 | 7/2008 | Thompson et al. |
| 7,396,598 B2 | 7/2008 | Takeuchi et al. |
| 7,431,968 B1 | 10/2008 | Shtein et al. |
| 7,445,855 B2 | 11/2008 | Mackenzie et al. |
| 7,534,505 B2 | 5/2009 | Lin et al. |
| 2002/0034656 A1 | 3/2002 | Thompson et al. |
| 2002/0134984 A1 | 9/2002 | Igarashi |
| 2002/0158242 A1 | 10/2002 | Son et al. |
| 2003/0138657 A1 | 7/2003 | Li et al. |
| 2003/0152802 A1 | 8/2003 | Tsuboyama et al. |
| 2003/0162053 A1 | 8/2003 | Marks et al. |
| 2003/0175553 A1 | 9/2003 | Thompson et al. |
| 2003/0230980 A1 | 12/2003 | Forrest et al. |
| 2004/0036077 A1 | 2/2004 | Ise |
| 2004/0137267 A1 | 7/2004 | Igarashi et al. |
| 2004/0137268 A1 | 7/2004 | Igarashi et al. |
| 2004/0174116 A1 | 9/2004 | Lu et al. |
| 2005/0025993 A1 | 2/2005 | Thompson et al. |
| 2005/0112407 A1 | 5/2005 | Ogasawara et al. |
| 2005/0238919 A1 | 10/2005 | Ogasawara |
| 2005/0244673 A1 | 11/2005 | Satoh et al. |
| 2005/0260441 A1 | 11/2005 | Thompson et al. |
| 2005/0260449 A1 | 11/2005 | Walters et al. |
| 2006/0008670 A1 | 1/2006 | Lin et al. |
| 2006/0202194 A1 | 9/2006 | Jeong et al. |
| 2006/0240279 A1 | 10/2006 | Adamovich et al. |
| 2006/0251923 A1 | 11/2006 | Lin et al. |
| 2006/0263635 A1 | 11/2006 | Ise |
| 2006/0280965 A1 | 12/2006 | Kwong et al. |
| 2007/0190359 A1 | 8/2007 | Knowles et al. |
| 2007/0278938 A1 | 12/2007 | Yabunouchi et al. |
| 2008/0015355 A1 | 1/2008 | Schafer et al. |
| 2008/0018221 A1 | 1/2008 | Egen et al. |
| 2008/0106190 A1 | 5/2008 | Yabunouchi et al. |
| 2008/0124572 A1 | 5/2008 | Mizuki et al. |
| 2008/0220265 A1 | 9/2008 | Xia et al. |
| 2008/0297033 A1 | 12/2008 | Knowles et al. |
| 2009/0008605 A1 | 1/2009 | Kawamura et al. |
| 2009/0009065 A1 | 1/2009 | Nishimura et al. |
| 2009/0017330 A1 | 1/2009 | Iwakuma et al. |
| 2009/0030202 A1 | 1/2009 | Iwakuma et al. |
| 2009/0039776 A1 | 2/2009 | Yamada et al. |
| 2009/0045730 A1 | 2/2009 | Nishimura et al. |
| 2009/0045731 A1 | 2/2009 | Nishimura et al. |
| 2009/0101870 A1 | 4/2009 | Prakash et al. |
| 2009/0108737 A1 | 4/2009 | Kwong et al. |
| 2009/0115316 A1 | 5/2009 | Zheng et al. |
| 2009/0165846 A1 | 7/2009 | Johannes et al. |
| 2009/0167162 A1 | 7/2009 | Lin et al. |
| 2009/0179554 A1 | 7/2009 | Kuma et al. |
| 2010/0187984 A1* | 7/2010 | Lin .................. C07D 491/04 313/504 |

FOREIGN PATENT DOCUMENTS

| | | | |
|---|---|---|---|
| EP | 2034538 | 3/2009 | |
| JP | 07247288 | 9/1995 | |
| JP | 200511610 | 1/2005 | |
| JP | 2007123392 | 5/2007 | |
| JP | 2007254297 | 10/2007 | |
| JP | 2008074939 | 4/2008 | |
| JP | 2011071163 | 4/2011 | |
| JP | 2011084531 | 4/2011 | |
| KR | 10-2010-0123172 | * 11/2010 | .............. H01L 51/50 |
| KR | 20100123172 | 11/2010 | |
| KR | 20120072787 | 7/2012 | |
| KR | 20120092908 | 8/2012 | |
| WO | 0139234 | 5/2001 | |
| WO | 0202714 | 1/2002 | |
| WO | 0215645 | 2/2002 | |
| WO | 03040257 | 5/2003 | |
| WO | 03060956 | 7/2003 | |
| WO | 2004093207 | 10/2004 | |
| WO | 2004107822 | 12/2004 | |
| WO | 2005014551 | 2/2005 | |
| WO | 2005019373 | 3/2005 | |
| WO | 2005030900 | 4/2005 | |
| WO | 2005089025 | 9/2005 | |
| WO | 2005123873 | 12/2005 | |
| WO | 2006009024 | 1/2006 | |
| WO | 2006056418 | 6/2006 | |
| WO | 2006072002 | 7/2006 | |
| WO | 2006082742 | 8/2006 | |
| WO | 2006098120 | 9/2006 | |
| WO | 2006100298 | 9/2006 | |
| WO | 2006103874 | 10/2006 | |
| WO | 2006114966 | 11/2006 | |
| WO | 2006132173 | 12/2006 | |
| WO | 2007002683 | 1/2007 | |
| WO | 2007004380 | 1/2007 | |
| WO | 2007063754 | 6/2007 | |
| WO | 2007063796 | 6/2007 | |
| WO | 2008056746 | 5/2008 | |
| WO | 2008101842 | 8/2008 | |
| WO | 2008132085 | 11/2008 | |
| WO | 2009000673 | 12/2008 | |
| WO | 2009003898 | 1/2009 | |
| WO | 2009008311 | 1/2009 | |
| WO | 2009018009 | 2/2009 | |
| WO | 2009050290 | 4/2009 | |
| WO | 2009021126 | 5/2009 | |
| WO | 2009062578 | 5/2009 | |
| WO | 2009063833 | 5/2009 | |
| WO | 2009066778 | 5/2009 | |
| WO | 2009066779 | 5/2009 | |
| WO | 2009086028 | 7/2009 | |
| WO | 2009100991 | 8/2009 | |
| WO | 2013027633 | 2/2013 | |

OTHER PUBLICATIONS

Adachi, Chihaya et al., "Nearly 100% Internal Phosphorescence Efficiency in an Organic Light Emitting Device," J. Appl. Phys., 90(10): 5048-5051 (2001).

Adachi, Chihaya et al., "High-Efficiency Red Electrophosphorescence Devices," Appl. Phys. Lett., 78(11)1622-1624 (2001).

Aonuma, Masaki et al., "Material Design of Hole Transport Materials Capable of Thick-Film Formation in Organic Light Emitting Diodes," Appl. Phys. Lett., 90:183503-1-183503-3.

Baldo et al., Highly Efficient Phosphorescent Emission from Organic Electroluminescent Devices, Nature, vol. 395, 151-154, (1998).

Baldo et al., Very high-efficiency green organic light-emitting devices based on electrophosphorescence, Appl. Phys. Lett., vol. 75, No. 3, 4-6 (1999).

Gao, Zhiqiang et al., "Bright-Blue Electroluminescence From a Silyl-Substituted ter-(phenylene-vinylene) derivative," Appl. Phys. Lett., 74(6): 865-867 (1999).

Guo, Tzung-Fang et al., "Highly Efficient Electrophosphorescent Polymer Light-Emitting Devices," Organic Electronics, 115-20 (2000).

Hamada, Yuji et al., "High Luminance in Organic Electroluminescent Devices with Bis(10-hydroxybenzo[h]quinolinato) beryllium as an Emitter," Chem. Lett., 905-906 (1993).

Holmes, R.J. et al., "Blue Organic Electrophosphorescence Using Exothermic Host-Guest Energy Transfer," Appl. Phys. Lett., 82(15):2422-2424 (2003).

Hu, Nan-Xing et al., "Novel High Tg Hole-Transport Molecules Based on Indolo[3,2-b]carbazoles for Organic Light-Emitting Devices," Synthetic Metals, 111-112:421-424 (2000).

(56) References Cited

OTHER PUBLICATIONS

Huang, Jinsong et al., "Highly Efficient Red-Emission Polymer Phosphorescent Light-Emitting Diodes Based on Two Novel Tris(1-phenylisoquinolinato-C2,N)iridium(III) Derivates," Adv. Mater., 19:739-743 (2007).
Huang, Wei-Sheng et al., "Highly Phosphorescent Bis-Cyclometalated Iridium Complexes Containing Benzoimidazole-Based Ligands," Chem. Mater., 16(12):2480-2488 (2004).
Hung, L.S. et al., "Anode Modification in Organic Light-Emitting Diodes by Low-Frequency Plasma Polymerization of CHF3," Appl. Phys. Lett, 78(5):673-675 (2001).
Ikai, Masamichi and Tokito, Shizuo, "Highly Efficient Phosphorescence From Organic Light-Emitting Devices with an Exciton-Block Layer," Appl. Phys. Lett., 79(2):156-158 (2001).
Ikeda, Hisao et al., "P-185 Low-Drive-Voltage OLEDs with a Buffer Layer Having Molybdenum Oxide," SID Symposium Digest, 37:923-926 (2006).
Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater. Chem., 3(3):319-320 (1993).
Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).
Kido, Junji et al., 1,2,4-Triazole Derivative as an Electron Transport Layer in Organic Electroluminescent Devices, Jpn. J. Appl. Phys., 32:L917-L920 (1993).
Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino) triphenylamine (m-MTDATA), as Hole-Transport Materials," Adv. Mater., 6(9):677-679 (1994).
Kwong, Raymond C. et al., "High Operational Stability of Electrophosphorescent Devices," Appl. Phys. Lett., 81(1) 162-164 (2002).
Lamansky, Sergey et al., "Synthesis and Characterization of Phosphorescent Cyclometalated Iridium Complexes," Inorg. Chem., 40(7):1704-1711 (2001).
Lee, Chang-Lyoul et al., "Polymer Phosphorescent Light-Emitting Devices Doped with Tris(2-phenylpyridine) Iridium as a Triplet Emitter," Appl. Phys. Lett., 77(15)2280-2282 (2000).
Lo, Shih-Chun et al., "Blue Phosphorescence from Iridium(III) Complexes at Room Temperature," Chem. Mater., 18 (21)5119-5129 (2006).
Ma, Yuguang et al., "Triplet Luminescent Dinuclear-Gold(I) Complex-Based Light-Emitting Diodes with Low Turn-On voltage," Appl. Phys. Lett., 74(10):1361-1363 (1999).
Mi, Bao-Xiu et al., "Thermally Stable Hole-Transporting Material for Organic Light-Emitting Diode an Isoindole Derivative," Chem. Mater., 15(16):3148-3151 (2003).
Nishida, Jun-ichi et al., "Preparation, Characterization, and Electroluminescence Characteristics of α-Diimine-type Platinum(II) Complexes with Perfluorinated Phenyl Groups as Ligands," Chem. Lett., 34(4): 592-593 (2005).
Niu, Yu-Hua et al., "Highly Efficient Electrophosphorescent Devices with Saturated Red Emission from a Neutral Osmium Complex," Chem. Mater., 17(13):3532-3536 (2005).
Noda, Tetsuya and Shirota,Yasuhiko, "5,5'-Bis(dimesitylboryl)-2,2'-bithiophene and 5,5"-Bis (dimesitylboryl)-2,2'5',2"-terthiophene as a Novel Family of Electron-Transporting Amorphous Molecular Materials," J. Am. Chem. Soc., 120 (37):9714-9715 (1998).
Okumoto, Kenji et al., "Green Fluorescent Organic Light-Emitting Device with External Quantum Efficiency of Nearly 10%," Appl. Phys. Lett., 89:063504-1-063504-3 (2006).

Palilis, Leonidas C., "High Efficiency Molecular Organic Light-Emitting Diodes Based on Silole Derivatives and Their Exciplexes," Organic Electronics, 4:113-121 (2003).
Paulose, Betty Marie Jennifer S. et al., "First Examples of Alkenyl Pyridines as Organic Ligands for Phosphorescent Iridium Complexes," Adv. Mater., 16(22):2003-2007 (2004).
Ranjan, Sudhir et al., "Realizing Green Phosphorescent Light-Emitting Materials from Rhenium(I) Pyrazolato Diimine Complexes," Inorg. Chem., 42(4):1248-1255 (2003).
Sakamoto,Youichi et al., "Synthesis, Characterization, and Electron-Transport Property of Perfluorinated Phenylene Dendrimers," J. Am. Chem. Soc., 122(8):1832-1833 (2000).
Salbeck, J. et al., "Low Molecular Organic Glasses for Blue Electroluminescence," Synthetic Metals, 91209-215 (1997).
Shirota, Yasuhiko et al., "Starburst Molecules Based on p-Electron Systems as Materials for Organic Electroluminescent Devices," Journal of Luminescence, 72-74:985-991 (1997).
Sotoyama, Wataru et al., "Efficient Organic Light-Emitting Diodes with Phosphorescent Platinum Complexes Containing N^C^N -Coordinating Tridentate Ligand," Appl. Phys. Lett., 86:153505-1-153505-3 (2005).
Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).
T. Östergård et al., "Langmuir-Blodgett Light-Emitting Diodes of Poly(3-Hexylthiophene) Electro-Optical Characteristics Related to Structure," Synthetic Metals, 87:171-177 (1997).
Takizawa, Shin-ya et al., "Phosphorescent Iridium Complexes Based on 2-Phenylimidazo[1,2-α]pyridine Ligands Tuning of Emission Color toward the Blue Region and Application to Polymer Light-Emitting Devices," Inorg. Chem., 46(10):4308-4319 (2007).
Tang, C.W. and VanSlyke, S.A., "Organic Electroluminescent Diodes," Appl. Phys. Lett., 51(12):913-915 (1987).
Tung, Yung-Liang et al., "Organic Light-Emitting Diodes Based on Charge-Neutral Ru II PHosphorescent Emitters," Adv. Mater., 17(8)1059-1064 (2005).
Van Slyke, S. A. et al., "Organic Electroluminescent Devices with Improved Stability," Appl. Phys. Lett, 69 (15):2160-2162 (1996).
Wang, Y. et al., "Highly Efficient Electroluminescent Materials Based on Fluorinated Organometallic Iridium Compounds," Appl. Phys. Lett., 79(4):449-451 (2001).
Wong, Keith Man-Chung et al., A Novel Class of Phosphorescent Gold(III) Alkynyl-Based Organic Light-Emitting Devices with Tunable Colour, Chem. Commun., 2906-2908 (2005).
Wong, Wai-Yeung, "Multifunctional Iridium Complexes Based on Carbazole Modules as Highly Efficient Electrophosphors," Angew. Chem. Int. Ed., 45:7800-7803 (2006).
Goushi, Kenichi et al., "Organic light-emitting diodes employing efficient reverse intersystem crossing for triplet-to-singlet state conversion", Nature Photonics, vol. 6, Apr. 2012, pp. 253-258.
Nakagawa, Tetsuya et al., "Electroluminescence based on thermally activated delayed fluorescence generated by a spirobifluorene donor-acceptor structure," Chem. Commun., 2012, 48, pp. 9580-9582.
Méhes, Gábor et al., "Enhanced Electroluminescence Efficiency in a Spiro-Acridine Derivative through Thermally Activated Delayed Fluorescence," Angew. Chem. Int. Ed., 2012, 51, pp. 11311-11315.
Uoyama, Hiroki et al., "Highly efficient organic light-emitting diodes from delayed fluorescence," Nature, Dec. 13, 2012, vol. 492, pp. 234-240.
Endo, Ayataka et al., "Efficient up-conversion of triplet excitons into a singlet state and its application for organic light emitting diodes," Applied Physics Letters, 98, 083302 (2011).
Tanaka, Hiroyuki et al., "Efficient green thermally activated delayed fluorescence (TADF) from phenoxazine-triphenyltriazine (PXZ-TRZ) derivative," Chem. Commun., 2012, 48, pp. 11392-11394.
Zhang, Qisheng et al., "Design of Efficient Thermally Activated Delayed Fluorescence Materials for Pure Blue Organic Light Emitting Diodes," J. Am. Chem. Soc. 2012, 134, pp. 14706-14709.

* cited by examiner

Formula I

ORGANIC ELECTROLUMINESCENT MATERIALS AND DEVICES

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices. More specifically, the present disclosure pertains to luminescent materials comprising donor-acceptor compounds with a high triplet energy heteropolyaromatic system as the electron acceptor for use as emitters in organic light emitting diodes.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted $Ir(ppy)_3$, which has the following structure:

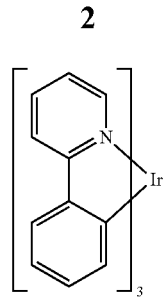

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

As used herein, the phrase "electron acceptor" means a fragment that can accept electron density from an aromatic system, and the phrase "electron donor" means a fragment that donates electron density into an aromatic system.

More details on OLEDs, and the definitions described above, can be found in U.S. Pat. No. 7,279,704, which is incorporated herein by reference in its entirety.

SUMMARY OF THE INVENTION

Donor-acceptor compounds with nitrogen containing dibenzofuran, dibenzothiophene and dibenzoselenophene as the acceptor may be efficient emitters with emission originated from the charge transfer (CT) state. The emission can be tuned by varying the strength of the donor-acceptor interaction and the resulting energy of the CT state. The compounds may be used as emitters in OLED.

According to an embodiment, a compound having the formula:

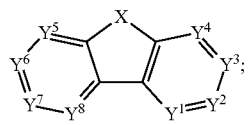

Formula 1 wherein each of $Y^1$ to $Y^8$ is C—R or N; at least two of $Y^1$ to $Y^8$ are N; at least one of $Y^1$ to $Y^8$ is C—R; each R is independently selected from the group consisting of hydrogen, deuterium, halide, cycloalkyl, heteroalkyl, arylalkyl, alkoxy, aryloxy, amino, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof; wherein at least one of the R is selected from the group of substitutents consisting of D1 through D140 shown below,

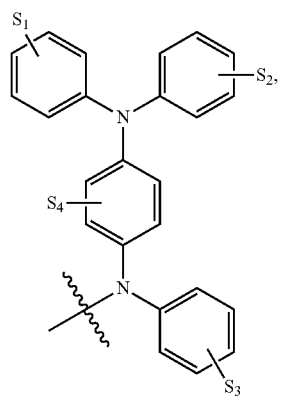

D1

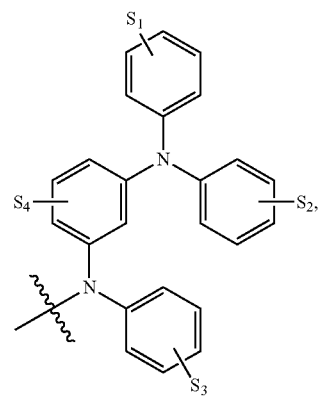

D2

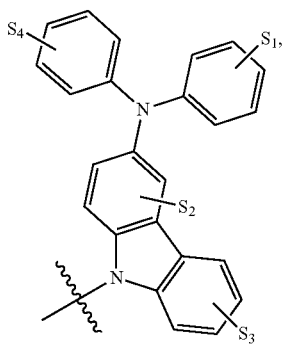

D3

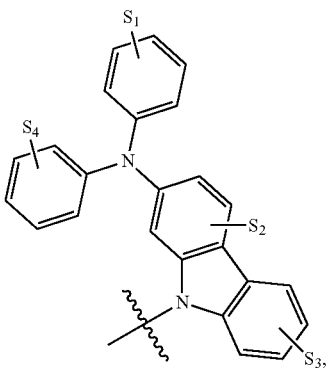

D4

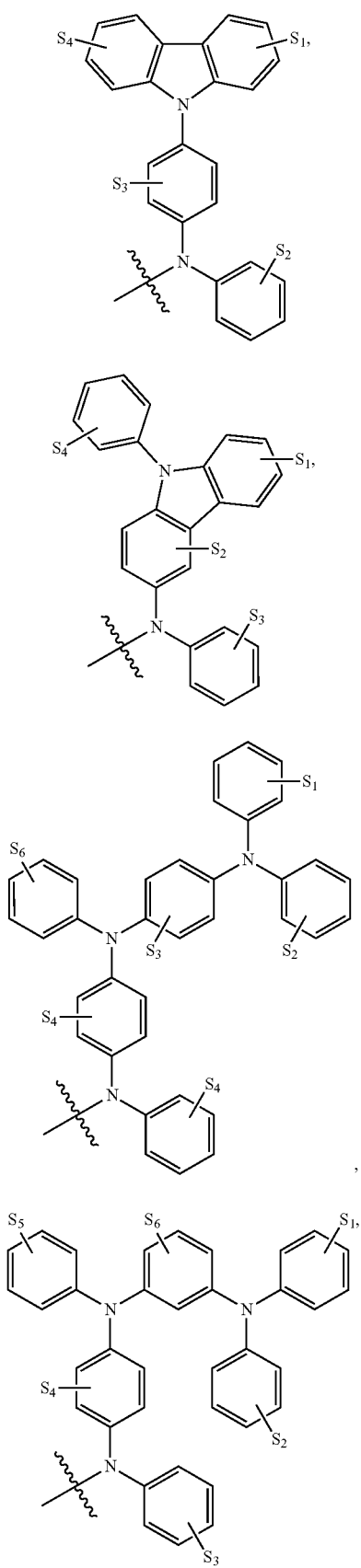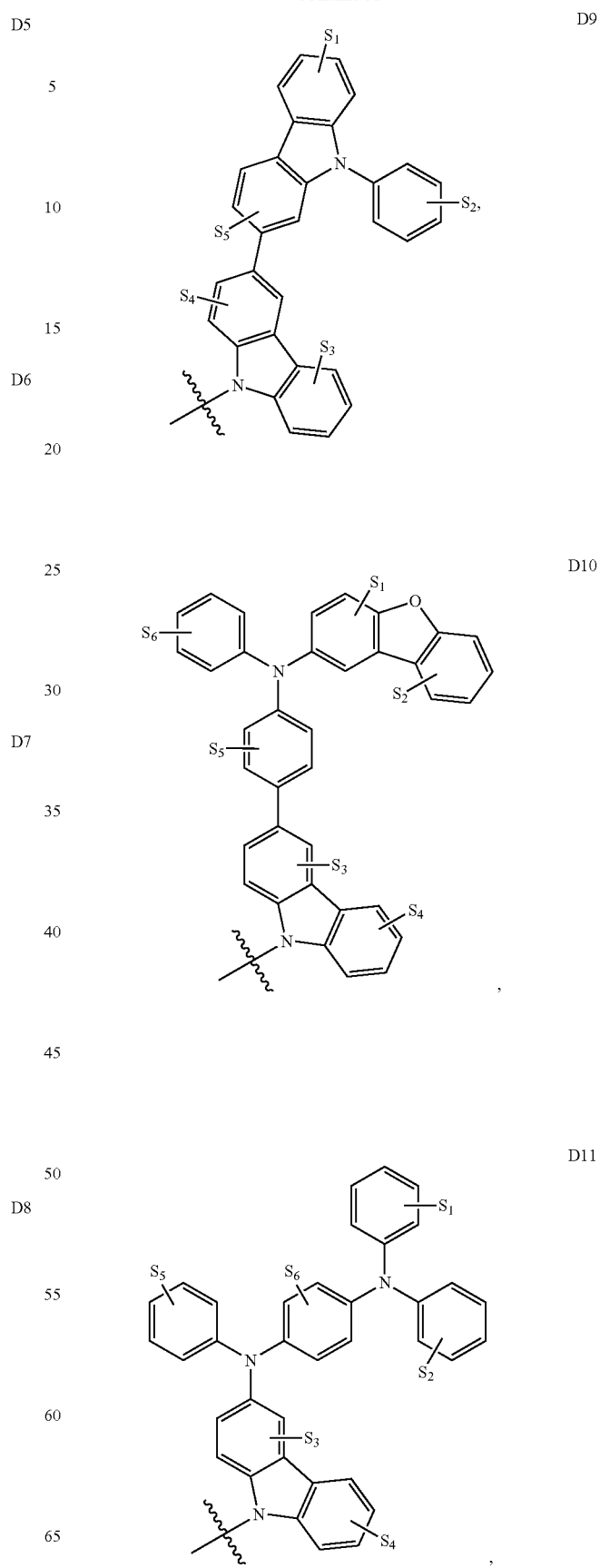

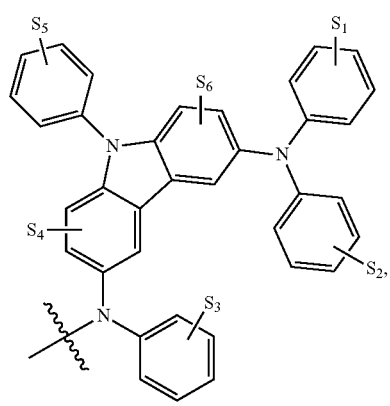
D12
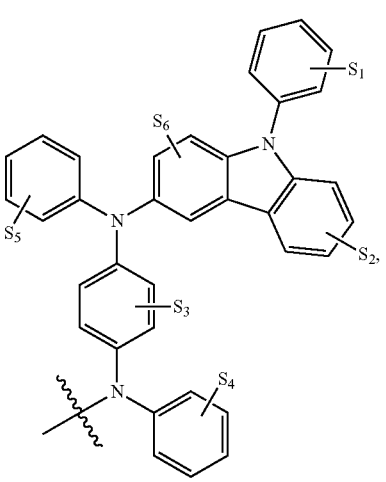
D15
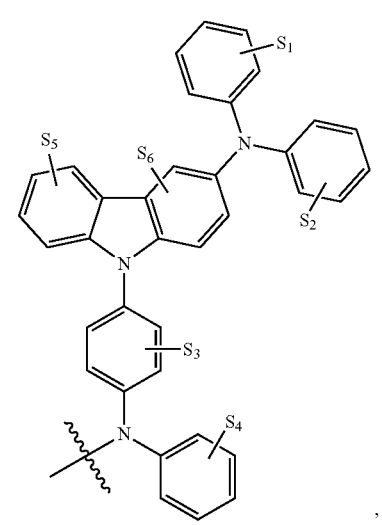
D13
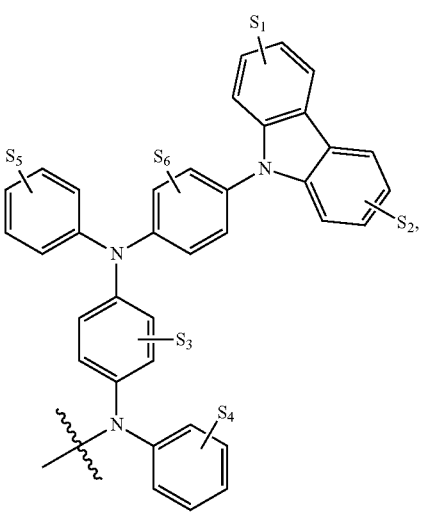
D16
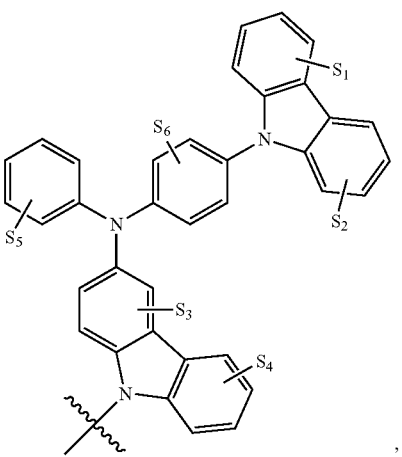
D17
D14

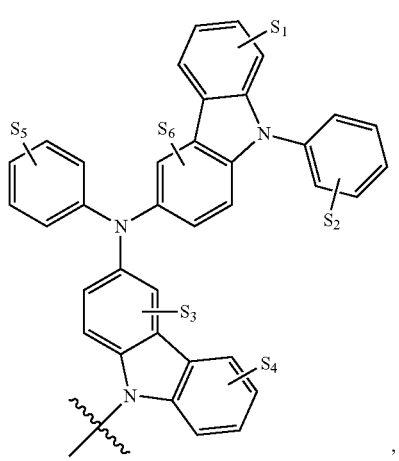
D18
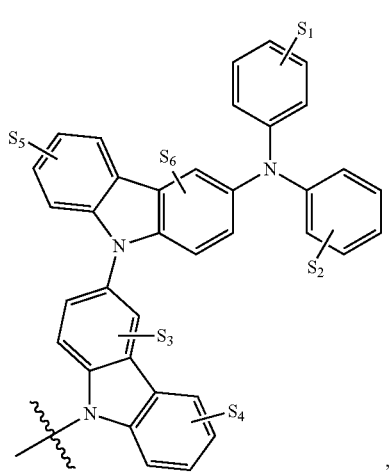
D19
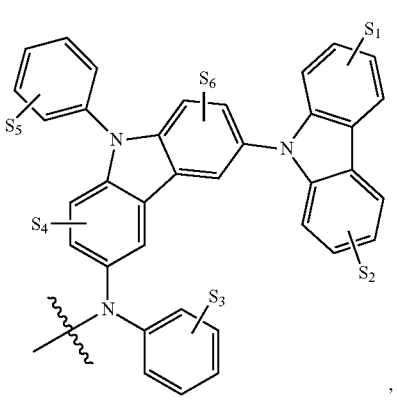
D20
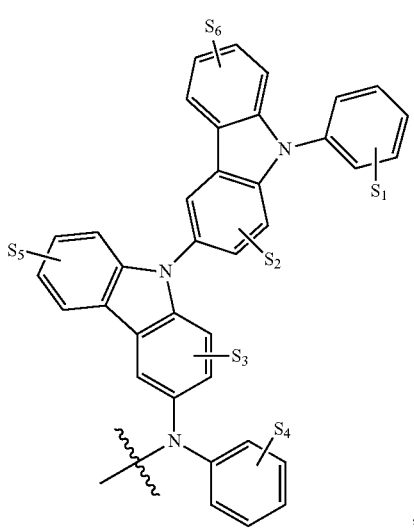
D21
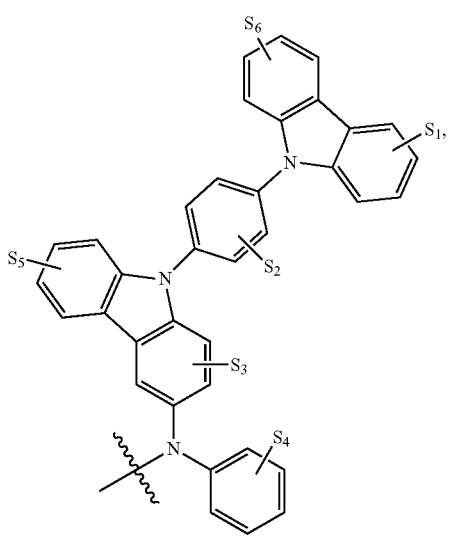
D22
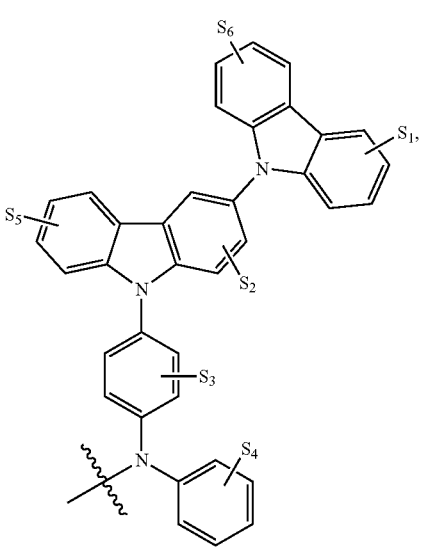
D23

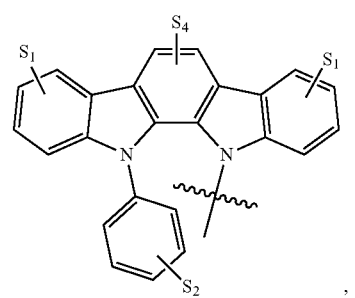 D24
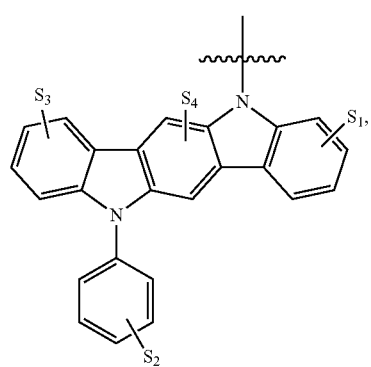 D25
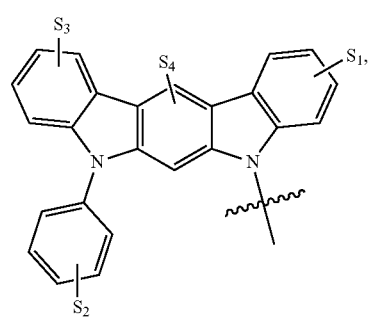 D26
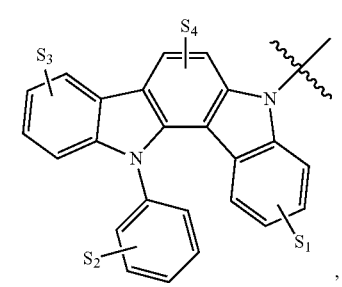 D27
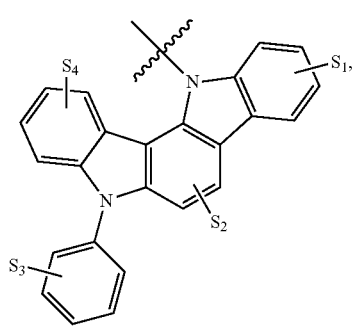 D28
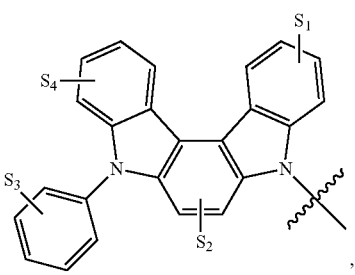 D29
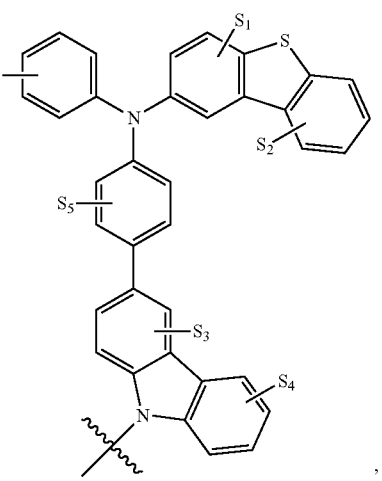 D30
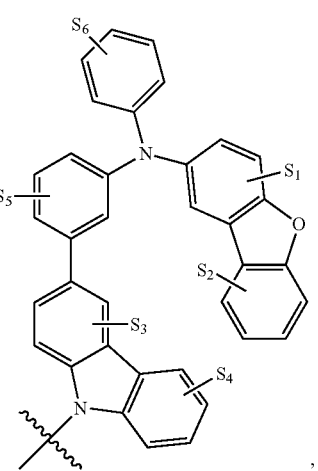 D31

D32 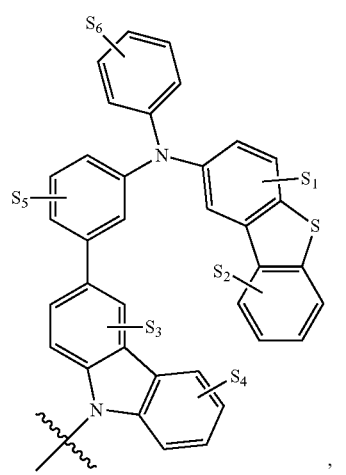
D35 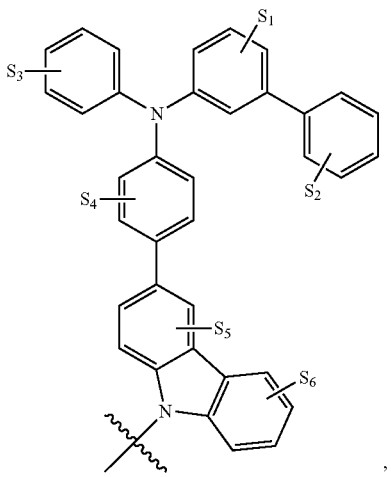
D33 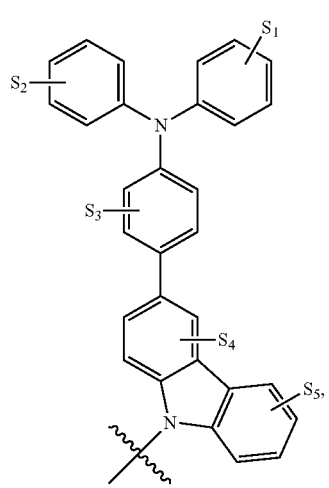
D36 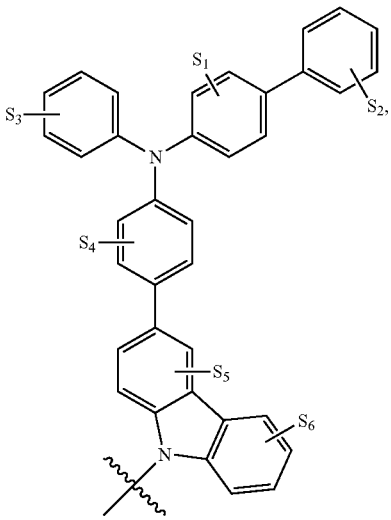
D34 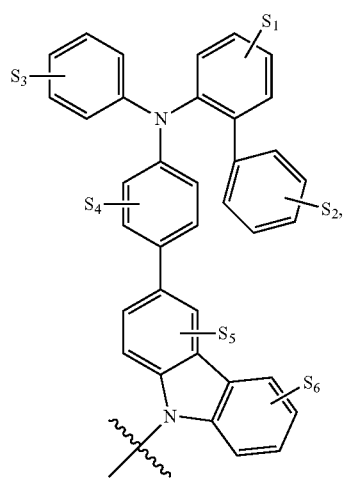
D37 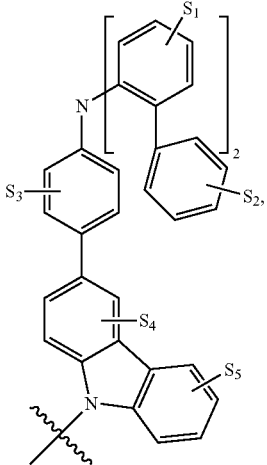

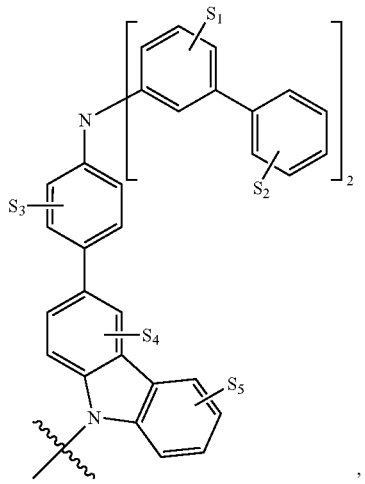
D38
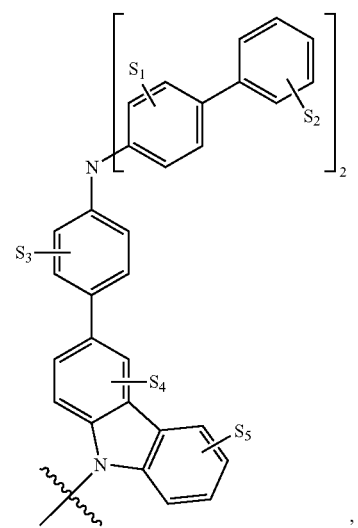
D39
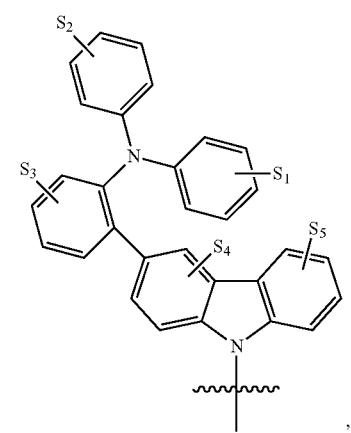
D40
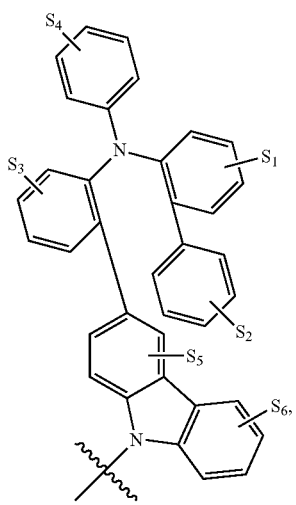
D41
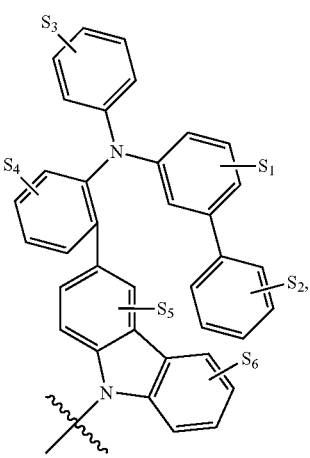
D42
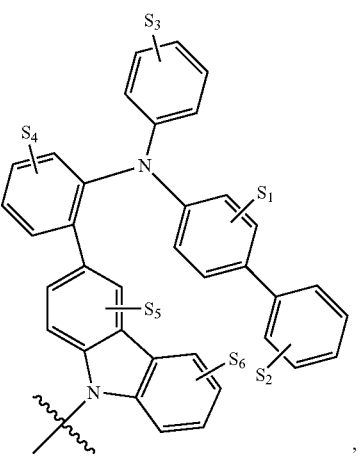
D43

D44
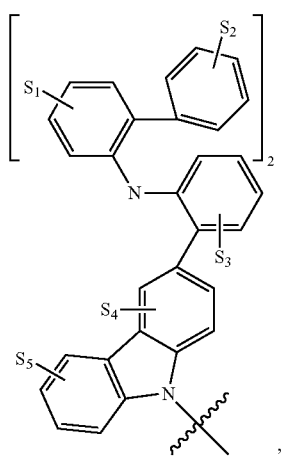
D45
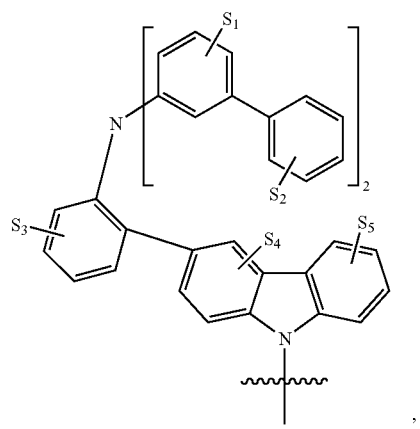
D46
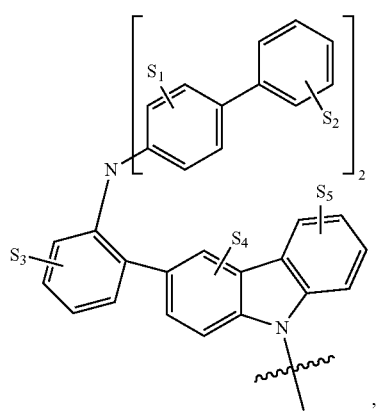
D47
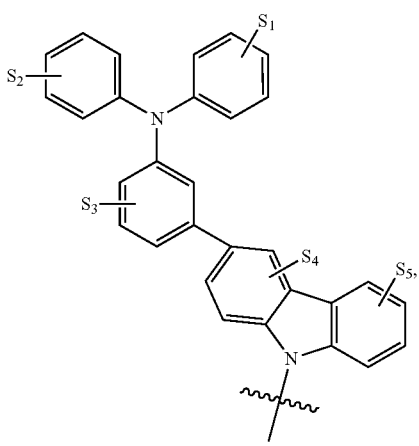
D48
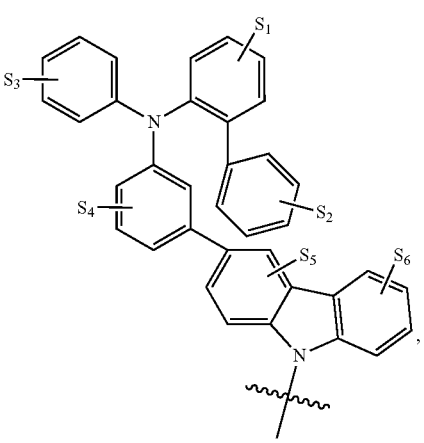
D49
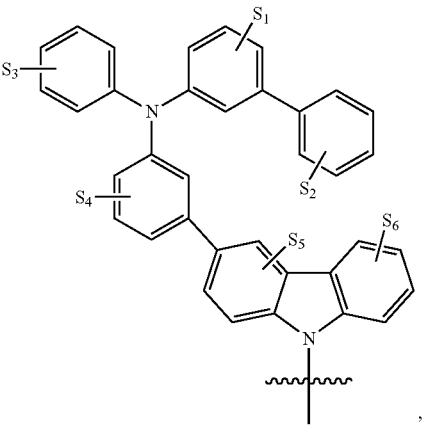

-continued
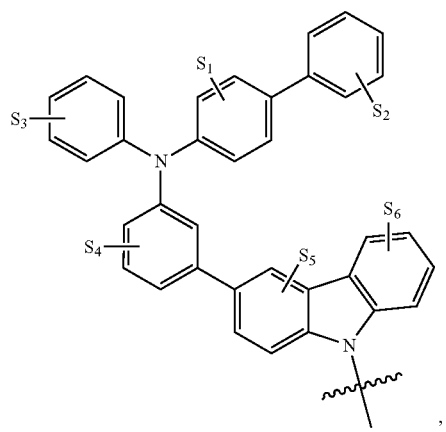
D50
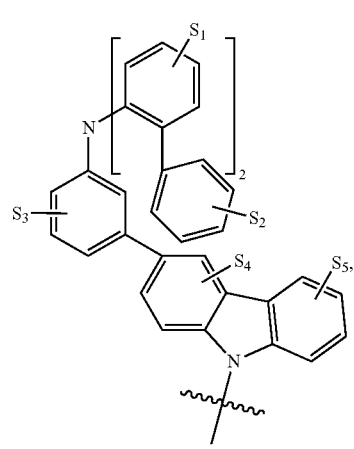
D51
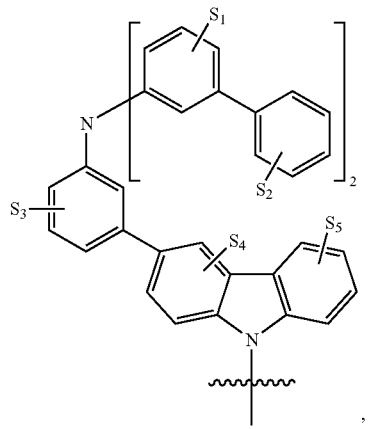
D52
-continued
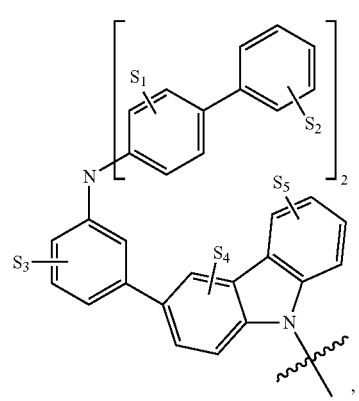
D53
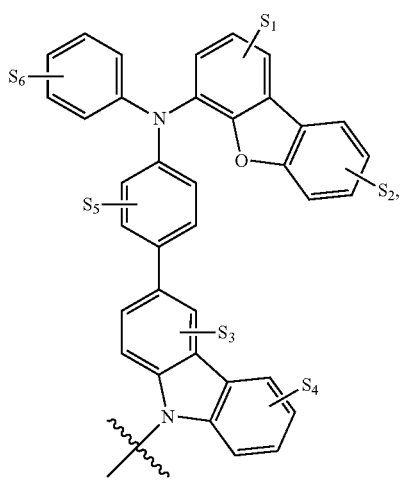
D54
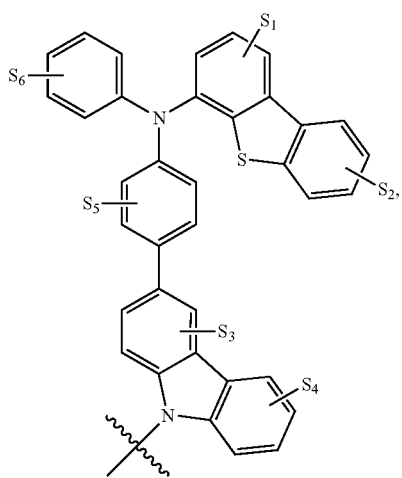
D55

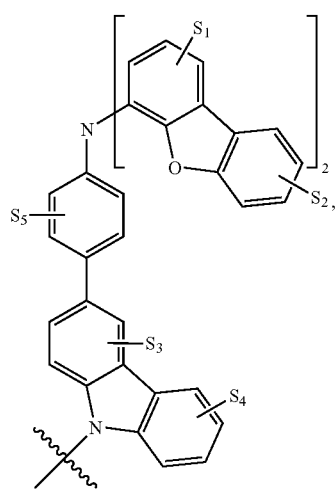
D56
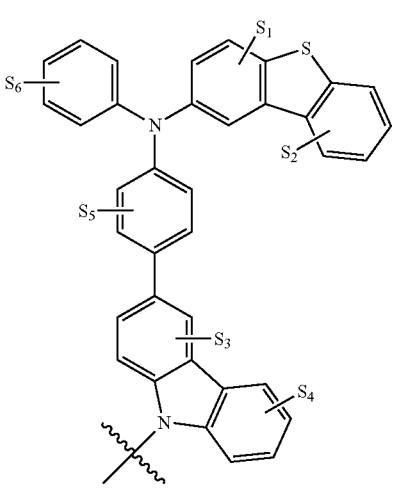
D59
D57
D60
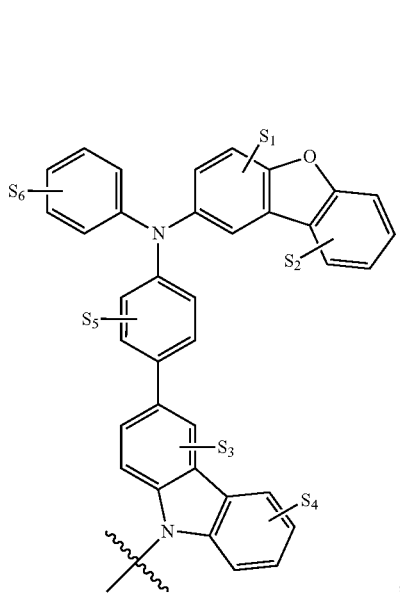
D58
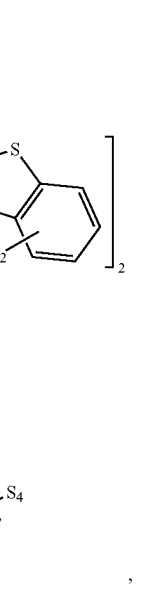
D61

-continued
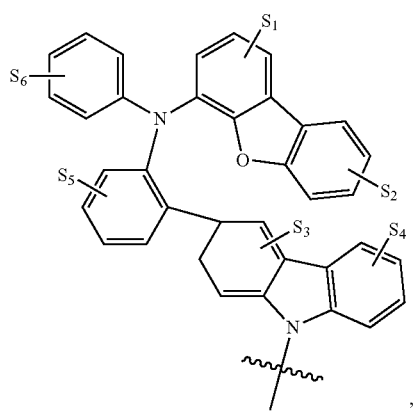
D62
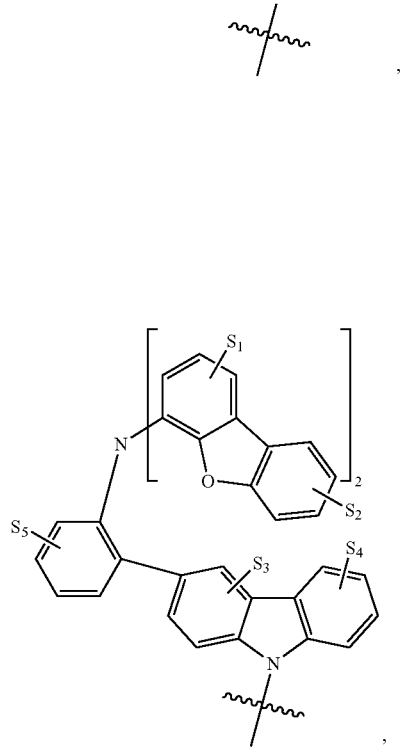
D63
D64
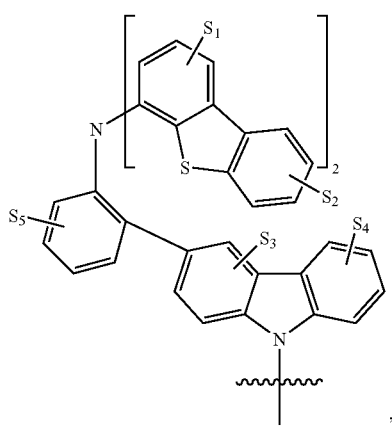
D65
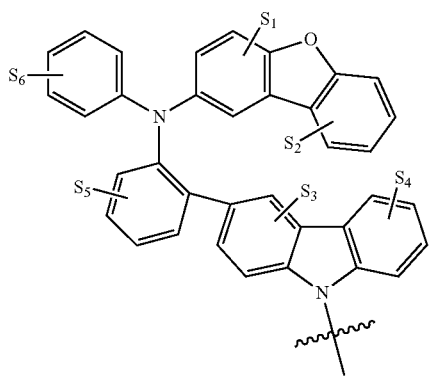
D66
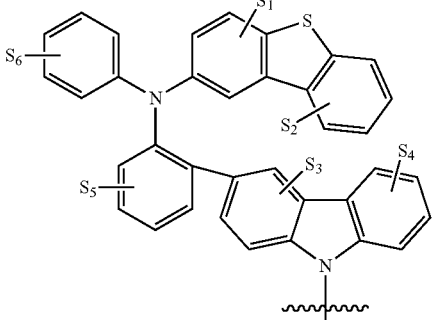
D67
D68

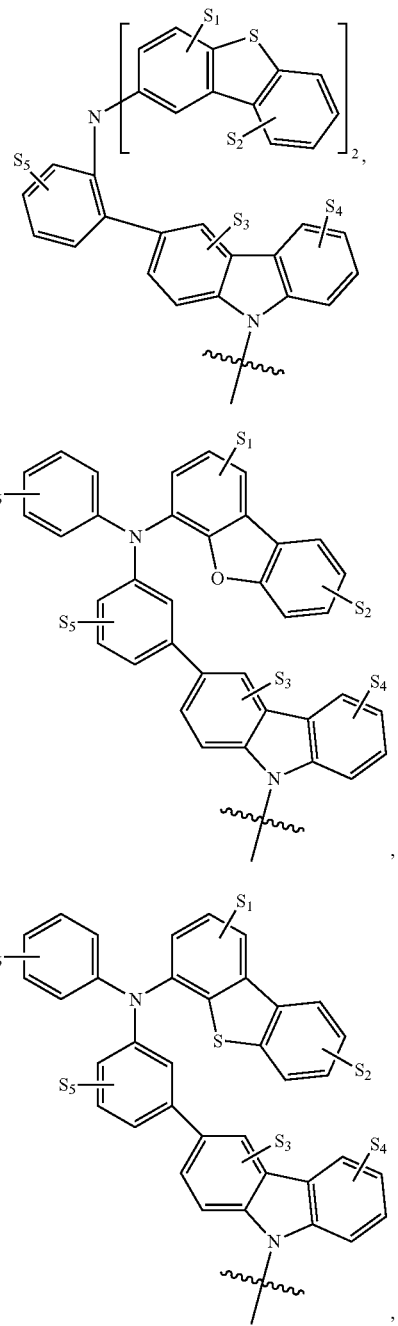

wherein S₁ to S₇ represent mono, di, tri, tetra or penta substitutions with hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

According to another aspect of the present disclosure, a first device comprising a first organic light emitting device is also provided. The first organic light emitting device can include an anode, a cathode, and an organic emissive layer disposed between the anode and the cathode. The organic emissive layer can include a compound of Formula 1, wherein each of $Y^1$ to $Y^8$ is C—R or N; at least one of $Y^1$ to $Y^8$ is N; at least one of $Y^1$ to $Y^8$ is C—R; each R is independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof; wherein at least one of the R comprises a donor group with at least one electron-donating nitrogen.

The first device can be a consumer product, an organic light-emitting device, and/or a lighting panel.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
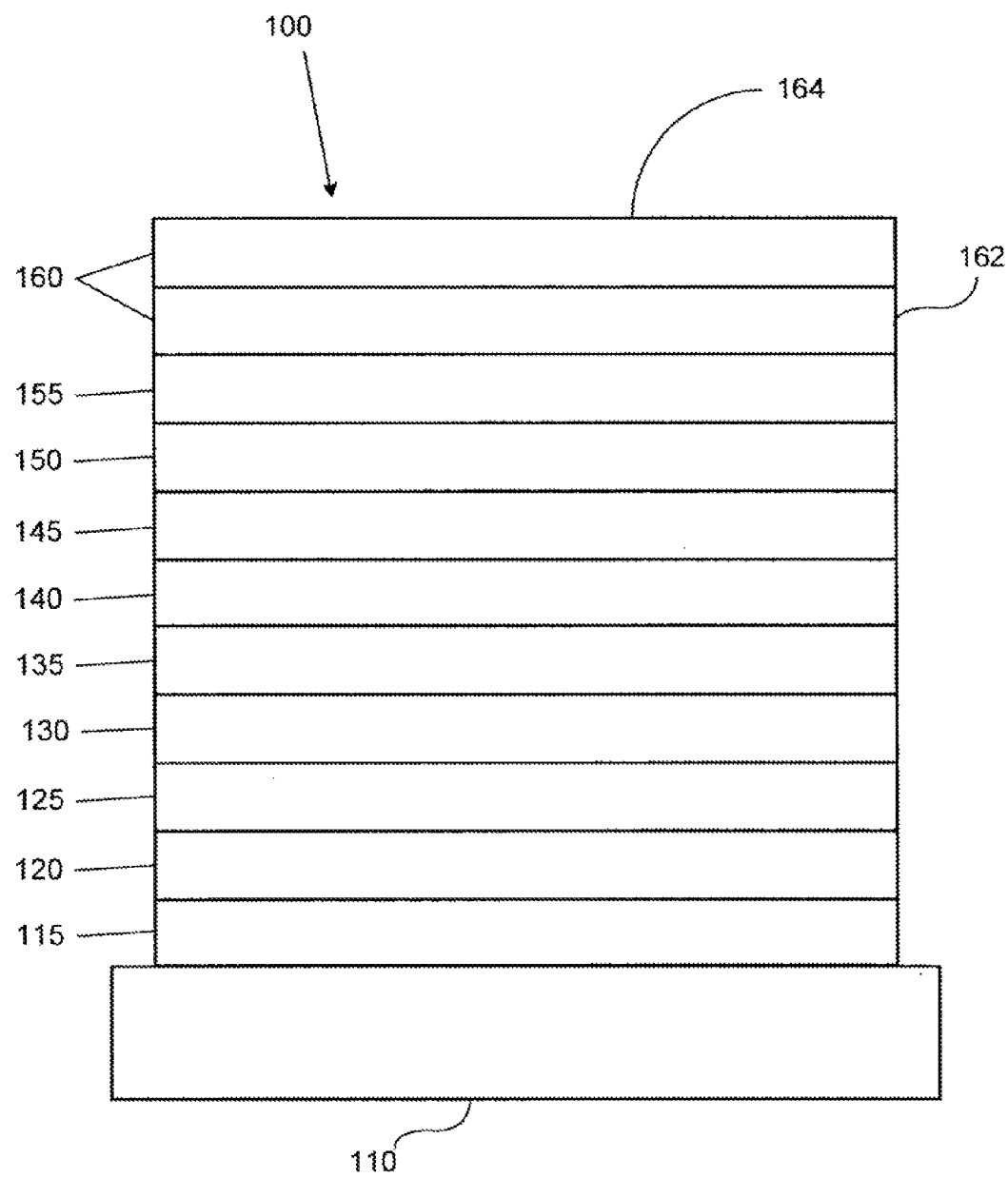
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
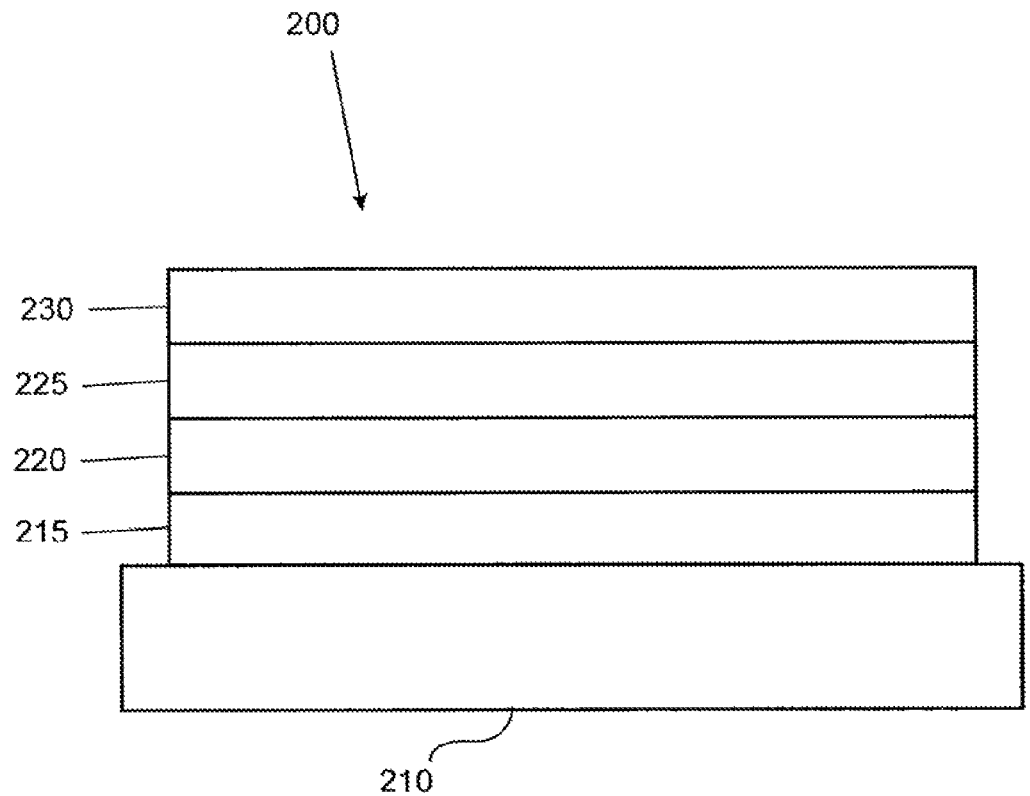
FIG. 2 shows an inverted organic light emitting device that does not have a separate electron transport layer.
Figure 3:
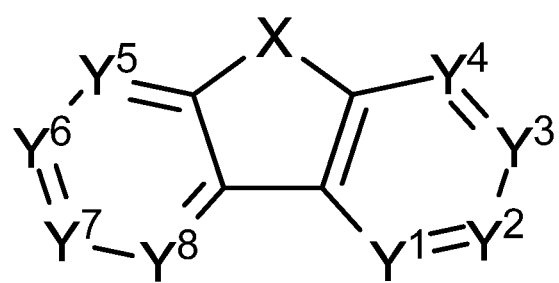
FIG. 3 shows Formula 1 as disclosed herein.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention may be incorporated into a wide variety of consumer products, including flat panel displays, computer monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, aralkyl, heterocyclic group, aryl, aromatic group, and heteroaryl are known to the art, and are defined in U.S. Pat. No. 7,279,704 at cols. 31-32, which are incorporated herein by reference. As used herein, "substituted" indicates that a substituent other than H is bonded to the relevant carbon.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the thermal population between the triplet states and the singlet excited states. Compounds that are capable of generating E-type delayed fluorescence are required to have very small singlet-triplet gaps. Thermal energy can activate the transition from the triplet state back to the singlet state. This type of delayed fluorescence is also known as thermally activated delayed fluorescence (TADF). A distinctive feature of TADF is that the delayed component increases as temperature rises due to the increased thermal energy. If the reverse intersystem crossing rate is fast enough to minimize the non-radiative decay from the triplet state, the fraction of back populated singlet excited states can potentially reach 75%. The total singlet fraction can be 100%, far exceeding the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap ($\Delta E_{S-T}$). Organic, non-metal containing, donor-acceptor luminescent materials may be able to achieve this. The emission in these materials is often characterized as a donor-acceptor charge-transfer (CT) type emission. The spatial separation of the HOMO and LUMO in these donor-acceptor type compounds often results in small $\Delta E_{S-T}$. These states may involve CT states. Often, donor-acceptor luminescent materials are constructed by connecting an electron donor moiety such as amino- or carbazole-derivatives and an electron acceptor moiety such as N-containing six-membered aromatic rings.

According to an embodiment, donor-acceptor compounds with unexpected CT emission properties are provided. The donor has at least one electron donating nitrogen. The acceptor moiety is based on electron deficient nitrogen containing high triplet energy heteropolyaromatic system.

Donor-acceptor compounds with CT emissions may be useful in high efficiency delayed fluorescence OLED (Appl. Phys. Lett. 2012, 98, 083302; Nature Photonics, 2012, 6, 253; Nature 2012, 492, 234; Chem. Commun. 2012, 48, 11392; Angew. Chem. Int. Ed. 2012, 51, 11311; J. Am. Chem. Soc., 2012, 134, 14706; Chem. Commun. 2012, 48, 9580). The electron acceptors used are triazene or cyano groups. While these groups are strongly electron deficient, making the design of strong donor-acceptor strength easy, OLEDs incorporating them may not be very stable because of the lack of electron delocalization in these acceptors. In this disclosure, we use a high triplet energy heteropolyaromatic system, namely, dibenzofuran, dibenzothiophene and dibenzoselenophene with one or multiple nitrogens in the ring to render a an electron acceptor with high triplet energy. High triplet energy is important in order to obtain blue emission.

According to a preferred embodiment, a donor-acceptor compounds having nitrogen containing dibenzofuran, dibenzothiophene and dibenzoselenophene as an electron acceptor that are unexpectedly suited as delayed fluorescence emitters are disclosed. Such a compound has the structure according to the formula

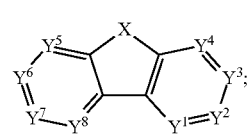

Formula 1 wherein each of $Y^1$ to $Y^8$ is C—R or N; at least two of $Y^1$ to $Y^8$ are N; at least one of $Y^1$ to $Y^8$ is C—R; each R is independently selected from the group consisting of hydrogen, deuterium, halide, alkyl, cycloalkyl, heteroalkyl, arylalkyl, alkoxy, aryloxy, amino, silyl alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof; wherein at least one of the R is selected from the group of substitutents consisting of D1 through D140; and wherein $S_1$ to $S_7$ represent mono, di, tri, tetra or penta substitutions with hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl carboxylic acids, ester, nitrile, isonitrile, sulfanyl, sulfonyl, phosphino, and combinations thereof.

In some embodiments, the donor-acceptor compound is selected from the group consisting of

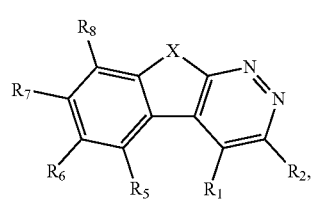

Formula 2

Formula 3
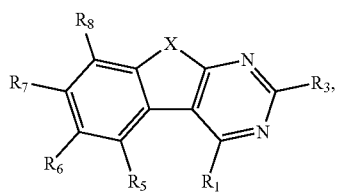
Formula 4
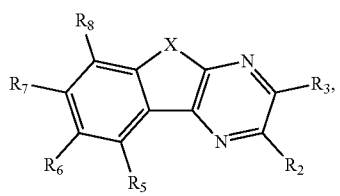
Formula 5
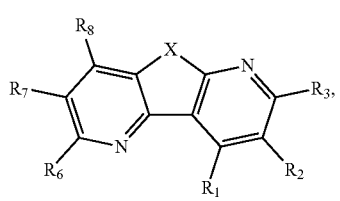
Formula 6
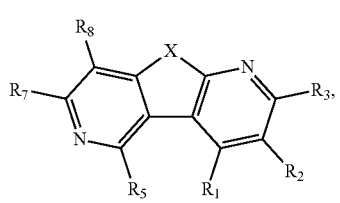
Formula 7
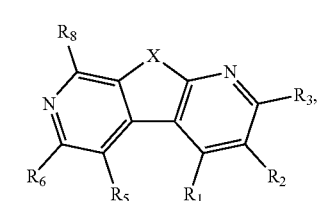
Formula 8
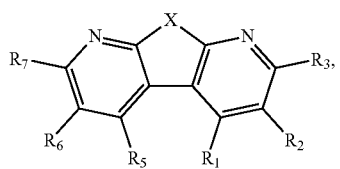
Formula 9
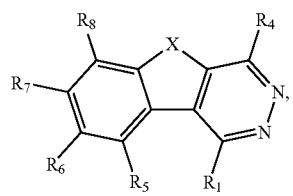
Formula 10
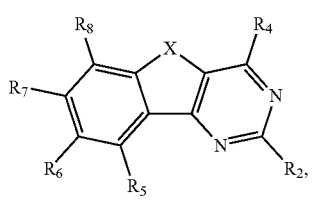
Formula 11
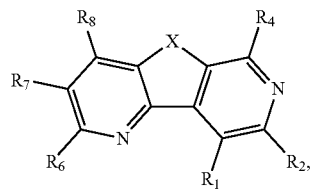
Formula 12
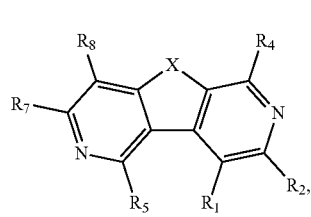
Formula 13
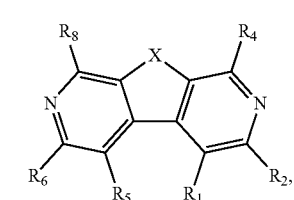
Formula 14
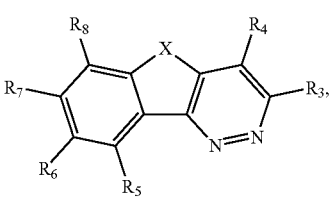
Formula 15
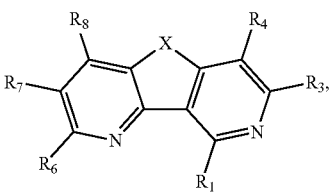
Formula 16
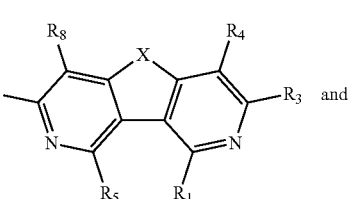
and
Formula 17
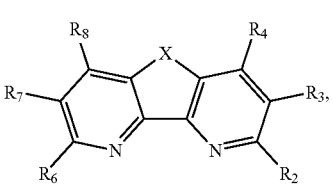
wherein at least one of $R_1$-$R_8$ is selected from the group consisting of D1 to D140.

In some more specific embodiments, the compound is selected from the group consisting of:
Compound O-10-10
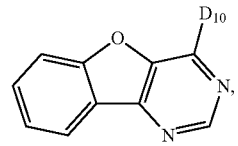
Compound S-10-10
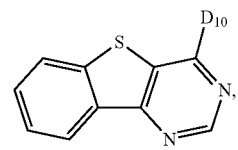
Compound Se-10-10
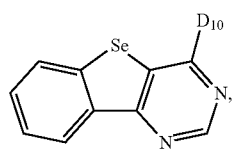
Compound O-13-10
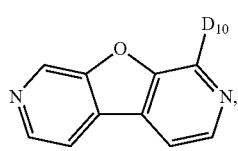
Compound S-13-10
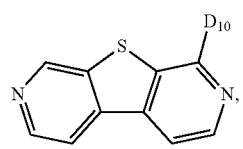
Compound Se-13-10
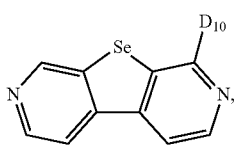
Compound O-10-54
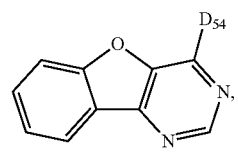
Compound S-10-54
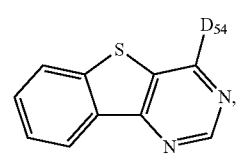
Compound Se-10-54
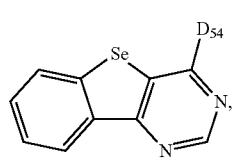
Compound O-13-54
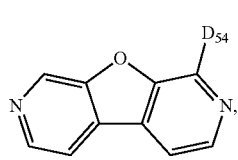
-continued
Compound S-13-54
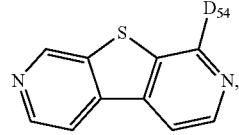
Compound Se-13-54
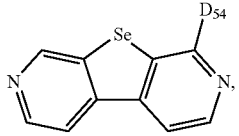
Compound O-10-55
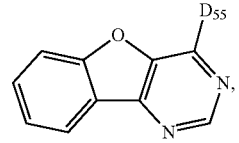
Compound S-10-55
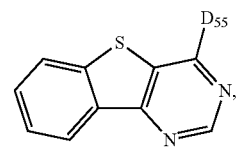
Compound Se-10-55
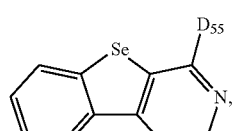
Compound O-10-56
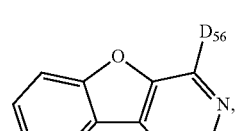
Compound S-10-56
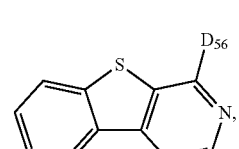
Compound Se-10-56
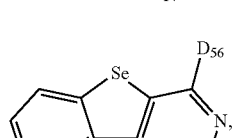
Compound O-13-56
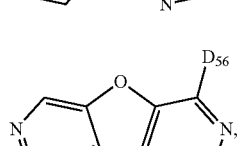
Compound S-13-56
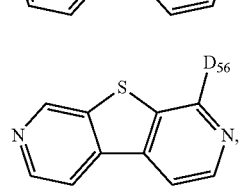

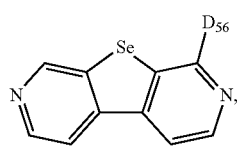
Compound Se-13-56
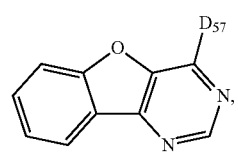
Compound O-10-57
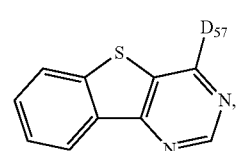
Compound S-10-57
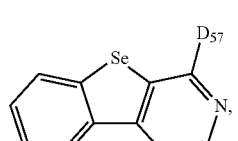
Compound Se-10-57
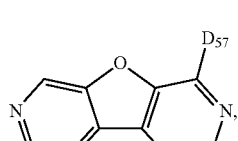
Compound O-13-57
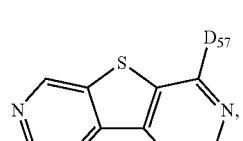
Compound S-13-57
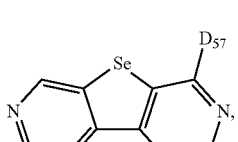
Compound Se-13-57
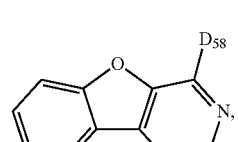
Compound O-10-58
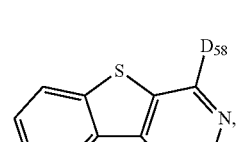
Compound S-10-58
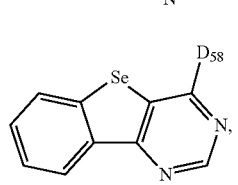
Compound Se-10-58
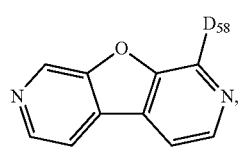
Compound O-13-58
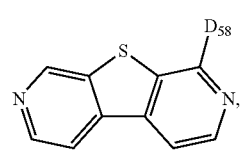
Compound S-13-58
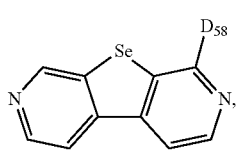
Compound Se-13-58
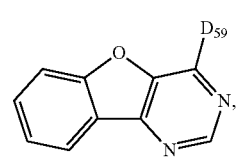
Compound O-10-59
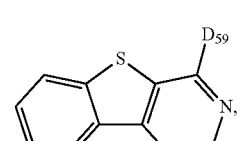
Compound S-10-59
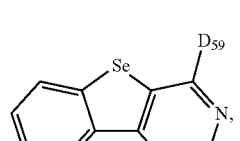
Compound Se-10-59
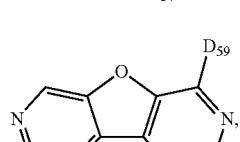
Compound O-13-59
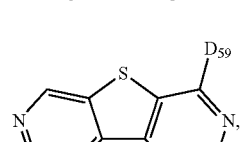
Compound S-13-59
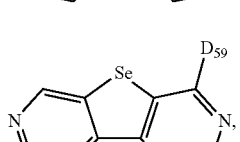
Compound Se-13-59
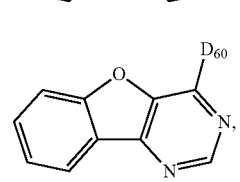
Compound O-10-60

-continued
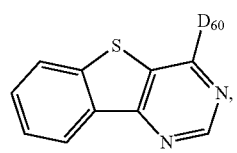
Compound S-10-60
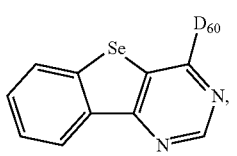
Compound Se-10-60
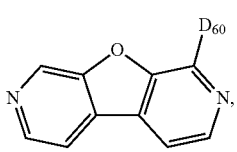
Compound O-13-60
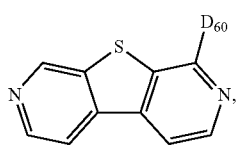
Compound S-13-60
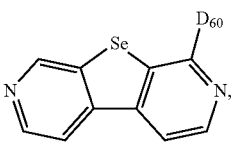
Compound Se-13-60
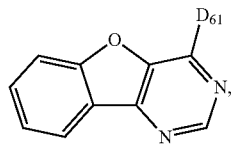
Compound O-10-61
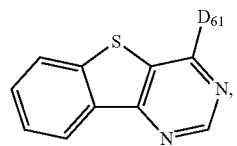
Compound S-10-61
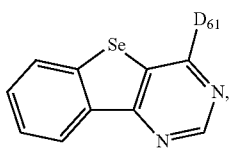
Compound Se-10-61
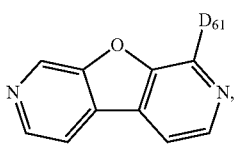
Compound O-13-61
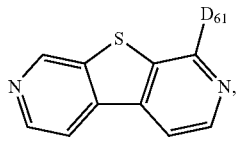
Compound S-13-61
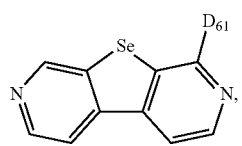
Compound Se-13-61
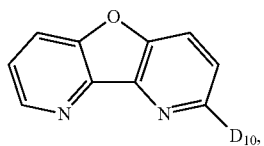
Compound O-17-10
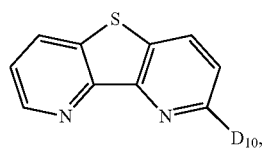
Compound S-17-10
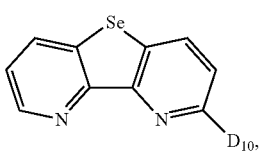
Compound Se-17-10
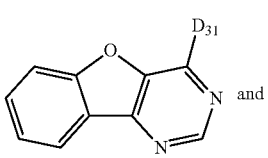
Compound O-10-31
and
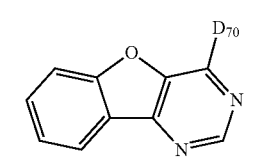
Compound O-10-70
wherein D10, D31, D54, D55, D56, D57, D58, D59, D60, D70 and D61 are
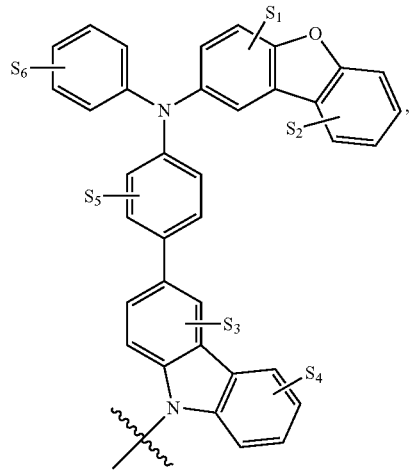
D10

D31 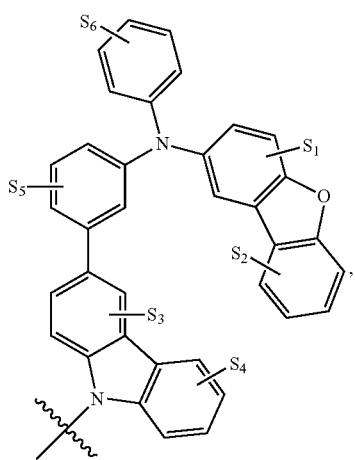
D54 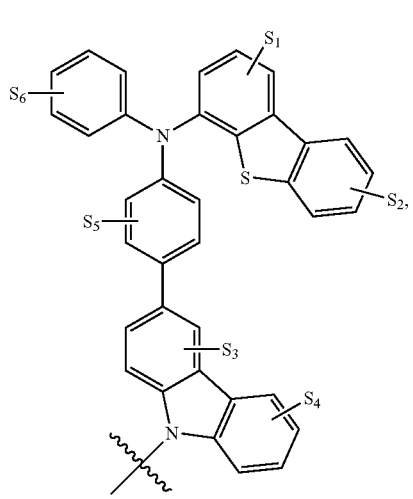
D56 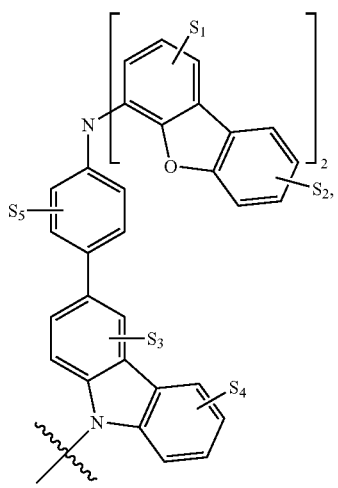
D57 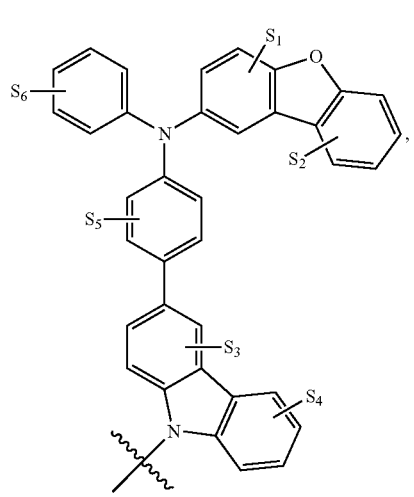

-continued

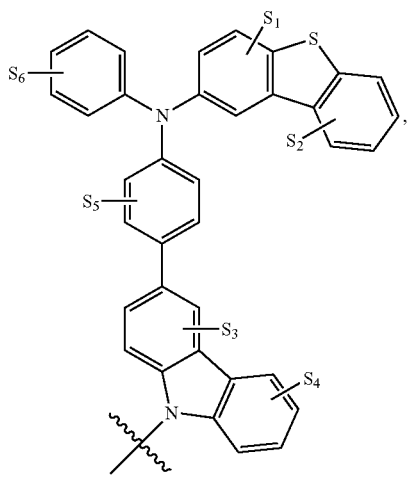
D59

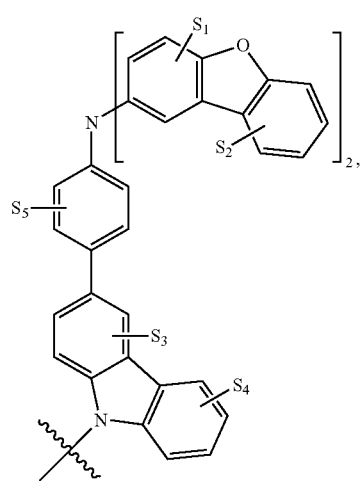
D60

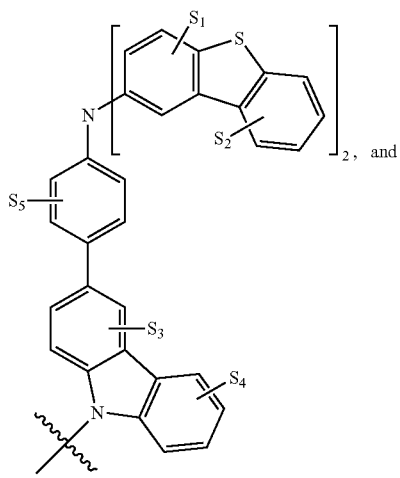
, and

-continued

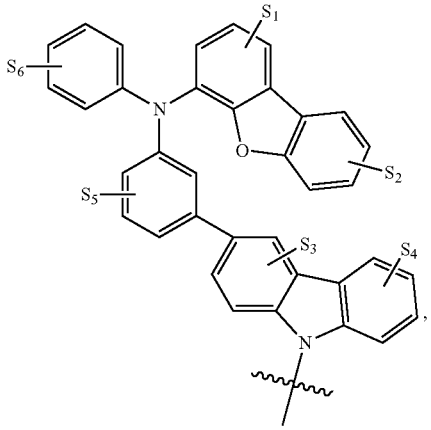
D70 wherein $S_1$ to $S_6$ represent mono, di, tri, tetra or penta substitutions with hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In some embodiments of the donor-acceptor compound, $S_1$ to $S_6$ are H. The resulting compounds are denoted as Compound No.-H. For example, Compound O-10-10-H is Compound O-10-10-H

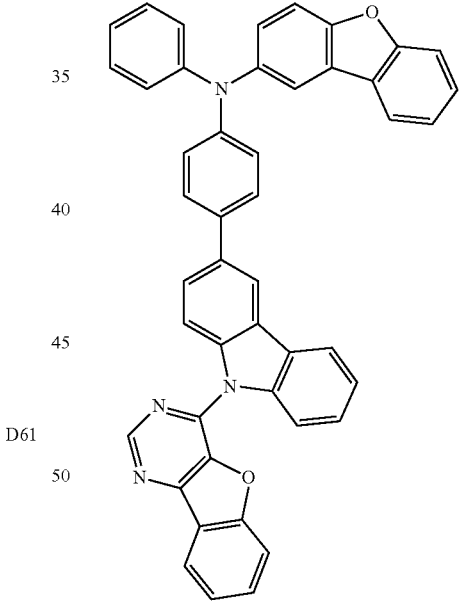

According to another aspect of the present disclosure, a first device that includes a first organic light emitting device is provided. The organic light emitting device comprises an anode, a cathode, and an organic emissive layer disposed between the anode and the cathode. The organic emissive layer comprises a first emitting compound having the structure according to Formula 1, wherein each of $Y^1$ to $Y^8$ is C—R or N; at least one of $Y^1$ to $Y^8$ is N; at least one of $Y^1$ to $Y^8$ is C—R; each R is independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof; and wherein at least one of the R comprises a donor group with at least one electron-donating nitrogen. In another embodiment of the first device, at least two of $Y^1$ to $Y^8$ is N.

In some specific embodiments, the first emitting compound is selected from the group consisting of

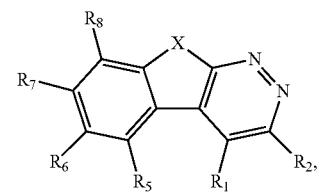
Formula 2

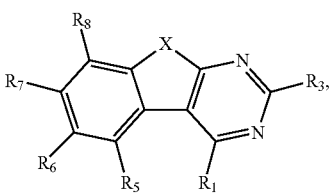
Formula 3

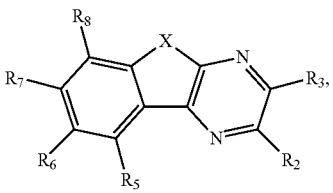
Formula 4

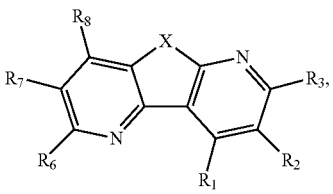
Formula 5

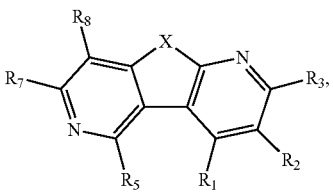
Formula 6

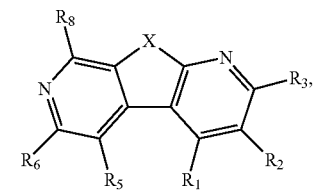
Formula 7

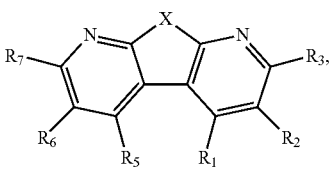
Formula 8

-continued

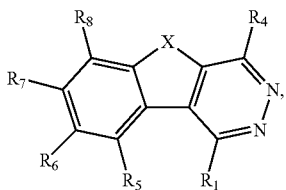
Formula 9

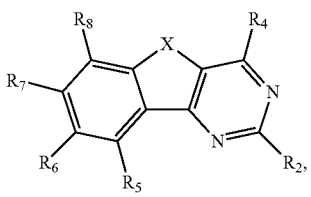
Formula 10

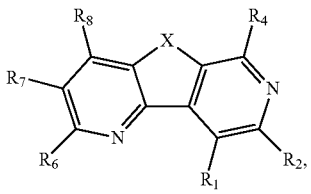
Formula 11

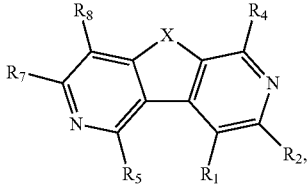
Formula 12

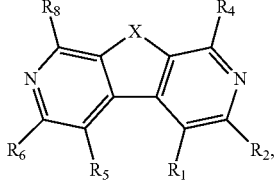
Formula 13

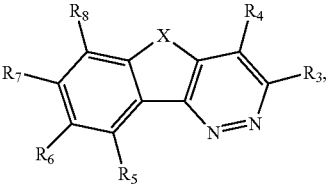
Formula 14

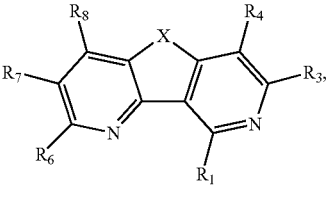
Formula 15

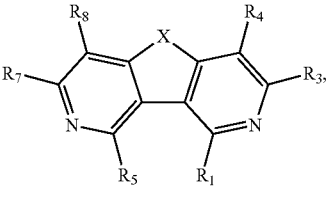
Formula 16

Formula 17
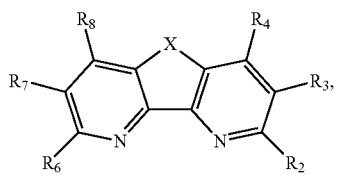

Formula 18
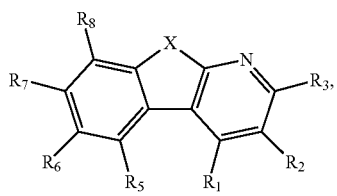

Formula 19
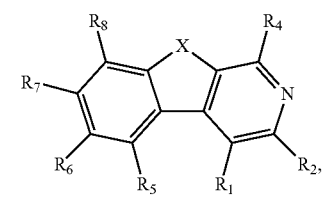

Formula 20
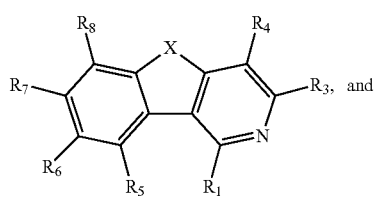

Formula 21
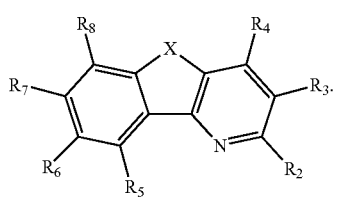

wherein $R_1$-$R_8$ is independently hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof;

at least one of $R_1$ to $R_8$ is $(L)_m$($Donor)_n$;

wherein L is a linker, m is 1 or 0, n≥1; and wherein Donor is an electron donating group containing at least one electron-donating nitrogen and Donors can be different when n>1.

The linker L can be one of

L1
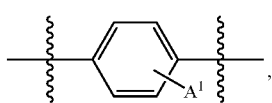

L2
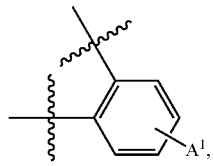

L3
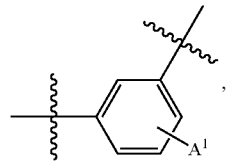

L4
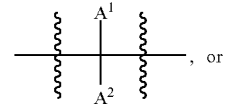

L5
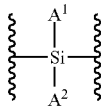

wherein $A^1$ to $A^2$ represent mono, di, tri or tetra substitutions with hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In some embodiments, the Donor is selected from the group consisting of D1 through D144 shown below:

D1
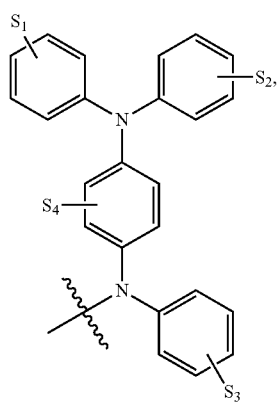

D2
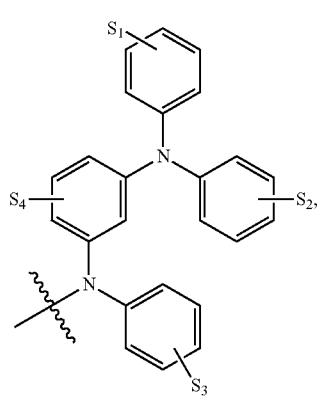
D3
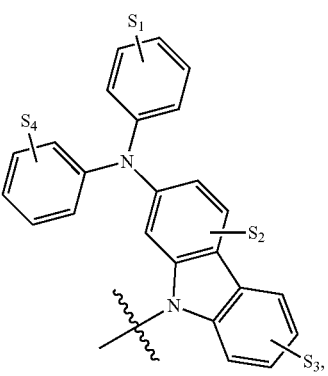
D4
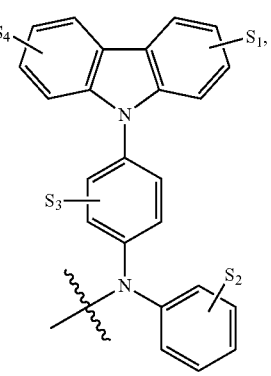
D5
D6
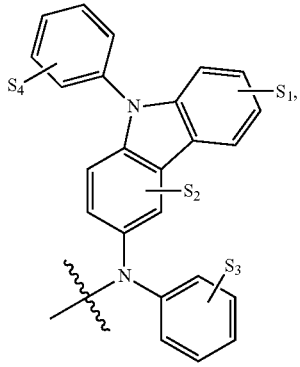
D7
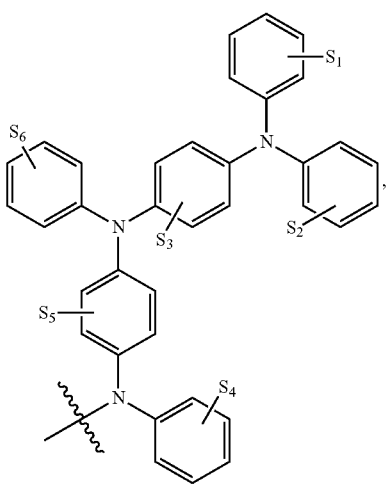
D8
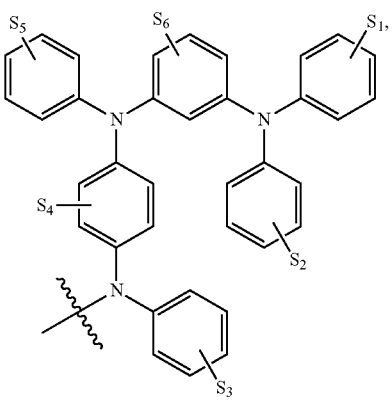

-continued
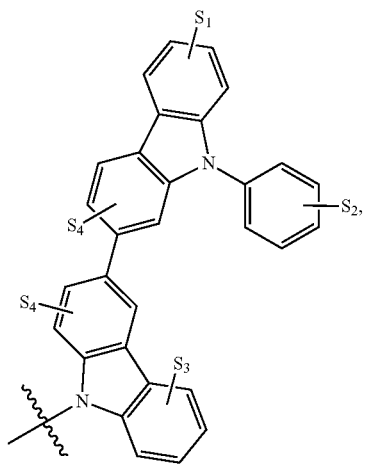
D9
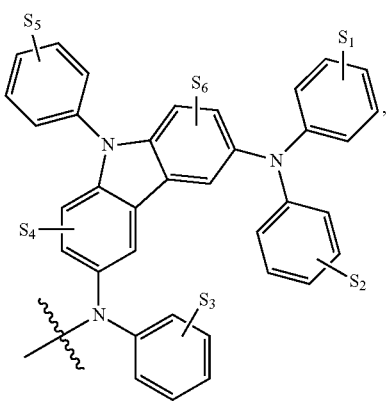
D12
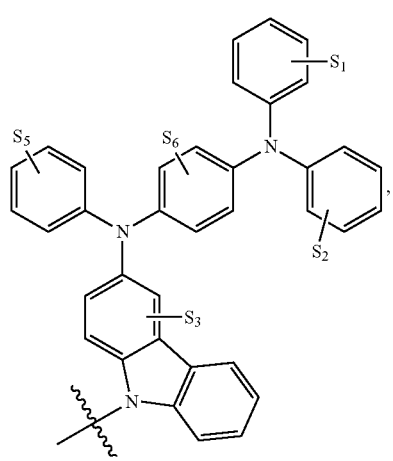
D10
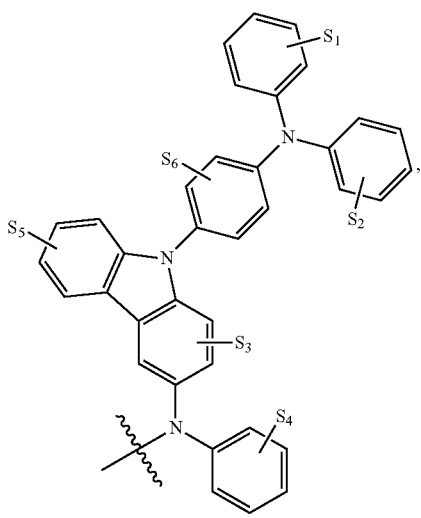
D13
D11
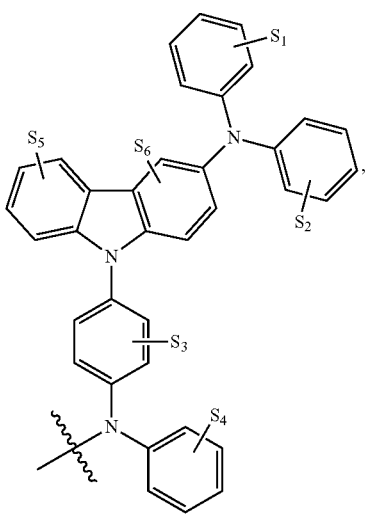
D14

D15
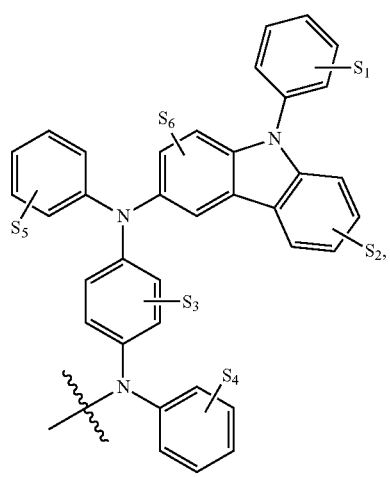
D16
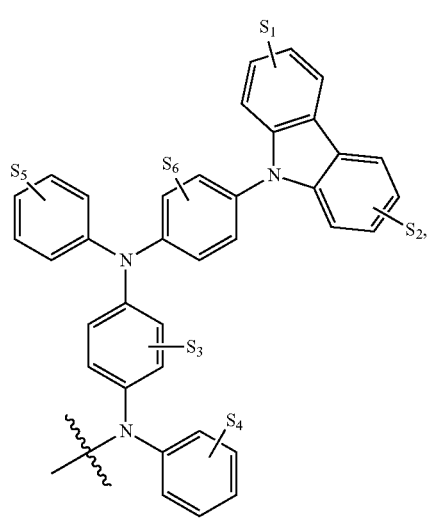
D17
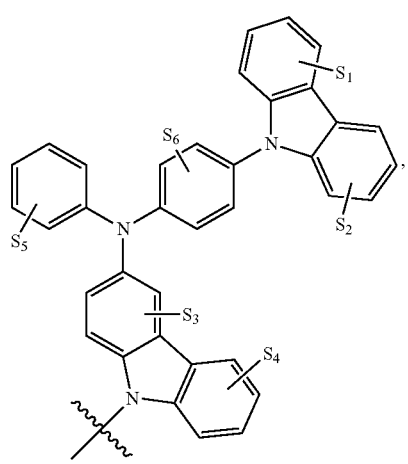
D18
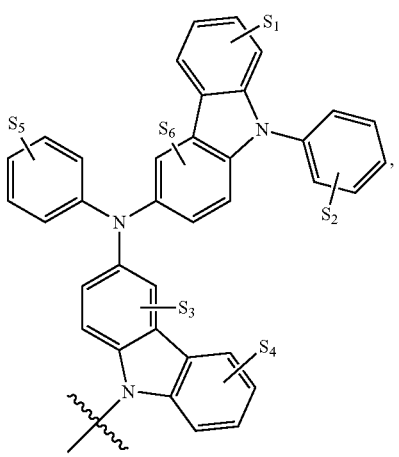
D19
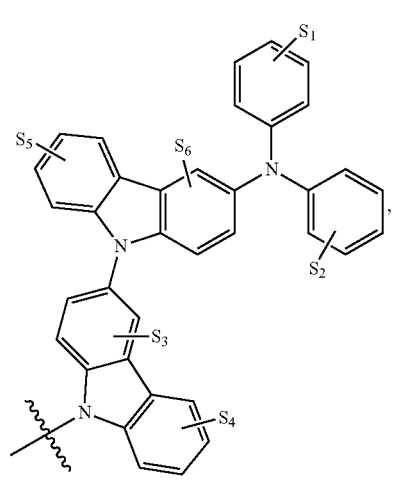
D20
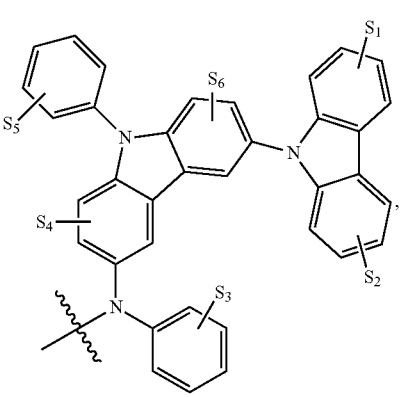

D21 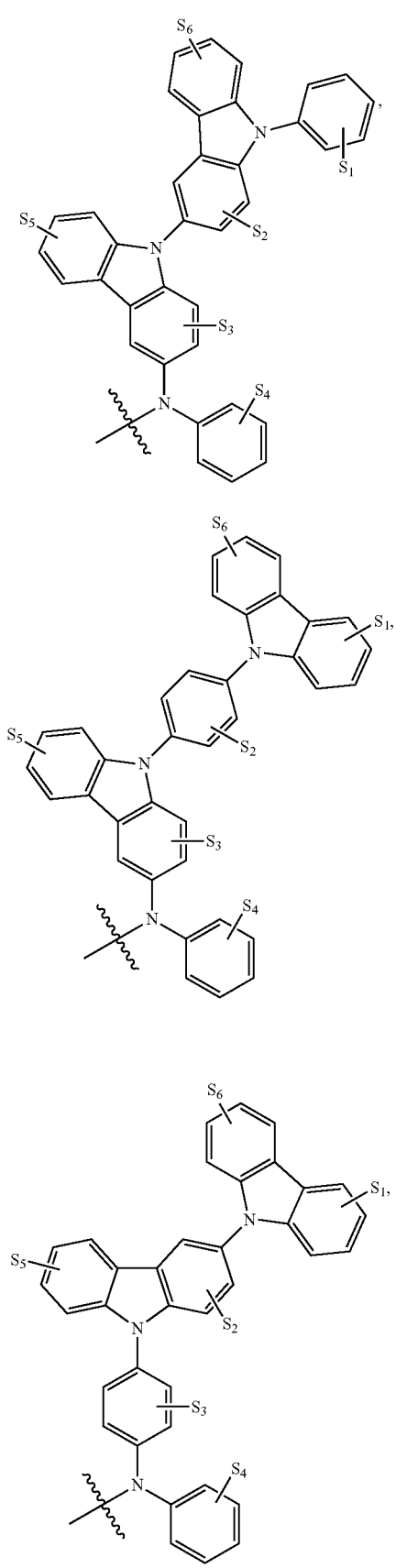
D22
D23
D24 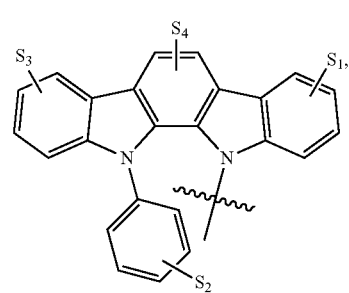
D25 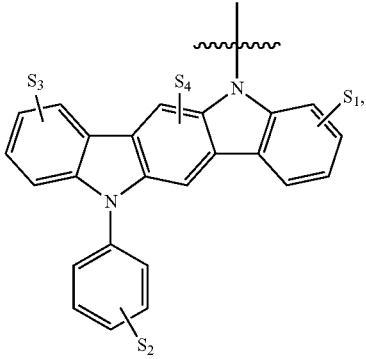
D26 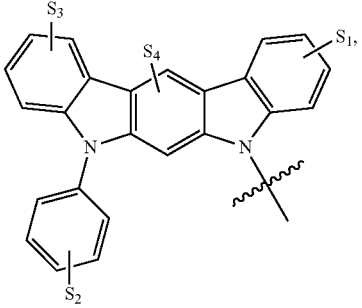
D27 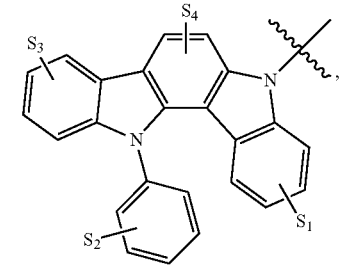
D28 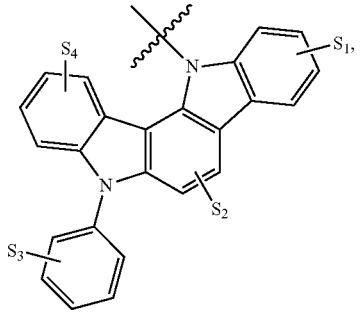

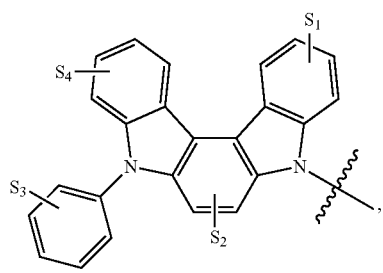
D29
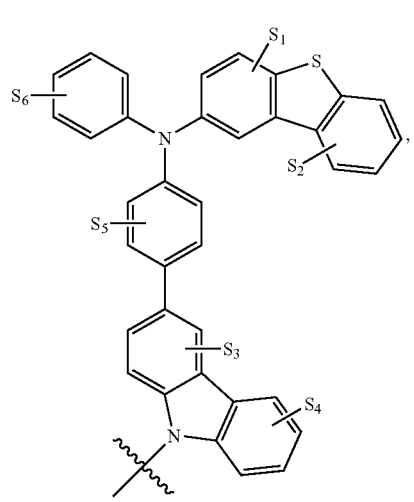
D30
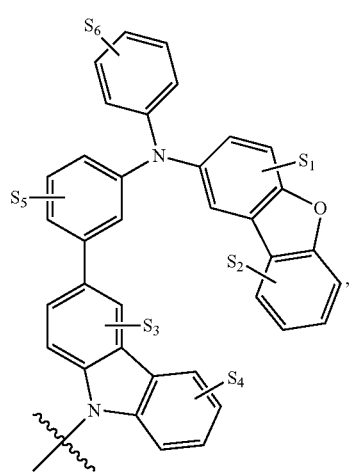
D31
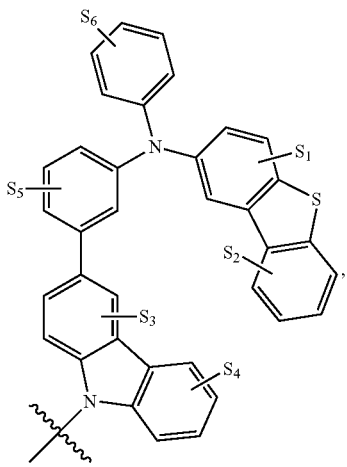
D32
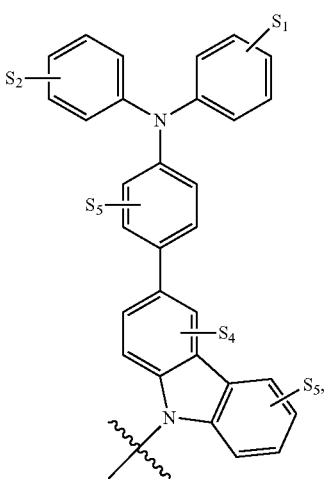
D33
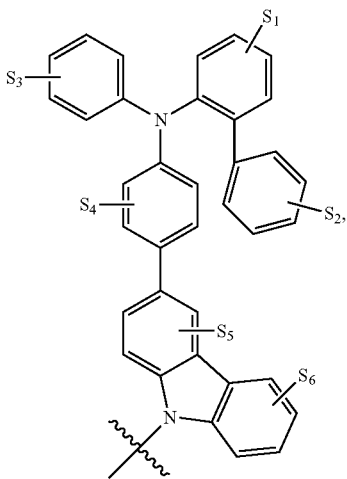
D34

-continued
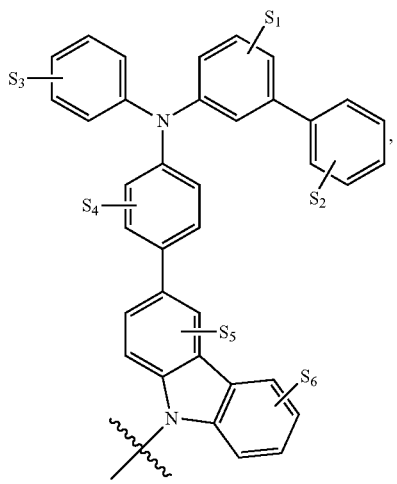
D35
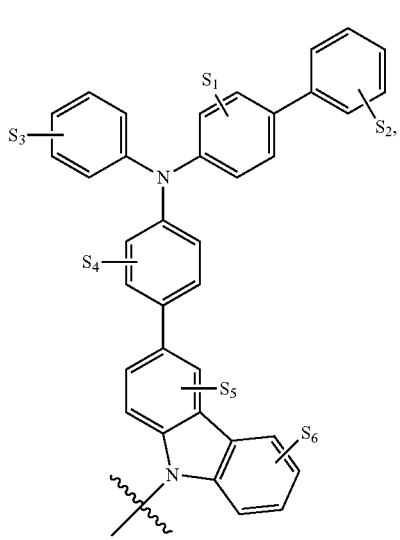
D36
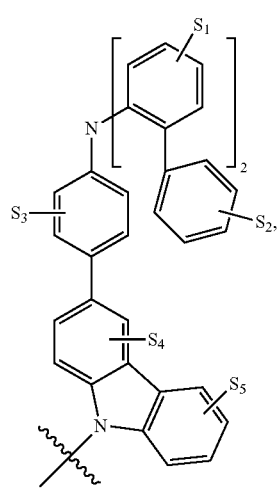
D37
-continued
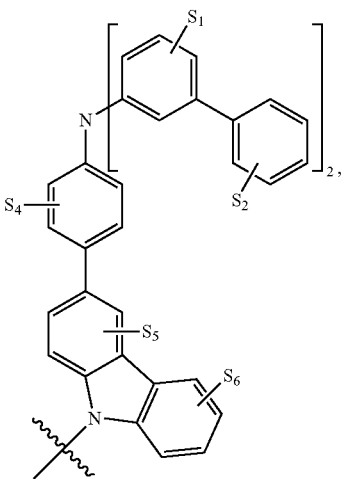
D38
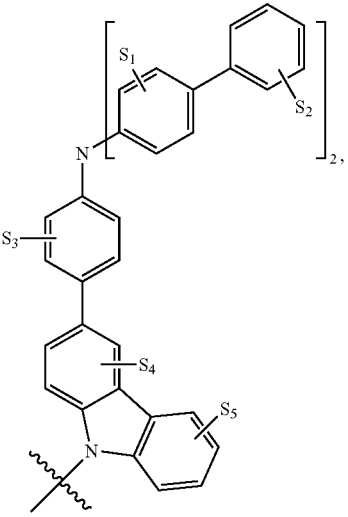
D39
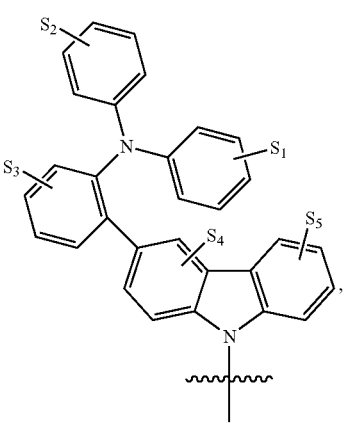
D40

-continued

D41

D42

D43

-continued

D44

D45

D46

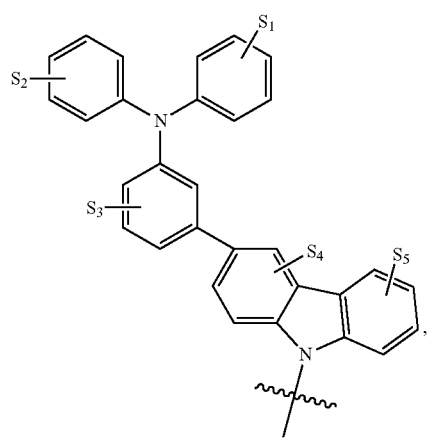
D47
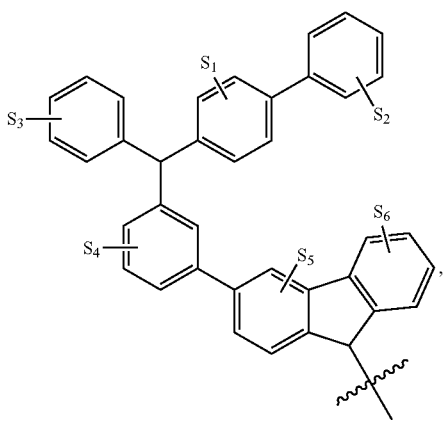
D50
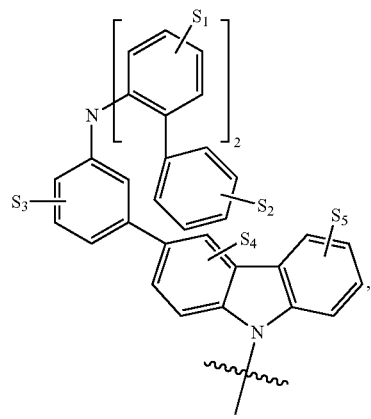
D51
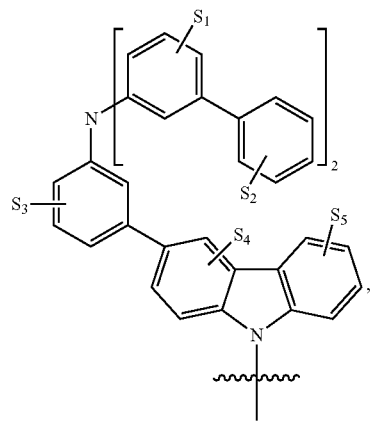
D52
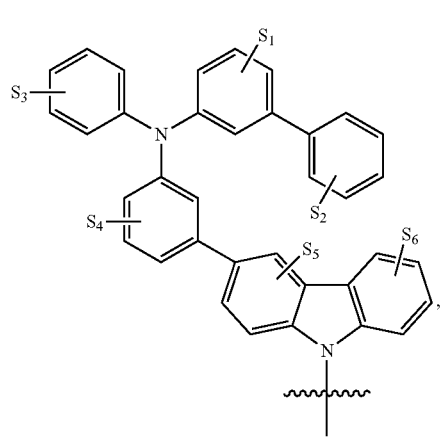
D49
D48
D53

-continued
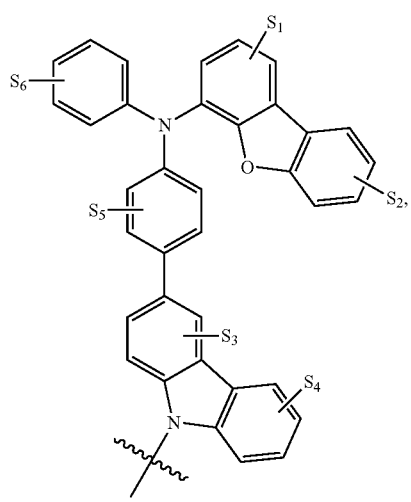
D54
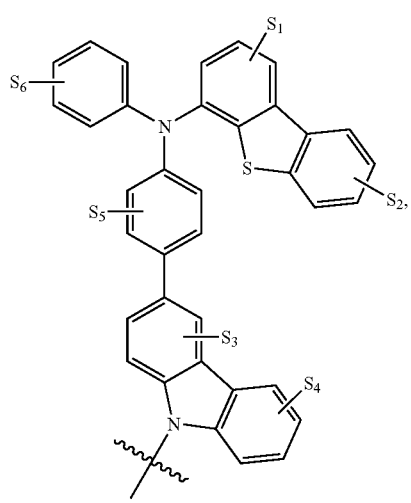
D55
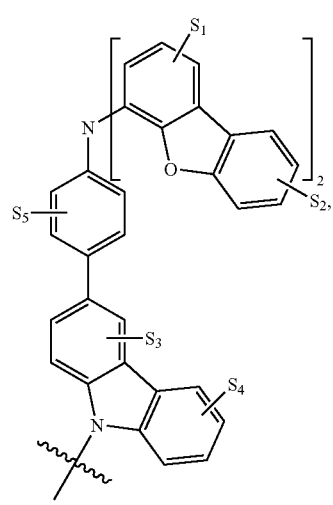
D56
-continued
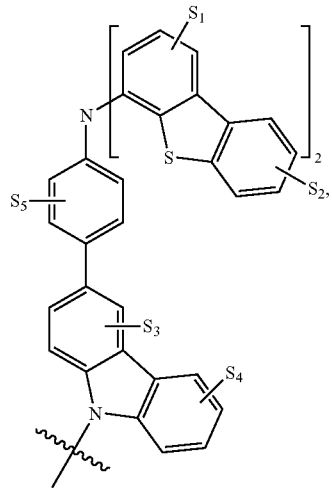
D57
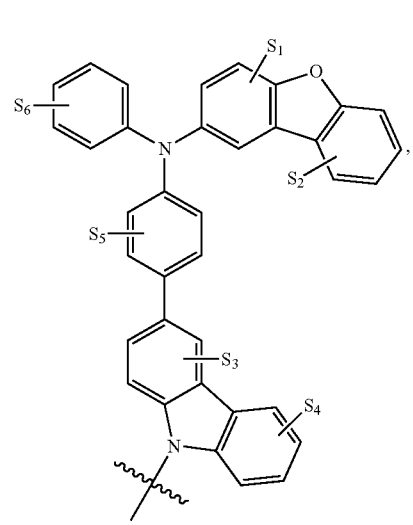
D58
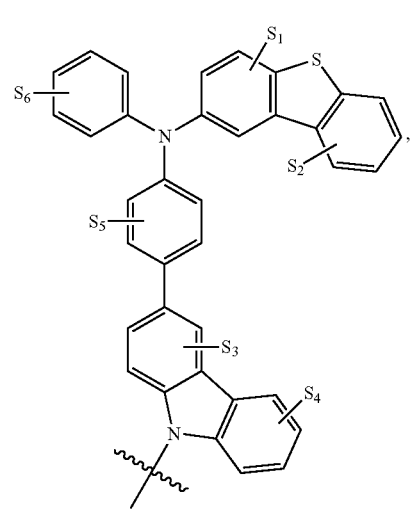
D59

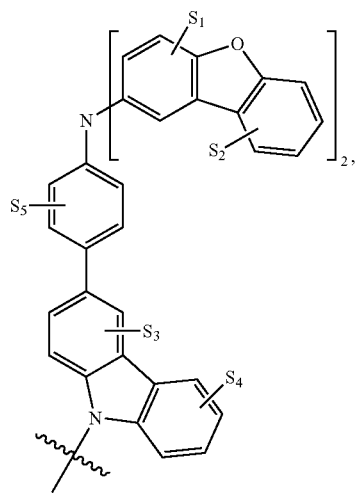
D60
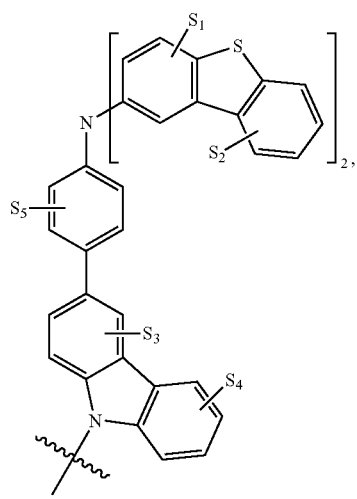
D61
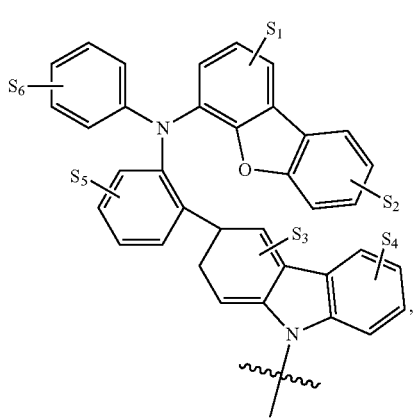
D62
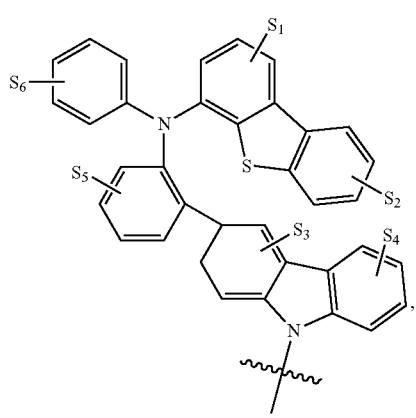
D63
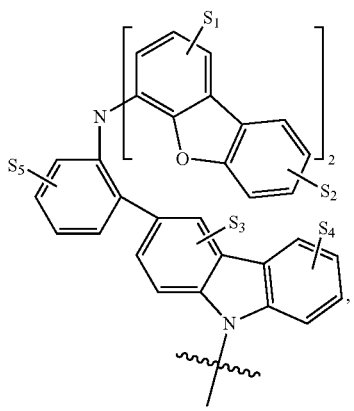
D64
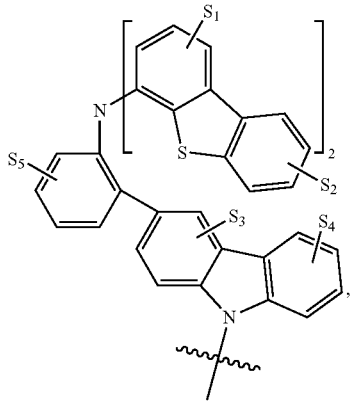
D65
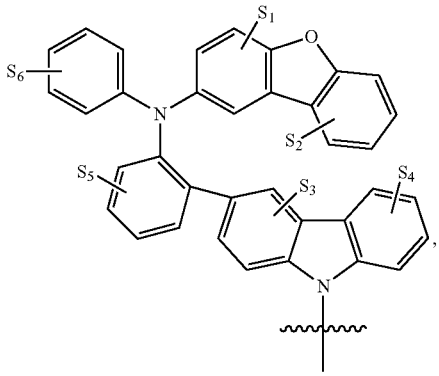
D66

D67
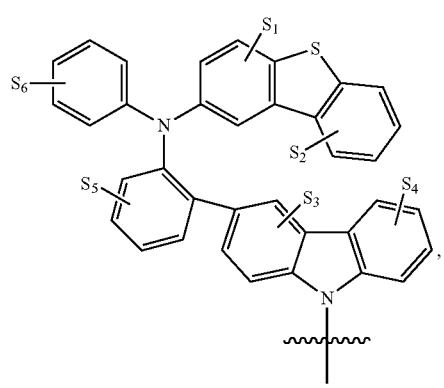
D68
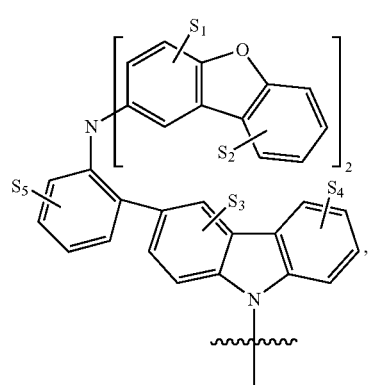
D69
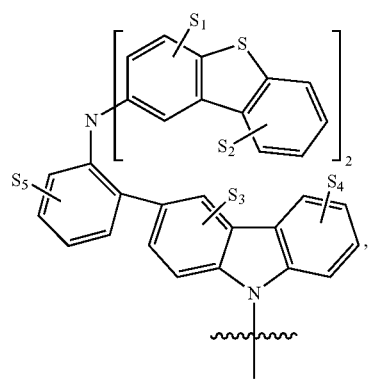
D70
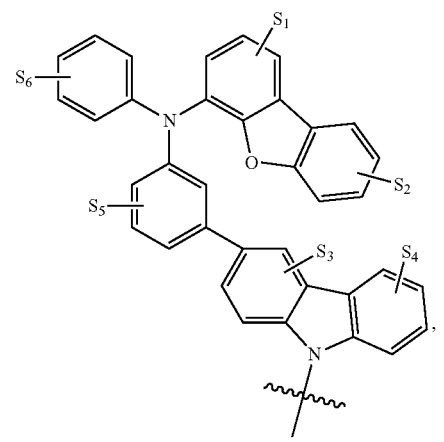
D71
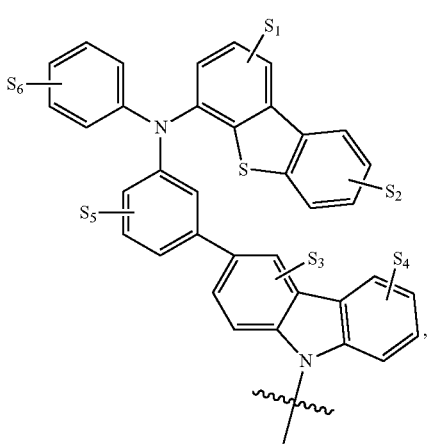
D72
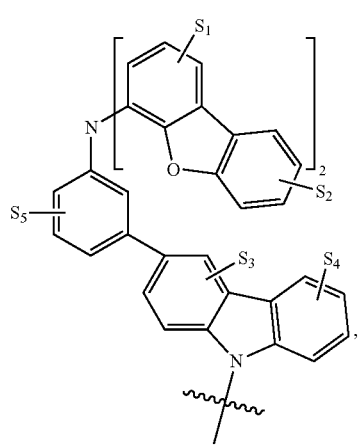
D73
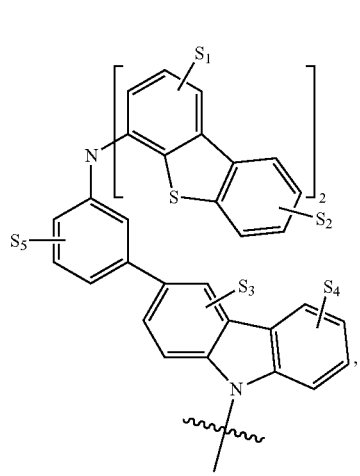

-continued
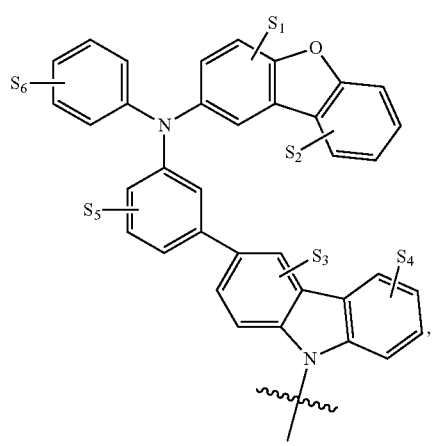
D74
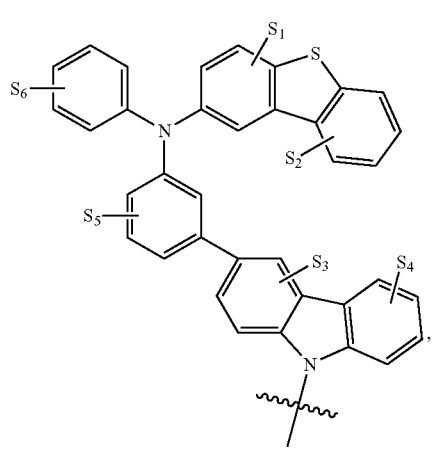
D75
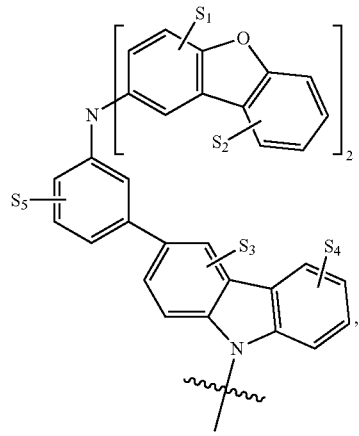
D76
-continued
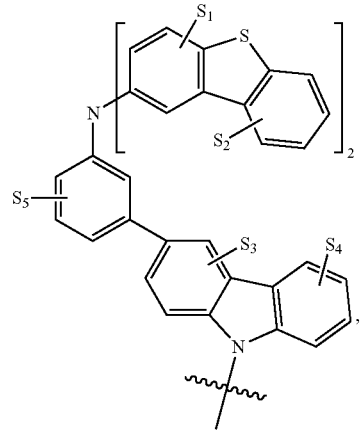
D77
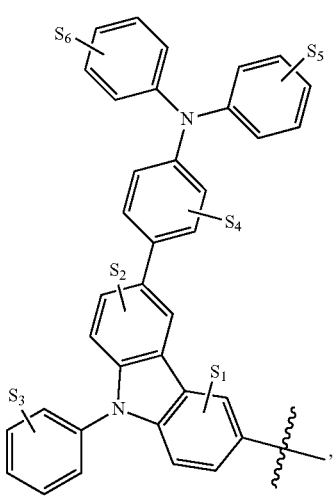
D78
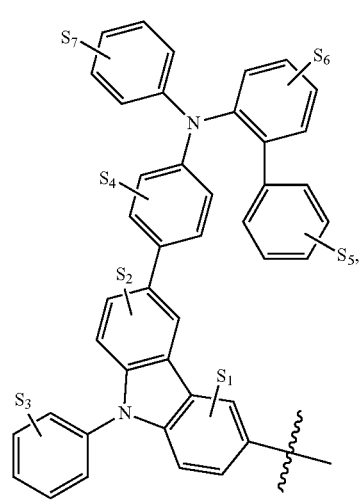
D79

-continued
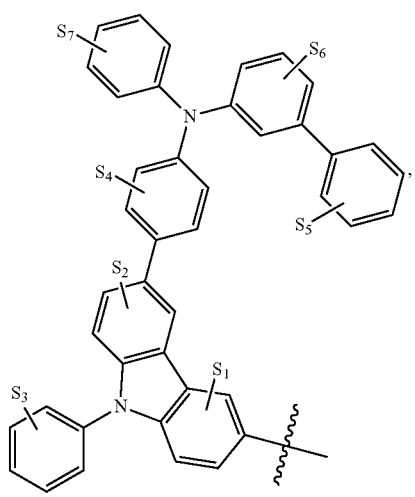
D80
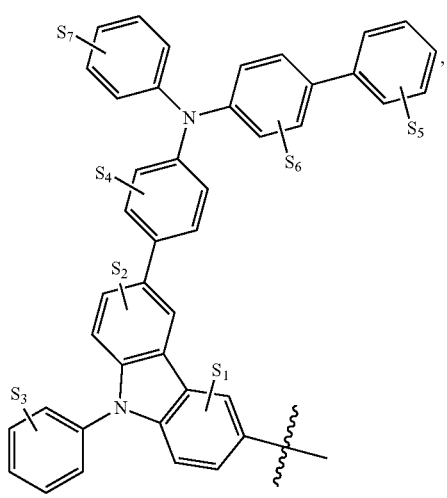
D81
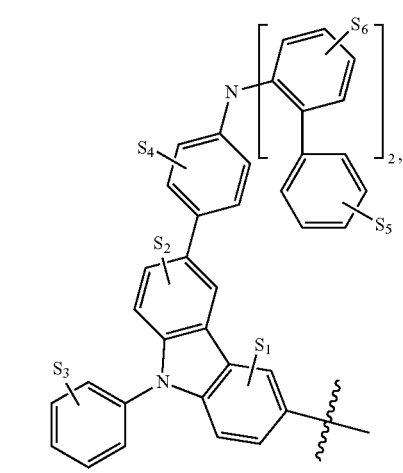
D82
-continued
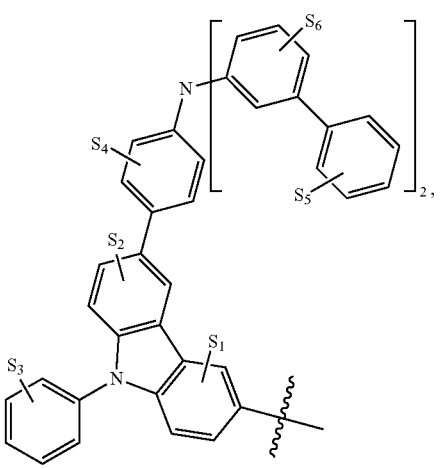
D83
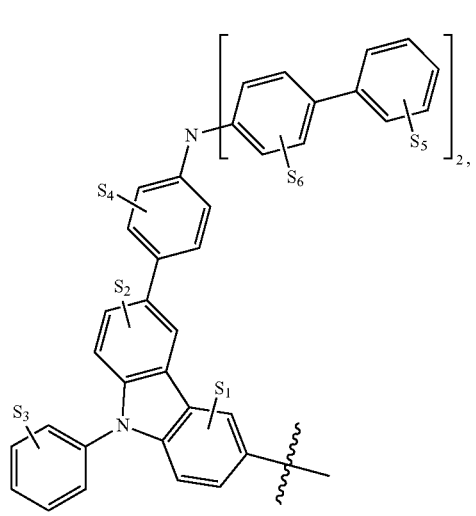
D84
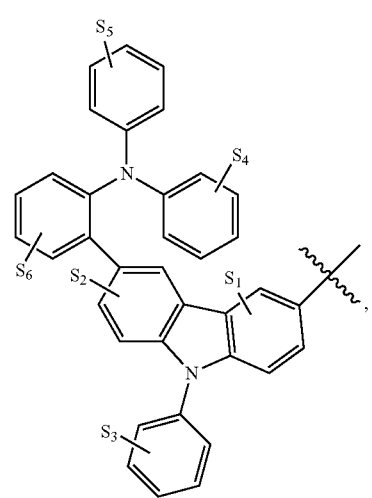
D85

-continued
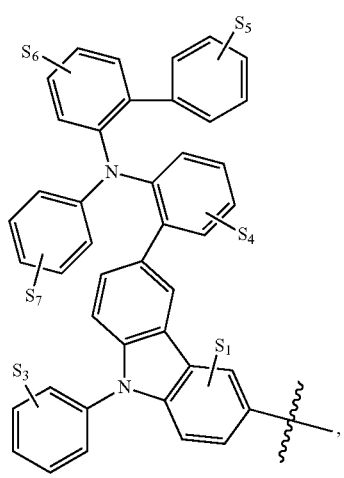
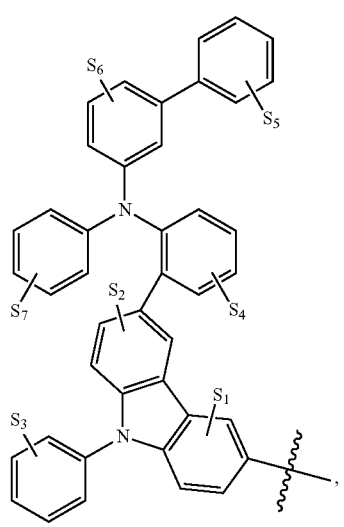
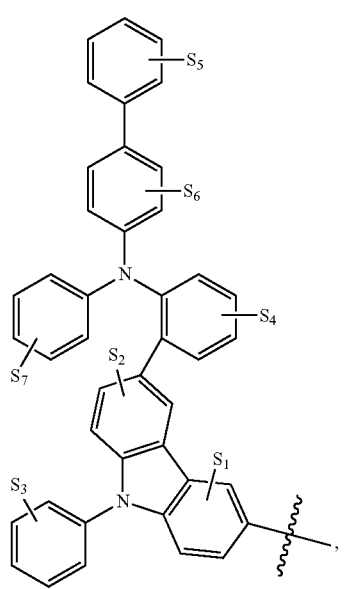
-continued
D86
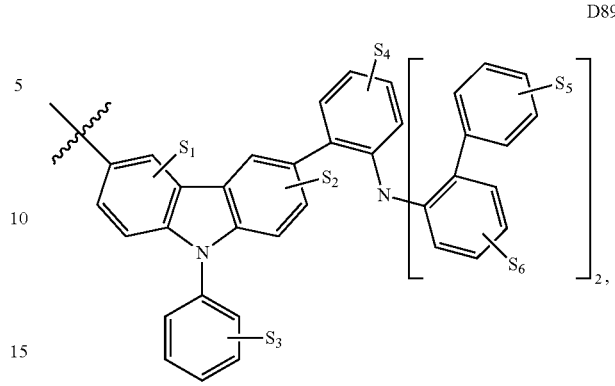
D87
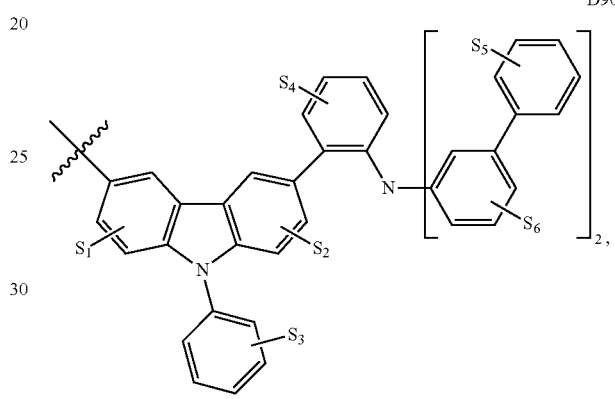
D88
D89
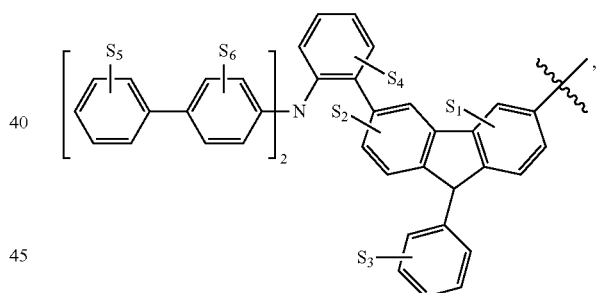
D90
D91
D92
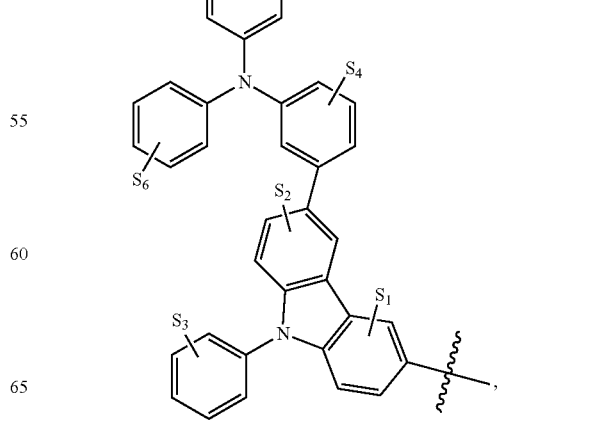

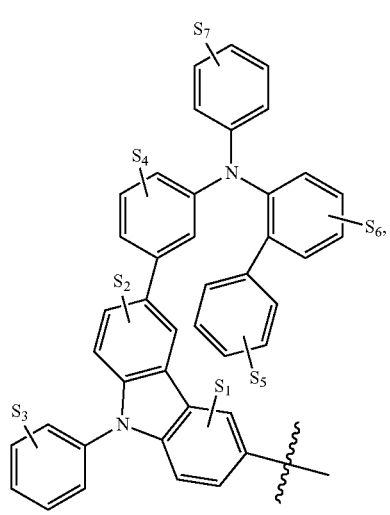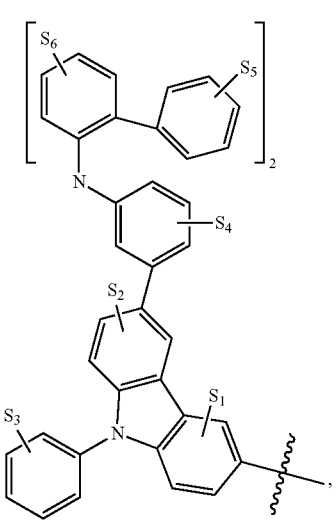

-continued
D99
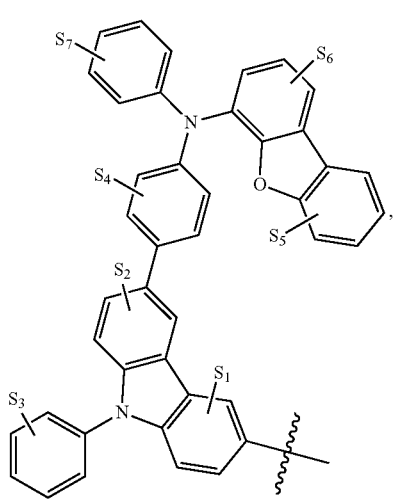
D100
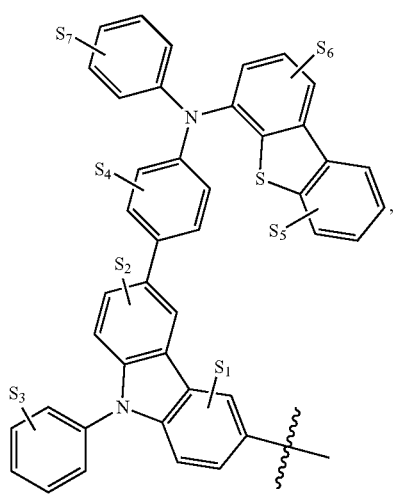
D101
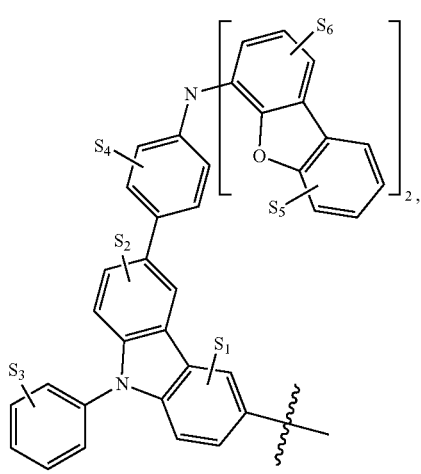
-continued
D102
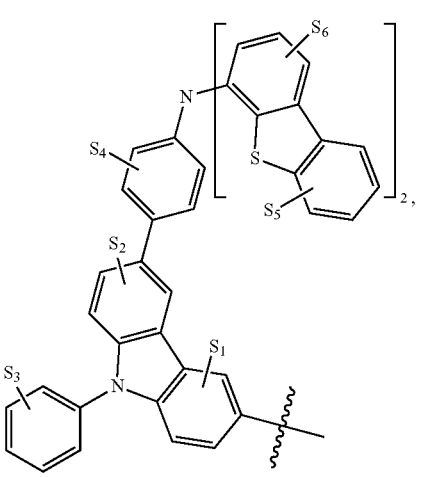
D103
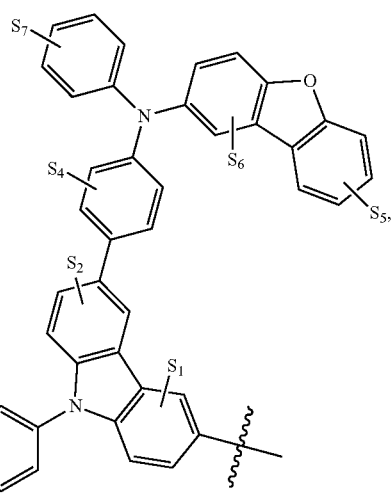
D104
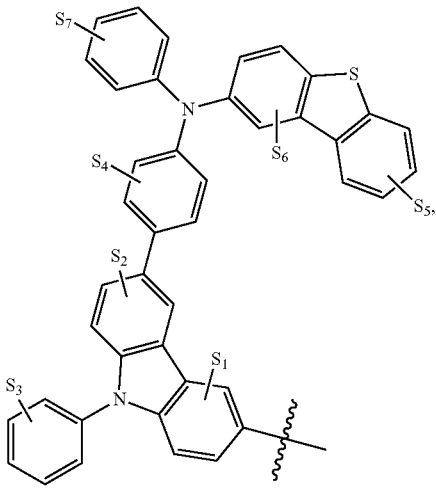

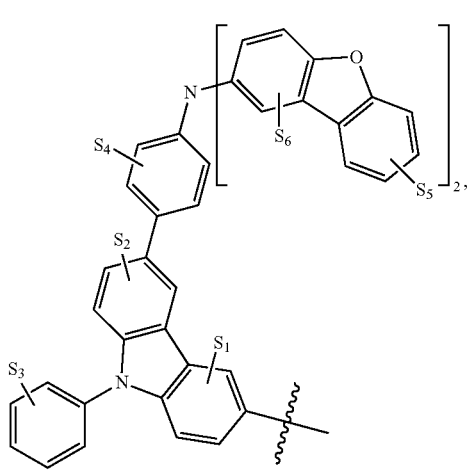
D105
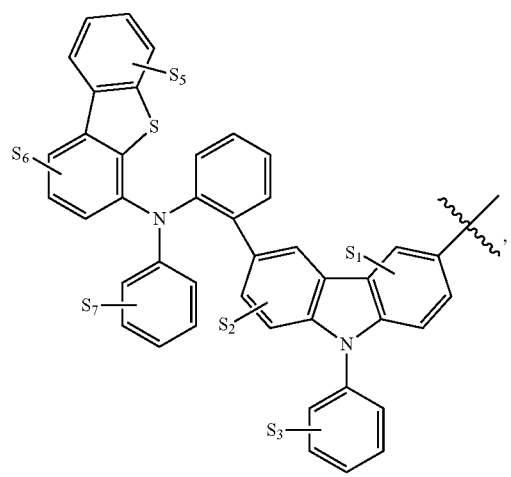
D108
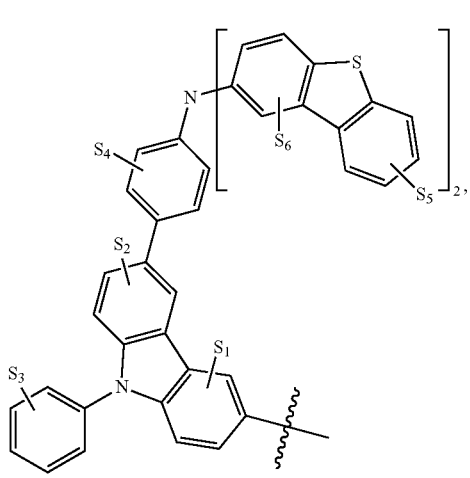
D106
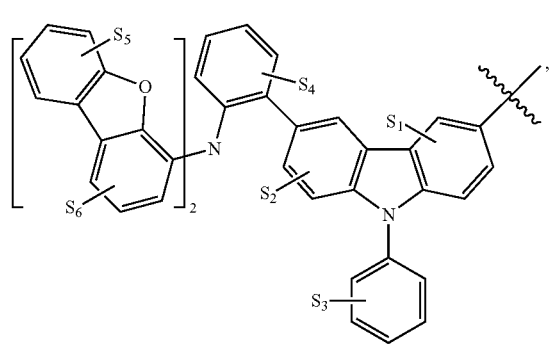
D109
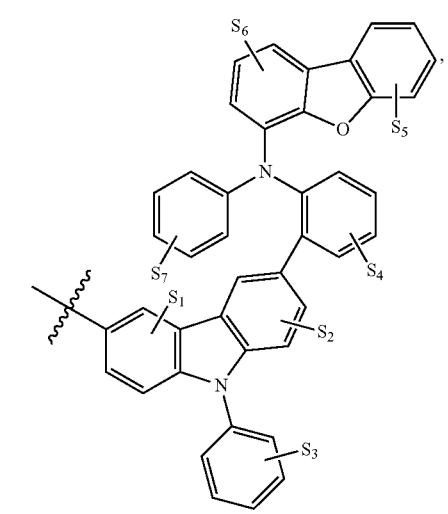
D107
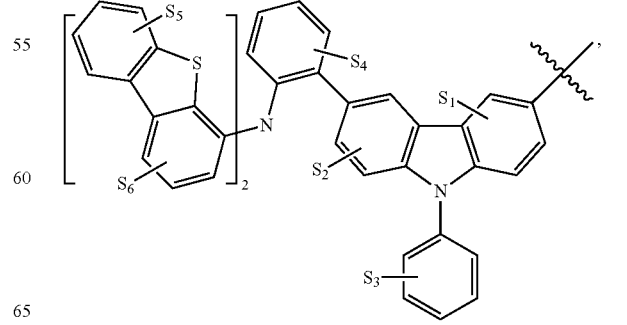
D110

D111
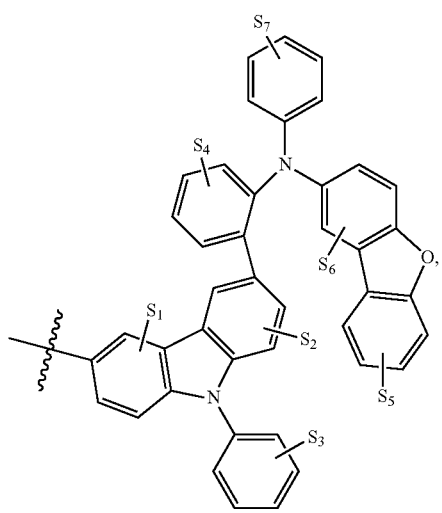
D112
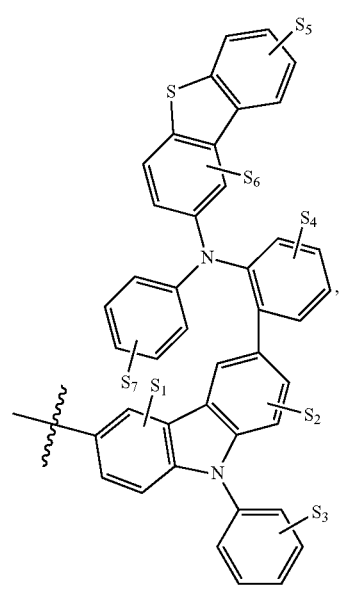
D113
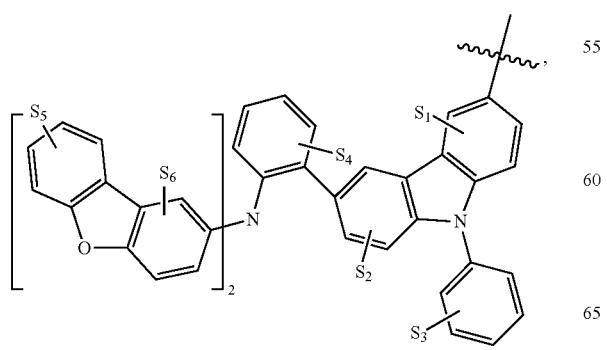
D114
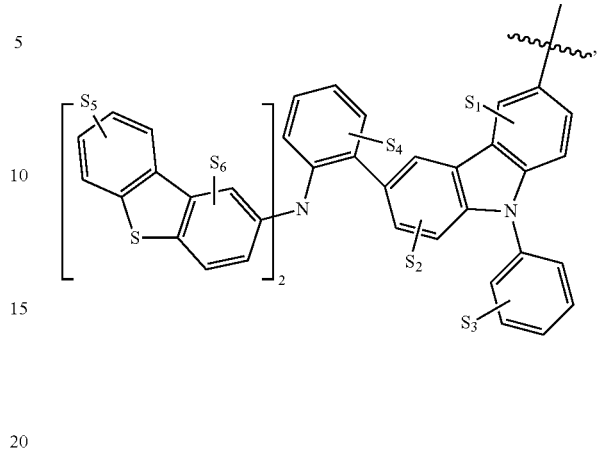
D115
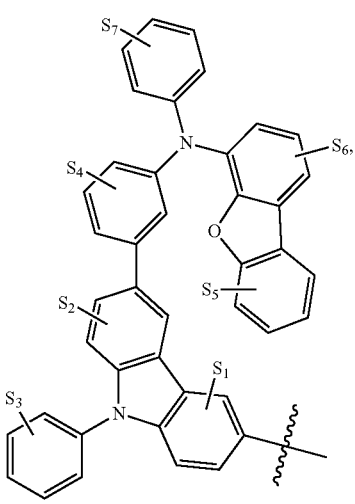
D116
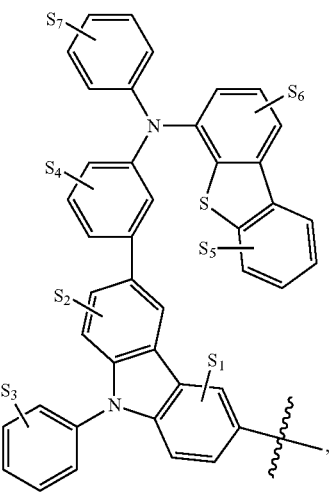

-continued
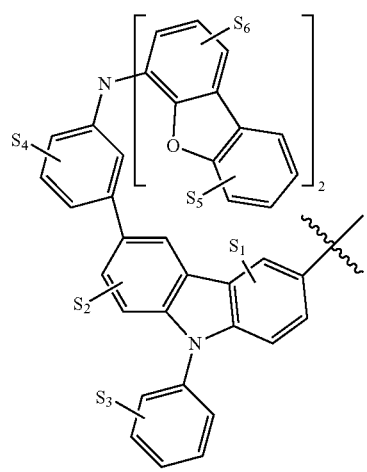
D117
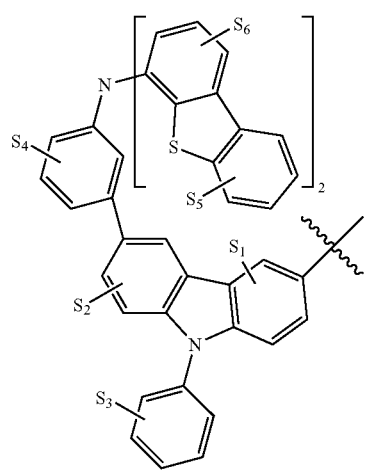
D118
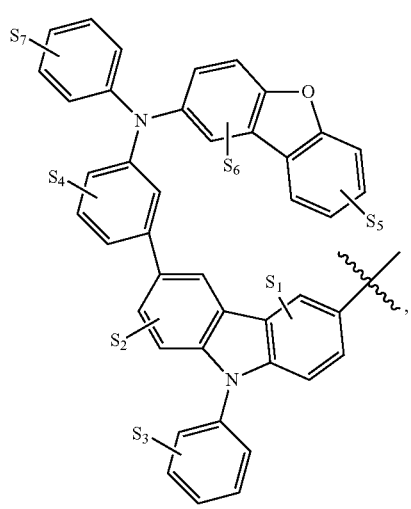
D119
-continued
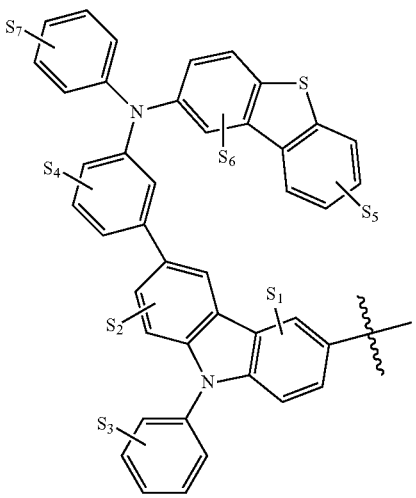
D120
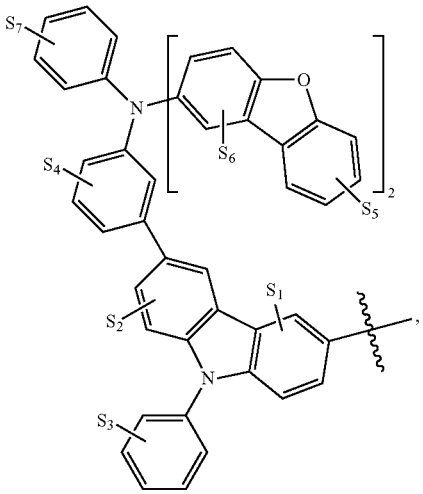
D121
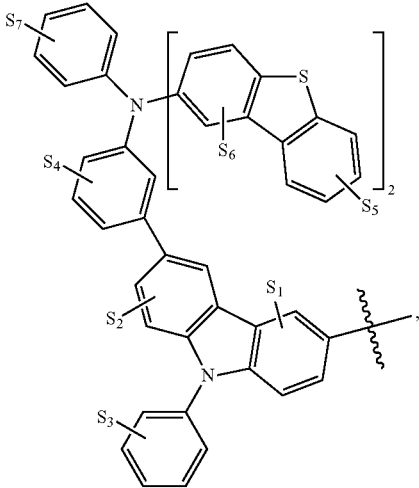
D122

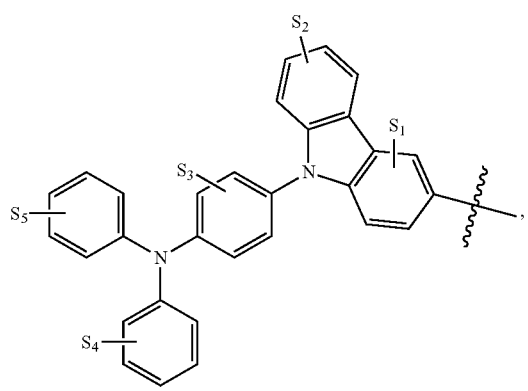
D123
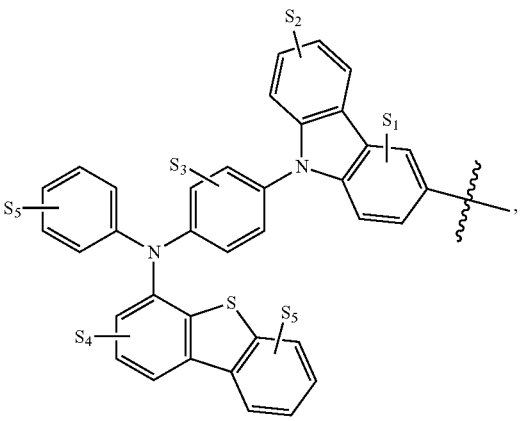
D126
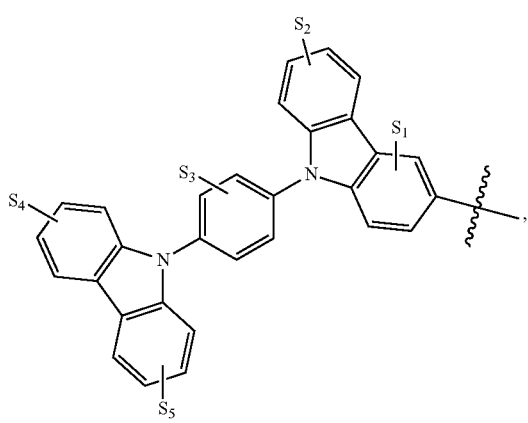
D124
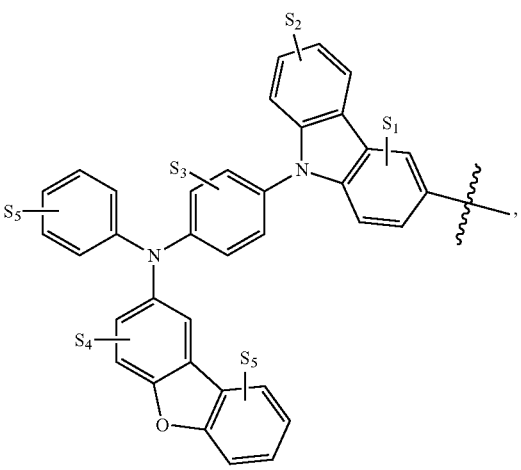
D127
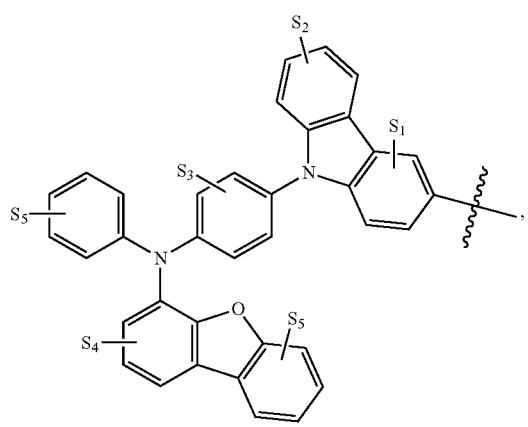
D125
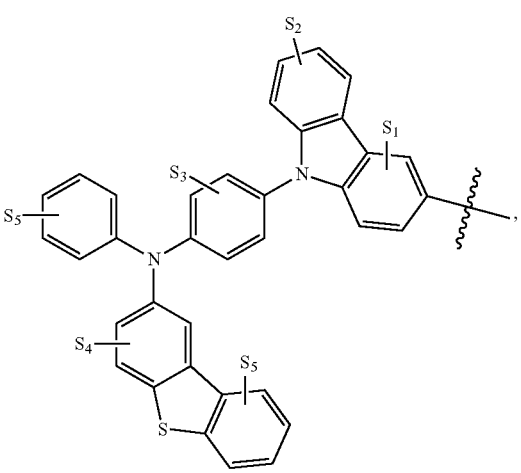
D128

-continued
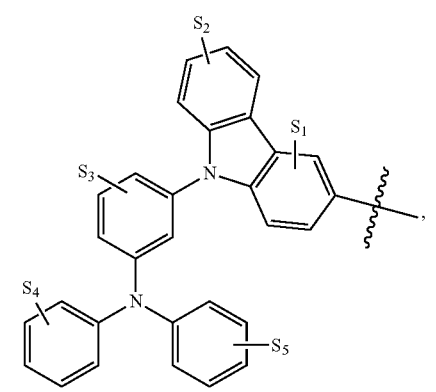
D129
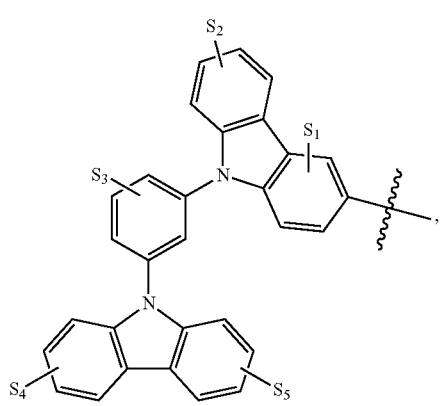
D130
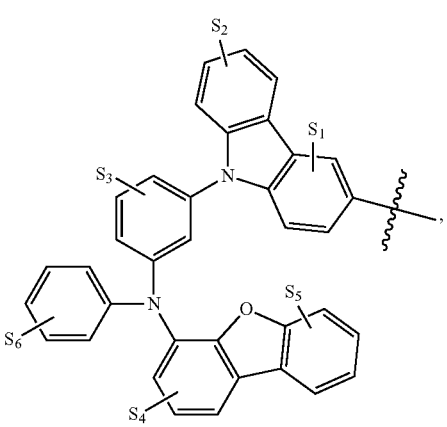
D131
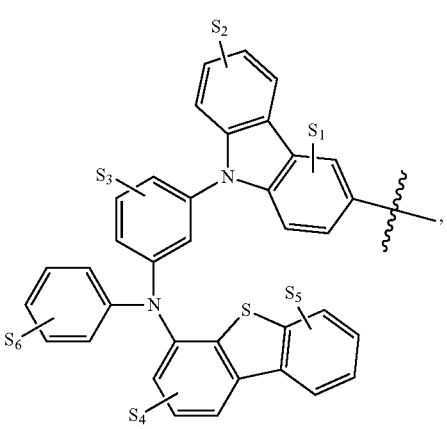
D132
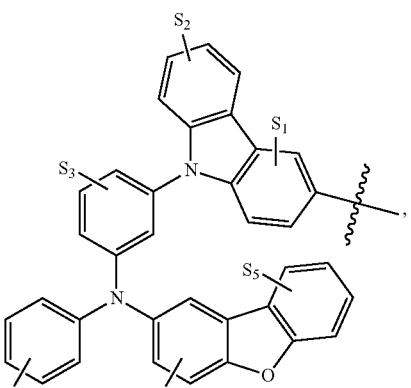
D133
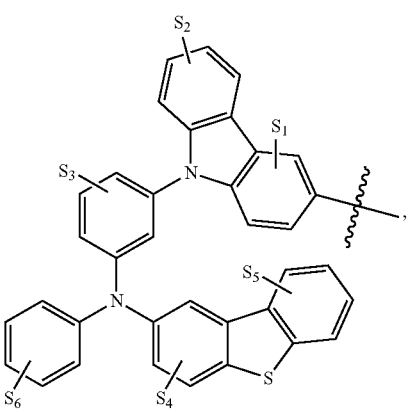
D134
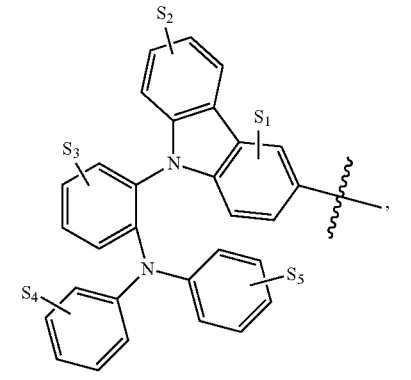
D135
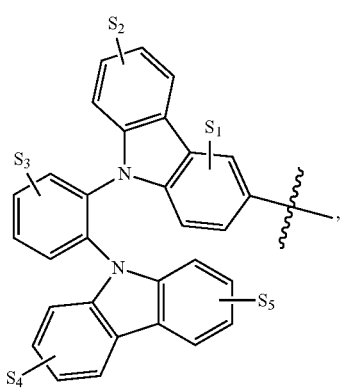
D136

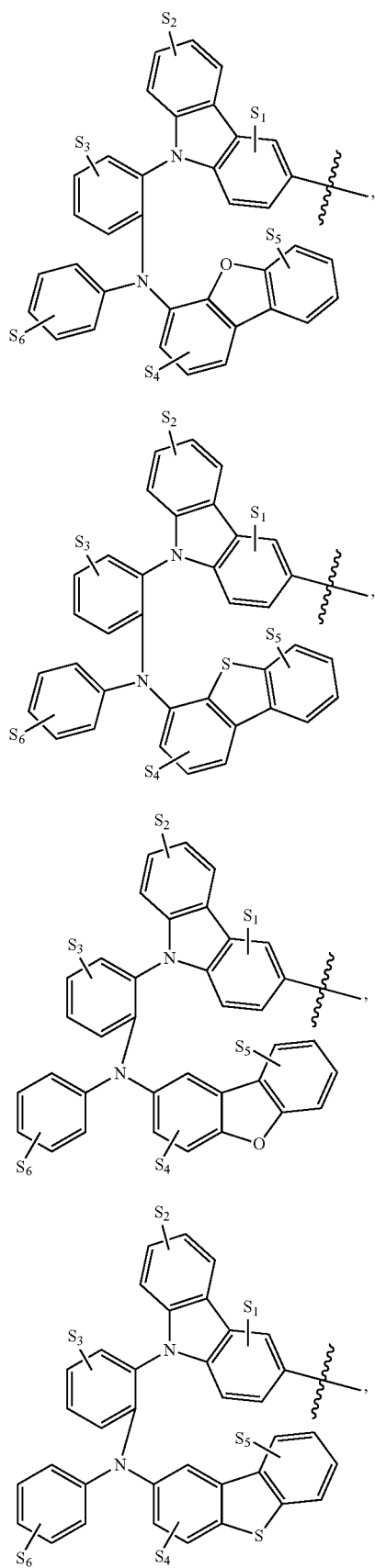

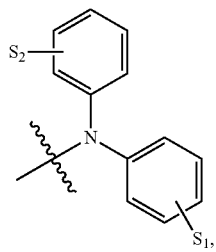

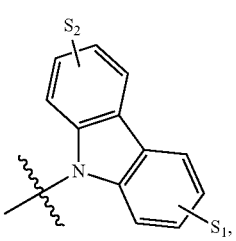

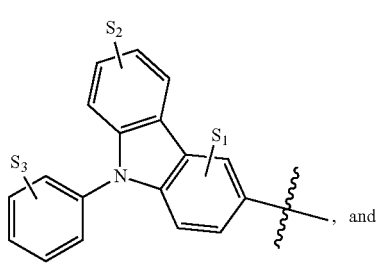

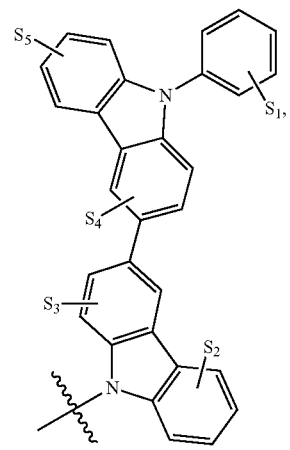

wherein $S_1$ to $S_7$ represent mono, di, tri, tetra or penta substitutions with hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one embodiment of the first device, the first emitting compound is selected from the group consisting of:
Compound O-10-10
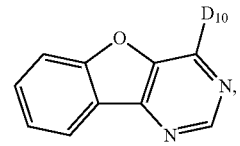
Compound S-10-10
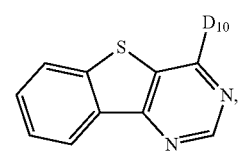
Compound Se-10-10
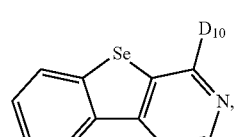
Compound O-13-10
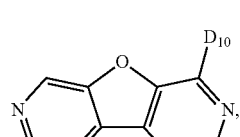
Compound S-13-10
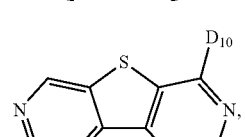
Compound Se-13-10
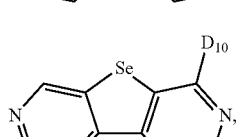
Compound O-10-54
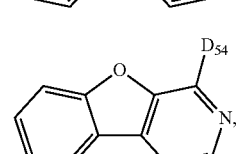
Compound S-10-54
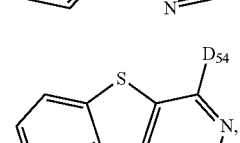
Compound Se-10-54
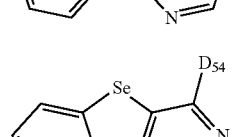
Compound O-13-54
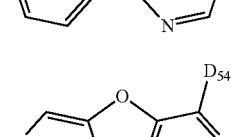
-continued
Compound S-13-54
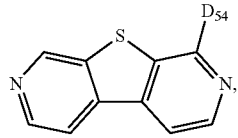
Compound Se-13-54
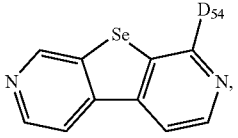
Compound O-10-55
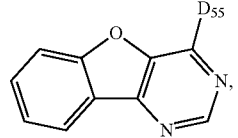
Compound S-10-55
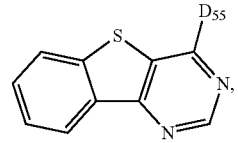
Compound Se-10-55
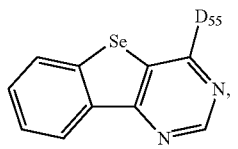
Compound O-10-56
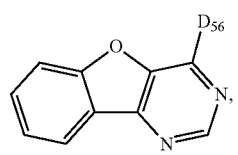
Compound S-10-56
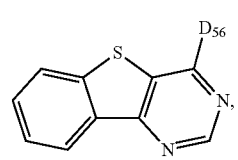
Compound Se-10-56
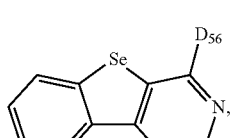
Compound O-13-56
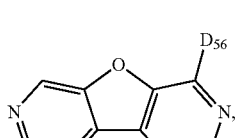
Compound S-13-56
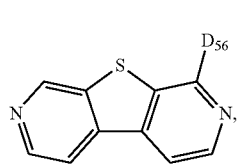

Compound Se-13-56
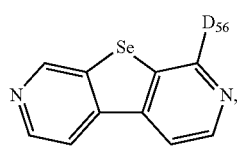
Compound O-10-57
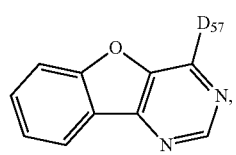
Compound S-10-57
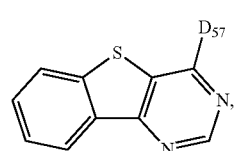
Compound Se-10-57
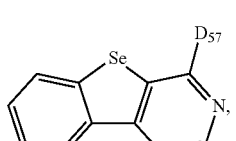
Compound O-13-57
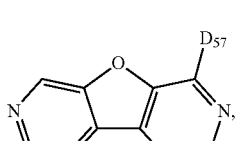
Compound S-13-57
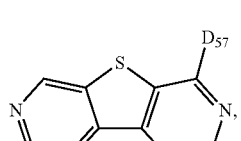
Compound Se-13-57
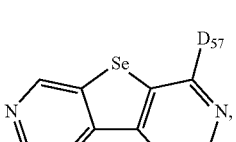
Compound O-10-58
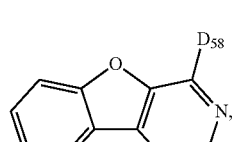
Compound S-10-58
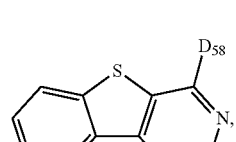
Compound Se-10-58
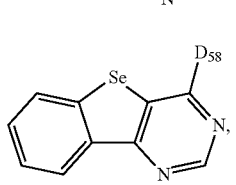
Compound O-13-58
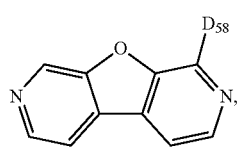
Compound S-13-58
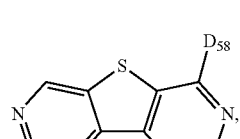
Compound Se-13-58
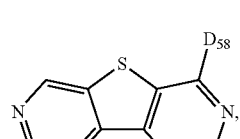
Compound O-10-59
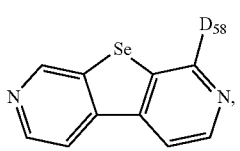
Compound S-10-59
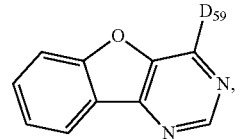
Compound Se-10-59
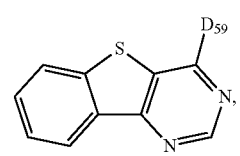
Compound O-13-59
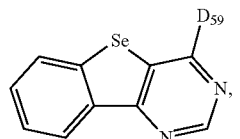
Compound S-13-59
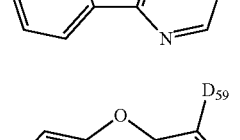
Compound Se-13-59
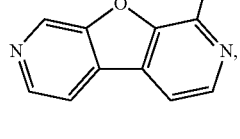
Compound O-10-60
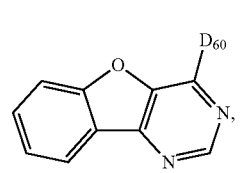

-continued
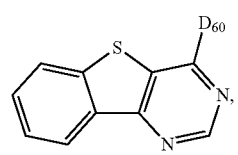
Compound S-10-60
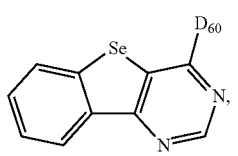
Compound Se-10-60
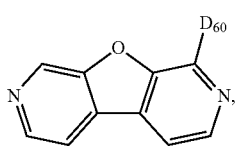
Compound O-13-60
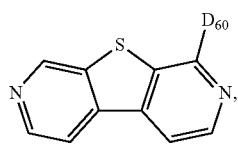
Compound S-13-60
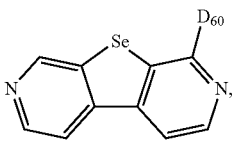
Compound Se-13-60
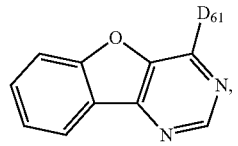
Compound O-10-61
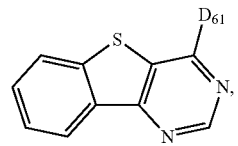
Compound S-10-61
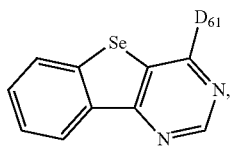
Compound Se-10-61
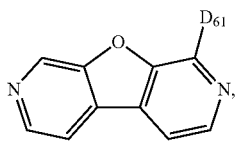
Compound O-13-61
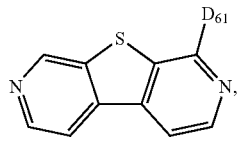
Compound S-13-61
-continued
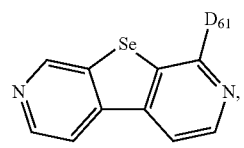
Compound Se-13-61
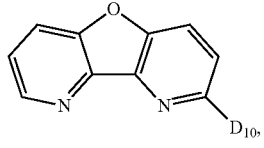
Compound O-17-10
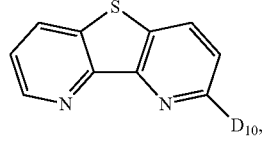
Compound S-17-10
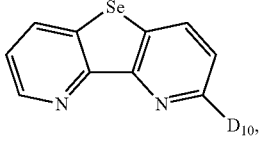
Compound Se-17-10
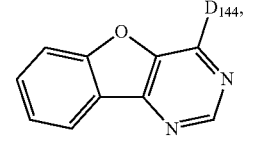
Compound O-10-144
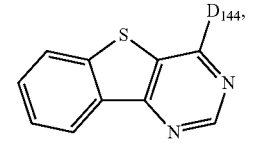
Compound S-10-144
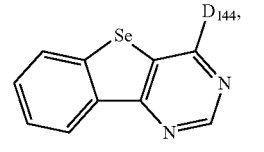
Compound Se-10-144
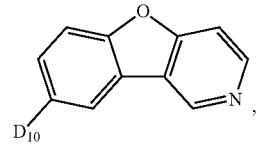
Compound O-20-10
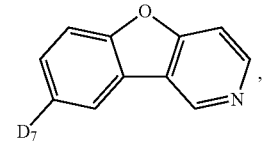
Compound O-20-7
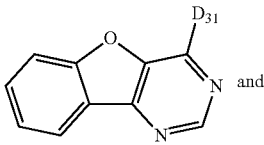
Compound O-10-31
and Compound O-10-70
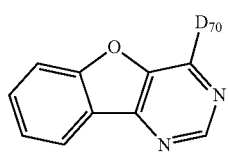
wherein in D7, D10, D31, D54, D55, D56, D57, D58, D59, D60, D61, D70 and D144 are
D7
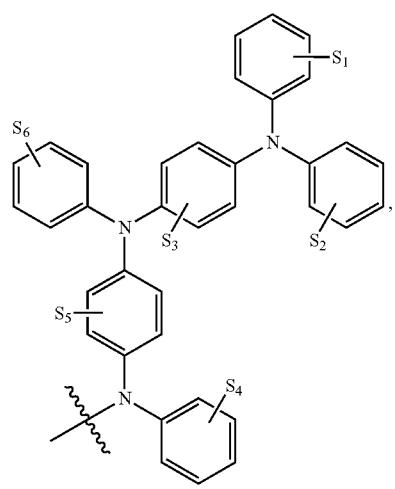
D10
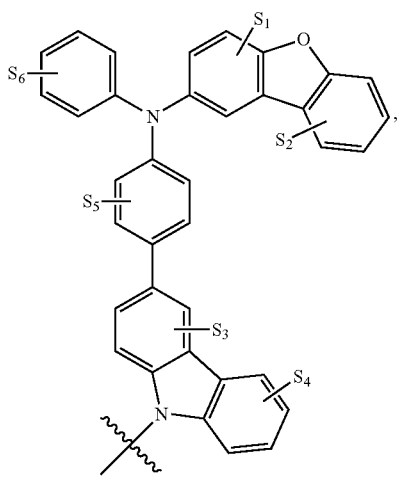
D31
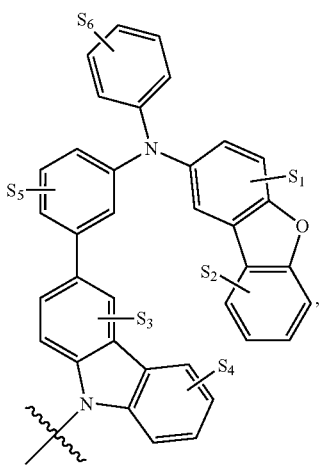
D54
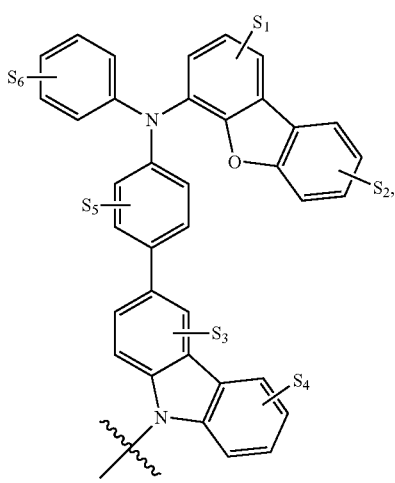
D55
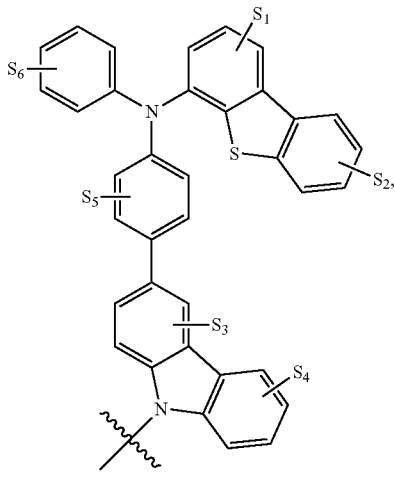

-continued
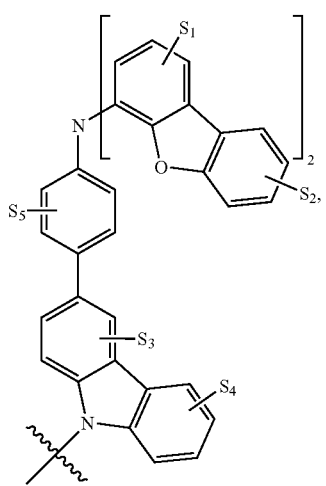
D56
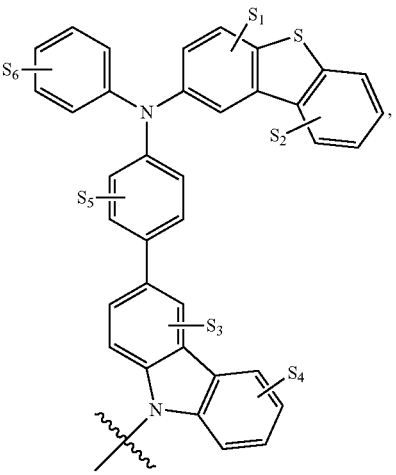
D59
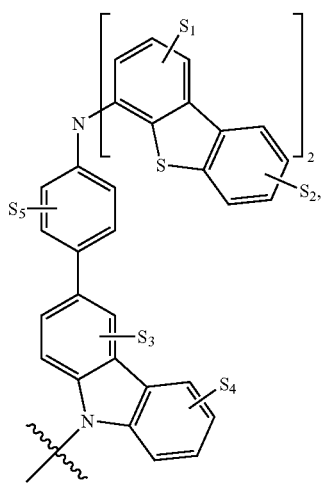
D57
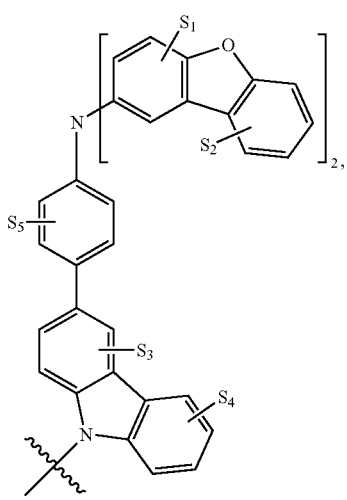
D60
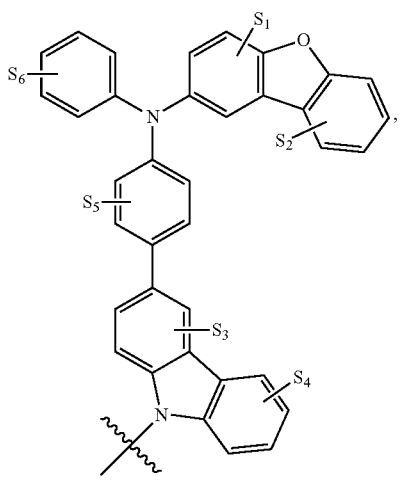
D58
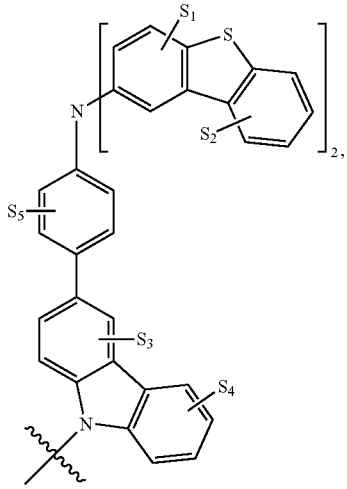
D61

D70

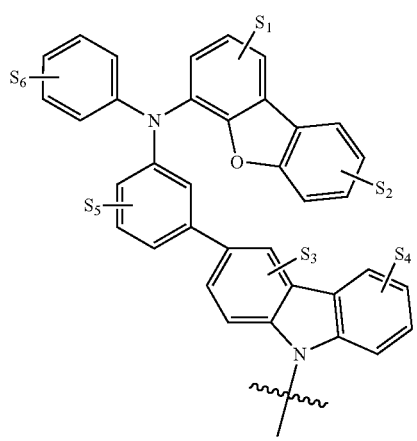

and

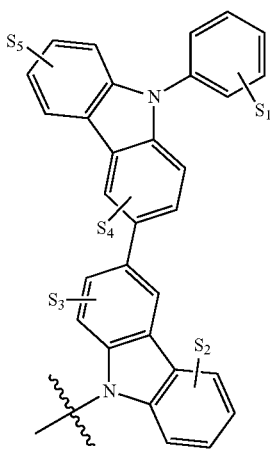

wherein $S_1$ to $S_6$ represent mono, di, tri, tetra or penta substitutions with hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof. In another embodiment of the first device, $S_1$ to $S_6$ are H. The resulting compounds are denoted as Compound No.-H. For example, Compound S-10-144-H is Compound S-10-144-H

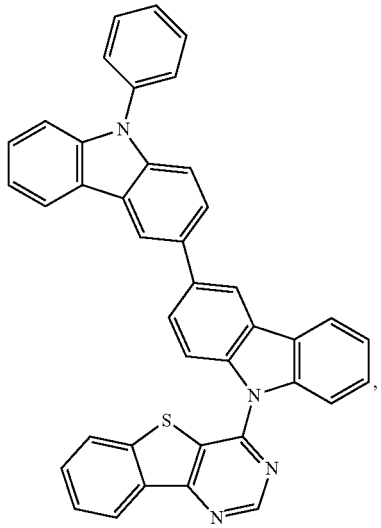

D144

The first device emits a luminescent radiation at room temperature when a voltage is applied across the organic light emitting device, wherein the luminescent radiation comprises a delayed fluorescence process. In the first device, the emissive layer can further comprise a first phosphorescent emitting material. In other embodiments, the emissive layer further comprises a second phosphorescent emitting material. The emissive layer further comprises a host material.

According to another aspect of the present disclosure, the first device comprises a second organic light emitting device, wherein the second organic light emitting device is stacked on the first organic light emitting device. The first device can be a consumer product. The first device can be an organic light-emitting device. The first device can be a lighting panel.

According to another embodiment of the first device, at least one of the R comprises a donor group with at least two electron-donating nitrogens.

In yet another aspect of the present disclosure, a formulation that includes a compound according to Formula 1 is described. The formulation can include one or more components selected from the group consisting of a solvent, a host, a hole injection material, hole transport material, an electron transport layer material (see below).

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

HIL/HTL:

A hole injecting/transporting material to be used in the present invention is not particularly limited, and any compound may be used as long as the compound is typically used as a hole injecting/transporting material. Examples of the material include, but not limit to: a phthalocyanine or porphryin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and sliane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to, the following general structures:

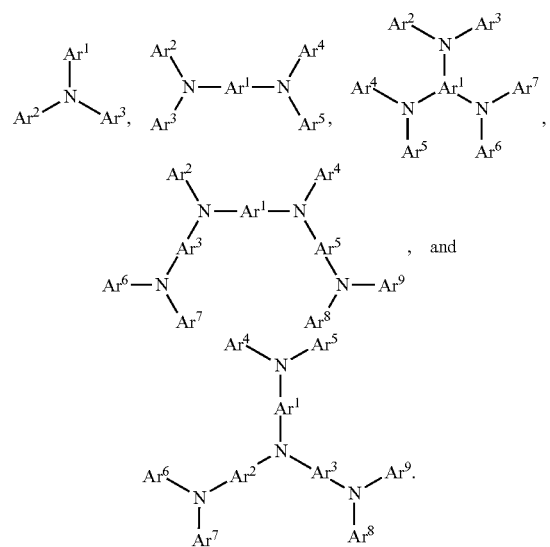

Each of $Ar^1$ to $Ar^9$ is selected from the group consisting aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Wherein each Ar is further substituted by a substituent selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, $Ar^1$ to $Ar^9$ is independently selected from the group consisting of:

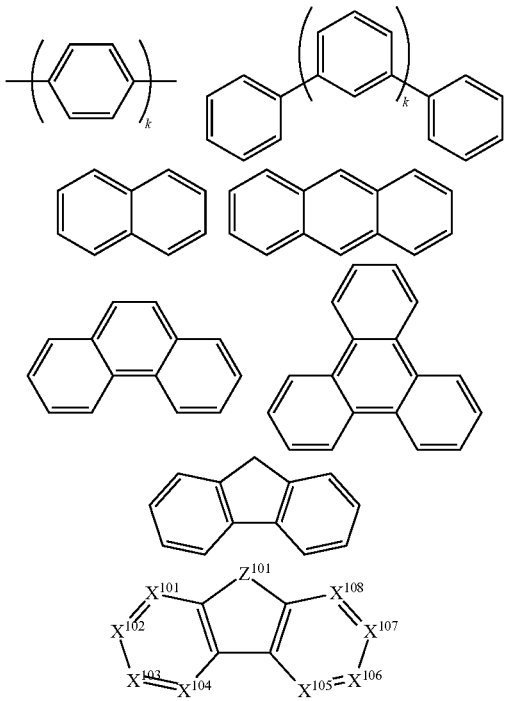

k is an integer from 1 to 20; $X^{101}$ to $X^{108}$ is C (including CH) or N; $Z^{101}$ is $NAr^1$, O, or S; $Ar^1$ has the same group defined above.

Examples of metal complexes used in HIL or HTL include, but not limit to the following general formula:

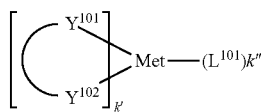

Met is a metal, which can have an atomic weight greater than 40; $(Y^{101}-Y^{102})$ is a bidentate ligand, $Y^{101}$ and $Y^{102}$ are independently selected from C, N, O, P, and S; $L^{101}$ is an ancillary ligand; k' is an integer value from 1 to the maximum number of ligands that may be attached to the metal; and k'+k" is the maximum number of ligands that may be attached to the metal.

In one aspect, $(Y^{101}-Y^{102})$ is a 2-phenylpyridine derivative. In another aspect, $(Y^{101}-Y^{102})$ is a carbene ligand. In another aspect, Met is selected from Ir, Pt, Os, and Zn. In a further aspect, the metal complex has a smallest oxidation potential in solution vs. Fc+/Fc couple less than about 0.6 V.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. While the Table below categorizes host materials as preferred for devices that emit various colors, any host material may be used with any dopant so long as the triplet criteria is satisfied.

Examples of metal complexes used as host are preferred to have the following general formula:

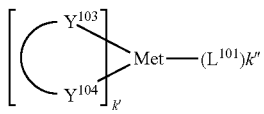

wherein Met is a metal; ($Y^{103}$-$Y^{104}$) is a bidentate ligand, $Y^{103}$ and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In one aspect, the metal complexes are:

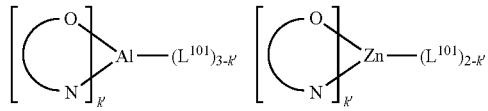

wherein (O—N) is a bidentate ligand, having metal coordinated to atoms O and N. In another aspect, Met is selected from Ir and Pt. In a further aspect, ($Y^{103}$-$Y^{104}$) is a carbene ligand.

Examples of organic compounds used as host are selected from the group consisting aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Wherein each group is further substituted by a substituent selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, host compound contains at least one of the following groups in the molecule:

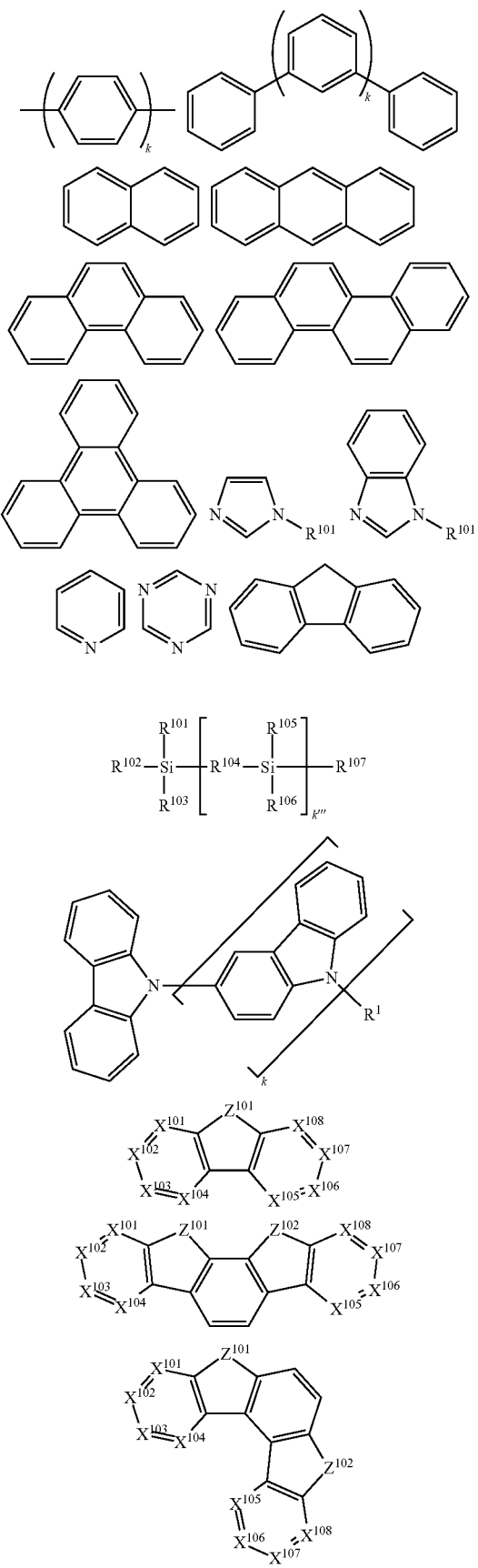

-continued

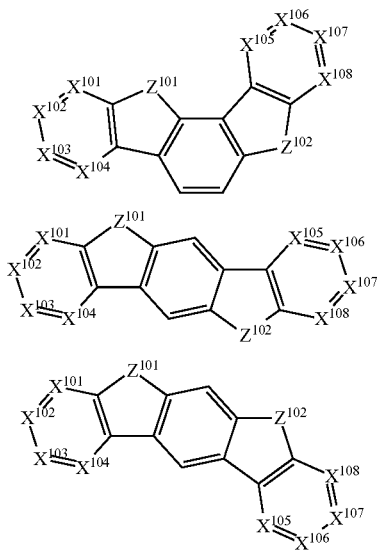

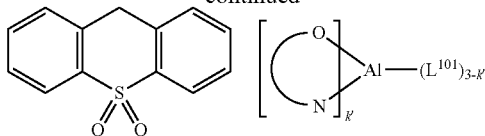

wherein k is an integer from 1 to 20; $L^{101}$ is an another ligand, k' is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

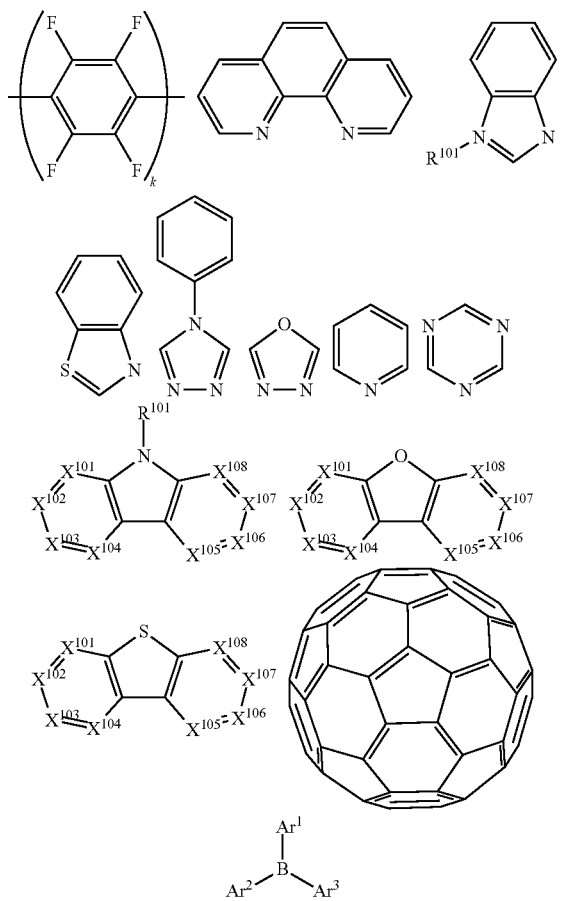

wherein $R^{101}$ to $R^{107}$ is independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above. k is an integer from 0 to 20 or 1 to 20; k''' is an integer from 0 to 20. $X^{101}$ to $X^{108}$ is selected from C (including CH) or N; and $Z^{101}$ and $Z^{102}$ is selected from $NR^{101}$, O, or S.

HBL:

A hole blocking layer (HBL) may be used to reduce the number of holes and/or excitons that leave the emissive layer. The presence of such a blocking layer in a device may result in substantially higher efficiencies as compared to a similar device lacking a blocking layer. Also, a blocking layer may be used to confine emission to a desired region of an OLED.

In one aspect, compound used in HBL contains the same molecule or the same functional groups used as host described above.

In another aspect, compound used in HBL contains at least one of the following groups in the molecule:

wherein $R^{101}$ is selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above. $Ar^1$ to $Ar^3$ has the similar definition as Ar's mentioned above. k is an integer from 1 to 20. $X^{101}$ to $X^{108}$ is selected from C (including CH) or N.

In another aspect, the metal complexes used in ETL contains, but not limit to the following general formula:

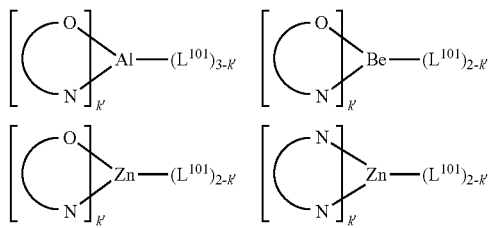

wherein (O—N) or (N—N) is a bidentate ligand, having metal coordinated to atoms O, N or N, N; $L^{101}$ is another ligand; k' is an integer value from 1 to the maximum number of ligands that may be attached to the metal.

In any above-mentioned compounds used in each layer of the OLED device, the hydrogen atoms can be partially or fully deuterated. Thus, any specifically listed substituent, such as, without limitation, methyl, phenyl, pyridyl, etc. encompasses undeuterated, partially deuterated, and fully deuterated versions thereof. Similarly, classes of substituents such as, without limitation, alkyl, aryl, cycloalkyl, heteroaryl, etc. also encompass undeuterated, partially deuterated, and fully deuterated versions thereof.

In addition to and/or in combination with the materials disclosed herein, many hole injection materials, hole transporting materials, host materials, dopant materials, exiton/hole blocking layer materials, electron transporting and electron injecting materials may be used in an OLED. Non-limiting examples of the materials that may be used in an OLED in combination with materials disclosed herein are listed in Table 1 below. Table 1 lists non-limiting classes of materials, non-limiting examples of compounds for each class, and references that disclose the materials.

TABLE 1

| MATERIAL | EXAMPLES OF MATERIAL | PUBLICATIONS |
|---|---|---|
| | Hole injection materials | |
| Phthalocyanine and porphryin compounds | 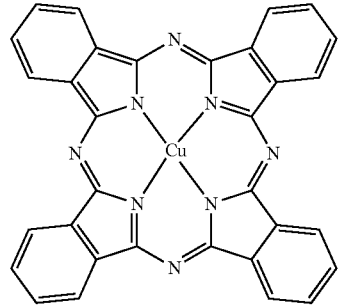 | Appl. Phys. Lett. 69, 2160 (1996) |
| Starburst triarylamines | 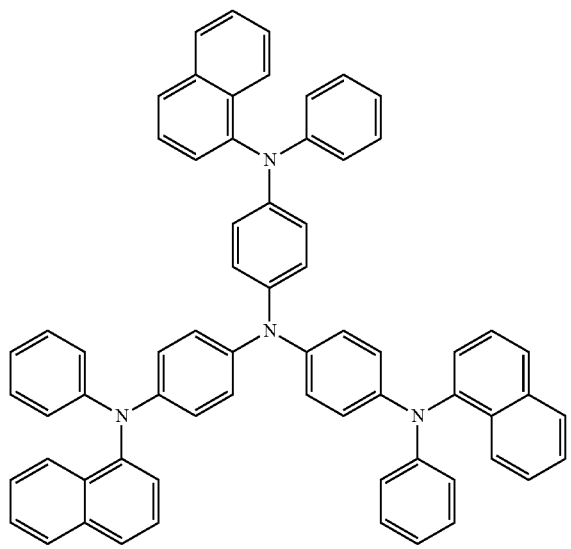 [SMILES: c1ccc(N(c2ccc(N(c3ccc(N(c4ccccc4)c4cccc5ccccc45)cc3)c3ccc(N(c4ccccc4)c4cccc5ccccc45)cc3)cc2)c2cccc3ccccc23)cc1] | J. Lumin. 72-74, 985 (1997) |
| $CF_x$ Fluorohydrocarbon polymer | $-[CH_xF_y]_n-$ | Appl. Phys. Lett. 78, 673 (2001) |

TABLE 1-continued
Hole injection materials
| MATERIAL | EXAMPLES OF MATERIAL | PUBLICATIONS |
|---|---|---|
| Conducting polymers (e.g., PEDOT:PSS, polyaniline, polypthiophene) | 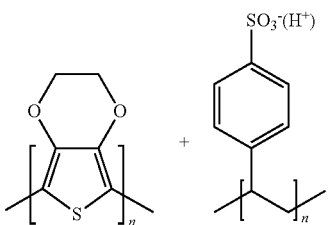 | Synth. Met. 87, 171 (1997) WO2007002683 |
| Phosphonic acid and sliane SAMs | 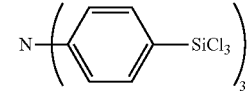 | US20030162053 |
| Triarylamine or polythiophene polymers with conductivity dopants | 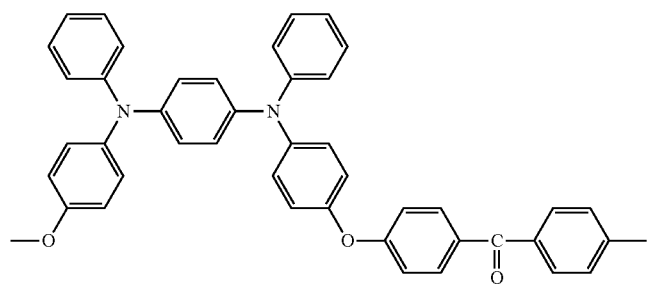<br>and<br>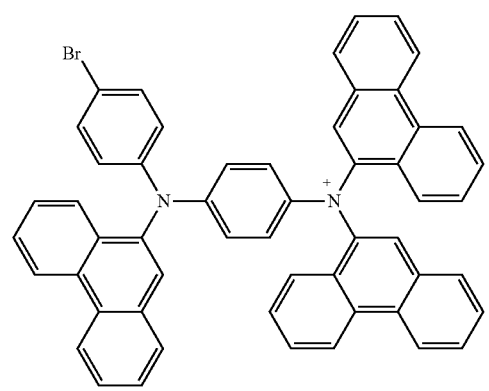 [SMILES: Brc1ccc(N(c2ccc(N(c3cc4ccccc4c4ccccc34)c3cc4ccccc4c4ccccc34)cc2)c2cc3ccccc3c3ccccc23)cc1] | EP1725079A1 |

TABLE 1-continued

| MATERIAL | EXAMPLES OF MATERIAL | PUBLICATIONS |
|---|---|---|
| | Hole injection materials | |
| Organic compounds with conductive inorganic compounds, such as molybdenum and tungsten oxides | 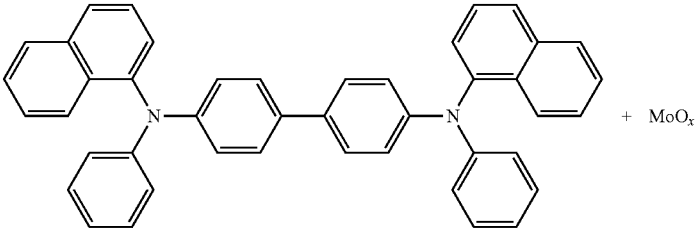 [SMILES: c1ccc(N(c2ccc(-c3ccc(N(c4ccccc4)c4cccc5ccccc45)cc3)cc2)c2cccc3ccccc23)cc1] | US20050123751<br>SID Symposium Digest, 37, 923 (2006)<br>WO2009018009 |
| n-type semiconducting organic complexes | 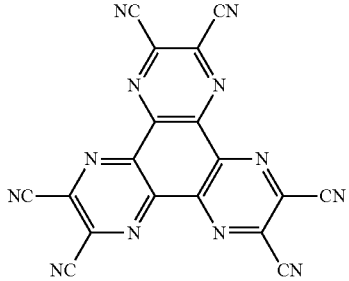 [SMILES: N#Cc1nc2c3nc(C#N)c(C#N)nc3c3nc(C#N)c(C#N)nc3c2nc1C#N] | US20020158242 |
| Metal organometallic complexes | | US20060240279 |
| Cross-linkable compounds | | US20080220265 |
| Polythiophene based polymers and copolymers | 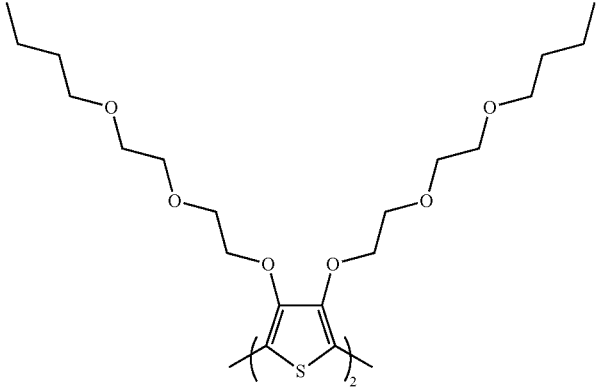 | WO 2011075644<br>EP2350216 |
| Hole transporting materials | | |
| Triarylamines (e.g., TPD, α-NPD) | 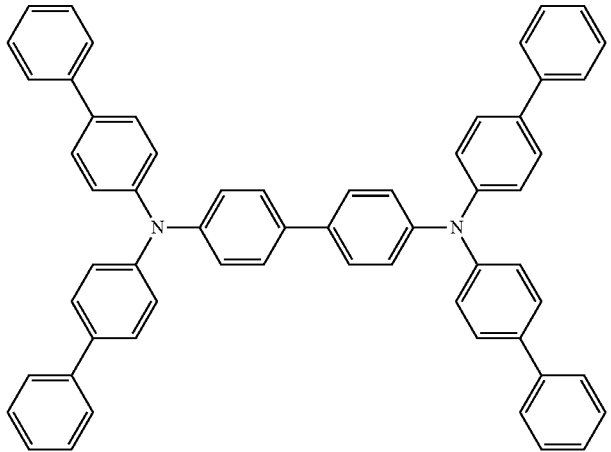 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1] | Appl. Phys. Lett. 51, 913 (1987)<br>U.S. Pat. No. 5,061,569<br>EP650955 |

115
116
TABLE 1-continued
| MATERIAL | EXAMPLES OF MATERIAL Hole injection materials | PUBLICATIONS |
|---|---|---|
| | 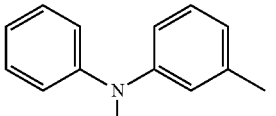 | J. Mater. Chem. 3, 319 (1993) |
| | 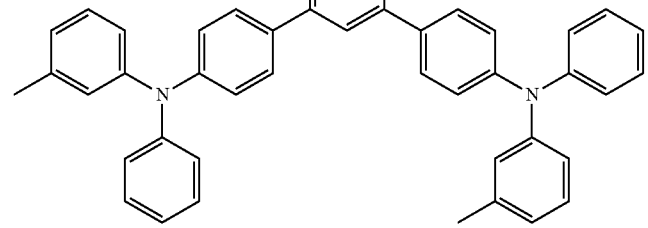 | Appl. Phys. Lett. 90, 183503 (2007) |
| | 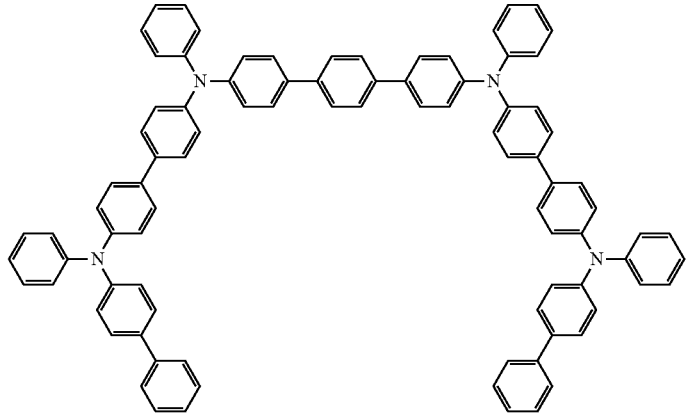 [SMILES: c1ccc(-c2ccc(N(c3ccccc3)c3ccc(-c4ccc(N(c5ccccc5)c5ccc(-c6ccc(-c7ccc(N(c8ccccc8)c8ccc(-c9ccc(N(c%10ccccc%10)c%10ccc(-c%11ccccc%11)cc%10)cc9)cc8)cc7)cc6)cc5)cc4)cc3)cc2)cc1] | Appl. Phys. Lett. 90, 183503 (2007) |
| Triaylamine on spirofluorene core | 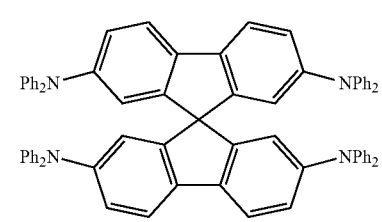 | Synth. Met. 91, 209 (1997) |

TABLE 1-continued
| MATERIAL | EXAMPLES OF MATERIAL Hole injection materials | PUBLICATIONS |
| --- | --- | --- |
| Arylamine carbazole compounds | 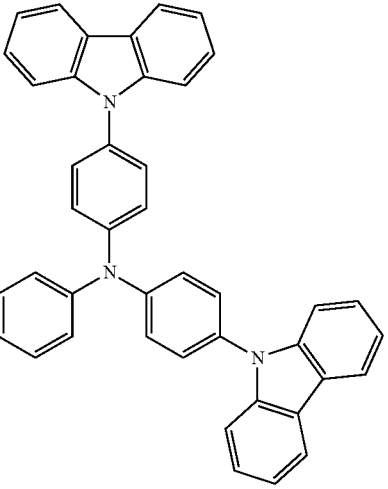 | Adv. Mater. 6, 677 (1994), US20080124572 |
| Triarylamine with (di)benzothiophene/ (di)benzofuran | 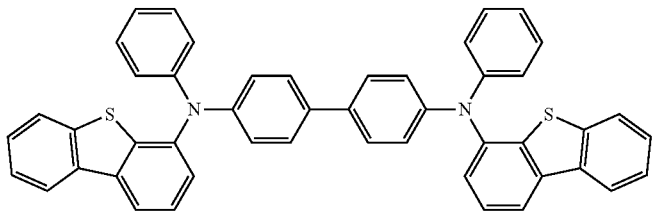 [SMILES: c1ccc(N(c2ccc(-c3ccc(N(c4ccccc4)c4cccc5c4sc4ccccc45)cc3)cc2)c2cccc3c2sc2ccccc23)cc1] | US20070278938, US20080106190 US20110163302 |
| Indolocarbazoles | 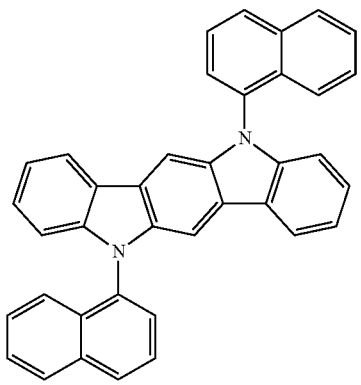 [SMILES: c1ccc2c(-n3c4ccccc4c4cc5c(cc43)c3ccccc3n5-c3cccc4ccccc34)cccc2c1] | Synth. Met. 111, 421 (2000) |
| Isoindole compounds | 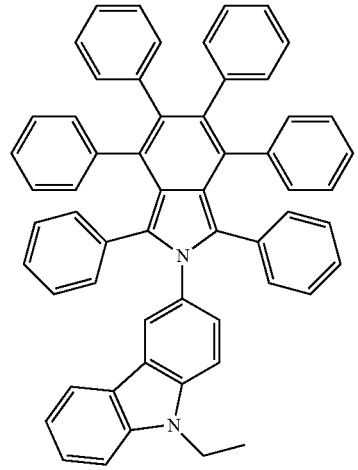 [SMILES: CCn1c2ccccc2c2cc(-n3c(-c4ccccc4)c4c(-c5ccccc5)c(-c5ccccc5)c(-c5ccccc5)c(-c5ccccc5)c4c3-c3ccccc3)ccc21] | Chem. Mater. 15, 3148 (2003) |

TABLE 1-continued

| MATERIAL | EXAMPLES OF MATERIAL Hole injection materials | PUBLICATIONS |
|---|---|---|
| Metal carbene complexes | | US20080018221 |
| Phosphorescent OLED host materials Red hosts | | |
| Arylcarbazoles | | Appl. Phys. Lett. 78, 1622 (2001) |
| Metal 8-hydroxyquinolates (e.g., Alq$_3$, BAlq) | | Nature 395, 151 (1998) |
| | | US20060202194 |
| | | WO2005014551 |
| | | WO2006072002 |

TABLE 1-continued

| MATERIAL | EXAMPLES OF MATERIAL | PUBLICATIONS |
|---|---|---|
| | Hole injection materials | |
| Metal phenoxybenzothiazole compounds | | Appl. Phys. Lett. 90, 123509 (2007) |
| Conjugated oligomers and polymers (e.g., polyfluorene) | | Org. Electron. 1, 15 (2000) |
| Aromatic fused rings | | WO2009066779, WO2009066778, WO2009063833, US20090045731, US20090045730, WO2009008311, US20090008605, US20090009065 |
| Zinc complexes | | WO2010056066 |
| Chrysene based compounds | | WO2011086863 |
| Green hosts | | |
| Arylcarbazoles | | Appl. Phys. Lett. 78, 1622 (2001) |

TABLE 1-continued
| MATERIAL | EXAMPLES OF MATERIAL | PUBLICATIONS |
|---|---|---|
| | Hole injection materials | |
| | 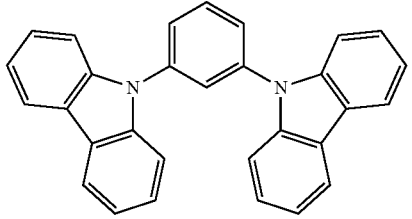 [SMILES: c1cc(-n2c3ccccc3c3ccccc32)cc(-n2c3ccccc3c3ccccc32)c1] | US20030175553 |
| | 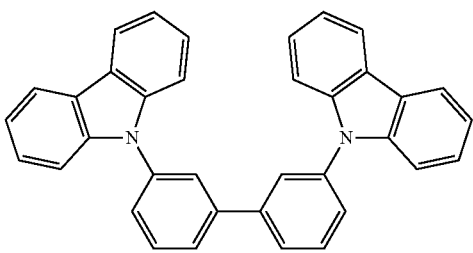 [SMILES: c1cc(-c2cccc(-n3c4ccccc4c4ccccc43)c2)cc(-n2c3ccccc3c3ccccc32)c1] | WO2001039234 |
| Aryltriphenylene compounds | 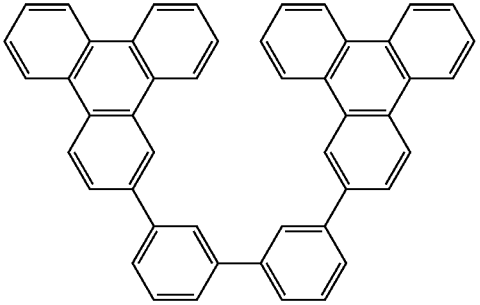 [SMILES: c1cc(-c2cccc(-c3ccc4c5ccccc5c5ccccc5c4c3)c2)cc(-c2ccc3c4ccccc4c4ccccc4c3c2)c1] | US20060280965 |
| | 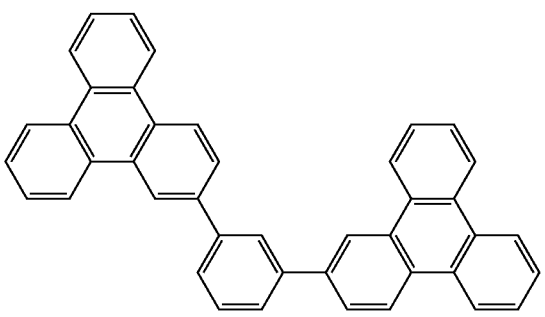 [SMILES: c1cc(-c2ccc3c4ccccc4c4ccccc4c3c2)cc(-c2ccc3c4ccccc4c4ccccc4c3c2)c1] | US20060280965 |
| | 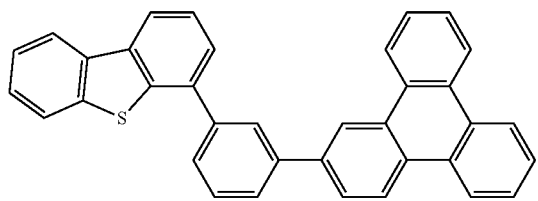 [SMILES: c1cc(-c2ccc3c4ccccc4c4ccccc4c3c2)cc(-c2cccc3c2sc2ccccc23)c1] | WO2009021126 |

TABLE 1-continued

| MATERIAL | EXAMPLES OF MATERIAL | PUBLICATIONS |
| --- | --- | --- |
| | Hole injection materials | |
| Poly-fused heteroaryl compounds | | US20090309488<br>US20090302743<br>US20100012931 |
| Donor acceptor type molecules | | WO2008056746 |
| | | WO2010107244 |
| Aza-carbazole/DBT/DBF | | JP2008074939 |

TABLE 1-continued
| MATERIAL | EXAMPLES OF MATERIAL<br>Hole injection materials | PUBLICATIONS |
|---|---|---|
| | 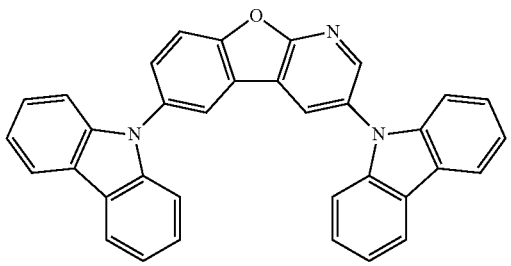 [SMILES: c1ccc2c(c1)c1ccccc1n2-c1ccc2oc3ncc(-n4c5ccccc5c5ccccc54)cc3c2c1] | US20100187984 |
| Polymers (e.g., PVK) | 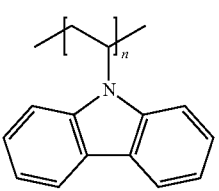 | Appl. Phys. Lett. 77, 2280 (2000) |
| Spirofluorene compounds | 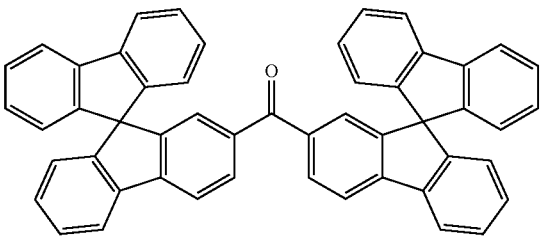 [SMILES: O=C(c1ccc2c(c1)C1(c3ccccc3-c3ccccc31)c1ccccc1-2)c1ccc2c(c1)C1(c3ccccc3-c3ccccc31)c1ccccc1-2] | WO2004093207 |
| Metal phenoxybenzooxazole compounds | 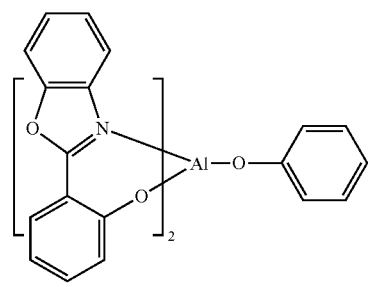 | WO2005089025 |
| | 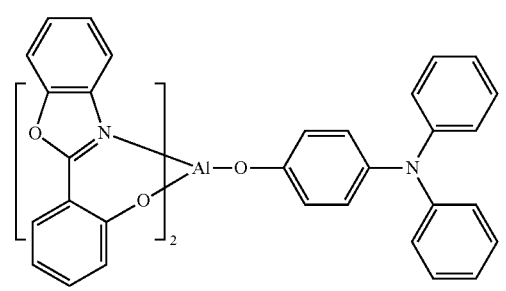 | WO2006132173 |
| | 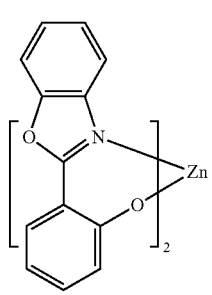 | JP200511610 |

TABLE 1-continued

| MATERIAL | EXAMPLES OF MATERIAL Hole injection materials | PUBLICATIONS |
|---|---|---|
| Spirofluorene-carbazole compounds | | JP2007254297 |
| | | JP2007254297 |
| Indolocabazoles | | WO2007063796 |
| | | WO2007063754 |
| 5-member ring electron deficient heterocycles (e.g., triazole, oxadiazole) | | J. Appl. Phys. 90, 5048 (2001) |

TABLE 1-continued
| MATERIAL | EXAMPLES OF MATERIAL | PUBLICATIONS |
|---|---|---|
| | Hole injection materials | |
| | 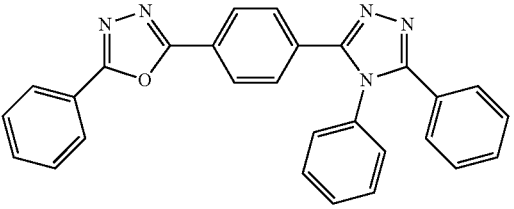 [SMILES: c1ccc(-c2nnc(-c3ccc(-c4nnc(-c5ccccc5)n4-c4ccccc4)cc3)o2)cc1] | WO2004107822 |
| Tetraphenylene complexes | 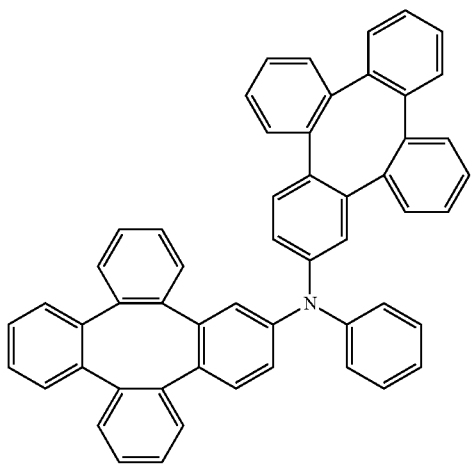 [SMILES: c1ccc(N(c2ccc3c(c2)-c2ccccc2-c2ccccc2-c2ccccc2-3)c2ccc3c(c2)-c2ccccc2-c2ccccc2-c2ccccc2-3)cc1] | US20050112407 |
| Metal phenoxypyridine compounds | 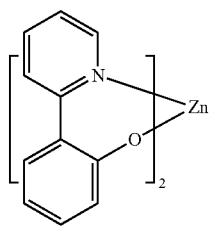 | WO2005030900 |
| Metal coordination complexes (e.g., Zn, Al with N^N ligands) | 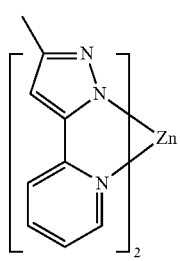 | US20040137268, US20040137267 |
| Blue hosts | | |
| Arylcarbazoles | 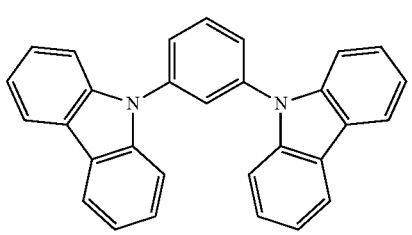 [SMILES: c1cc(-n2c3ccccc3c3ccccc32)cc(-n2c3ccccc3c3ccccc32)c1] | Appl. Phys. Lett, 82, 2422 (2003) |

TABLE 1-continued

| MATERIAL | EXAMPLES OF MATERIAL<br>Hole injection materials | PUBLICATIONS |
|---|---|---|
| | | US20070190359 |
| Dibenzothiophene/<br>Dibenzofuran-carbazole<br>compounds | | WO2006114966,<br>US20090167162 |
| | | US20090167162 |
| | | WO2009086028 |
| | | US20090030202,<br>US20090017330 |
| | | US20100084966 |

TABLE 1-continued
| MATERIAL | EXAMPLES OF MATERIAL Hole injection materials | PUBLICATIONS |
|---|---|---|
| Silicon aryl compounds | 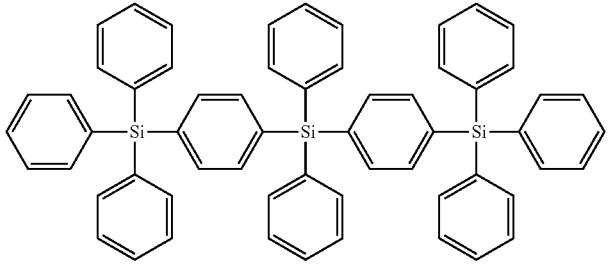 [SMILES: c1ccc([Si](c2ccccc2)(c2ccccc2)c2ccc([Si](c3ccccc3)(c3ccccc3)c3ccc([Si](c4ccccc4)(c4ccccc4)c4ccccc4)cc3)cc2)cc1] | US20050238919 |
|  | 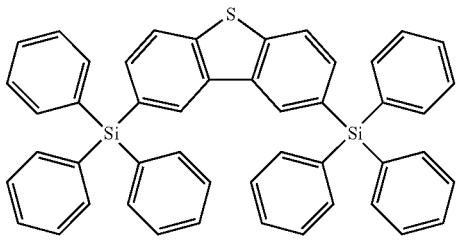 [SMILES: c1ccc([Si](c2ccccc2)(c2ccccc2)c2ccc3sc4ccc([Si](c5ccccc5)(c5ccccc5)c5ccccc5)cc4c3c2)cc1] | WO2009003898 |
| Silicon/Germanium aryl compounds | 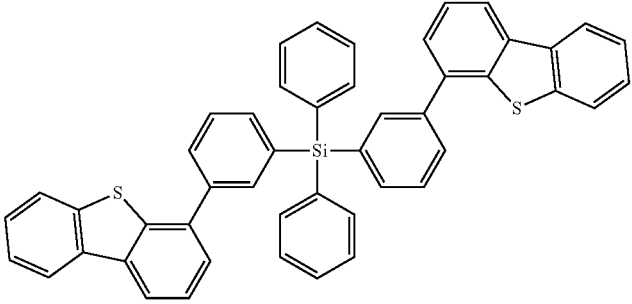 [SMILES: c1ccc([Si](c2ccccc2)(c2cccc(-c3cccc4c3sc3ccccc34)c2)c2cccc(-c3cccc4c3sc3ccccc34)c2)cc1] | EP2034538A |
| Aryl benzoyl ester | 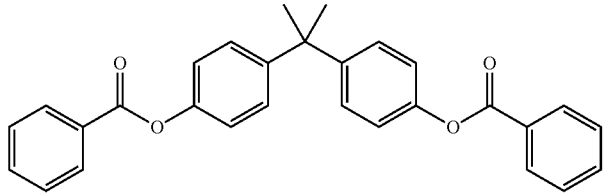 [SMILES: CC(C)(c1ccc(OC(=O)c2ccccc2)cc1)c1ccc(OC(=O)c2ccccc2)cc1] | WO2006100298 |
| Carbazole linked by non-conjugated groups | 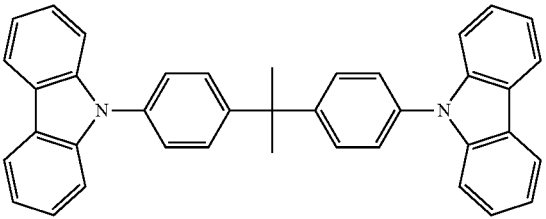 [SMILES: CC(C)(c1ccc(-n2c3ccccc3c3ccccc32)cc1)c1ccc(-n2c3ccccc3c3ccccc32)cc1] | US20040115476 |
| Aza-carbazoles | 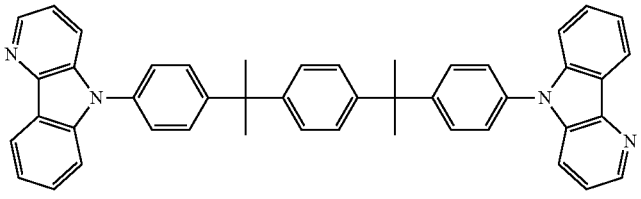 [SMILES: CC(C)(c1ccc(-n2c3ccccc3c3ncccc32)cc1)c1ccc(C(C)(C)c2ccc(-n3c4ccccc4c4ncccc43)cc2)cc1] | US20060121308 |

TABLE 1-continued
| MATERIAL | EXAMPLES OF MATERIAL<br>Hole injection materials | PUBLICATIONS |
|---|---|---|
| High triplet metal organometallic complex | 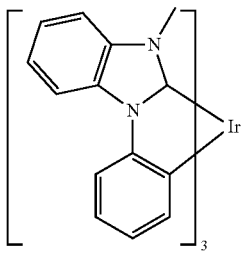 | U.S. Pat. No. 7,154,114 |
| Phosphorescent dopants<br>Red depants | | |
| Heavy metal porphyrins (e.g., PtOEP) | 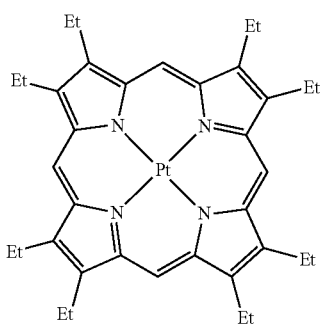 | Nature 395, 151 (1998) |
| Iridium(III) organometallic complexes | 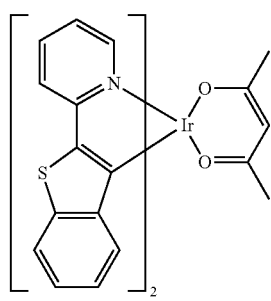 | Appl. Phys. Lett. 78, 1622 (2001) |
| | 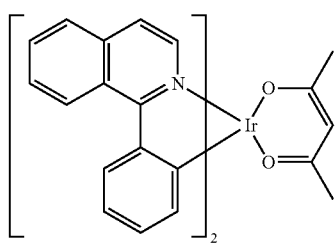 | US2006835469 |
| | 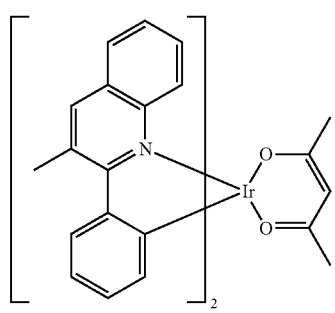 | US2006835469 |

TABLE 1-continued

| MATERIAL | EXAMPLES OF MATERIAL | PUBLICATIONS |
|---|---|---|
| | Hole injection materials | |
| | | US20060202194 |
| | | US20060202194 |
| | | US20070087321 |
| | | US20080261076<br>US20100090591 |
| | | US20070087321 |

TABLE 1-continued

| MATERIAL | EXAMPLES OF MATERIAL | PUBLICATIONS |
|---|---|---|
| | Hole injection materials | |
| | | Adv. Mater. 19, 739 (2007) |
| | | WO2009100991 |
| | | WO2008101842 |
| | | U.S. Pat. No. 7,232,618 |
| Platinum(II) organometallic complexes | | WO2003040257 |

TABLE 1-continued
| MATERIAL | EXAMPLES OF MATERIAL | PUBLICATIONS |
|---|---|---|
| | Hole injection materials | |
| | 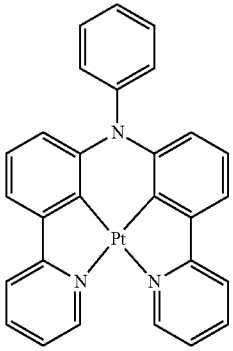 | US20070103060 |
| Osminum(III) complexes | 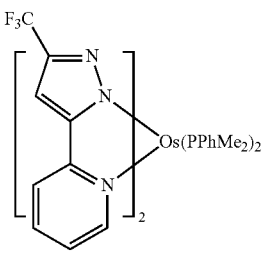 | Chem. Mater. 17, 3532 (2005) |
| Ruthenium(II) complexes | 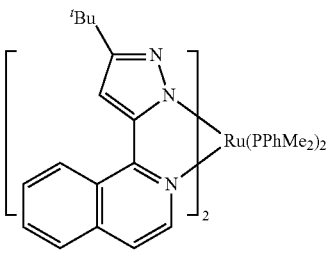 | Adv. Mater. 17, 1059 (2005) |
| Rhenium (I), (II), and (III) complexes | 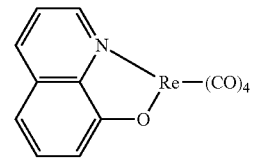 | US20050244673 |
| Green dopants | | |
| Iridium(III) organometallic complexes | 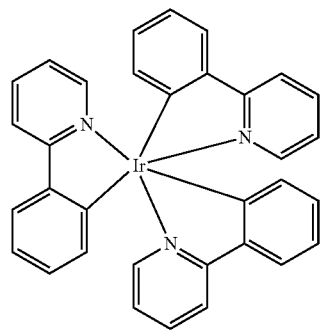
and its derivatives | Inorg. Chem. 40, 1704 (2001) |

TABLE 1-continued
| MATERIAL | EXAMPLES OF MATERIAL | PUBLICATIONS |
|---|---|---|
| | Hole injection materials | |
| | 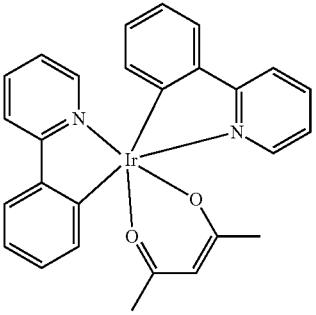 | US20020034656 |
| | 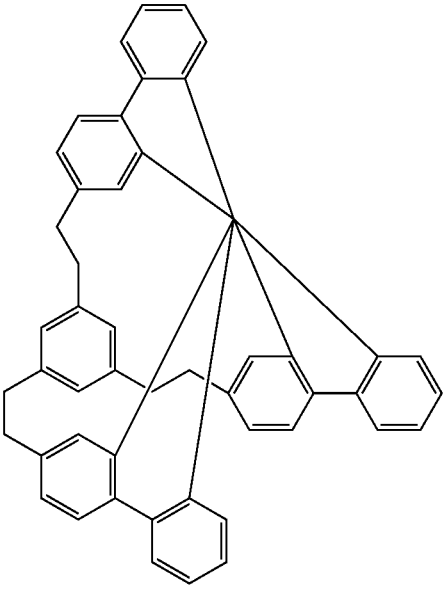 | U.S. Pat. No. 7,332,232 |
| | 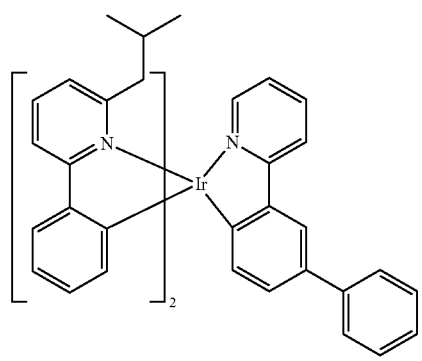 | US20090108737 |

TABLE 1-continued

| MATERIAL | EXAMPLES OF MATERIAL Hole injection materials | PUBLICATIONS |
|---|---|---|
| | | WO2010028151 |
| | | EP1841834B |
| | | US20060127696 |
| | | US20090039776 |
| | | U.S. Pat. No. 6,921,915 |

TABLE 1-continued
| MATERIAL | EXAMPLES OF MATERIAL | PUBLICATIONS |
|---|---|---|
| | Hole injection materials | |
| | 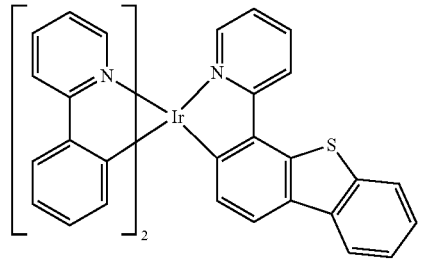 | US20100244004 |
| | 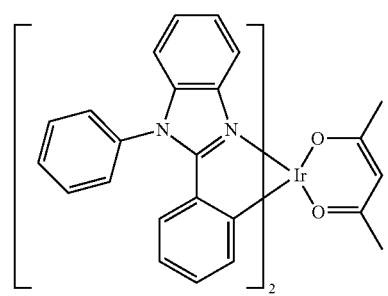 | U.S. Pat. No. 6,687,266 |
| | 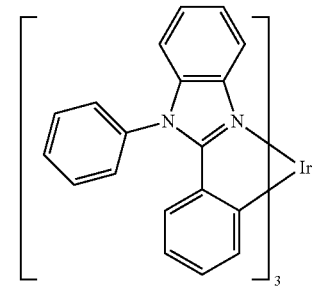 | Chem. Mater. 16, 2480 (2004) |
| | 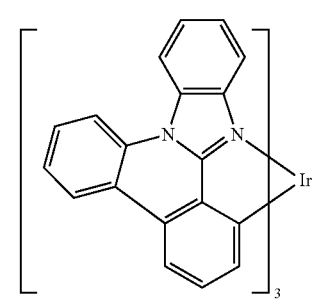 | US20070190359 |
| | 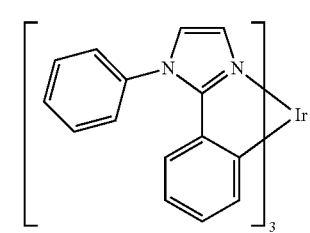 | US 20060008670<br>JP2007123392 |

TABLE 1-continued

| MATERIAL | EXAMPLES OF MATERIAL<br>Hole injection materials | PUBLICATIONS |
|---|---|---|
| | | WO2010086089,<br>WO2011044988 |
| | | Adv. Mater. 16, 2003<br>(2004) |
| | | Angew. Chem. Int. Ed.<br>2006, 45, 7800 |
| | | WO2009050290 |
| | | US20090165846 |
| | | US20080015355 |

TABLE 1-continued
| MATERIAL | EXAMPLES OF MATERIAL | PUBLICATIONS |
|---|---|---|
| | Hole injection materials | |
| | 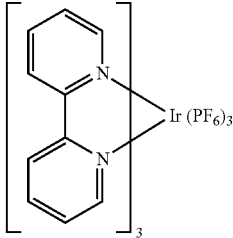 | US20010015432 |
| | 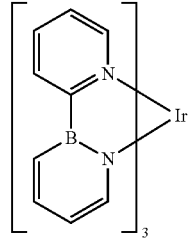 | US20100295032 |
| Monomer for polymeric metal organometallic compounds | 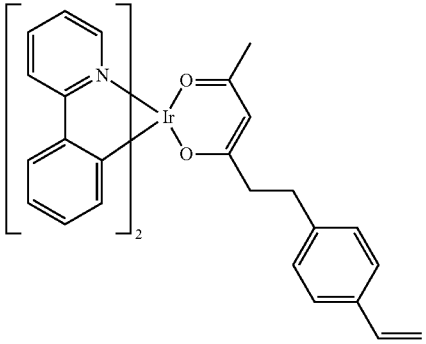 | U.S. Pat. No. 7,250,226, U.S. Pat. No. 7,396,598 |
| Pt(II) organometallic complexes, including polydentated ligands | 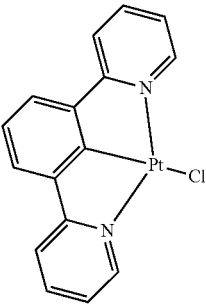 | Appl. Phys. Lett. 86, 153505 (2005) |
| | 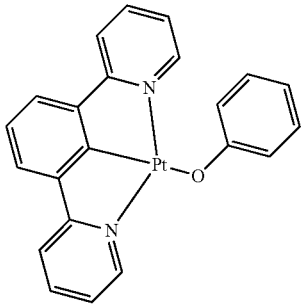 | Appl. Phys. Lett. 86, 153505 (2005) |

TABLE 1-continued
| MATERIAL | EXAMPLES OF MATERIAL | PUBLICATIONS |
|---|---|---|
| | Hole injection materials | |
| | 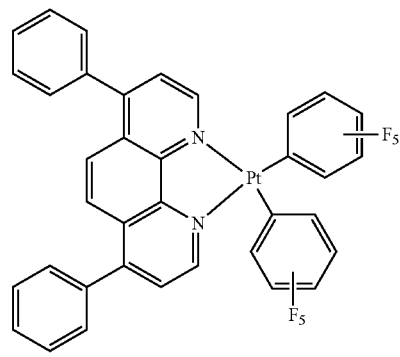 | Chem. Lett. 34, 592 (2005) |
| | 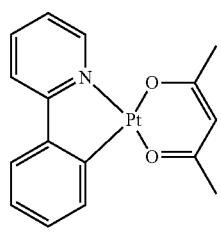 | WO2002015645 |
| | 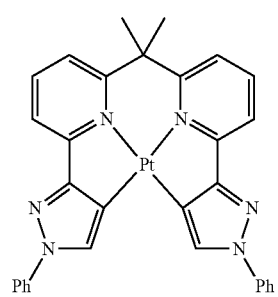 | US20060263635 |
| | 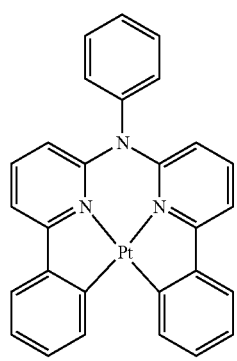 | US20060182992<br>US20070103060 |

TABLE 1-continued

| MATERIAL | EXAMPLES OF MATERIAL | PUBLICATIONS |
|---|---|---|
| | Hole injection materials | |
| Cu complexes | | WO2009000673 |
| | | US20070111026 |
| Gold complexes | | Chem. Commun. 2906 (2005) |
| Rhenium(III) complexes | | Inorg. Chem. 42, 1248 (2003) |

TABLE 1-continued

| MATERIAL | EXAMPLES OF MATERIAL<br>Hole injection materials | PUBLICATIONS |
|---|---|---|
| Osmium(II) complexes | | U.S. Pat. No. 7,279,704 |
| Deuterated organometallic complexes | | US20030138657 |
| Organometallic complexes with two or more metal centers | | US20030152802 |
| | | U.S. Pat. No. 7,090,928 |

TABLE 1-continued
| MATERIAL | EXAMPLES OF MATERIAL Hole injection materials | PUBLICATIONS |
|---|---|---|
| Blue dopants | | |
| Iridium(III) organometallic Complexes | 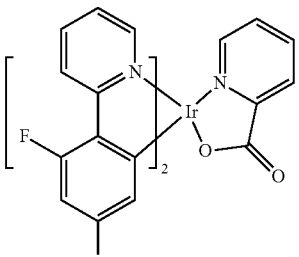 | WO2002002714 |
| | 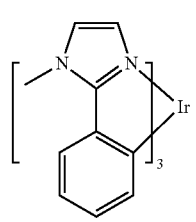 | WO2006009024 |
| | 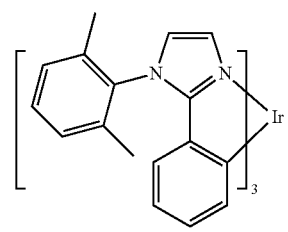 | US20060251923<br>US20110057559<br>US20110204333 |
| | 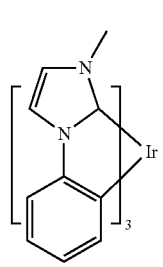 | U.S. Pat. No. 7,393,599,<br>WO2006056418,<br>US20050260441,<br>WO2005019373 |
| | 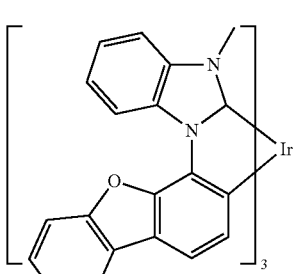 | U.S. Pat. No. 7,534,505 |

TABLE 1-continued
| MATERIAL | EXAMPLES OF MATERIAL<br>Hole injection materials | PUBLICATIONS |
|---|---|---|
| | 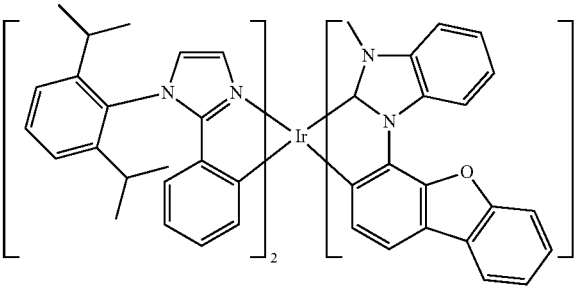 | WO2011051404 |
| | 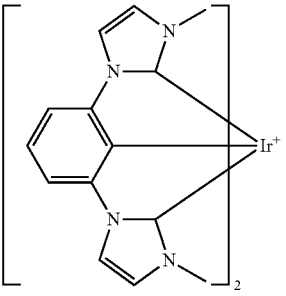 | U.S. Pat. No. 7,445,855 |
| | 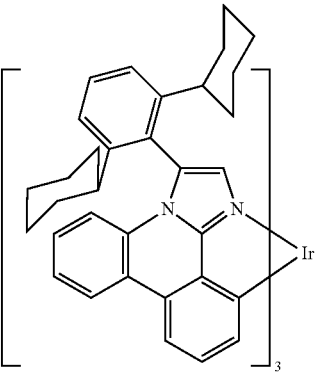 | US20070190359,<br>US20080297033<br>US20100148663 |
| | 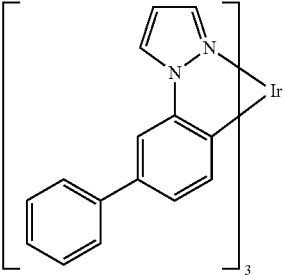 | U.S. Pat. No. 7,338,722 |
| | 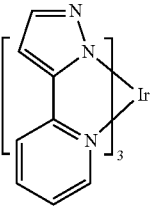 | US20020134984 |

| MATERIAL | EXAMPLES OF MATERIAL | PUBLICATIONS |
|---|---|---|
| | Hole injection materials | |
| | 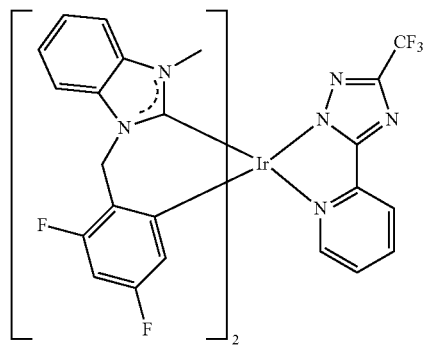 | Angew. Chem. Int. Ed. 47, 4542 (2008) |
| | 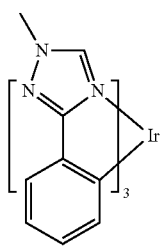 | Chem. Mater. 18, 5119 (2006) |
| | 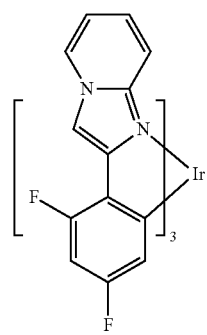 | Inorg. Chem. 46, 4308 (2007) |
| | 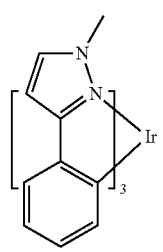 | WO2005123873 |
| | 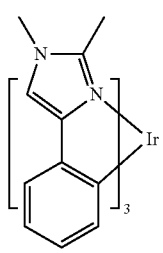 | WO2005123873 |

TABLE 1-continued
| MATERIAL | EXAMPLES OF MATERIAL | PUBLICATIONS |
|---|---|---|
| | Hole injection materials | |
| | 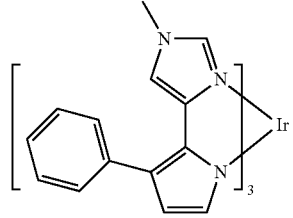 | WO2007004380 |
| | 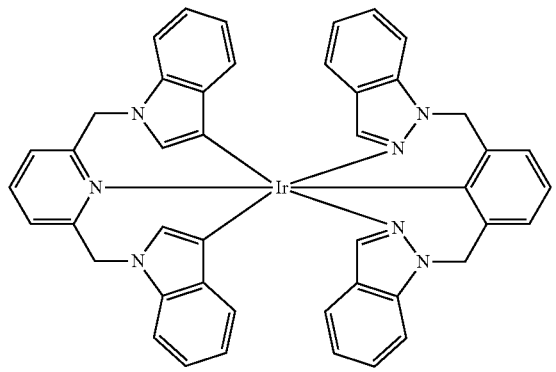 | WO2006082742 |
| Osmium(II) complexes | 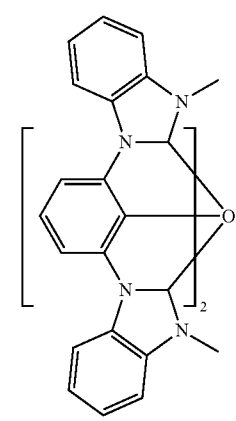 | U.S. Pat. No. 7,279,704 |
| | 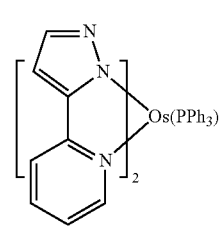 | Organometallics 23, 3745 (2004) |
| Gold complexes | 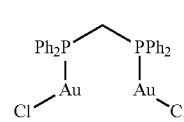 | Appl. Phys. Lett. 74, 1361 (1999) |
| Platinum(II) complexes | 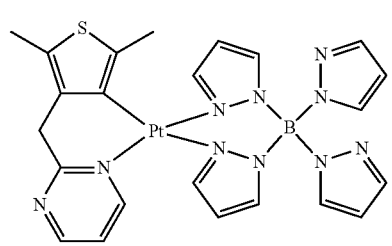 | WO2006098120, WO2006103874 |

TABLE 1-continued

| MATERIAL | EXAMPLES OF MATERIAL | PUBLICATIONS |
|---|---|---|
| Hole injection materials | | |
| Pt tetradentate complexes with at least one metal-carbene bond | 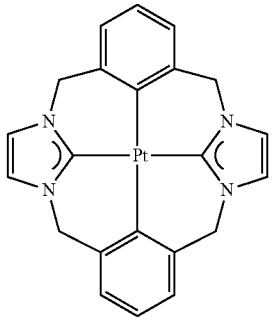 | U.S. Pat. No. 7,655,323 |
| Exciton/hole blocking layer materials | | |
| Bathocuprine compounds (e.g., BCP, BPhen) | 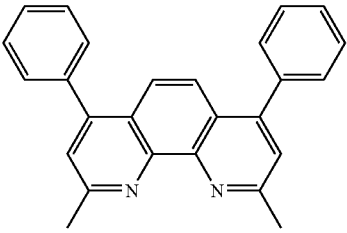 [SMILES: Cc1cc(-c2ccccc2)c2ccc3c(-c4ccccc4)cc(C)nc3c2n1] | Appl. Phys. Lett. 75, 4 (1999) |
| | 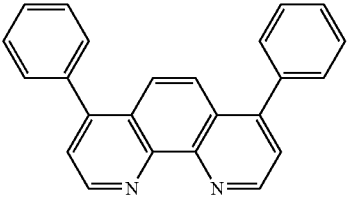 [SMILES: c1ccc(-c2ccnc3c2ccc2c(-c4ccccc4)ccnc23)cc1] | Appl. Phys. Lett. 79, 449 (2001) |
| Metal 8-hydroxyquinolates (e.g., BAlq) | 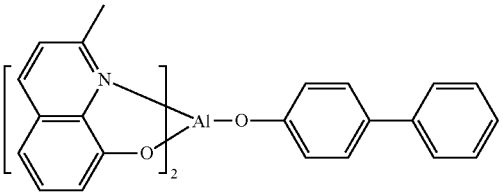 | Appl. Phys. Lett. 81, 162 (2002) |
| 5-member ring electron deficient heterocycles such as triazole, oxadiazole, imidazole, benzoimidazole | 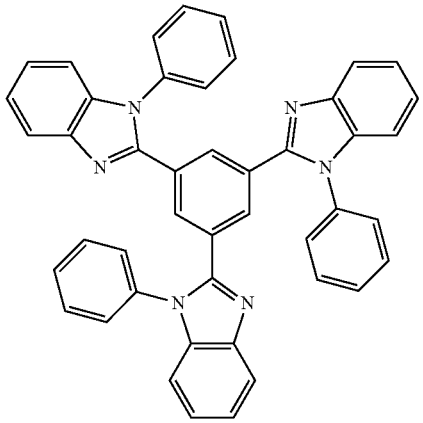 [SMILES: c1ccc(-n2c(-c3cc(-c4nc5ccccc5n4-c4ccccc4)cc(-c4nc5ccccc5n4-c4ccccc4)c3)nc3ccccc32)cc1] | Appl. Phys. Lett. 81, 162 (2002) |

TABLE 1-continued
| MATERIAL | EXAMPLES OF MATERIAL<br>Hole injection materials | PUBLICATIONS |
|---|---|---|
| Triphenylene compounds | 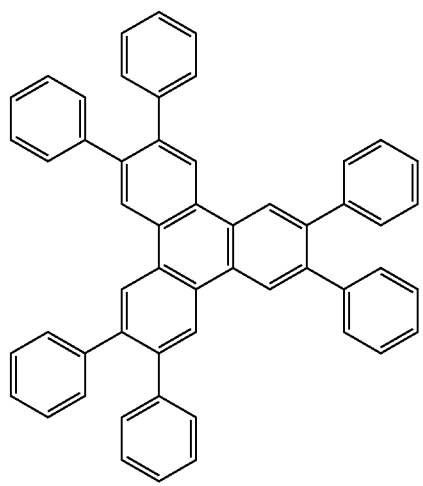 [SMILES: c1ccc(-c2cc3c4cc(-c5ccccc5)c(-c5ccccc5)cc4c4cc(-c5ccccc5)c(-c5ccccc5)cc4c3cc2-c2ccccc2)cc1] | US20050025993 |
| Fluorinated aromatic compounds | 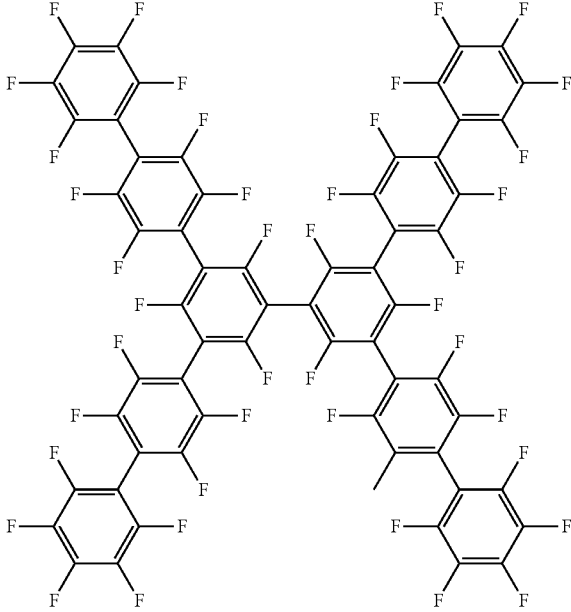 [SMILES: Cc1c(F)c(-c2c(F)c(-c3c(F)c(F)c(-c4c(F)c(F)c(F)c(F)c4F)c(F)c3F)c(F)c(-c3c(F)c(-c4c(F)c(F)c(-c5c(F)c(F)c(F)c(F)c5F)c(F)c4F)c(F)c(-c4c(F)c(F)c(-c5c(F)c(F)c(F)c(F)c5F)c(F)c4F)c3F)c2F)c(F)c(F)c1-c1c(F)c(F)c(F)c(F)c1F] | Appl. Phys. Lett. 79, 156 (2001) |
| Phenothiazine-S-oxide | 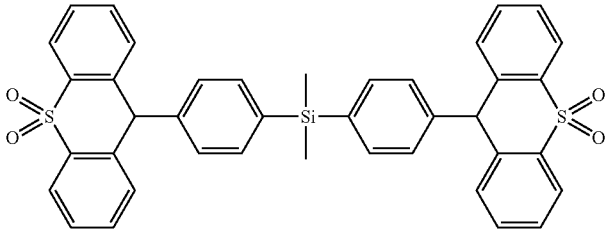 [SMILES: C[Si](C)(c1ccc(C2c3ccccc3S(=O)(=O)c3ccccc32)cc1)c1ccc(C2c3ccccc3S(=O)(=O)c3ccccc32)cc1] | WO2008132085 |
| Silylated five-membered nitrogen, oxygen, sulfur or phosphorus dibenzoheterocycles | 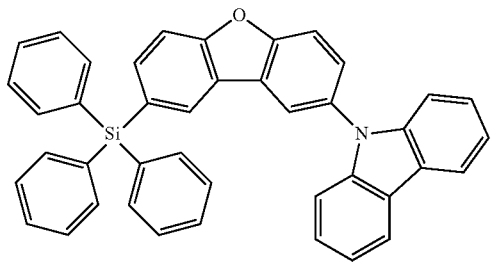 [SMILES: c1ccc([Si](c2ccccc2)(c2ccccc2)c2ccc3oc4ccc(-n5c6ccccc6c6ccccc65)cc4c3c2)cc1] | WO2010079051 |

TABLE 1-continued
| MATERIAL | EXAMPLES OF MATERIAL | PUBLICATIONS |
|---|---|---|
| Aza-carbazoles | 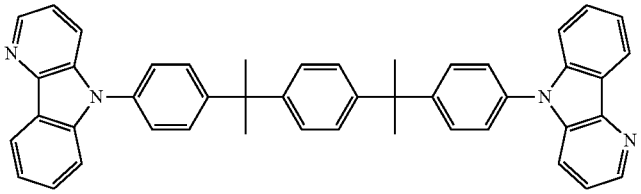 [SMILES: CC(C)(c1ccc(-n2c3ccccc3c3ncccc32)cc1)c1ccc(C(C)(C)c2ccc(-n3c4ccccc4c4ncccc43)cc2)cc1] | US20060121308 |
| Electron transporting materials | | |
| Anthracene-benzoimidazole compounds | 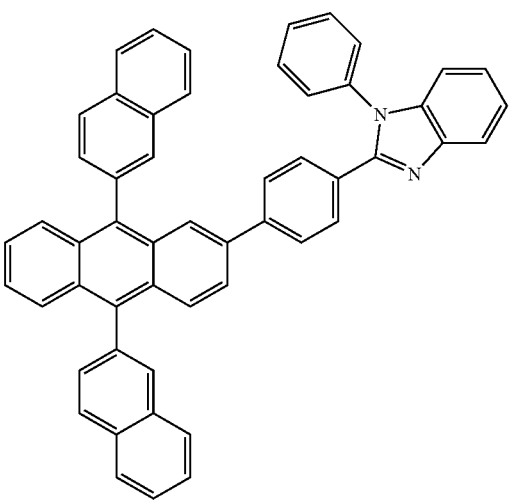 [SMILES: c1ccc(-n2c(-c3ccc(-c4ccc5c(-c6ccc7ccccc7c6)c6ccccc6c(-c6ccc7ccccc7c6)c5c4)cc3)nc3ccccc32)cc1] | WO2003060956 |
| | 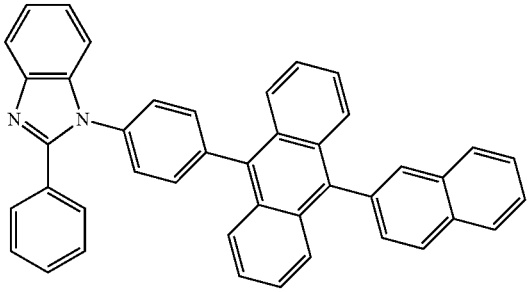 [SMILES: c1ccc(-c2nc3ccccc3n2-c2ccc(-c3c4ccccc4c(-c4ccc5ccccc5c4)c4ccccc34)cc2)cc1] | US20090179554 |
| Aza triphenylene derivatives | 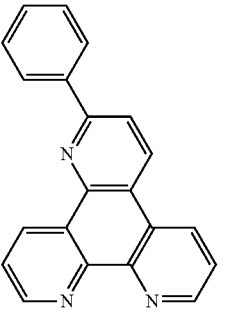 [SMILES: c1ccc(-c2ccc3c4cccnc4c4ncccc4c3n2)cc1] | US20090115316 |
| Anthracene-benzothiazole compounds | 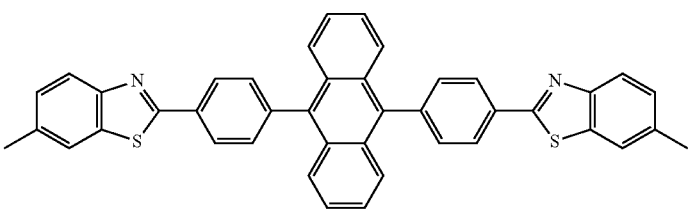 | Appl. Phys. Lett. 89, 063504 (2006) |

TABLE 1-continued

| MATERIAL | EXAMPLES OF MATERIAL | PUBLICATIONS |
|---|---|---|
| | Hole injection materials | |
| Metal 8-hydroxyquinolates (e.g., Alq$_3$, Zrq$_4$) | | Appl. Phys. Lett. 51, 913 (1987)<br>U.S. Pat. No. 7,230,107 |
| Metal hydroxybenoquinolates | | Chem. Lett. 5, 905 (1993) |
| Bathocuprine compounds such as BCP, BPhen, etc | | Appl. Phys. Lett. 91, 263503 (2007) |
| | | Appl. Phys. Lett. 79, 449 (2001) |
| 5-member ring electron deficient heterocycles (e.g., triazole, oxadiazole, imidazole, benzoimidazole) | | Appl. Phys. Lett. 74, 865 (1999) |
| | | Appl. Phys. Lett. 55, 1489 (1989) |

TABLE 1-continued
| MATERIAL | EXAMPLES OF MATERIAL Hole injection materials | PUBLICATIONS |
|---|---|---|
| | 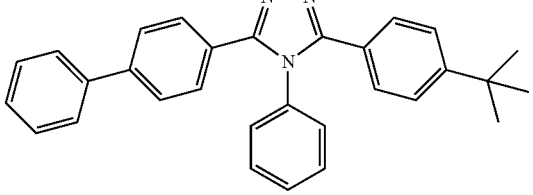 | Jpn. J. Apply. Phys. 32, L917 (1993) |
| Silole compounds | 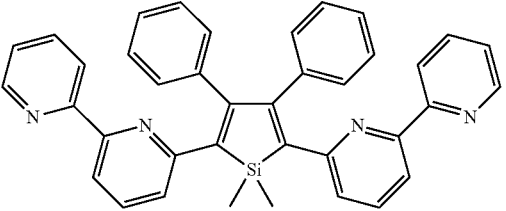 [SMILES: C[Si]1(C)C(c2cccc(-c3ccccn3)n2)=C(c2ccccc2)C(c2ccccc2)=C1c1cccc(-c2ccccn2)n1] | Org. Electron. 4, 113 (2003) |
| Arylborane compounds | 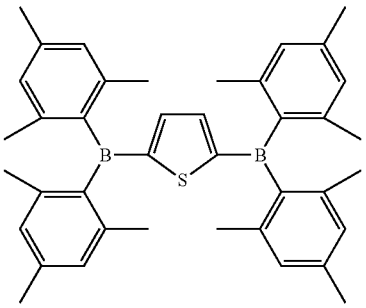 | J. Am. Chem. Soc. 120, 9714 (1998) |
| Fluorinated aromatic compounds | 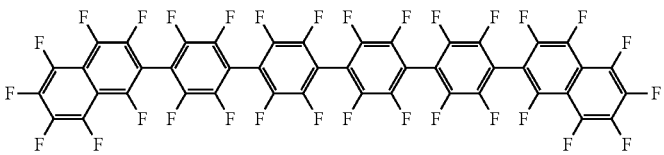 [SMILES: Fc1c(F)c(-c2c(F)c(F)c(-c3c(F)c(F)c4c(F)c(F)c(F)c(F)c4c3F)c(F)c2F)c(F)c(F)c1-c1c(F)c(F)c(-c2c(F)c(F)c(-c3c(F)c(F)c4c(F)c(F)c(F)c(F)c4c3F)c(F)c2F)c(F)c1F] | J. Am. Chem. Soc. 122, 1832 (2000) |
| Fullerene (e.g., C60) | 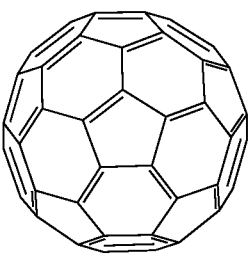 [SMILES: c1cc2c3ccc4c5ccc6c7ccc8c9ccc%10c1c1c2c2c3c4c3c5c6c4c7c8c5c9c%10c1c1c2c3c4c51] | US20090101870 |
| Triazine complexes | 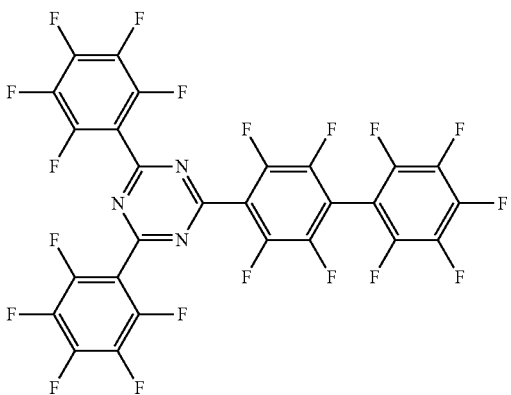 [SMILES: Fc1c(F)c(F)c(-c2nc(-c3c(F)c(F)c(F)c(F)c3F)nc(-c3c(F)c(F)c(-c4c(F)c(F)c(F)c(F)c4F)c(F)c3F)n2)c(F)c1F] | US20040036077 |

| MATERIAL | EXAMPLES OF MATERIAL Hole injection materials | PUBLICATIONS |
|---|---|---|
| Zn (N^N) complexes | 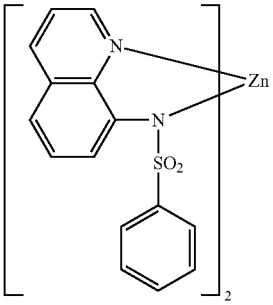 | U.S. Pat. No. 6,528,187 |

Compound Examples

Synthesis of Compound S-10-144-H

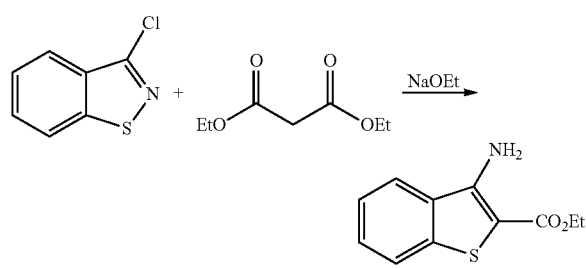

Synthesis of ethyl 3-aminobenzo[b]thiophene-2-carboxylate: A dry 2-neck 500 mL round-bottom flask (RBF) was charged with sodium ethanolate (46.2 mL, 124 mmol), diluted with 151 mL absolute EtOH, cooled in an ice bath and treated dropwise with diethyl malonate (17.98 mL, 118 mmol) under an atmosphere of nitrogen. After stirring for 20 minutes, the ice bath was removed and 3-chlorobenzo[d]isothiazole (20.0 g, 118 mmol) was added in one portion and stirred for 24 hours. The reaction solution was quenched with water, extracted with ether and treated with excess 4 M HCl/dioxane. A pinkish-white precipitate was filtered off, suspended in water, basified with Na₂CO₃, extracted with ether, washed with water and brine, dried over sodium sulfate, filtered and concentrated to yellow solids (~20 g) which were recrystallized from ethanol/water and dried in a vacuum oven at 60° C. for 3 hrs to give ethyl 3-aminobenzo[b]thiophene-2-carboxylate (19.9 g, 76% yield).

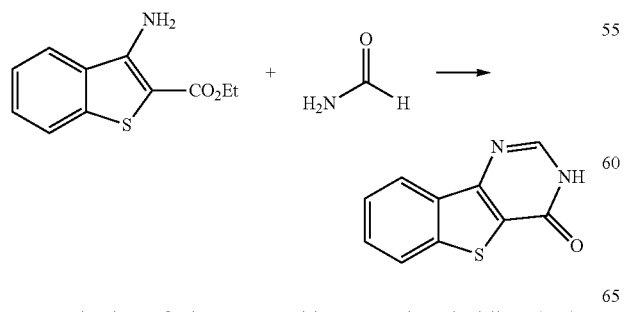

Synthesis of benzo[4,5]thieno[3,2-d]pyrimidin-4(3H)-one: A 100 mL RBF was charged with ethyl 3-aminobenzo[b]thiophene-2-carboxylate (17.7 g, 80 mmol), treated with formamide (60.6 mL, 1520 mmol) and heated to 190° C. for 2 hrs. Precipitate formed upon cooling. The solid precipitate was collected by filtration and washed with ether, then recrystallized from ethanol/tetrahydrofuran. Benzo[4,5]thieno[3,2-d]pyrimidin-4(3H)-one (9.9 g, 61% yield) was obtained.

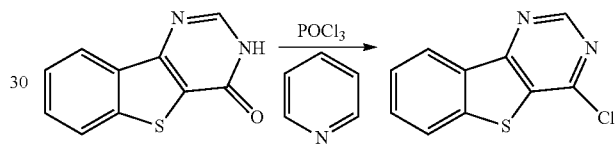

Synthesis of 4-chlorobenzo[4,5]thieno[3,2-d]pyrimidine: Benzo[4,5]thieno[3,2-d]pyrimidin-4(3H)-one (10.78 g, 26.7 mmol) was treated with pyridine (2.68 mL, 33.3 mmol) and phosphoryl trichloride (53.4 mL, 573 mmol), then heated to reflux at 110° C. for 1 hr. Excess POCl₃ was removed and cautiously quenched with ice water in an ice bath. The pH was adjusted to ~5 with ammonium hydroxide. Solid was collected by filtration washed with water. The solid was dried to give 4-chlorobenzo[4,5]thieno[3,2-d]pyrimidine (10 g, 85% yield).

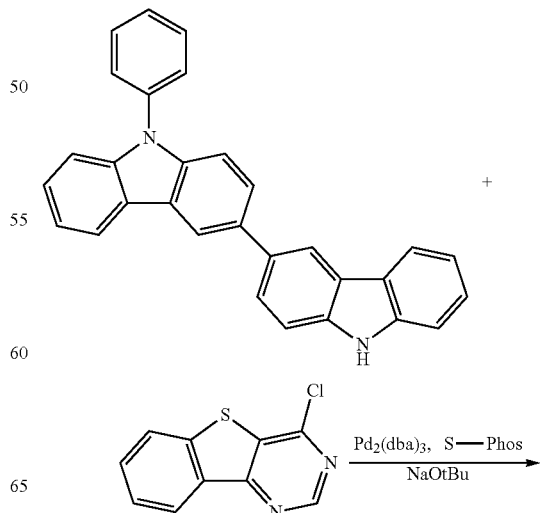

-continued

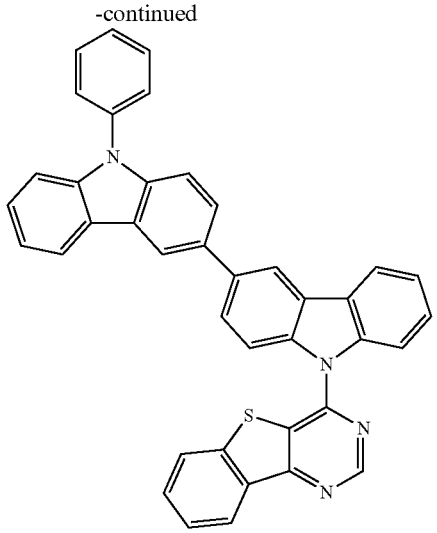

Synthesis of 4-(9'-phenyl-9H,9'H-[3,3'-bicarbazol]-9-yl)benzo[4,5]thieno[3,2-d]pyrimidine: 9-phenyl-9H,9'H-3,3'-bicarbazole (3.05 g, 7.47 mmol), 4-chlorobenzo[4,5]thieno[3,2-d]pyrimidine (1.812 g, 8.21 mmol), Pd$_2$dba$_3$ (0.342 g, 0.373 mmol), dicyclohexyl(2',6'-dimethoxy-[1,1'-biphenyl]-2-yl)phosphine (S-Phos) (0.307 g, 0.747 mmol), and sodium 2-methylpropan-2-olate (1.794 g, 18.67 mmol) were charged to a 250 mL RBF, diluted in m-Xylene (Volume: 74.7 mL), degassed with nitrogen and heated to reflux at 150° C. overnight. The reaction was quenched with aqueous ammonium chloride and filtered through a plug of Celite® with dichloromethane (DCM). The crude was purified by column chromatography and then recrystallized from toluene/ethanol to give 4-(9'-phenyl-9H,9'H-[3,3'-bicarbazol]-9-yl)benzo[4,5]thieno[3,2-d]pyrimidine (1.95 g, 44% yield).

Synthesis of Compound S-17-144-H

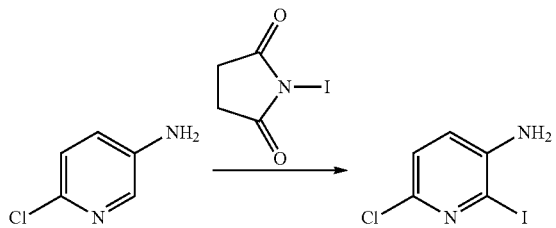

Synthesis of 6-chloro-2-iodopyridin-3-amine: 6-chloropyridin-3-amine (40.0 g, 311 mmol) was dissolved in dimethylformamide (DMF) (Volume: 534 mL) and treated with 1-iodopyrrolidine-2,5-dione (70.0 g, 311 mmol) in one portion. The reaction solution was stirred at room temperature under nitrogen overnight and quenched with water and extracted with EtOAc and Et$_2$O. Organic layer was washed twice with brine and dried over sodium sulfate. DMF was removed on kugelrohr at 100° C. to afford ~90 g red solids. The crude was purified via column chromatography to give 6-chloro-2-iodopyridin-3-amine (57 g, 72% yield).

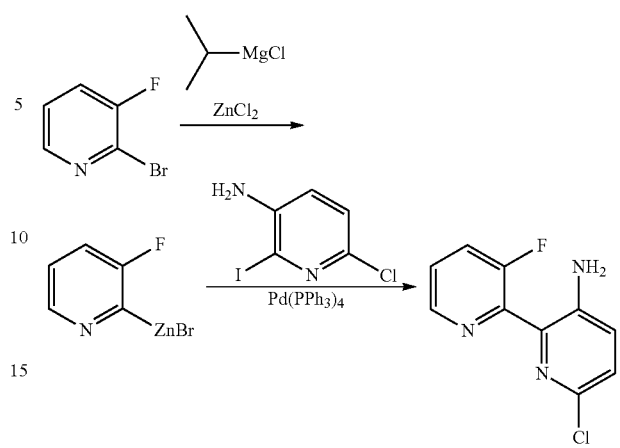

Synthesis of 6-chloro-3'-fluoro-[2,2'-bipyridin]-3-amine: A 3-neck 1000 mL RBF was dried under vacuum, then charged with isopropylmagnesium chloride (78 mL, 156 mmol) and cooled with a water bath. 2-bromo-3-fluoropyridine (14.37 mL, 142 mmol) was added dropwise making sure temperature did not exceed 30° C. The reaction was stirred at room temperature overnight, then treated dropwise with zinc (II) chloride (341 mL, 170 mmol) over 3 hrs and stirred at room temperature overnight. This suspension was then added dropwise via canula to a degassed, 65° C. solution of Pd(PPh$_3$)$_4$ (8.21 g, 7.10 mmol) and 6-chloro-2-iodopyridin-3-amine (39.8 g, 156 mmol) in tetrahydrofuran (THF) (Volume: 474 mL) and heated at reflux overnight. After cooled to room temperature, the reaction was quenched with sat. aq. NaHCO$_3$ and water. The precipitate was filtered out and washed with EtOAc. The filtrate was extracted with EtOAc. The crude product was purified by column chromatography in 40-50% EtOAc/hexanes with column conditioned in 20% TEA/hexanes to give 6-chloro-3'-fluoro-[2,2'-bipyridin]-3-amine (21.8 g, 69% yield).

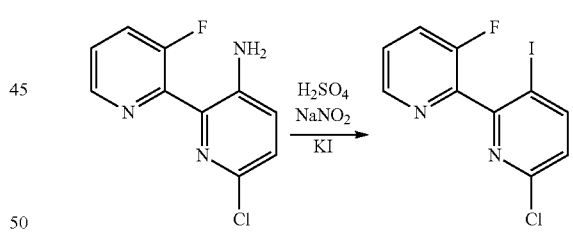

Synthesis of 6-chloro-3'-fluoro-3-iodo-2,2'-bipyridine: A 500 mL 3 neck RBF equipped with mechanical stirrer, reflux condenser, and addition funnel was charged with 6-chloro-3'-fluoro-[2,2'-bipyridin]-3-amine (6.63 g, 29.6 mmol). It was treated with 2M sulfuric acid (111 mL, 222 mmol) creating a yellow/orange solution. The reaction was cooled to −5° C. and treated dropwise with a solution of sodium nitrile (2.66 g, 38.5 mmol) in 49 mL water at −5° C. The yellow/orange suspension was stirred at 0° C. for 30 minutes, then treated dropwise with a solution of potassium iodide (14.76 g, 89 mmol) in 63 mL of water. The reaction was stirred at room temperature for 30 minutes, then heated to 80° C. for 1 hour. After cooling, the reaction was extracted with EtOAc, washed with water, 2M Na$_2$CO$_3$, NaHSO$_3$, and brine, dried over sodium sulfate, filtered, and concentrated. The crude product was purified by column chromatography using 20% EtOAc/hexanes to give 6-chloro-3'-fluoro-3-iodo-2,2'-bipyridine (16 g, 81% yield).

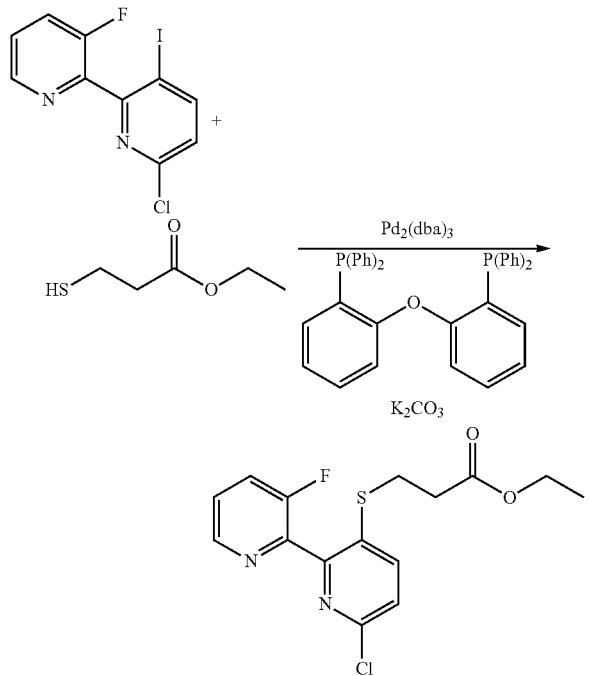

Synthesis of ethyl 3-((6-chloro-3'-fluoro-[2,2'-bipyridin]-3-yl)thio)propanoate: 6-chloro-3'-fluoro-3-iodo-2,2'-bipyridine (21.4 g, 64.0 mmol), Potassium Carbonate (22.10 g, 160 mmol), (oxybis(2,1-phenylene))bis(diphenylphosphine) (3.45 g, 6.40 mmol), Pd$_2$(dba)$_3$ (2.93 g, 3.20 mmol) were charged to a dry 500 mL RBF, taken up in Toluene (Volume: 256 mL) and degassed with nitrogen. Ethyl 3-mercaptopropanoate (8.92 mL, 70.4 mmol) was added and the reaction solution was heated to reflux for 7 hours. The reaction was quenched with NH$_4$Cl and extracted with EtOAc. The crude was purified by column chromatography using EtOAc and hexanes to give ethyl 3-((6-chloro-3'-fluoro-[2,2'-bipyridin]-3-yl)thio)propanoate (21.5 g, ~100% yield) with some impurities.

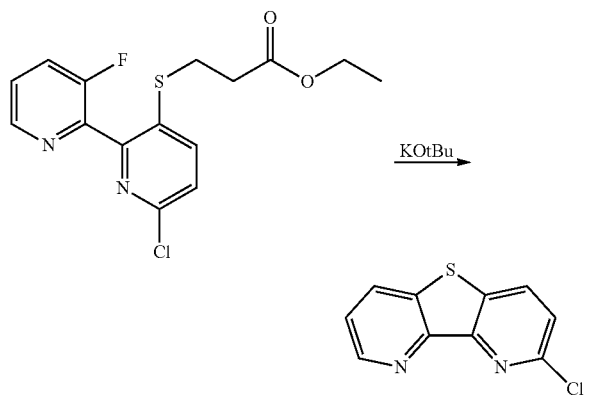

Synthesis of 2-chlorothieno[3,2-b:4,5-b']dipyridine: A 500 mL RBF was charged with ethyl 3-((6-chloro-3'-fluoro-[2,2'-bipyridin]-3-yl)thio)propanoate (16.55 g, 48.6 mmol), THF (Volume: 194 mL) and degassed with nitrogen for 10 minutes, then treated with potassium 2-methylpropan-2-olate (8.17 g, 72.8 mmol) and heated to reflux at 75° C. for 24 hours. The reaction was quenched with aqueous ammonium chloride, extracted 2× with EtOAc. The crude product was purified by column chromatography to give 2-chlorothieno[3,2-b:4,5-b']dipyridine (7 g, 68% yield).

Synthesis of Compound S-17-144-H

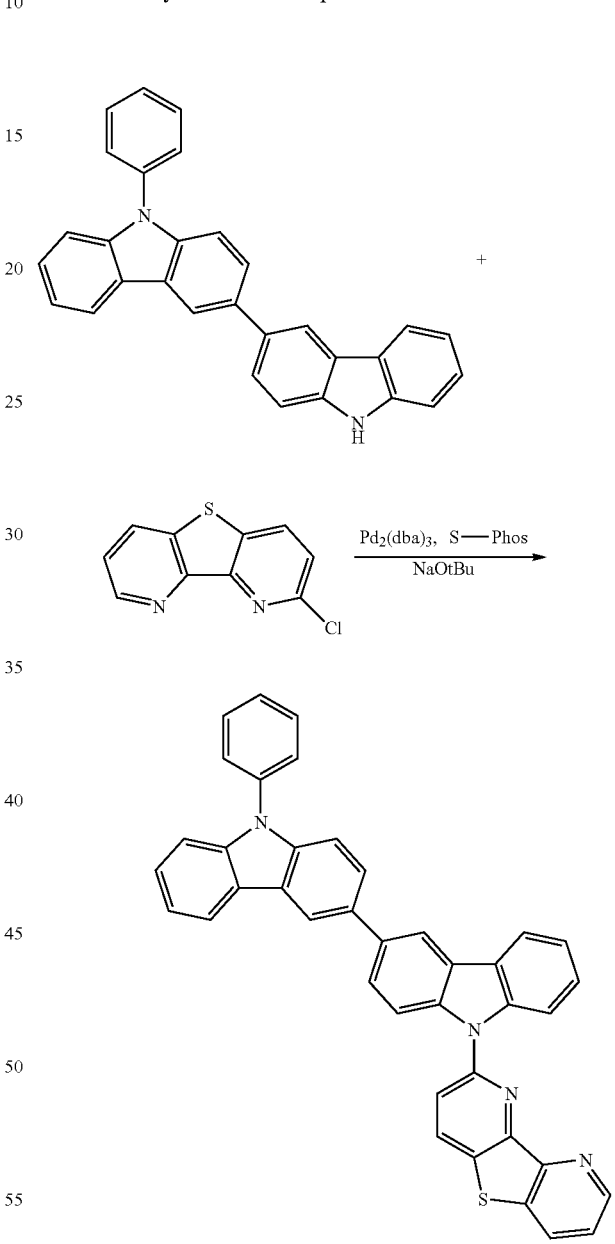

9-phenyl-9H,9'H-3,3'-bicarbazole (3.0 g, 7.34 mmol), 2-chlorothieno[3,2-b:4,5-b']dipyridine (2.026 g, 9.18 mmol), Pd$_2$dba$_3$ (0.336 g, 0.367 mmol), dicyclohexyl(2',6'-dimethoxy-[1,1'-biphenyl]-2-yl)phosphine (S-Phos) (0.301 g, 0.734 mmol), and sodium 2-methylpropan-2-olate (1.764 g, 18.36 mmol) were charged to a dry 250 mL RBF, treated with m-Xylene (Volume: 73.4 mL) and degassed with nitrogen then heated to reflux at 150° C. overnight. The reaction solution was cooled to room temperature, quenched with aq.

NH₄Cl and filtered through small plug of Celite® with DCM. The crude product was purified by column chromatography to give 1.86 g pure product.

Synthesis of N-phenyldibenzo[b,d]furan-2-amine

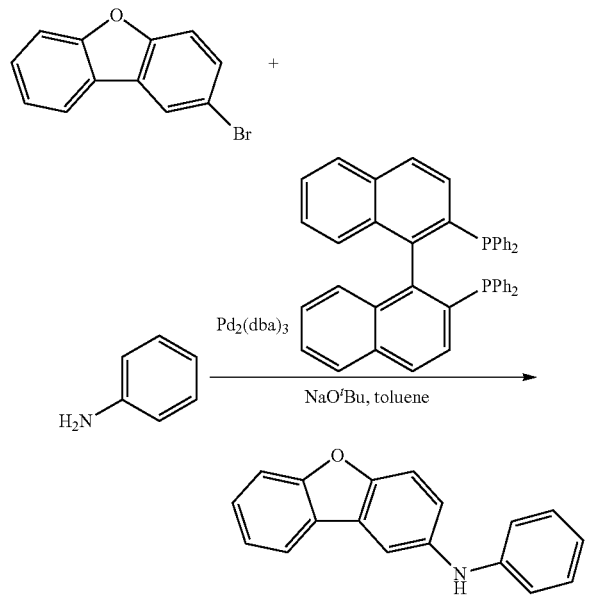

4-bromodibenzo[b,d]furan (3.0 g, 12.1 mmol) and aniline (1.69 g, 18.1 mmol) were mixed in 100 mL of toluene. The solution was bubbled with nitrogen for 15 min. Pd₂(dba)₃ (0.05 g, 0.05 mmol), 2,2'-bis(diphenylphosphino)-1,1'-binaphthyl (0.15 g, 0.24 mmol) and sodium t-butoxide (1.7 g, 17.4 mmol) were added. The mixture was refluxed overnight under nitrogen. After cooling, the reaction mixture was filtered through celite/silica pad and the filtrate was concentrated under vacuum. The residue was then purified by column chromatography using DCM:hexane (1:1, v/v) as the eluent. 2.0 g (65%) of a white solid was obtained as the product.

Synthesis of N-(4-bromophenyl)-N-phenyldibenzo[b,d]furan-2-amine

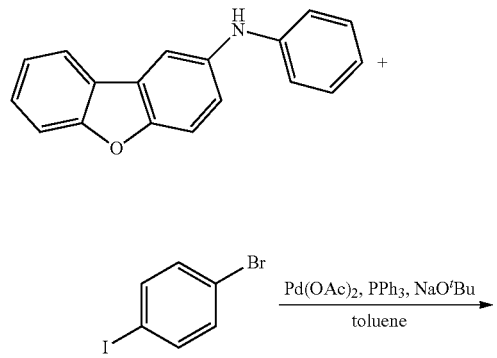

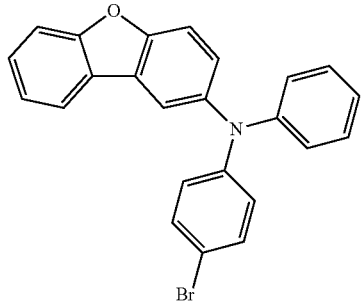

N-phenyldibenzo[b,d]furan-2-amine (5.0 g, 19.3 mmol), and 1-bromo-4-iodobenzene (10.9 g, 38.6 mmol) were mixed in 100 mL of toluene. The solution was bubbled with nitrogen for 15 min. Pd(OAc)₂ (0.22 g, 1.0 mmol), triphenylphosphine (0.51 g, 1.9 mmol) and sodium t-butoxide (2.2 g, 23.1 mmol) were added. The mixture was refluxed overnight under nitrogen.

After cooling, the reaction mixture was filtered through celite/silica pad and the filtrate was concentrated under vacuum. The residue was then purified by column chromatography using DCM:hexane (1:1, v/v) as the eluent. 5.6 g (71%) of a yellow solid was obtained as the product.

Synthesis of N-phenyl-N-(4-(4,4,5,5-tetramethyl-1,3,2-dioxaborolan-2-yl)phenyl)dibenzo[b,d]furan-2-amine

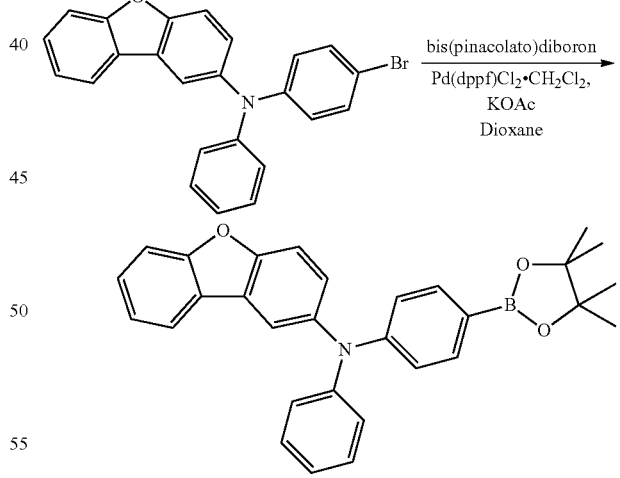

N-(4-bromophenyl)-N-phenyldibenzo[b,d]furan-2-amine (5.3 g, 12.8 mmol), bis(pinacolato)diboron (11.4 g, 44.8 mmol) and KOAc (3.77 g, 38.4 mmol) were mixed in 130 mL of dry 1,4-dioxane. The solution was bubbled with nitrogen for 15 minutes, then Pd(dppf)Cl₂.CH₂Cl₂ (0.28 g, 0.4 mmol) was added. The mixture was refluxed overnight under nitrogen. After cooling, the reaction mixture was filtered through celite/silica pad and the solvent was then evaporated. The residue was then purified by column chromatography using DCM:hexane (1:3, v/v) as the eluent. 5.21 g (88%) of a white solid was obtained as the product.

Synthesis of N-(4-(9H-carbazol-3-yl)phenyl)-N-phenyldibenzo[b,d]furan-2-amine

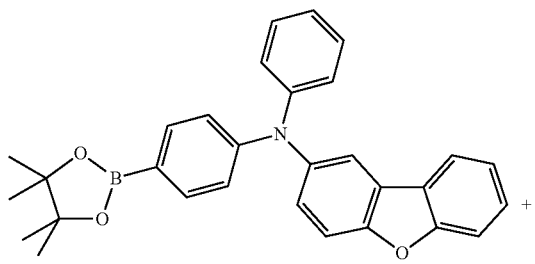

+

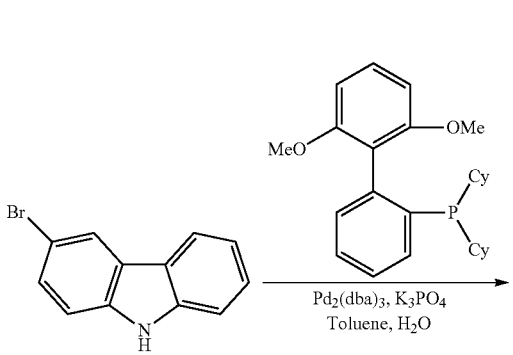

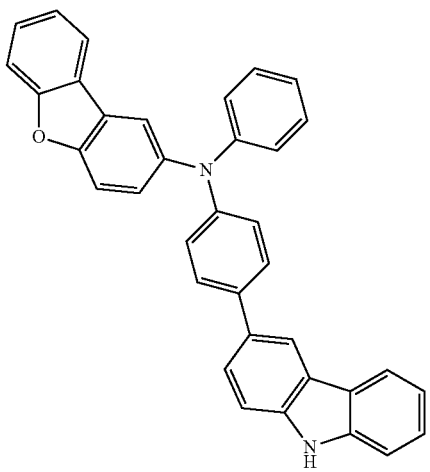

N-phenyl-N-(4-(4,4,5,5-tetramethyl-1,3,2-dioxaborolan-2-yl)phenyl)dibenzo[b,d]furan-2-amine (3.25 g, 7.0 mol), and 3-bromo-9H-carbazole (1.73 g, 7.0 mmol) were mixed in 45 mL of toluene and 15 ml of ethanol. To the solution was bubbled with nitrogen for 15 min. Pd$_2$(dba)$_3$ (0.16 g, 0.18 mmol), 2-dicyclohexylphosphino-2',6'-dimethoxybiphenyl (0.29 g, 7.0 mmol) and K$_3$PO$_4$ (4.49 g, 21.1 mmol) were added. The mixture was refluxed overnight under nitrogen. After cooling, aqueous layer was removed from the reaction mixture and dry over magnesium sulfate, and was filtered through filter paper and the filtrate was then evaporated. The residue was then purified by column chromatography using THF:hexane (1:3, v/v) as eluent 3.0 g (85%) of a white solid was obtained as the product.

Synthesis of 3-(5-chloro-2-methoxyphenyl)pyridin-4-amine

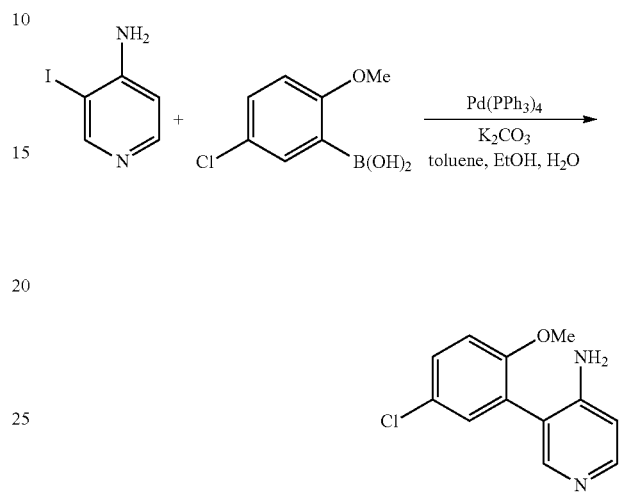

3-iodopyridin-4-amine (2.2 g, 10 mmol), (5-chloro-2-methoxyphenyl)boronic acid (1.86 g, 10 mmol) and, and K$_2$CO$_3$ (4.2 g, 30 mmol) were mixed in 50 mL of toluene, 5 mL of deionized water and 5 mL of ethanol. To the solution was bubbled with nitrogen for 15 min. Pd(PPh$_3$)$_4$ (0.23 g, 0.2 mmol) was then added. The mixture was refluxed overnight under nitrogen. After cooling, the aqueous layer was removed and the organic layer was then concentrated. The residue was then purified by column chromatography using ethyl acetate as the eluent. 2.0 g (85%) of product was collected as the product.

Synthesis of 8-chlorobenzofuro[3,2-c]pyridine

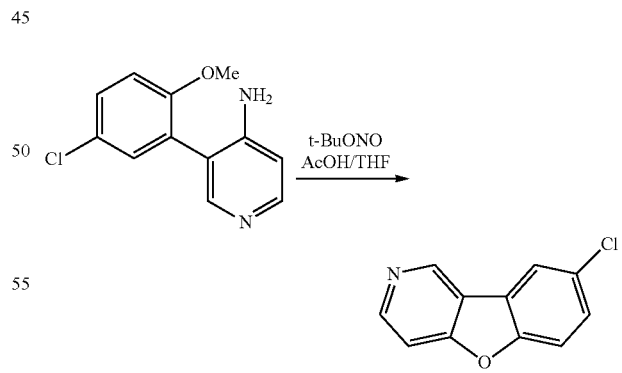

3-(5-chloro-2-methoxyphenyl)pyridin-4-amine (2 g, 8.5 mmol) was dissolved in 25 mL of acetic acid and 10 mL of THF at −10° C. To the solution t-butyl nitrite (2 ml, 17 mmol) was dropwisely added. The mixture was warmed to room temperature overnight. Water was added to the reaction mixture and was extracted by dichloromethane, the organic layer was then dried by MgSO$_4$ and concentrated. The residue was then purified by column chromatography using THF:hexane (1:3, v/v) as the eluent. 0.8 g (46%) of product was collected as the product.

Synthesis of Compound O-20-10-H

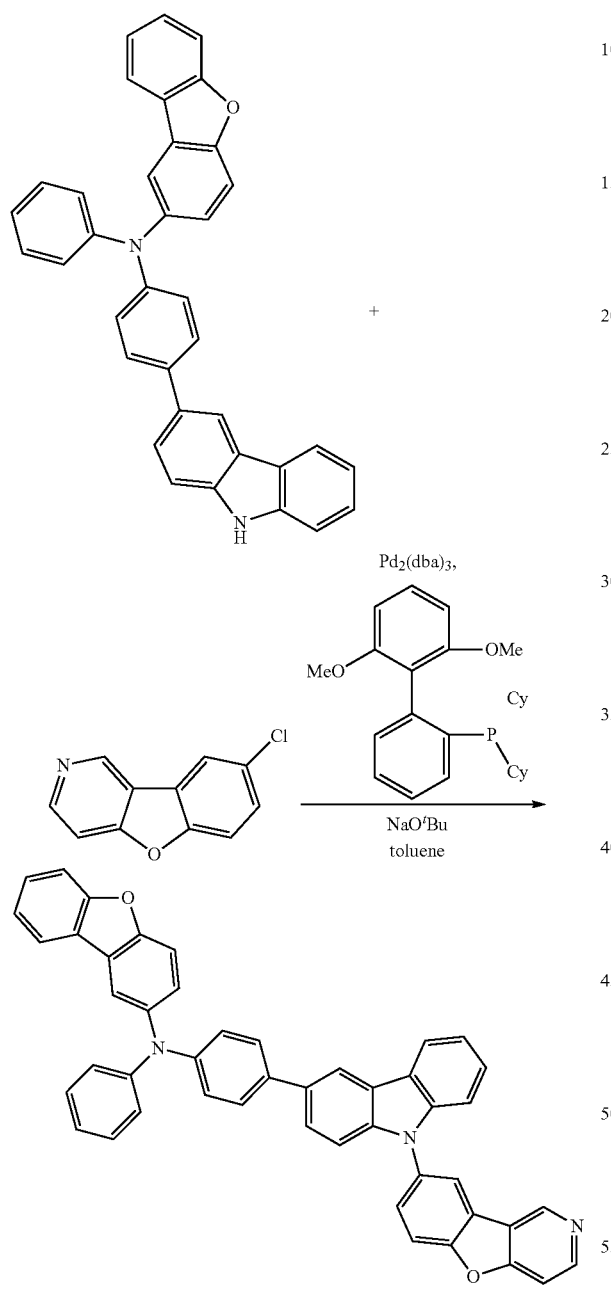

N-(4-(9H-carbazol-3-yl)phenyl)-N-phenyldibenzo[b,d]furan-2-amine (0.76 g, 1.5 mmol) and 8-chlorobenzofuro[3,2-c]pyridine (0.3 g, 1.48 mmol) were mixed in 70 mL of dry xylene. To the solution was bubbled with nitrogen for 15 min. Pd$_2$(dba)$_3$ (0.16 g, 0.17 mmol), 2-dicyclohexylphosphino-2',6'-dimethoxybiphenyl (0.24 g, 0.58 mmol) and $^t$BuONa (0.23 g, 2.4 mmol) were then added. The mixture was refluxed overnight under nitrogen. After cooling, the reaction mixture was filtered through celite/silica pad and the solvent was then concentrated. The residue was then purified by column chromatography using THF:hexane (1:4, v/v) as the eluent. 0.3 g (30%) of product was collected.

Synthesis of Compound O-20-7-H

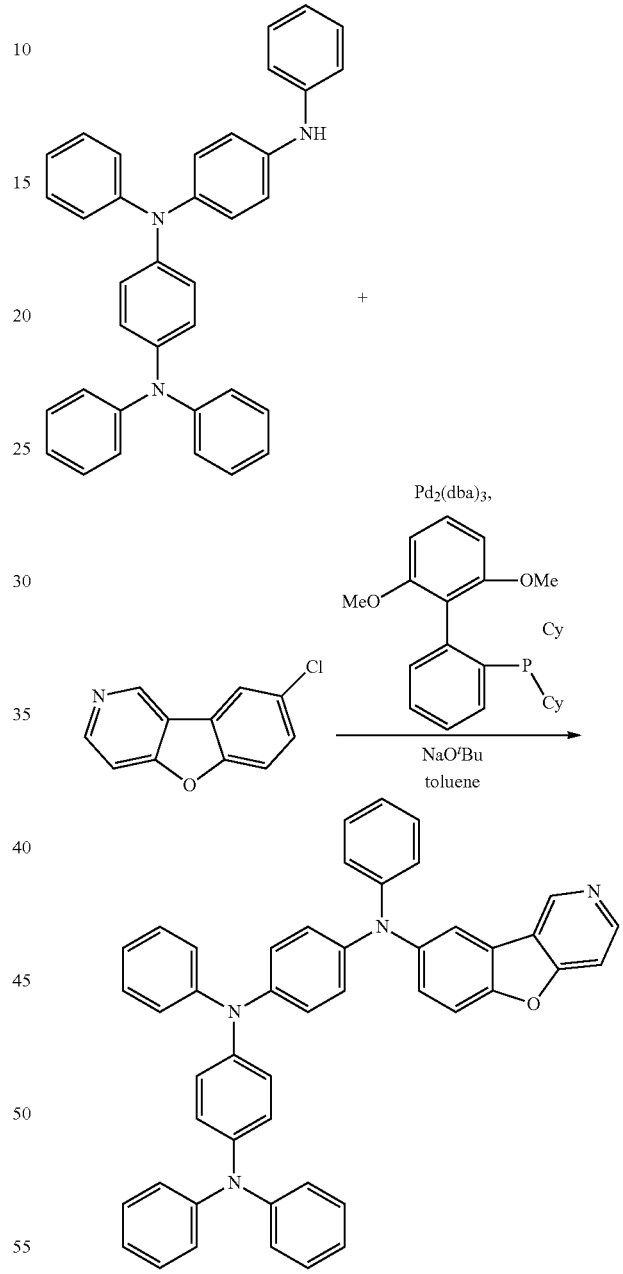

$N^1,N^1,N^4$-triphenyl-$N^4$-(4-(phenylamino)phenyl)benzene-1,4-diamine (0.76 g, 1.5 mmol) and 8-chlorobenzofuro[3,2-c]pyridine (0.3 g, 1.48 mmol) were mixed in 70 mL of dry xylene. To the solution was bubbled with nitrogen for 15 min. Pd$_2$(dba)$_3$ (0.16 g, 0.17 mmol), 2-dicyclohexylphosphino-2',6'-dimethoxybiphenyl (0.24 g, 0.58 mmol) and $^t$BuONa (0.23 g, 2.4 mmol) were then added. The mixture was refluxed overnight under nitrogen. After cooling, the reaction mixture was filtered through celite/silica pad and the solvent was then concentrated. The residue was then purified by column chromatography using THF:hexane (1:4, v/v) as the eluent. 0.55 g (55%) of product was collected as the product.

Synthesis of Compound O-10-144-H

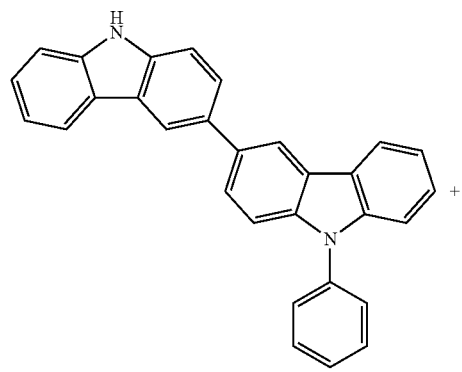

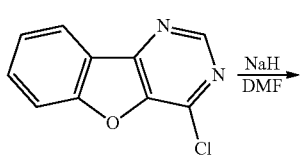

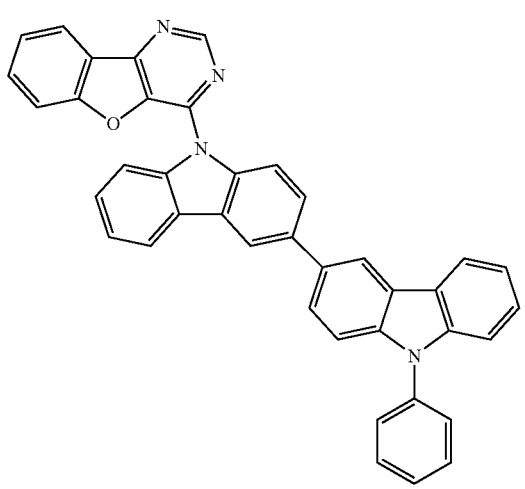

9-phenyl-9H,9'H-3,3'-bicarbazole (2.7 g, 6.6 mmol) and sodium hydride (0.4 g, 10.4 mmol) were mixed in 30 mL of dry DMF. To the solution was stirred for 1 hour. 4-chlorobenzofuro[3,2-d]pyrimidine (1.6 g, 7.8 mmol) was added. The mixture was stirred overnight under nitrogen. The reaction mixture was poured into water and the precipitate was filtered. The residue was then purified by column chromatography using THF:hexane (1:4, v/v) as the eluent. 3.0 g (78%) of product was collected as the product.

Synthesis of Compound O-10-10-H

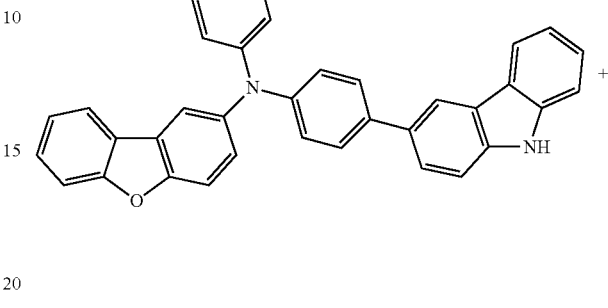

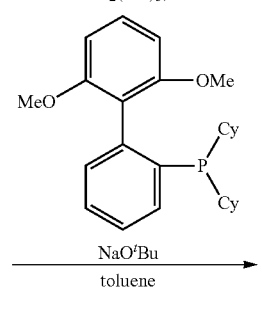

N-(4-(9H-carbazol-3-yl)phenyl)-N-phenyldibenzo[b,d]furan-2-amine (0.90 g, 1.8 mmol), and 4-chlorobenzofuro[3,2-d]pyrimidine (0.37 g, 1.8 mmol) were mixed in 10 mL of dry toluene. The solution was bubbled with nitrogen for 15 min. Pd$_2$(dba)$_3$ (0.082 g, 0.09 mmol), 2-dicyclohexylphosphino-2',6'-dimethoxybiphenyl (0.074 g, 0.18 mmol) and sodium t-butoxide (3.5 g, 3.6 mmol) were then added. The mixture was refluxed overnight under nitrogen. After cooling, the reaction mixture was filtered through celite/silica pad and the filtrate was concentrated under vacuum. The residue was then purified by column chromatography using gradient from hexane to THF:hexane (1:3, v/v) as the eluent. 0.40 g (33%) of a yellow solid was obtained as the product.

Synthesis of N-(3-bromophenyl)-N-phenyldibenzo[b,d]furan-2-amine

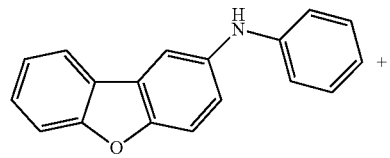

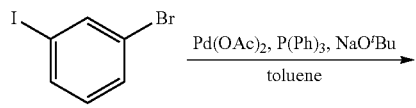

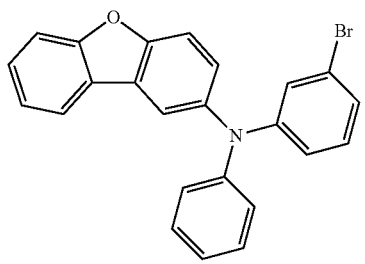

N-phenyldibenzo[b,d]furan-2-amine (5.0 g, 19.3 mmol), and 1-bromo-3-iodobenzene (10.9 g, 38.6 mmol) were mixed in 100 mL of toluene. The solution was bubbled with nitrogen for 15 min. Pd(OAc)$_2$ (0.22 g, 1.0 mmol), triphenylphosphine (0.51 g, 1.9 mmol) and sodium t-butoxide (2.2 g, 23.1 mmol) were then added. The mixture was refluxed overnight under nitrogen. After cooling, the reaction mixture was filtered through celite/silica pad and the filtrate was concentrated under vacuum. The residue was then purified by column chromatography using DCM:hexane (1:1, v/v) as the eluent. 5.6 g (71%) of a yellow solid was obtained as the product.

Synthesis of N-phenyl-N-(3-(4,4,5,5-tetramethyl-1,3,2-dioxaborolan-2-yl)phenyl)dibenzo[b,d]furan-2-amine

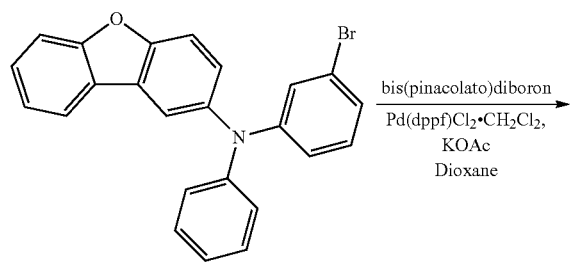

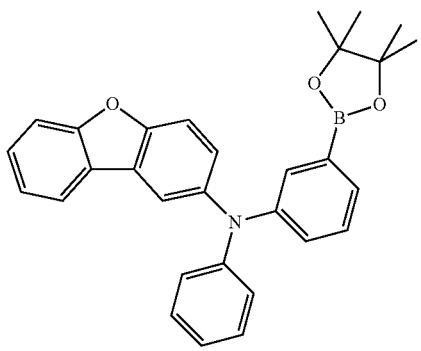

N-(3-bromophenyl)-N-phenyldibenzo[b,d]furan-2-amine (5.3 g, 12.8 mmol), bis(pinacolato)diboron (11.4 g, 44.8 mmol) and KOAc (3.77 g, 38.4 mmol) were mixed in 130 mL of dry 1,4-dioxane. The solution was bubbled with nitrogen for 15 minutes, then Pd(dppf)Cl$_2$·CH$_2$Cl$_2$ (0.28 g, 0.4 mmol) was added. The mixture was refluxed overnight under nitrogen. After cooling, the reaction mixture was filtered through celite/silica pad and the solvent was then concentrated. The residue was then purified by column chromatography using DCM:hexane (1:3, v/v) as the eluent. 5.21 g (88%) of a white solid was obtained as the product.

Synthesis of N-(3-(9H-carbazol-3-yl)phenyl)-N-phenyldibenzo[b,d]furan-2-amine

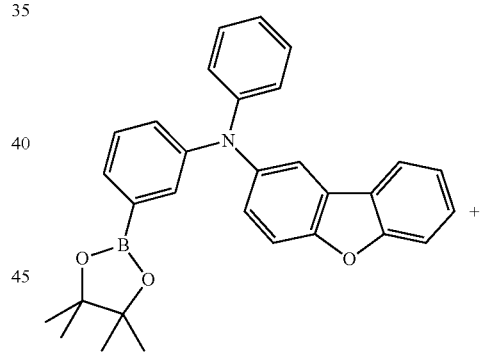

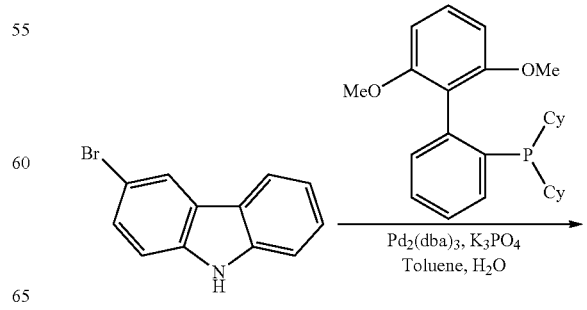

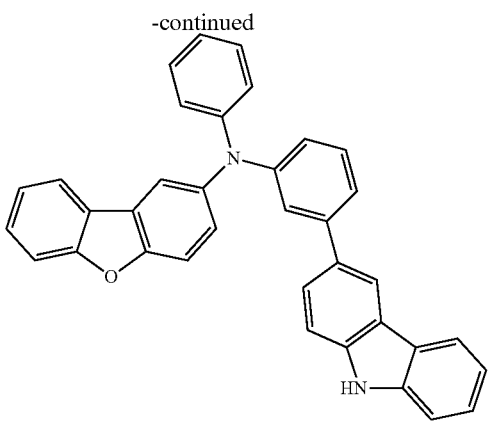

N-phenyl-N-(3-(4,4,5,5-tetramethyl-1,3,2-dioxaborolan-2-yl)phenyl)dibenzo[b,d]furan-2-amine (3.25 g, 7.0 mol), and 3-bromo-9H-carbazole (1.73 g, 7.0 mmol) were mixed in 45 mL of toluene and 15 mL of ethanol. To the solution was bubbled with nitrogen for 15 min. Pd$_2$(dba)$_3$ (0.16 g, 0.18 mmol), 2-dicyclohexylphosphino-2',6'-dimethoxybiphenyl (0.29 g, 7.0 mmol) and K$_3$PO$_4$ (4.49 g, 21.1 mmol) were then added. The mixture was refluxed overnight under nitrogen.

After cooling, aqueous layer was removed from the reaction mixture and dry over magnesium sulfate, and was filtered through filter paper and the solvent was then concentrated. The residue was then purified by column chromatography using THF:hexane (1:3, v/v) as the eluent. 3.0 g (85%) of a whited solid was obtained as the product.

Synthesis of Compound O-10-31-H

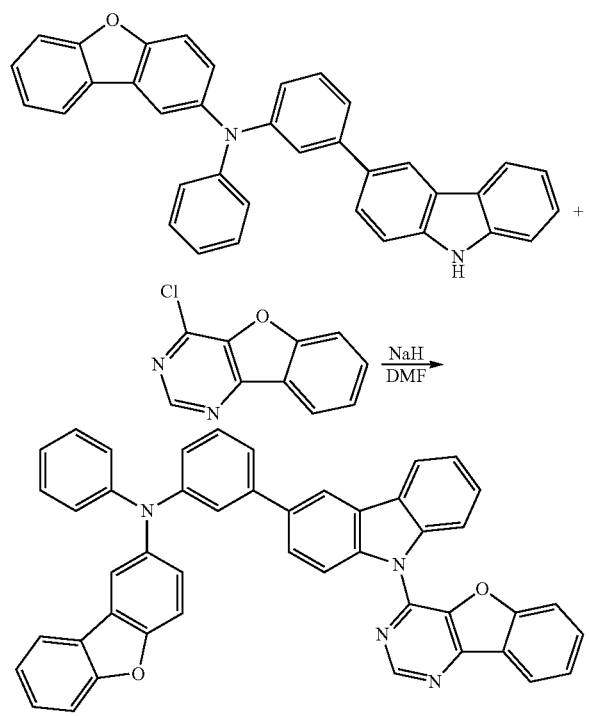

N-(3-(9H-carbazol-3-yl)phenyl)-N-phenyldibenzo[b,d]furan-2-amine (2.5 g, 5.0 mmol) and sodium hydride (0.34 g, 8.5 mmol) were mixed in 30 mL of dry DMF. The solution was stirred for 1 hour at room temperature. 4-chlorobenzofuro[3,2-d]pyrimidine (1.9 g, 9.5 mmol) was added. The mixture was stirred overnight under nitrogen. The reaction mixture was poured into water and the precipitate was filtered. The residue was then purified by column chromatography using THF:hexane (1:3, v/v) as the eluent. 2.4 g (74%) of a pale yellow solid was obtained as the product.

Photoluminescence (PL) and Device Examples

Photoluminescence and photoluminescence quantum yield (PLQY) experiments were carried out and summarized in Table 2. Poly(methyl methacrylate) (PMMA) doped film (95:5 by weight of PMMA:emitter) were fabricated by solution drop casting on quartz substrates. High PL quatum yields were obtained for Compound S-10-144-H, Compound O-10-144-H and Compound O-10-10-H.

TABLE 2

| Compound | PLQY in PMMA film (%) | Em$_{max}$ in PMMA film (nm) |
|---|---|---|
| S-10-144-H | 75% | 452 |
| S-17-144-H | 27% | 455 |
| O-10-144-H | 80% | 458 |
| O-10-10-H | 69% | 476 |

Solvatochromism experiments were carried out and summarized in Table 3. Photoluminescence spectra of Compound O-10-144-H and Compound O-10-10-H in solvents with different polarity were obtained at room temperature, and bathochromic shift was observed as the polarity of the solvent increased, suggesting the emissive origin of these classes of compound arised from donor-acceptor based CT state.

TABLE 3

| Compound | Em$_{max}$ in 3-methylpentane (nm) | Em$_{max}$ in toluene (nm) | Em$_{max}$ in 2-methyltetrahydrofuran (nm) |
|---|---|---|---|
| O-10-144-H | 427 | 468 | 506 |
| O-10-10-H | 437 | 491 | 567 |

Compound O-10-144-H and Compound O-10-10-H were tested as emitters in OLEDs. In the OLED experiment, all device examples were fabricated by high vacuum (<10$^{-7}$ Torr) thermal evaporation. The anode electrode is ~800 Å of indium tin oxide (ITO). The cathode consisted of 10 Å of LiF followed by 1,000 Å of Al. All devices were encapsulated with a glass lid sealed with an epoxy resin in a nitrogen glove box (<1 ppm of H$_2$O and O$_2$) and a moisture getter was incorporated inside the package.

The organic stack of the Device Example 1 consisted of sequentially, from the ITO surface, 100 Å of LG101 (LG Chem, Korea) as the hole injection layer (HIL), 300 Å of Compound A as the hole transporting layer (HTL), 300 Å of Compound B doped with 5% of Compound O-10-10-H as the emissive layer (EML), 50 Å of Compound C as the ETL2 and 400 Å of LG-201 (LG Chem, Korea) as the ETL1. The maximum external quantum efficiency was 4.5%. CIE was 0.167, 0.287.

Device Example 2 was the same as Device Example 1 except that Compound O-10-10-H is replaced with Compound O-10-144-H. The maximum external quantum efficiency is 3.8%. CIE is 0.144, 0.192.

Device Example 3 consisted of sequentially, from the ITO surface, 100 Å of LG101 (LG Chem, Korea) as the hole injection layer (HIL), 300 Å of Compound D as the hole transporting layer (HTL), 300 Å of Compound O-10-144-H as the emissive layer (EML), 50 Å of Compound E as the ETL2 and 400 Å of LG-201 (LG Chem, Korea) as the ETL1. The maximum external quantum efficiency was 6.2%. CIE was 0.199, 0.398.

Device Example 4 consisted of sequentially, from the ITO surface, 100 Å of LG101 (LG Chem, Korea) as the hole injection layer (HIL), 300 Å of Compound D as the hole transporting layer (HTL), 300 Å of Compound B doped with 10% of Compound O-10-144-H as the emissive layer (EML), 400 Å of Compound F as the ETL. The maximum external quantum efficiency was 11.0%. CIE was 0.141, 0.182. The high device external quamtum efficiency (EQE) of Device Examples 1 and 2 shows that donor-acceptor compounds of Formula 1 are efficient emitters for OLEDs. The high device external quamtum efficiency also suggests that triplet excition may be converted into emissive singlet excition via the delayed fluorescence mechanism.

Compound A

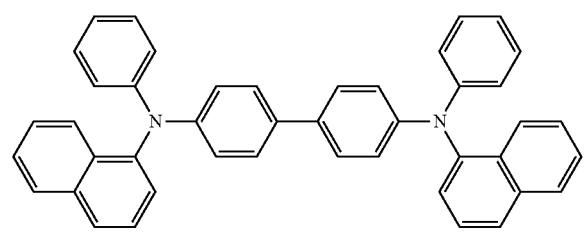

Compound B

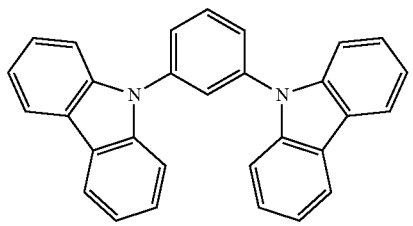

Compound C

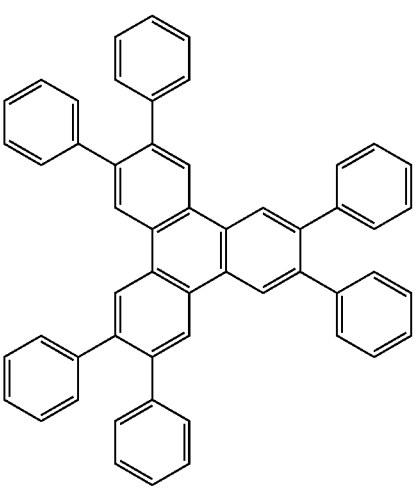

Compound D

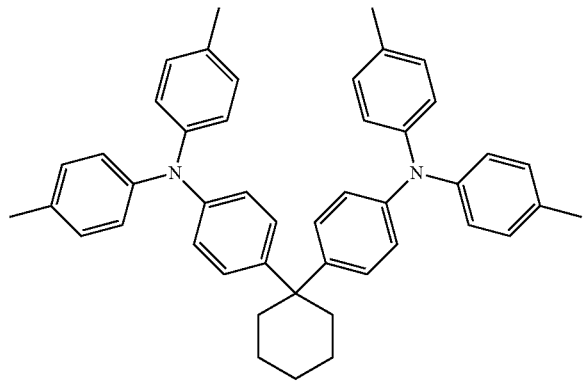

Compound E

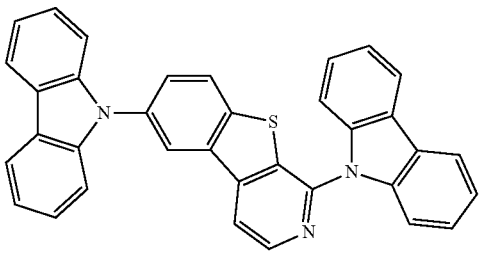

Compound F

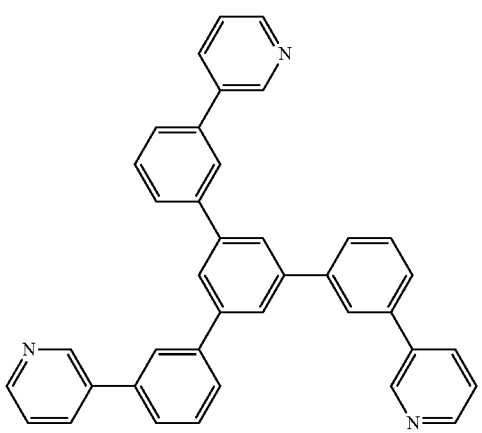

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A compound having the formula:

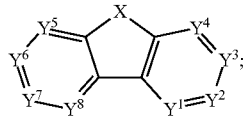

Formula 1 wherein each of $Y^1$ to $Y^8$ is C—R or N;
wherein at least two of $Y^1$ to $Y^8$ is N;
wherein at least one of $Y^1$ to $Y^8$ is C—R;
X is O, S, or Se;
each R is independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof;
wherein at least one of the R is selected from the group consisting of

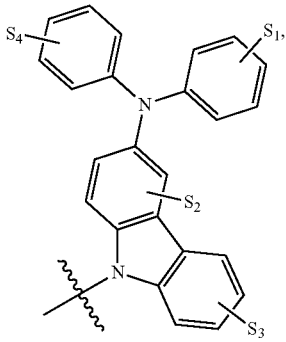

D3

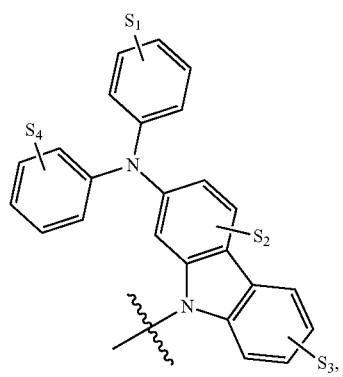

D4

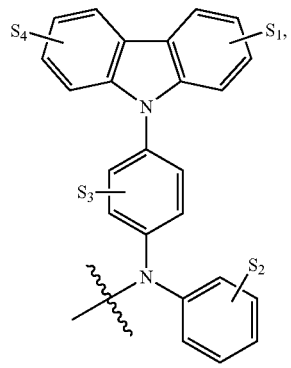

D5

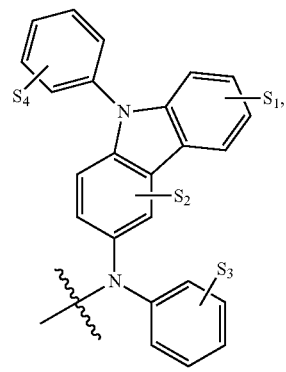

D6

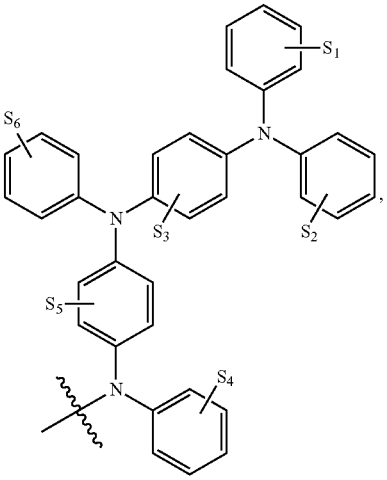

D7

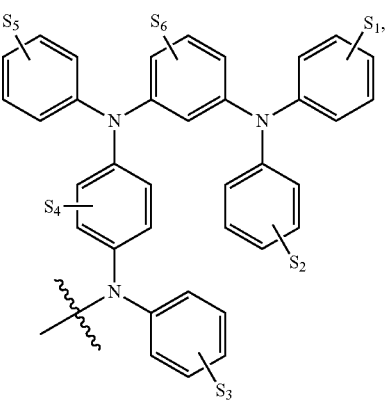

D8

-continued
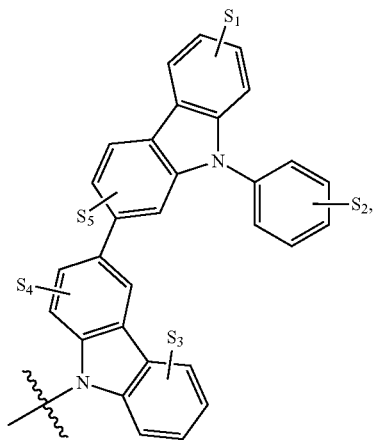
D9
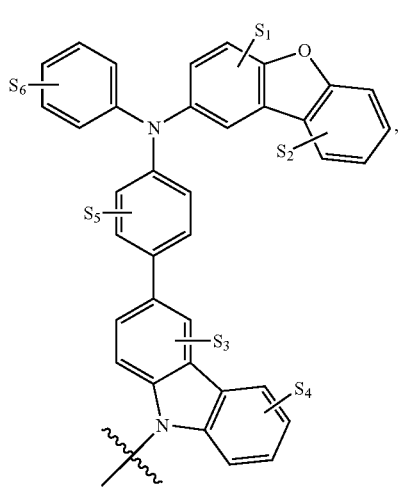
D10
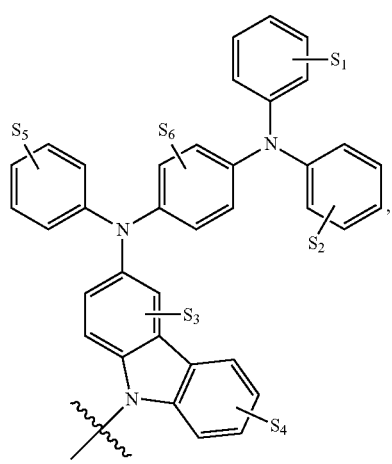
D11
-continued
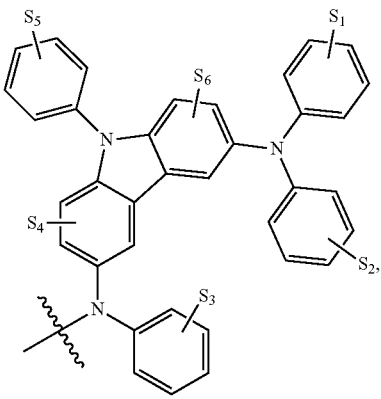
D12
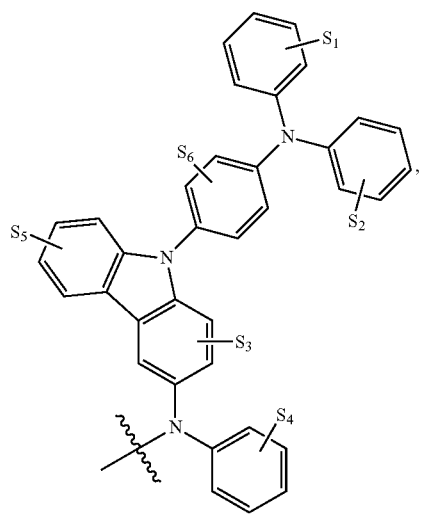
D13
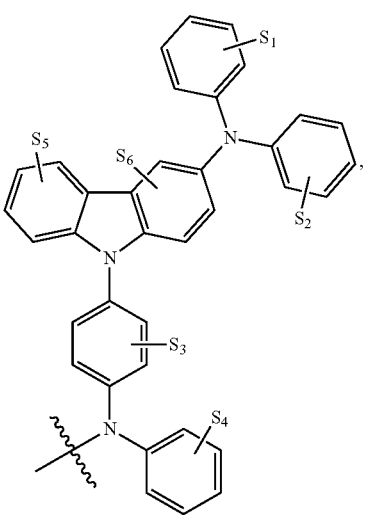
D14

-continued
D15
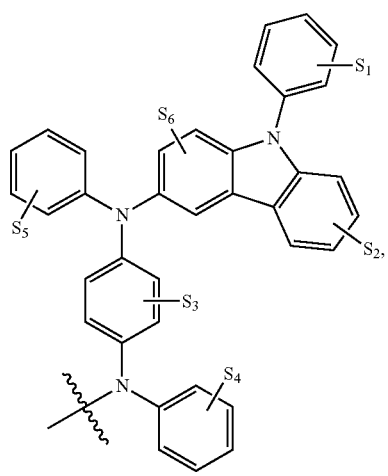
D16
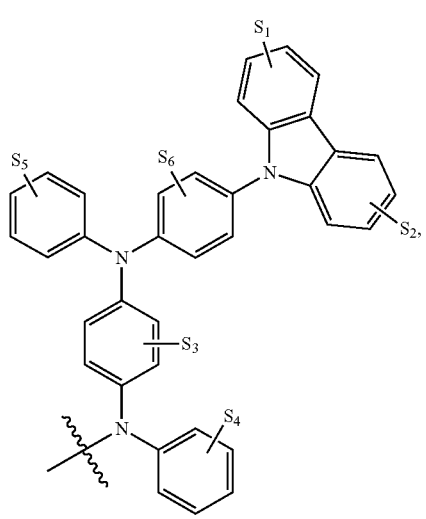
D17
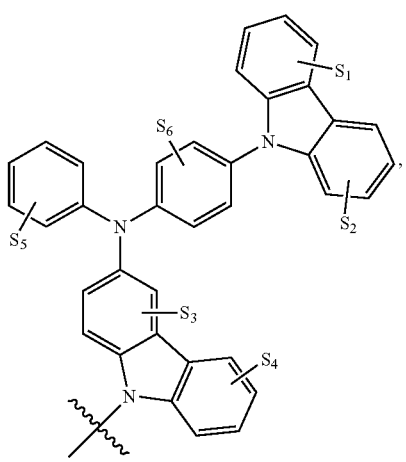
-continued
D18
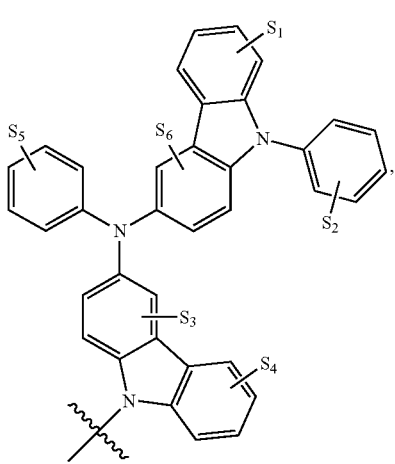
D19
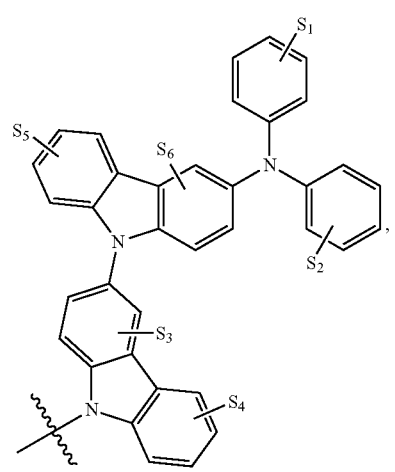
D20
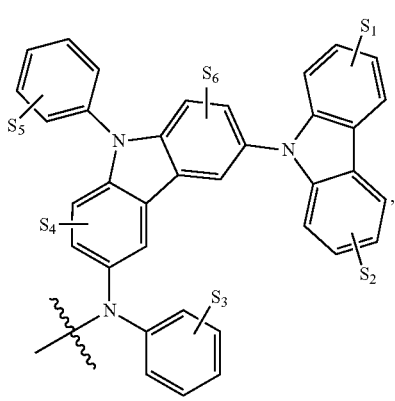

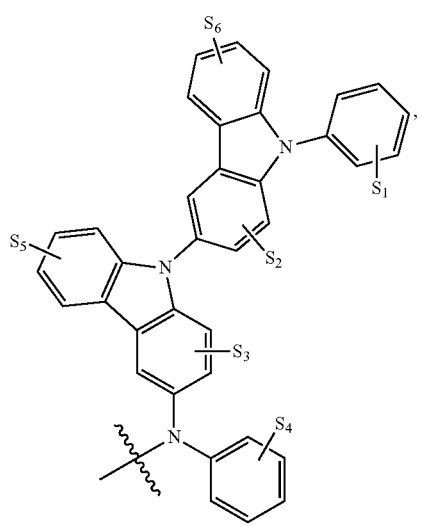
D21
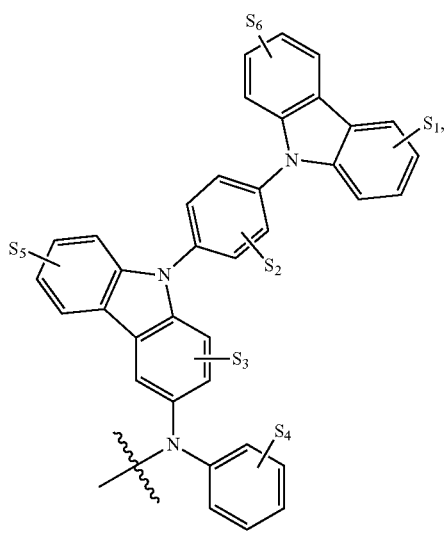
D22
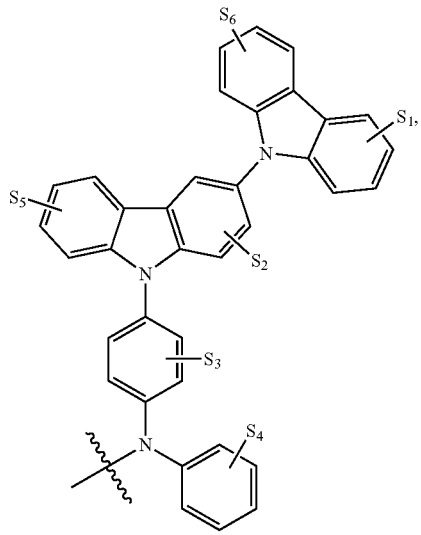
D23
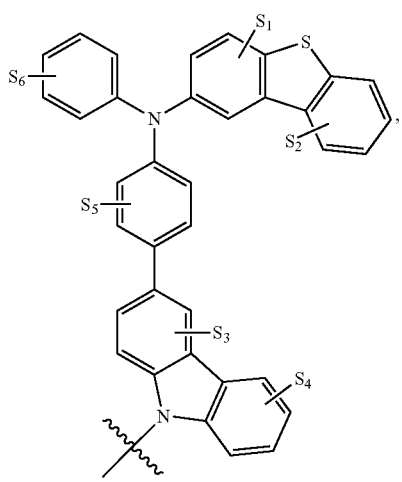
D30
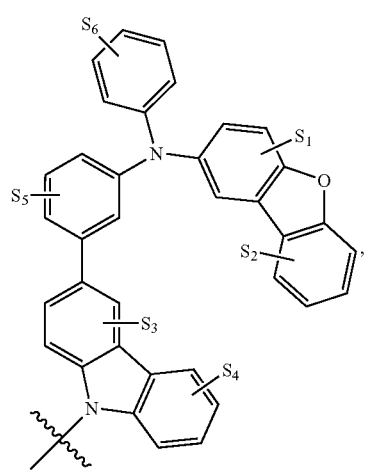
D31
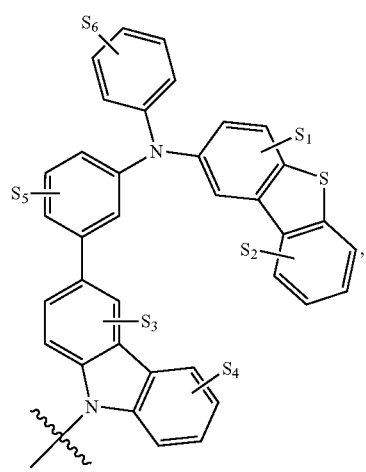
D32

-continued
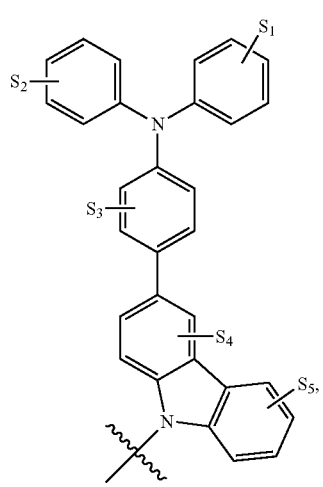 D33
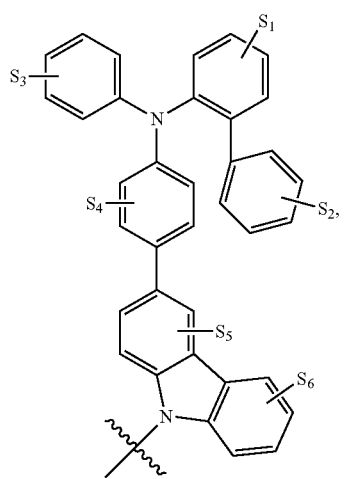 D34
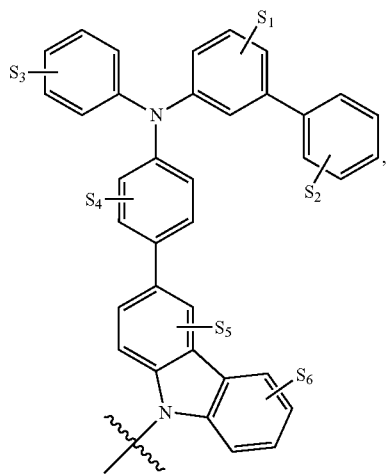 D35
-continued
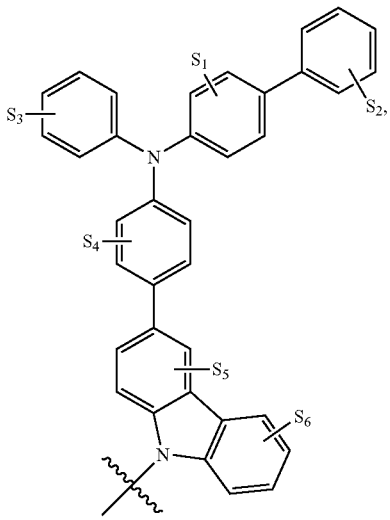 D36
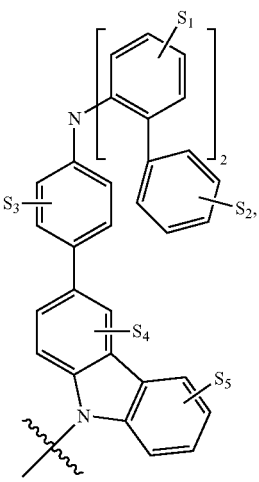 D37
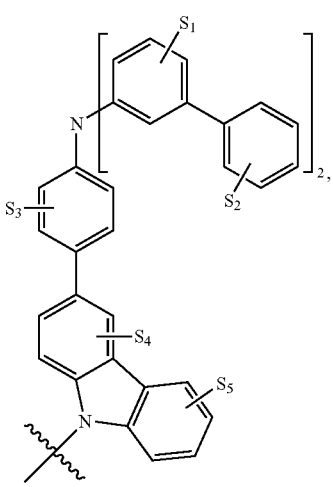 D38

D39
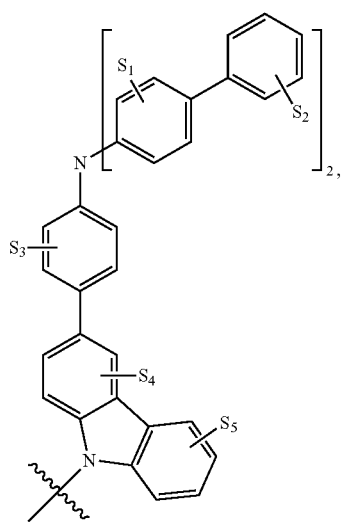
D40
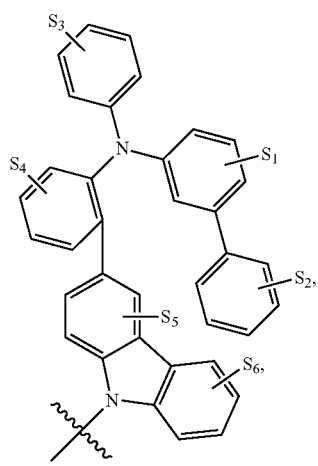
D41
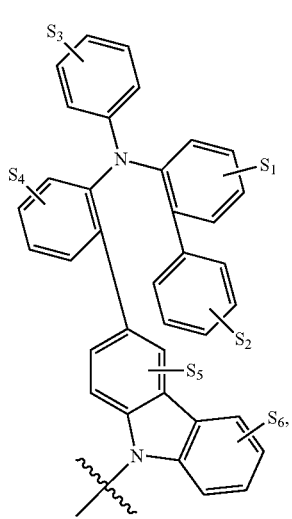
D42
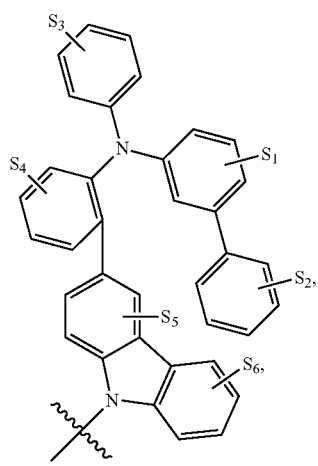
D43
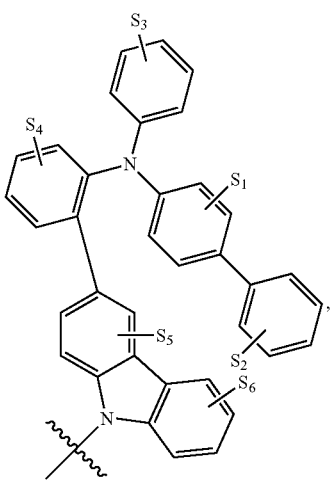
D44
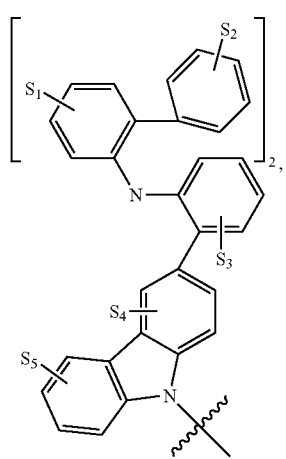

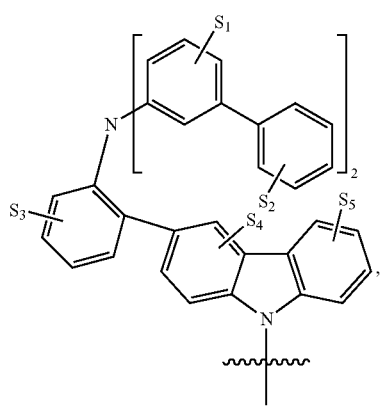 D45
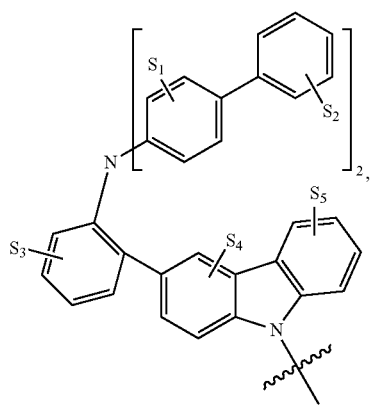 D46
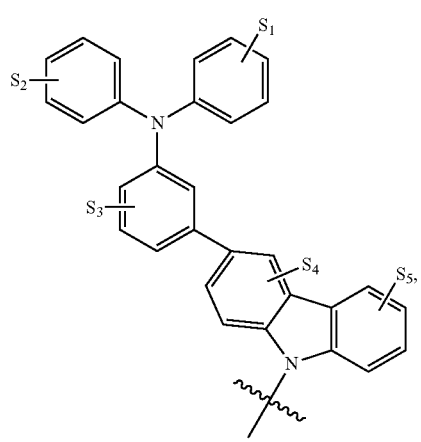 D47
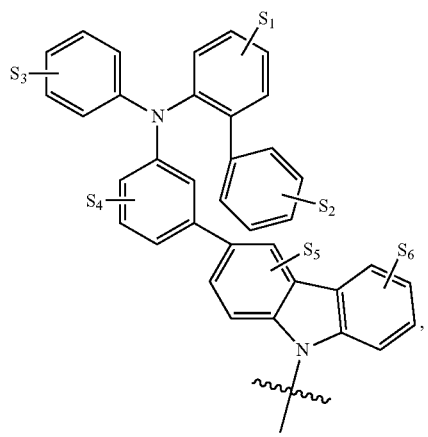 D48
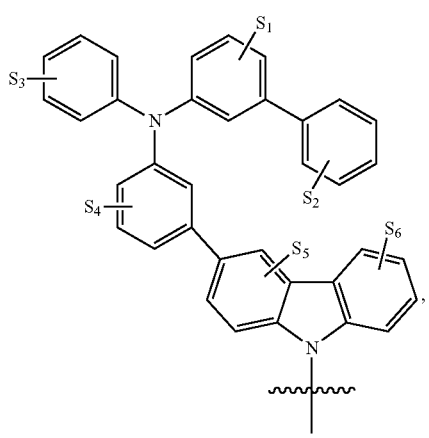 D49
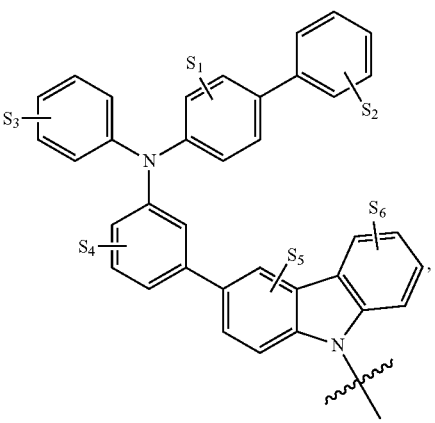 D50

D51
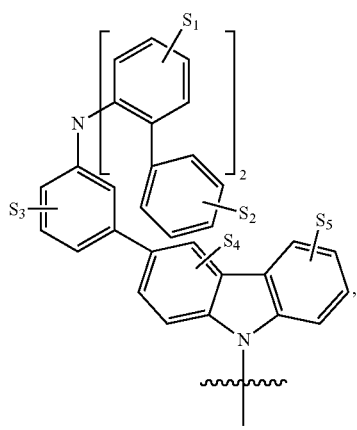
D52
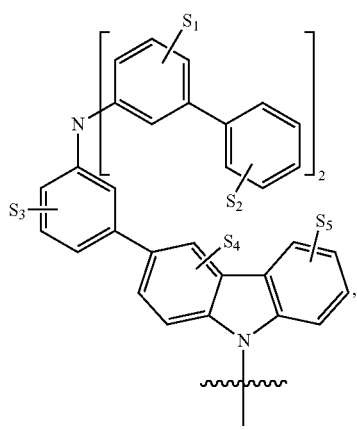
D53
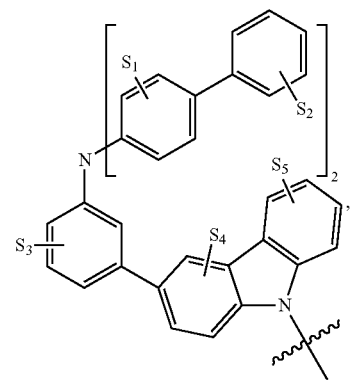
D54
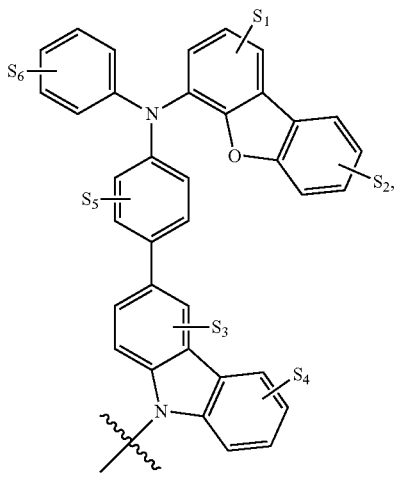
D55
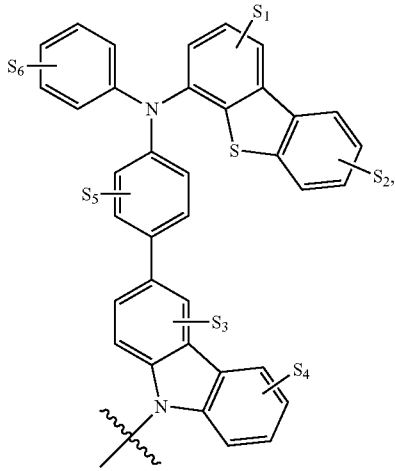
D56
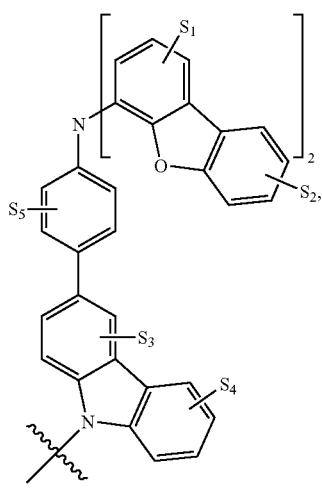

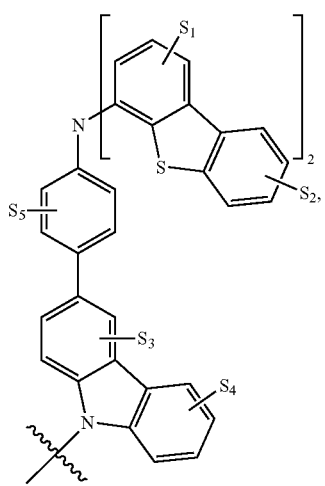
D57
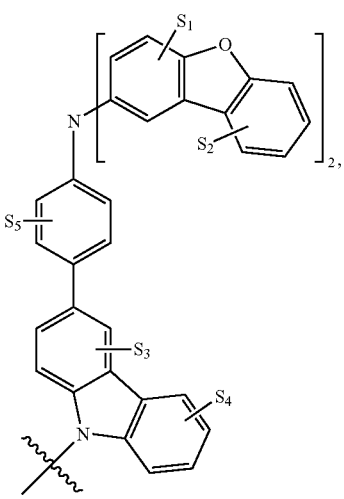
D60
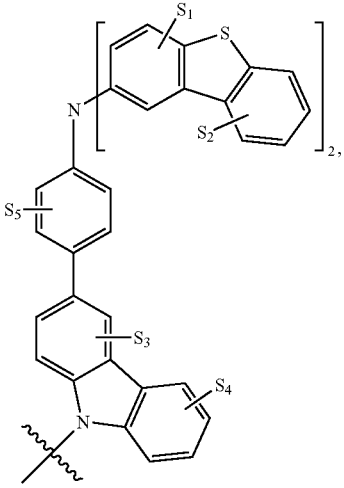
D61
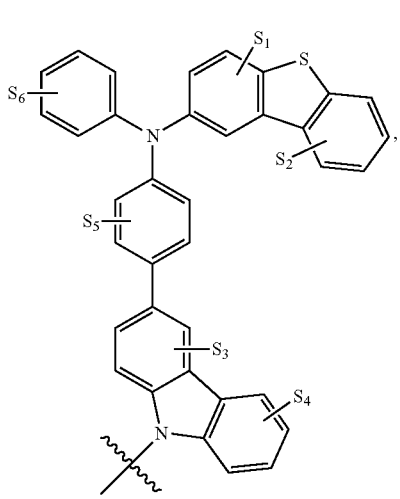
D58
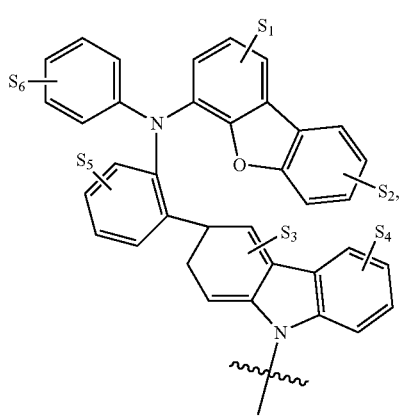
D59
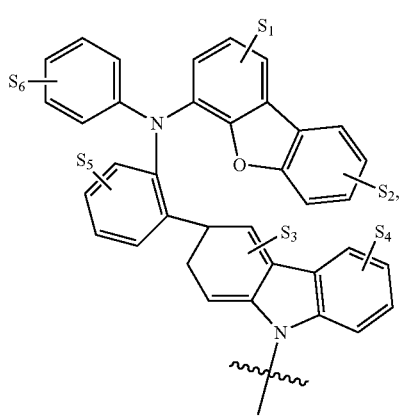
D62

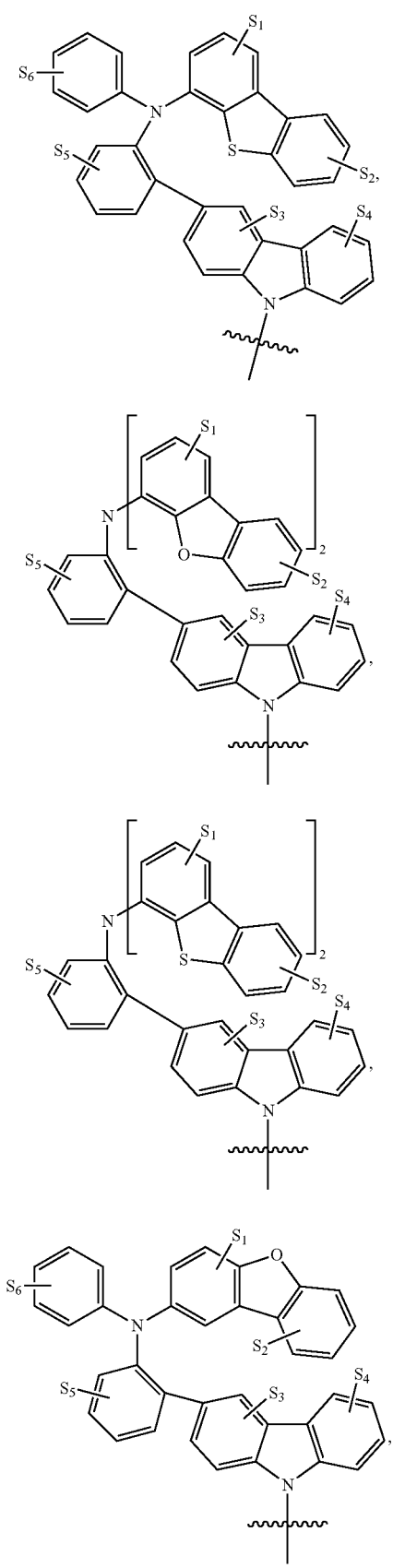
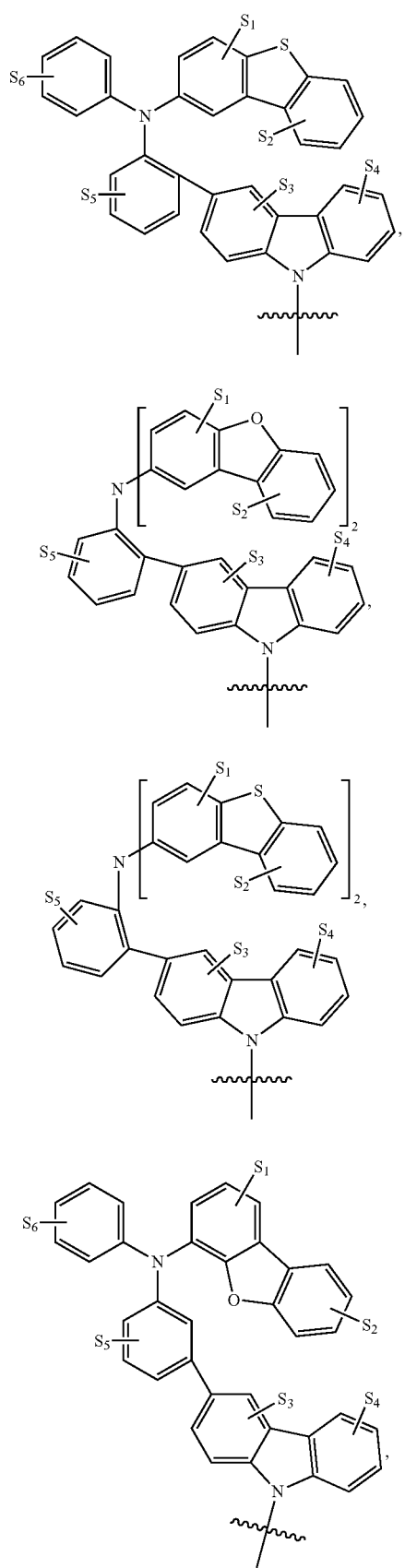

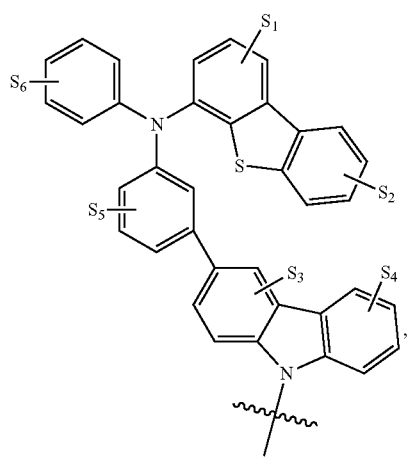
D71
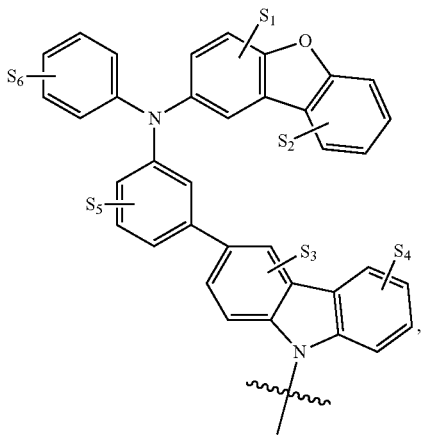
D74
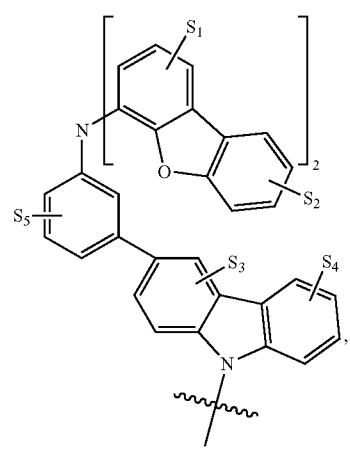
D72
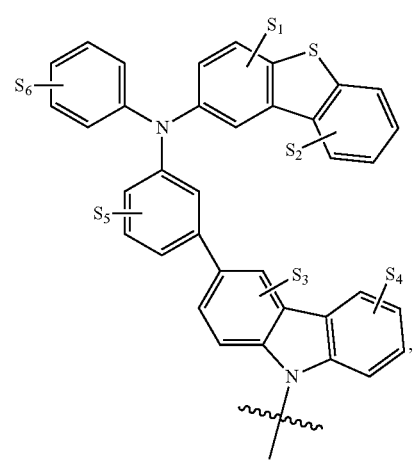
D75
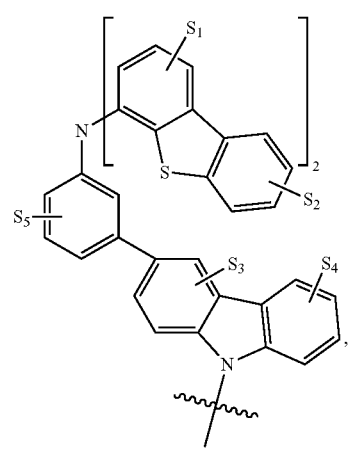
D73
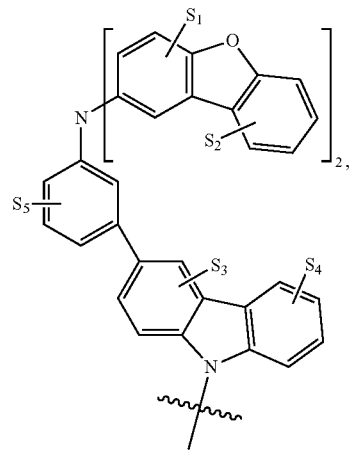
D76

-continued
D77
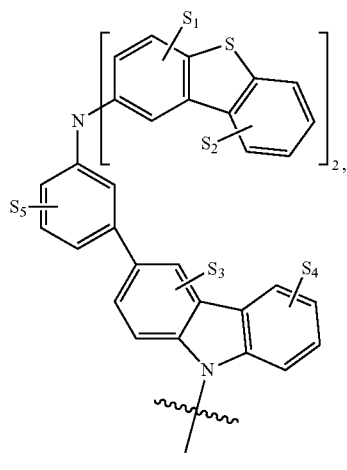
D78
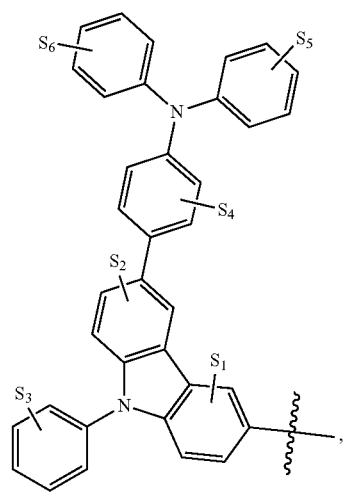
D79
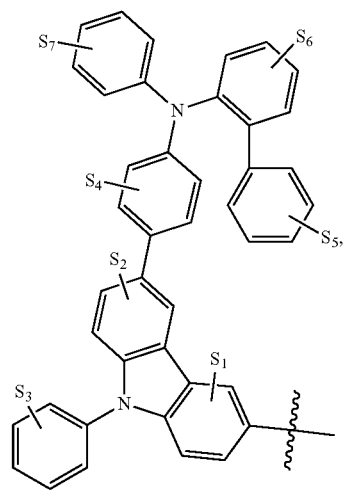
-continued
D80
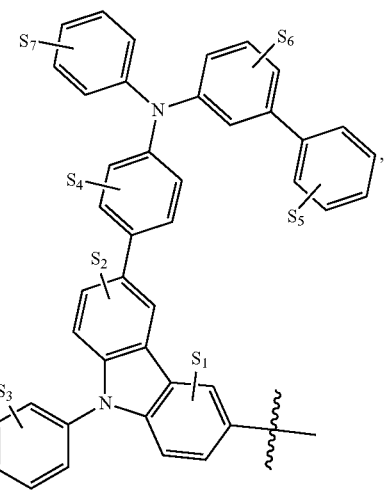
D81
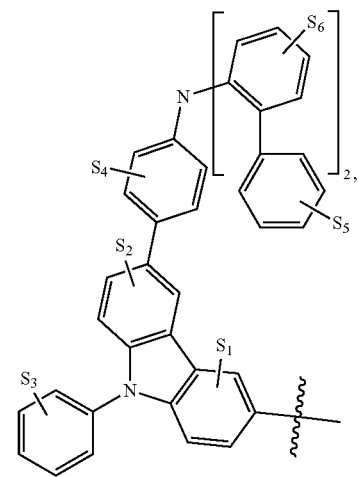
D82

-continued
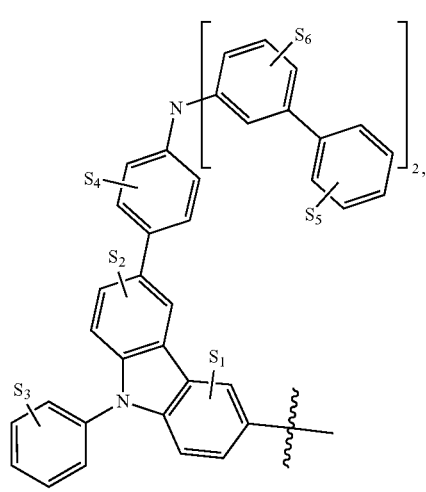
D83
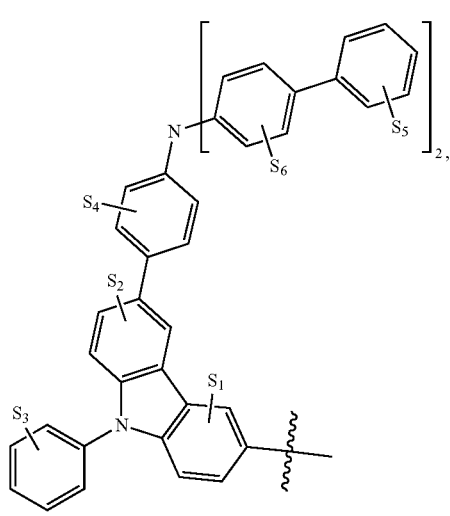
D84
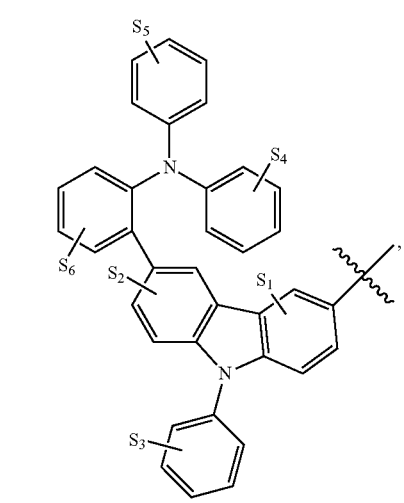
D85
-continued
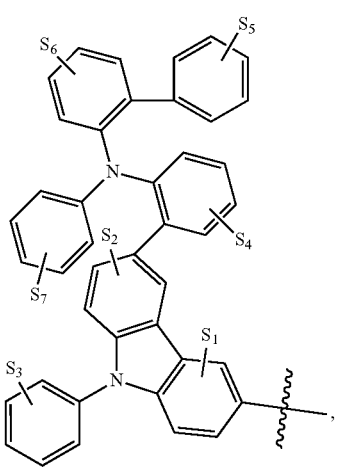
D86
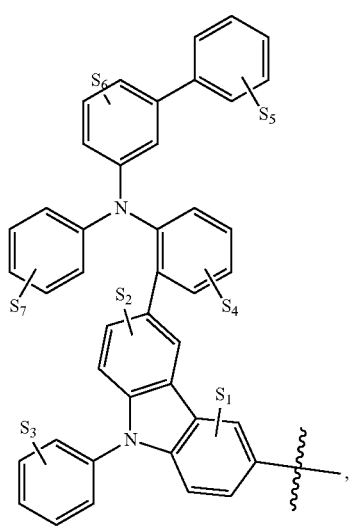
D87
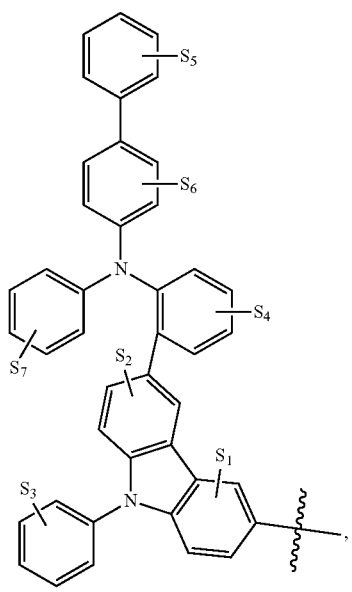
D88

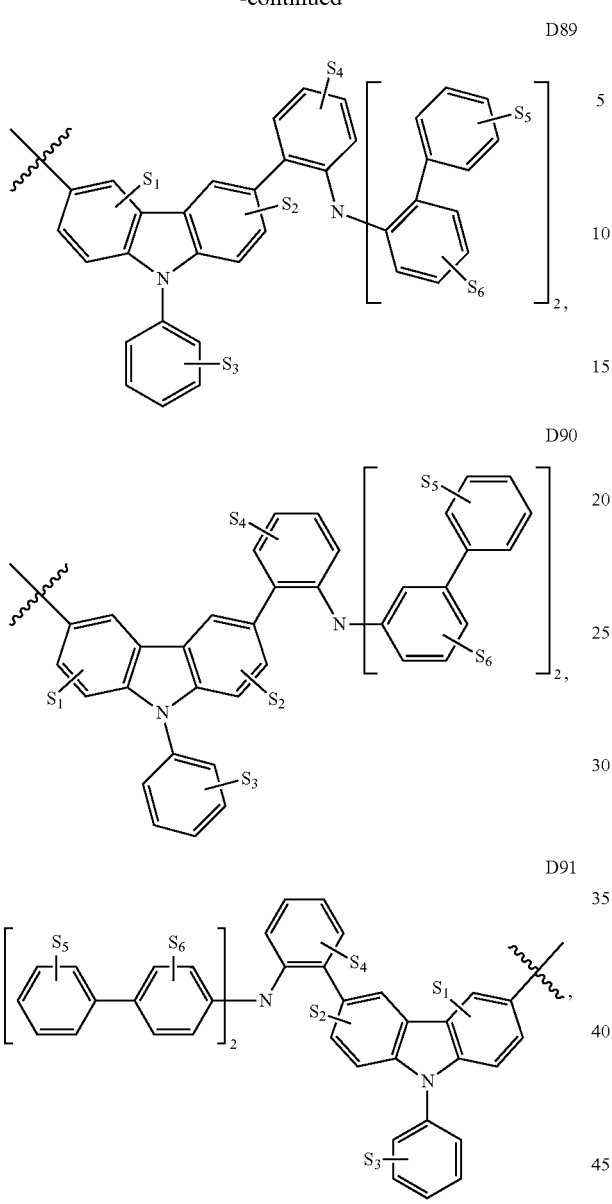
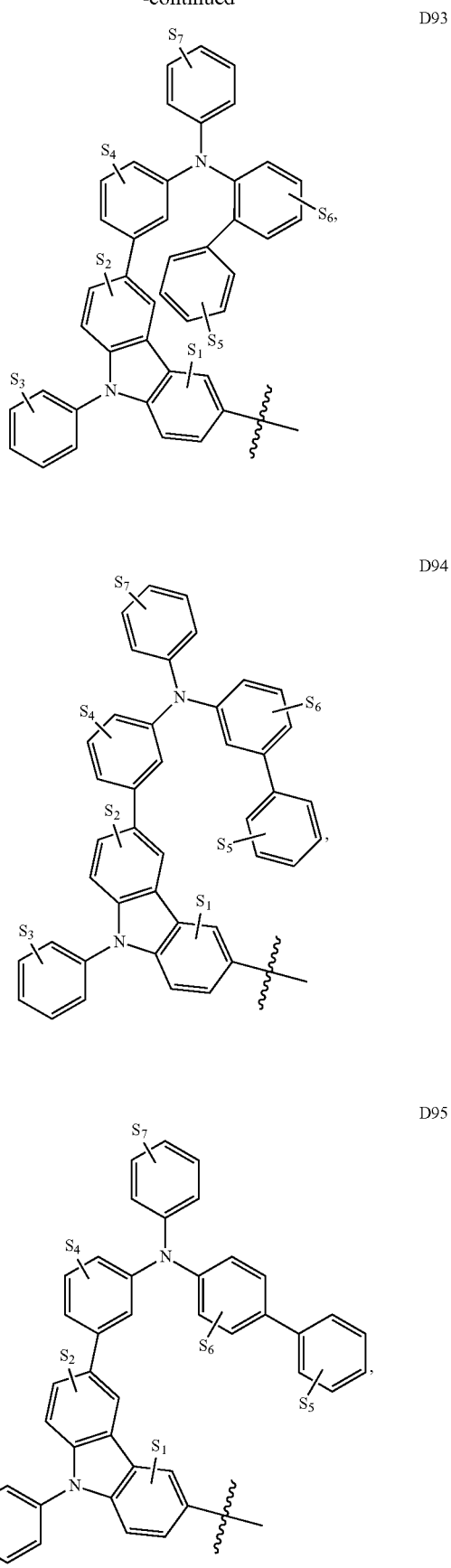

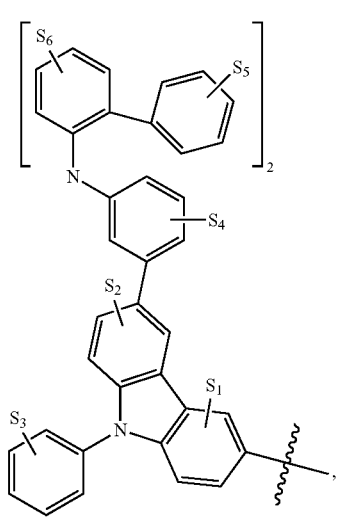
D96
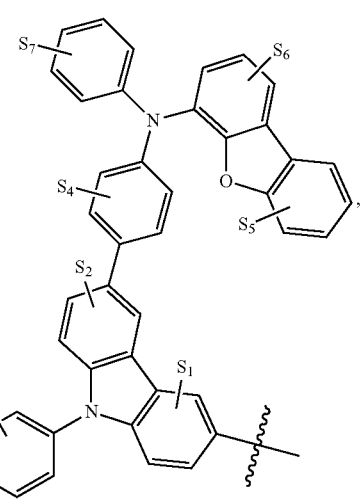
D99
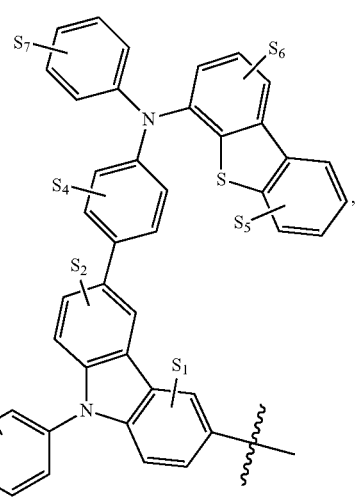
D100
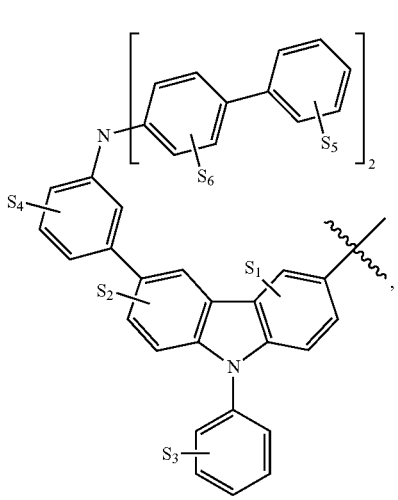
D98
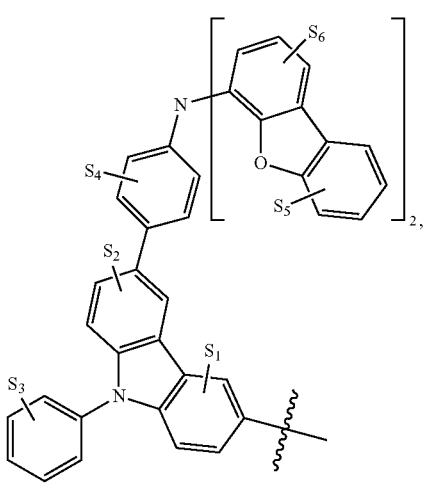
D101

D102
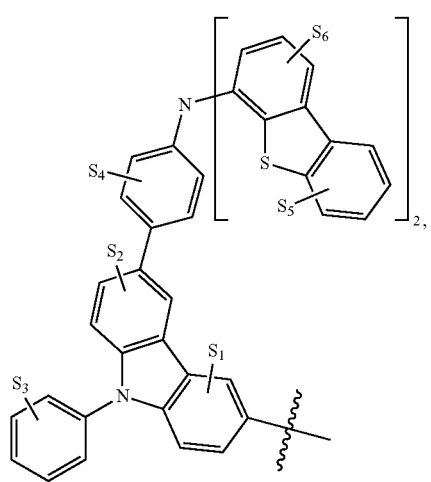
D103
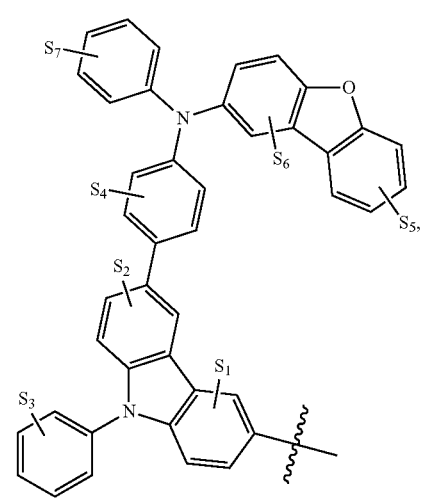
D104
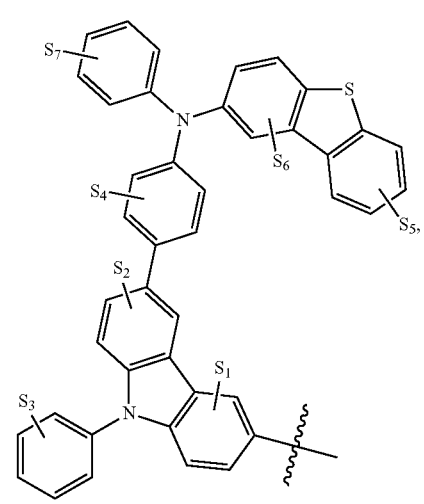
D105
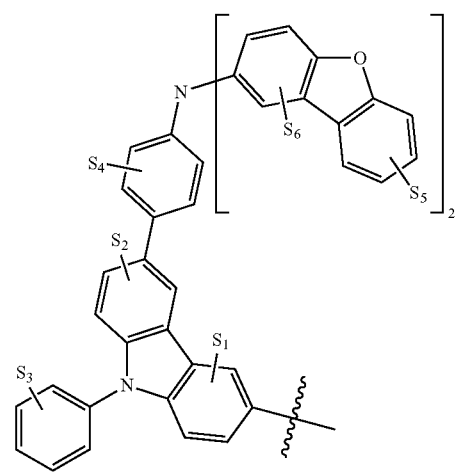
D106
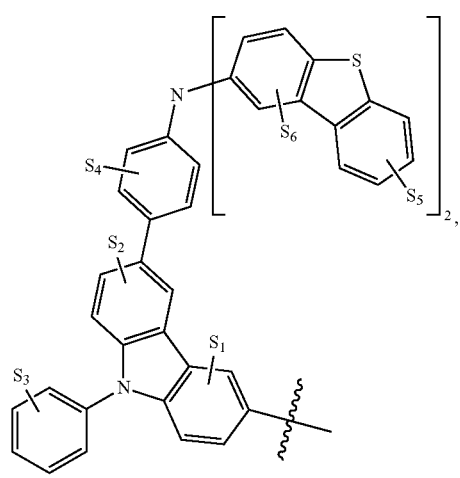
D107
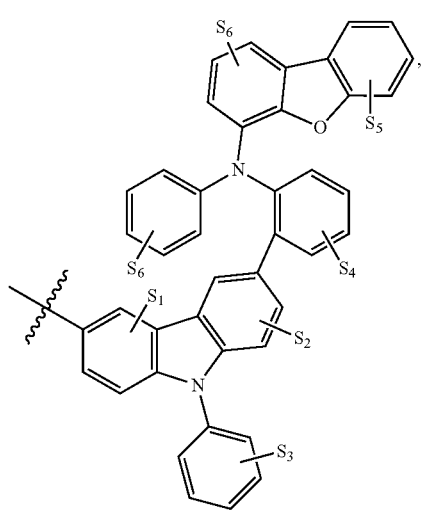

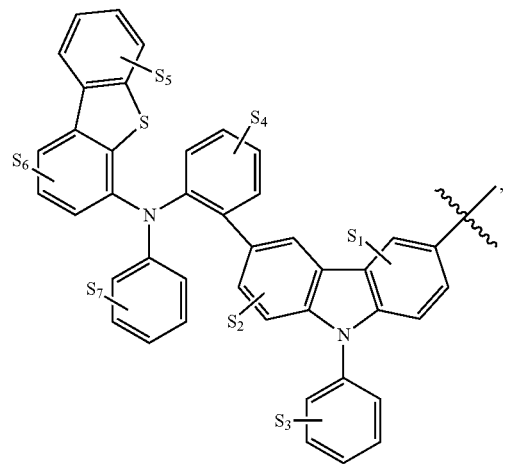
D108
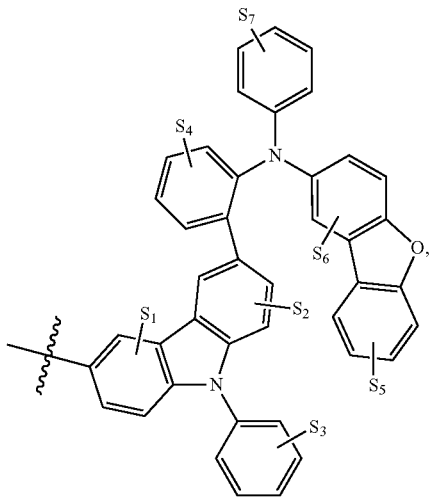
D111
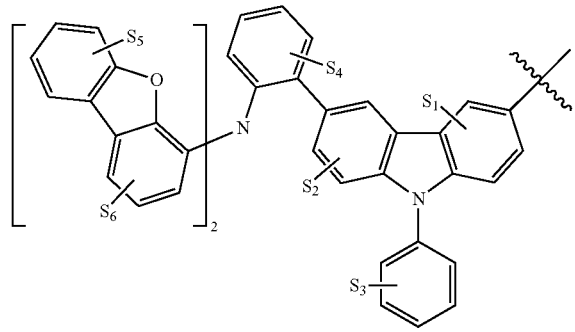
D109
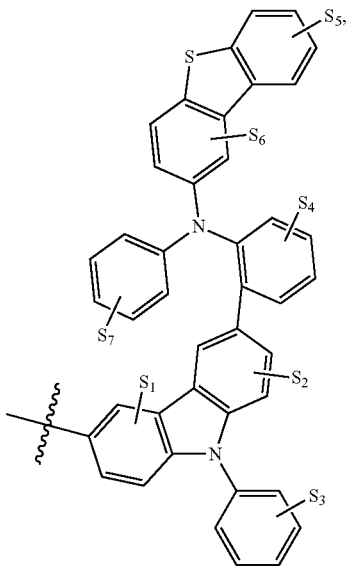
D112
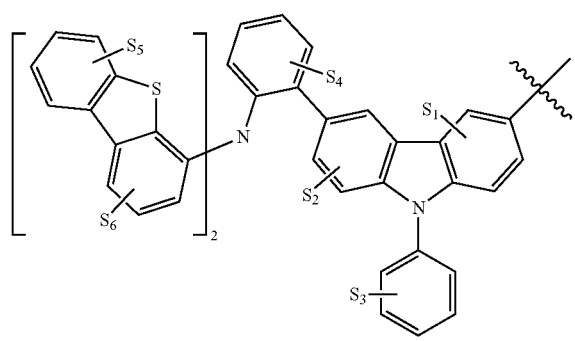
D110
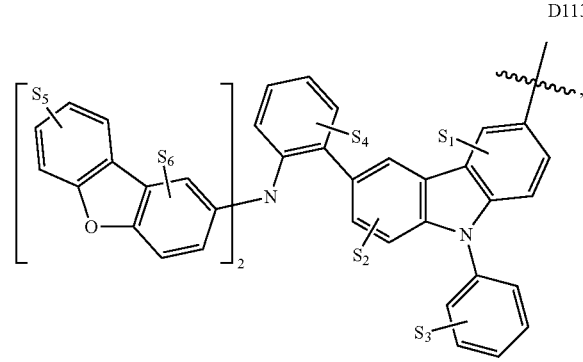
D113

-continued
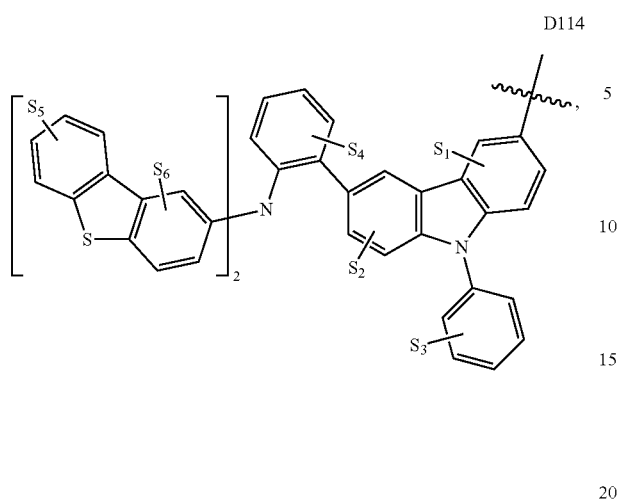
D114
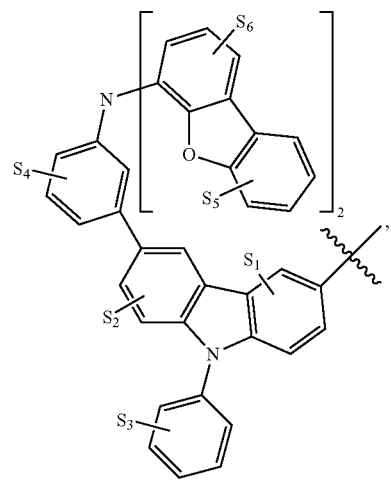
D117
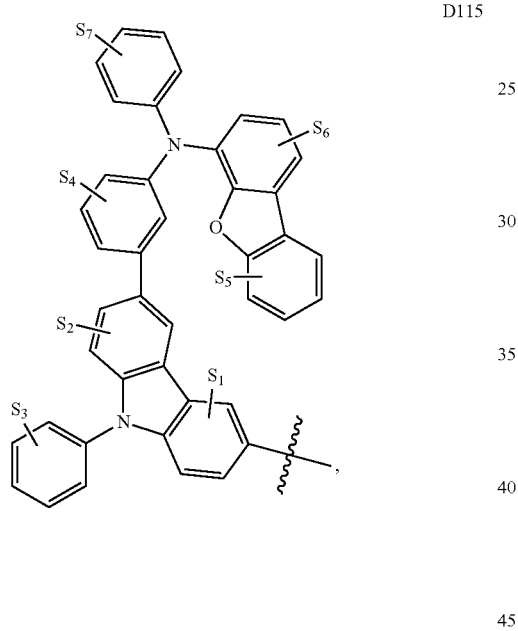
D115
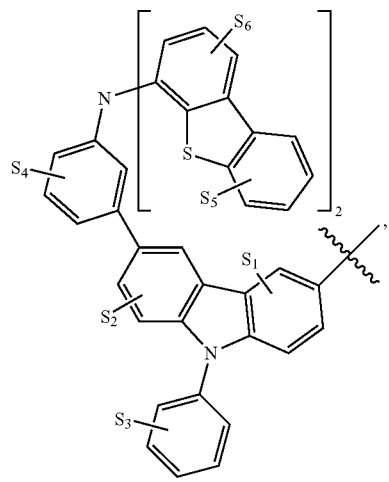
D118
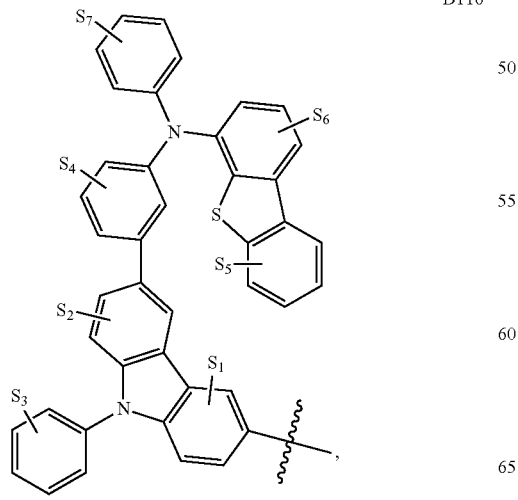
D116
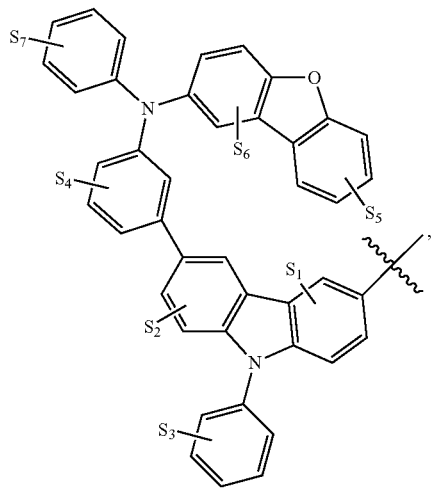
D119

-continued
D120
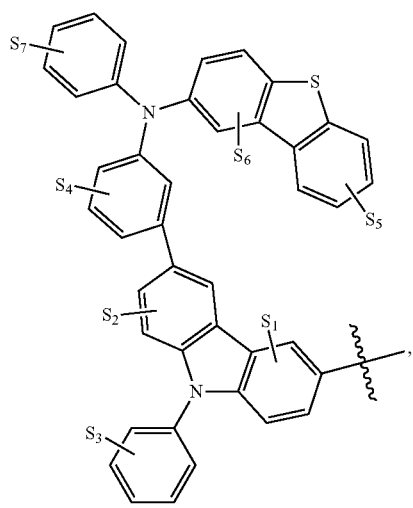
D121
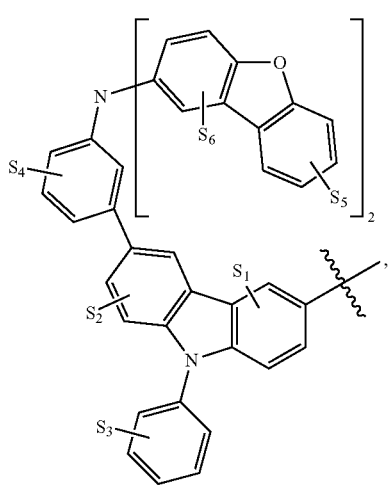
D122
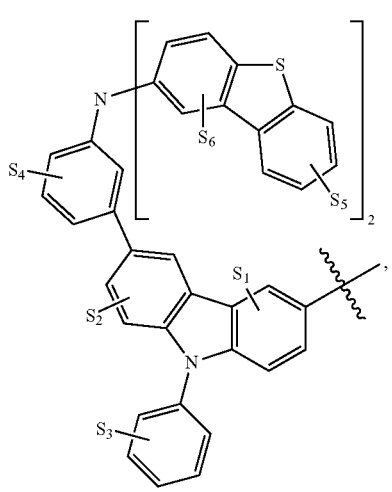
-continued
D123
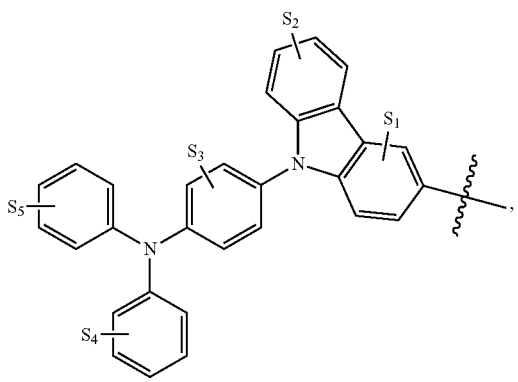
D124
D125
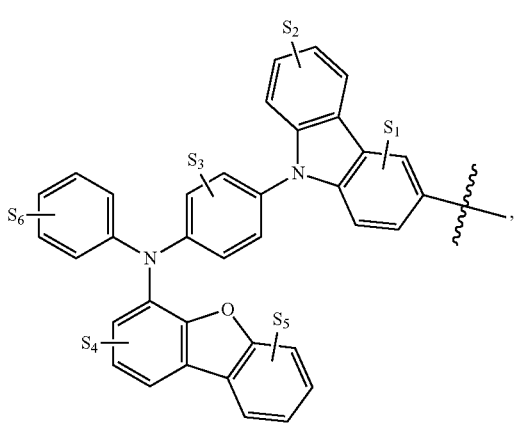

-continued
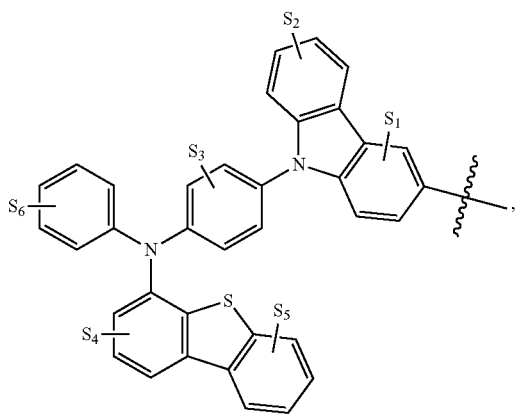
D126
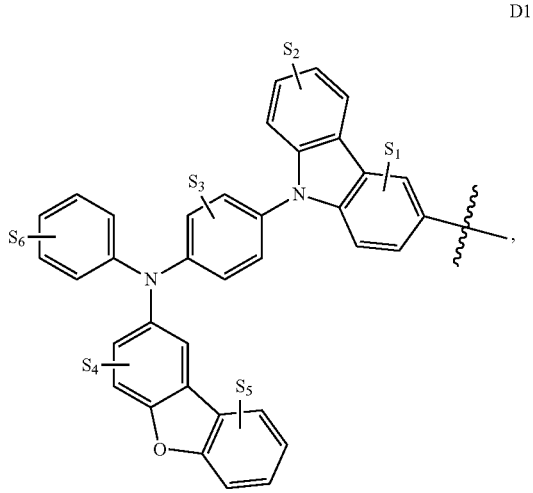
D127
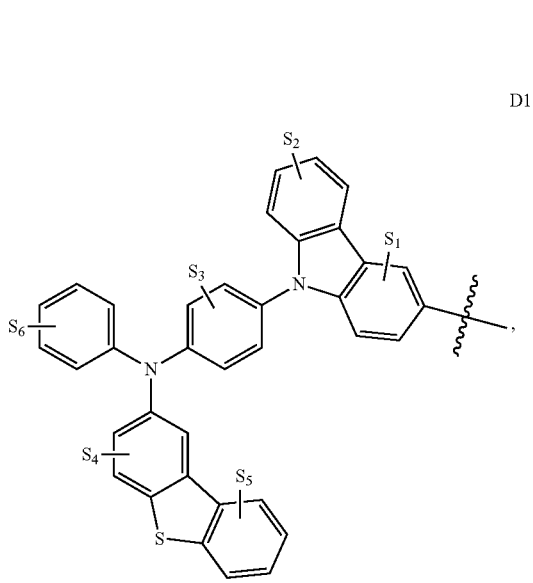
D128
-continued
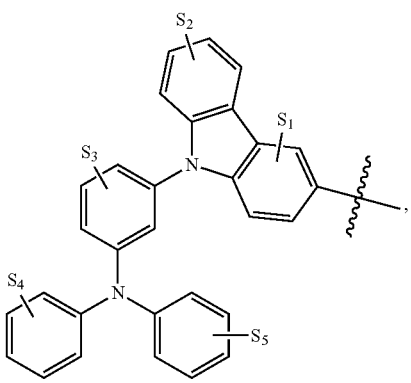
D129
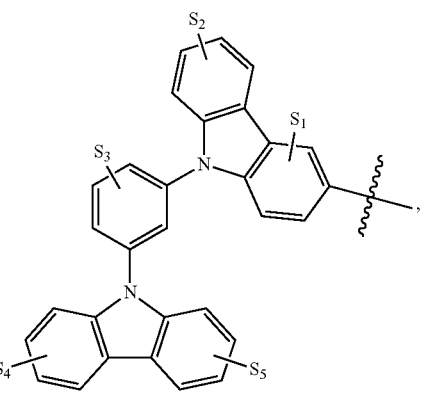
D130
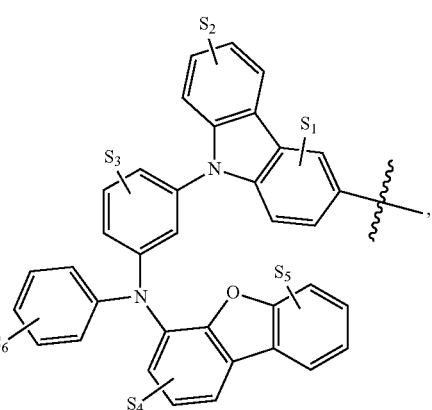
D131
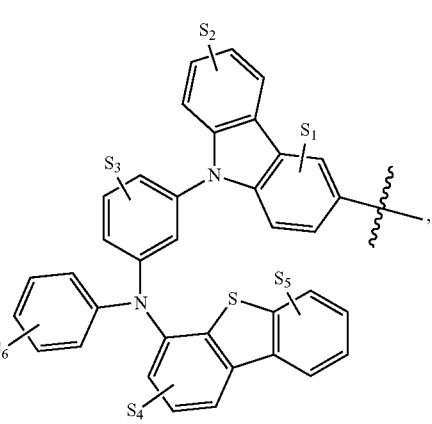
D132

-continued
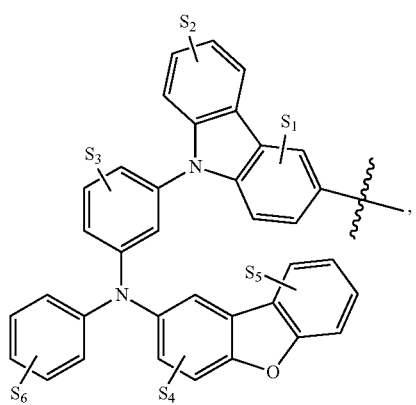
D133
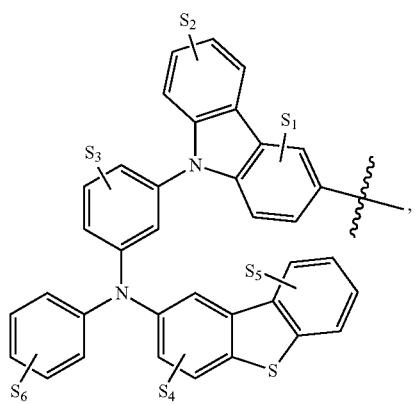
D134
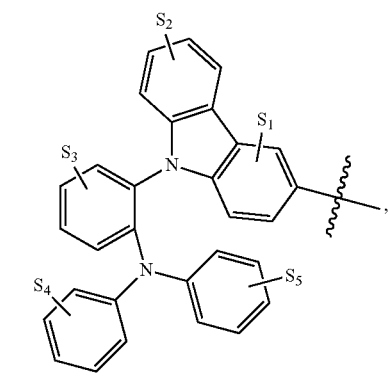
D135
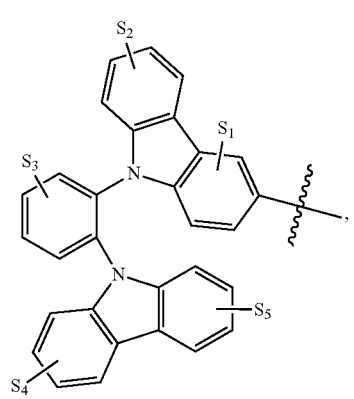
D136
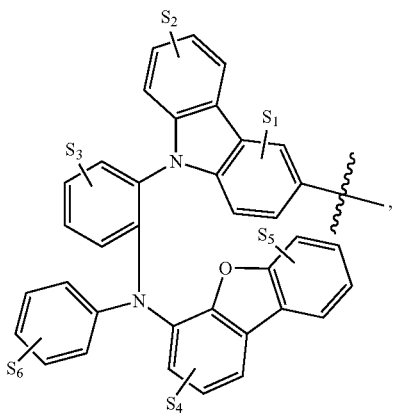
D137
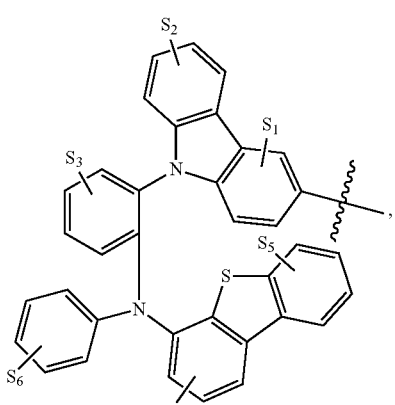
D138
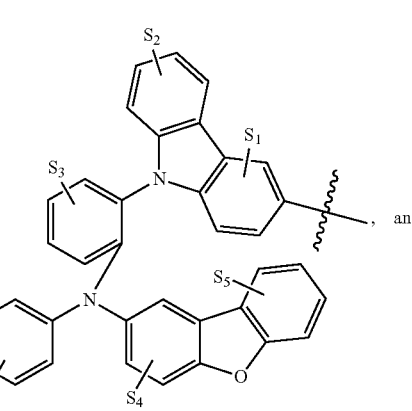
D139
, and
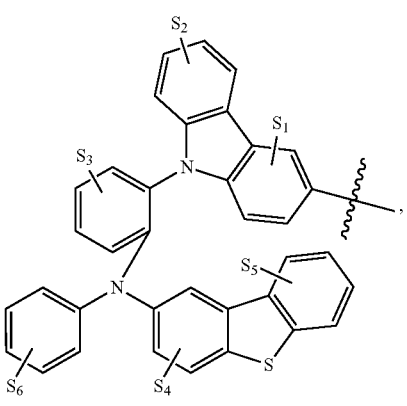
D140 wherein $S_1$ to $S_7$ represent mono, di, tri, tetra or penta substitutions with hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

2. The compound of claim 1, wherein the compound is selected from the group consisting of

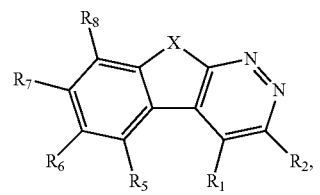
Formula 2

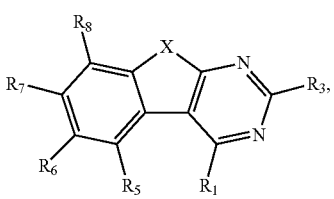
Formula 3

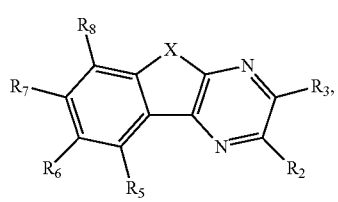
Formula 4

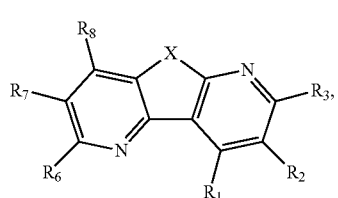
Formula 5

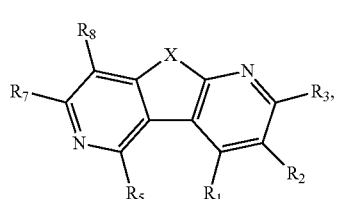
Formula 6

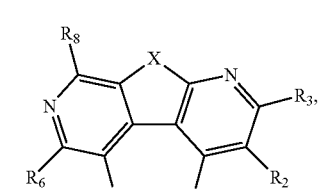
Formula 7

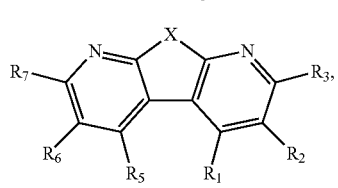
Formula 8

-continued

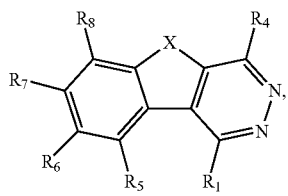
Formula 9

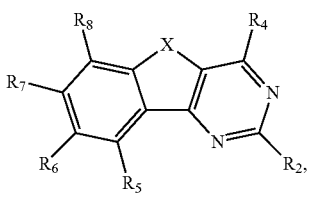
Formula 10

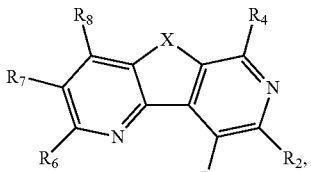
Formula 11

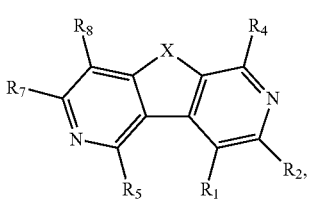
Formula 12

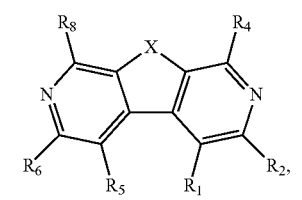
Formula 13

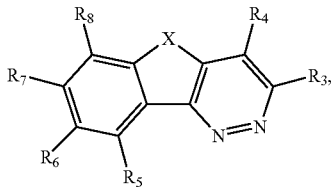
Formula 14

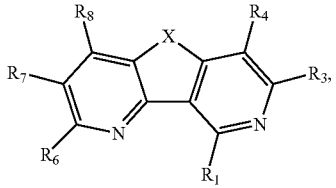
Formula 15

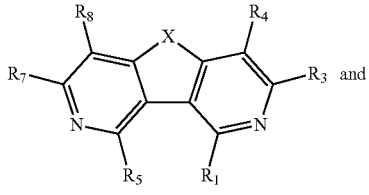
Formula 16

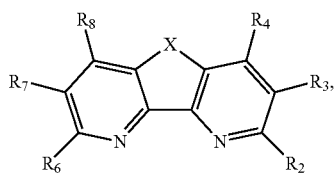

Formula 17 wherein at least one of R$_1$-R$_8$ is selected from the group consisting of D1 to D140.

3. The compound of claim 1, wherein the compound is selected from the group consisting of:

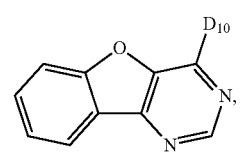

Compound O-10-10

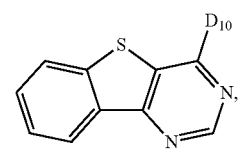

Compound S-10-10

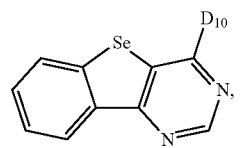

Compound Se-10-10

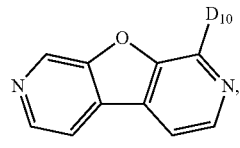

Compound O-13-10

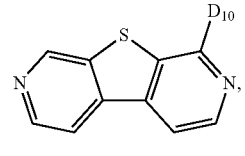

Compound S-13-10

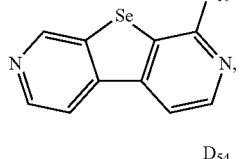

Compound Se-13-10

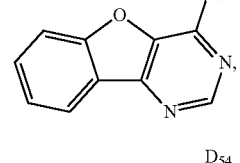

Compound O-10-54

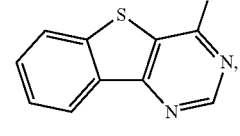

Compound S-10-54

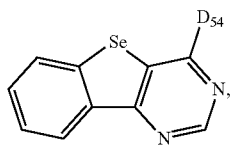

Compound Se-10-54

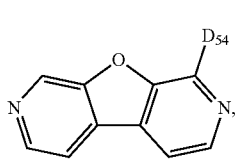

Compound O-13-54

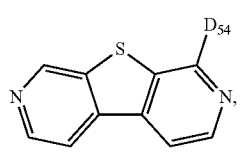

Compound S-13-54

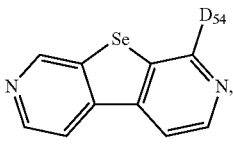

Compound Se-13-54

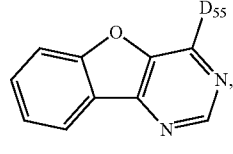

Compound O-10-55

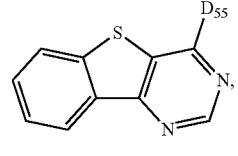

Compound S-10-55

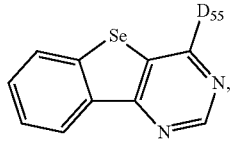

Compound Se-10-55

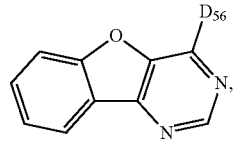

Compound O-10-56

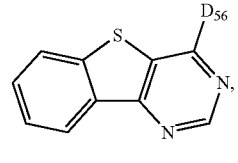

Compound S-10-56

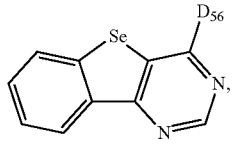

Compound Se-10-56

Compound O-13-56
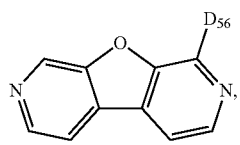
Compound S-13-56
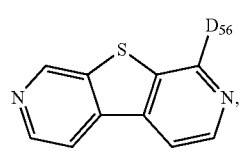
Compound Se-13-56
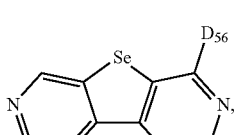
Compound O-10-57
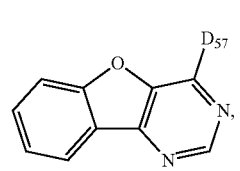
Compound S-10-57
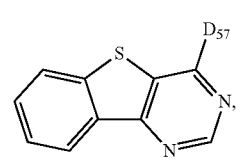
Compound Se-10-57
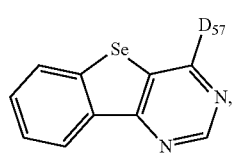
Compound O-13-57
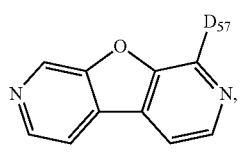
Compound S-13-57
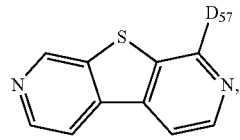
Compound Se-13-57
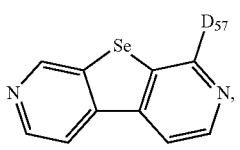
Compound O-10-58
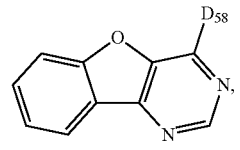
Compound S-10-58
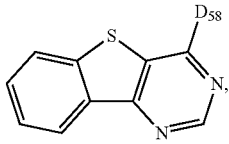
Compound Se-10-58
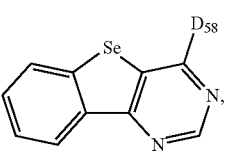
Compound O-13-58
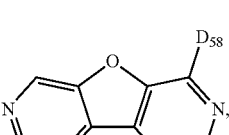
Compound S-13-58
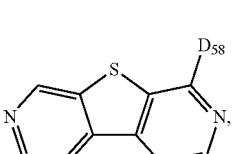
Compound Se-13-58
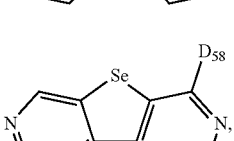
Compound O-10-59
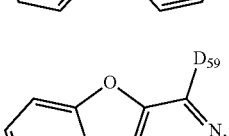
Compound S-10-59
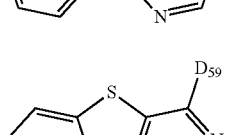
Compound Se-10-59
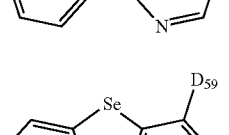
Compound O-13-59
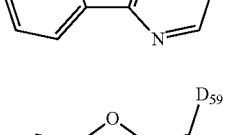
Compound S-13-59
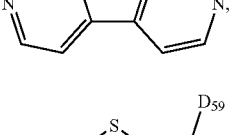

Compound Se-13-59
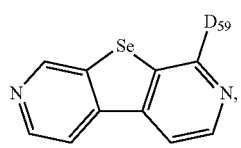
Compound O-10-60
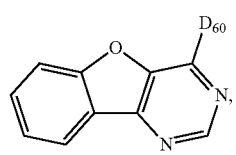
Compound S-10-60
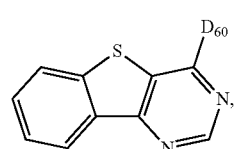
Compound Se-10-60
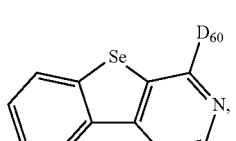
Compound O-13-60
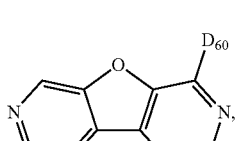
Compound S-13-60
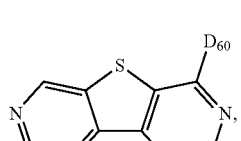
Compound Se-13-60
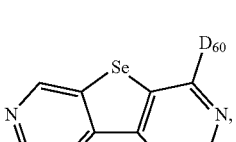
Compound O-10-61
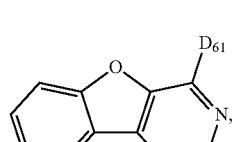
Compound S-10-61
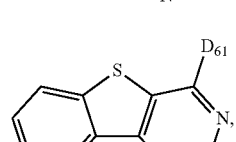
Compound Se-10-61
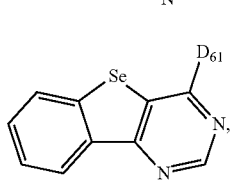
Compound O-13-61
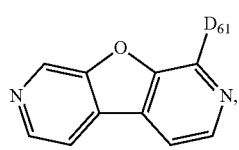
Compound S-13-61
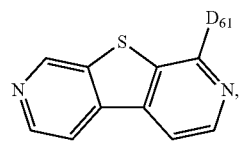
Compound Se-13-61
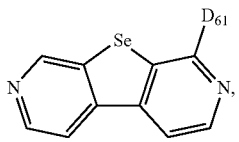
Compound O-17-10
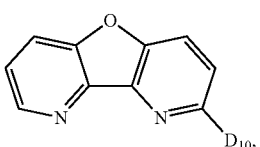
Compound S-17-10
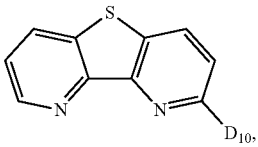
Compound Se-17-10
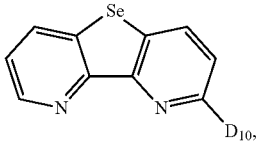
Compound O-10-31
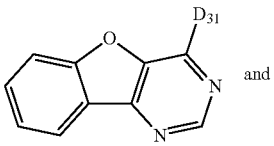
and
Compound O-10-70
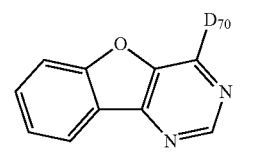

wherein D10, D31, D54, D55, D56, D57, D58, D59, D60, D70 and D61 are

D58
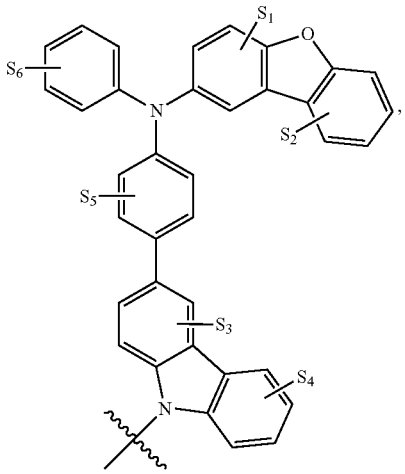

D59
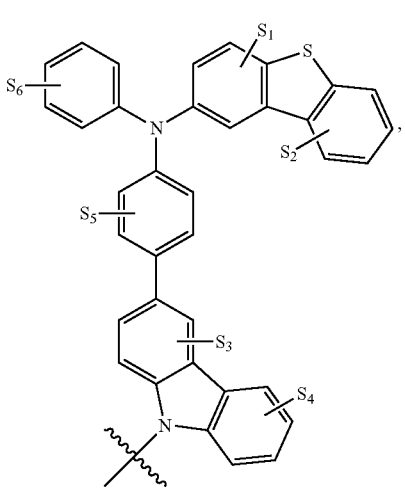

D60
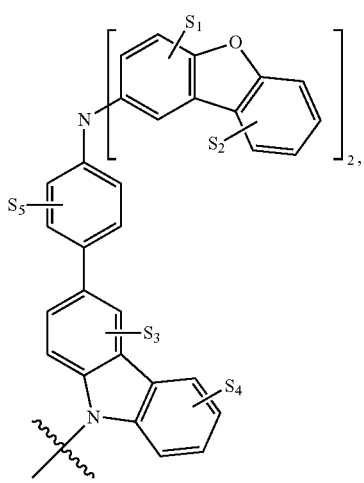

D61
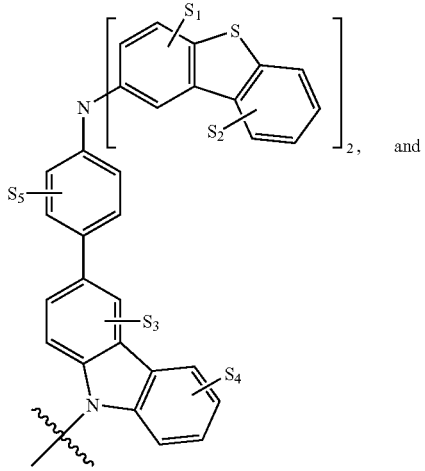

D70
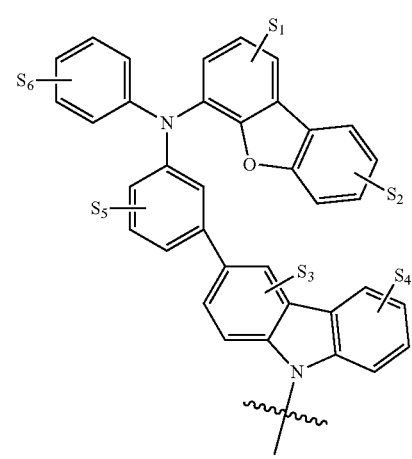

wherein $S_1$ to $S_6$ represent mono, di, tri, tetra or penta substitutions with hydrogen, deuterium, halide; alkyl, cycloalkyl, heteroalkyl, arylalkyl, alkoxy, aryloxy, amino, silyl, alkenyl, cycloalkenyl heteroalkenyl, alkynyl, aryl, heteroaryl, acyl, carbonyl, carboxylic acids, ester, nitrile, isonitrile, sulfanyl, sulfonyl, phosphino, and combinations thereof.

4. The compound of claim 3, wherein $S_1$ to $S_6$ are H.

5. A first device comprising a first organic light emitting device, the first organic light emitting device comprising:
an anode;
a cathode; and
an emissive layer, disposed between the anode and the cathode;
wherein the emissive layer comprises a host material and a first emitting compound having the formula:

Formula 1

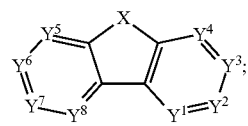

wherein each of $Y^1$ to $Y^8$ is C—R or N;
wherein at least one of $Y^1$ to $Y^8$ is N;
wherein at least one of $Y^1$ to $Y^8$ is C—R;

X is O, S, or Se;

each R is independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof; and wherein at least one of the R comprises a donor group with at least one electron-donating nitrogen.

6. The first device of claim 5, wherein at least two of $Y^1$ to $Y^8$ are N.

7. The first device of claim 5, wherein the first emitting compound is selected from the group consisting of Formula 2
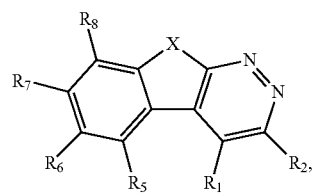

Formula 3
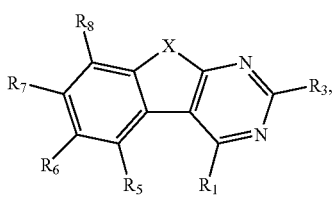

Formula 4
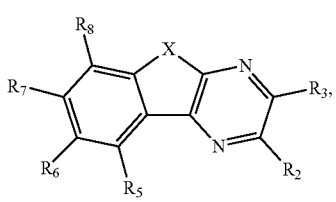

Formula 5
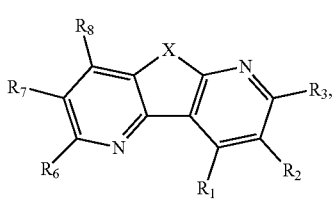

Formula 6
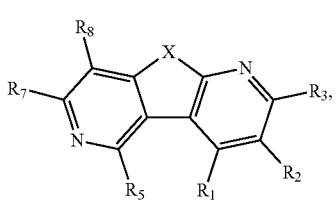

Formula 7
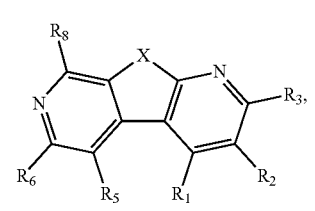

Formula 8
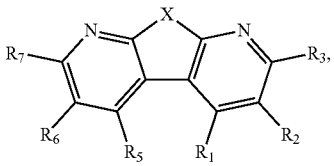

Formula 9
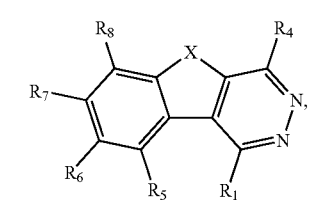

Formula 10
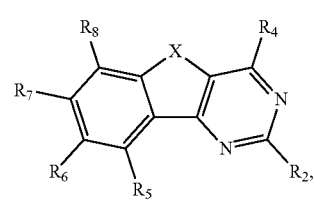

Formula 11
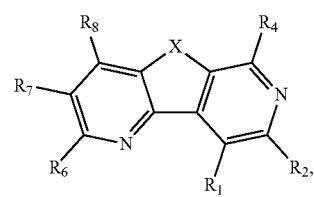

Formula 12
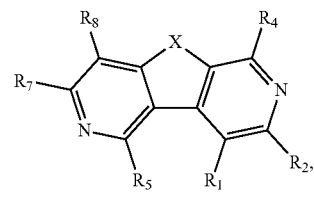

Formula 13
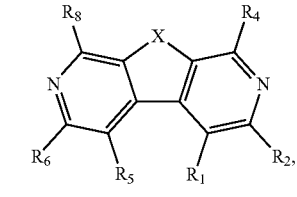

Formula 14
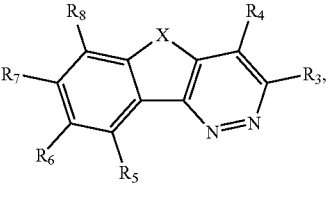

Formula 15
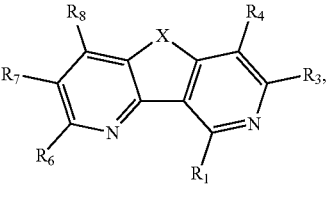

Formula 16

Formula 17

Formula 18

Formula 19

Formula 20

Formula 21 wherein $R_1$-$R_8$ is independently hydrogen, deuterium, halide, cycloalkyl, heteroalkyl, arylalkyl, alkoxy, aryloxy, amino, alkenyl, cycloalkenyl, heteroalkenyl, alkynyl, aryl, heteroaryl, acyl, carbonyl, carboxylic acids, ester, nitrile, isonitrile, sulfanyl, sulfonyl, phosphino, and combinations thereof;

at least one of $R_1$ to $R_8$ is $(L)_m$ $(Donor)_n$;

wherein L is a linker, m is 1 or 0, n≥1; and wherein Donor is an electron donating group containing at least one electron-donating nitrogen and Donors can be different when n>1.

8. The first device of claim 7, wherein the linker L is selected from the group consisting of

L1

L2

L3

L4

L5 wherein $A^1$ to $A^2$ represent mono, di, tri or tetra substitutions with hydrogen, deuterium, halide, cycloalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, sulfanyl, sulfinyl, sulfonyl, phosphino, and combinations thereof.

9. The first device of claim 7, wherein the Donor is selected from the group consisting of:

D1

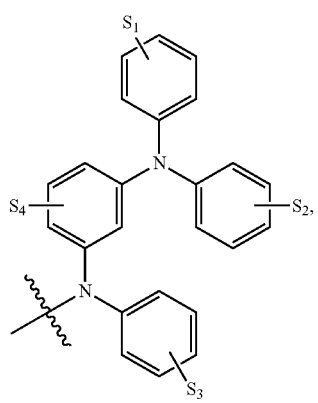 D2
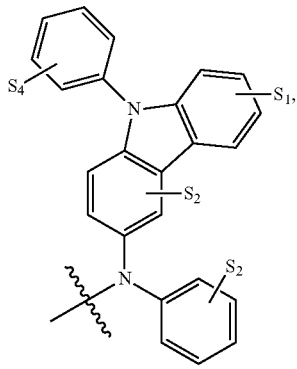 D6
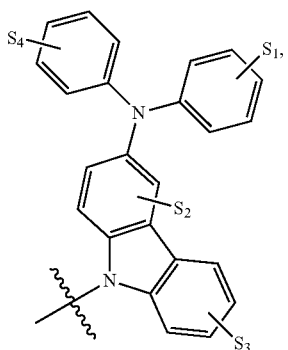 D3
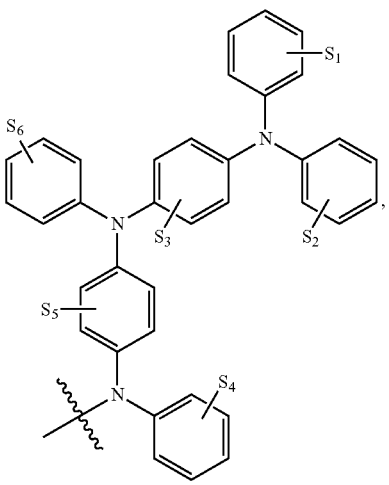 D7
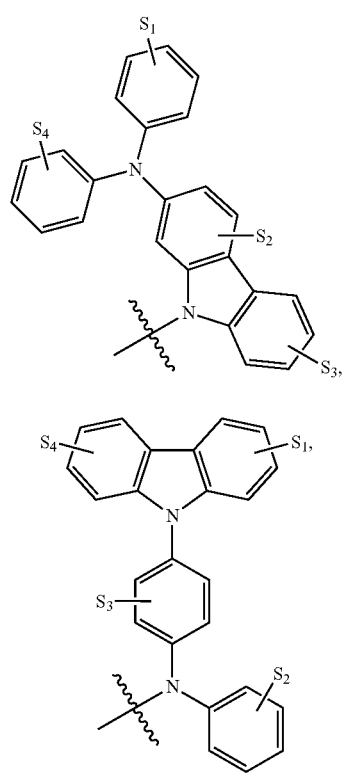 D4
D5
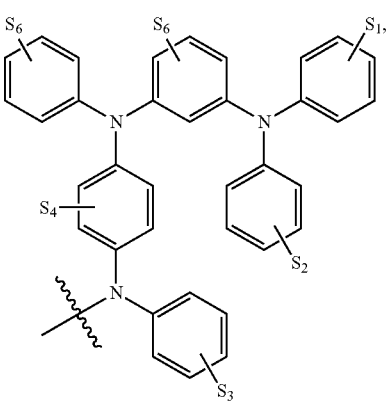 D8

D9
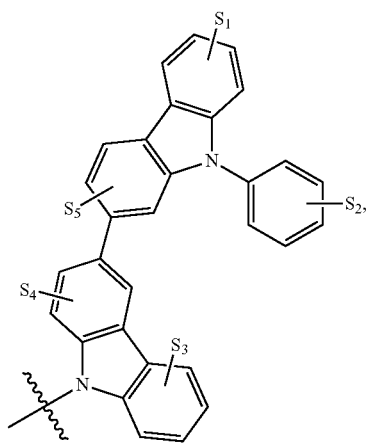
D10
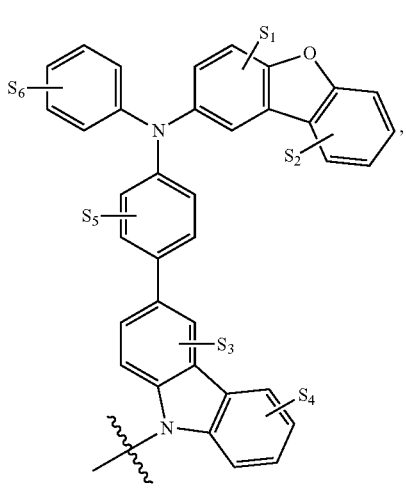
D11
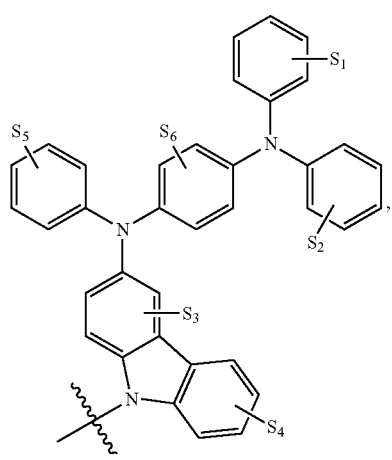
D12
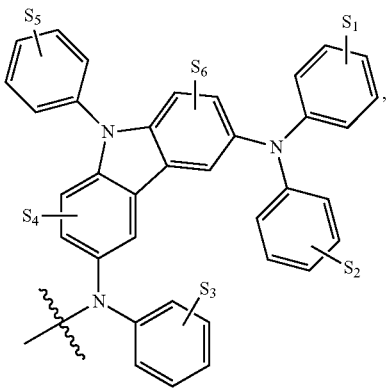
D13
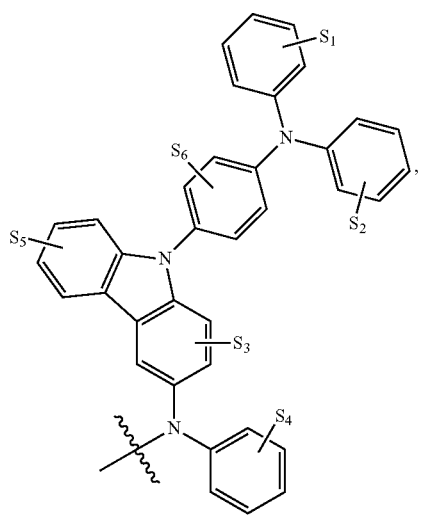
D14
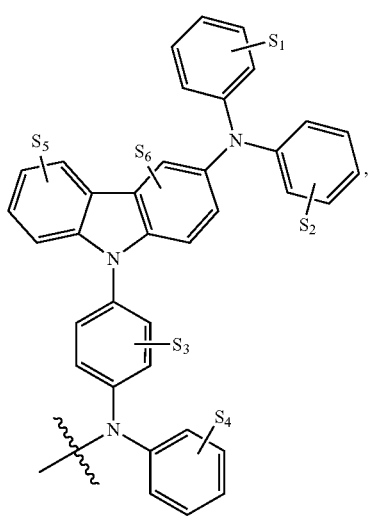

-continued
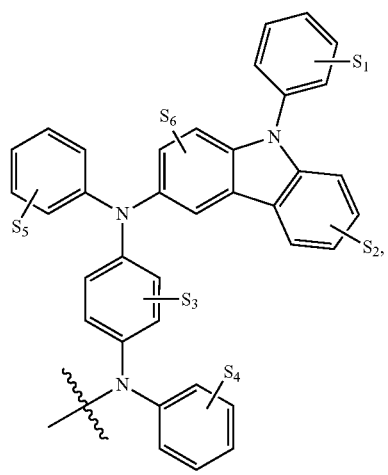
D15
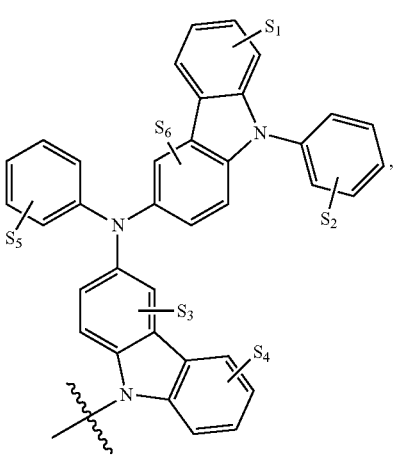
D18
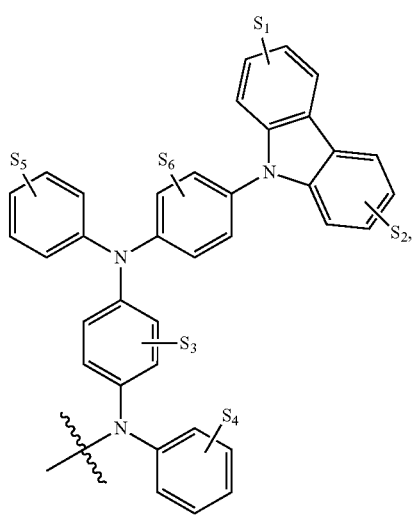
D16
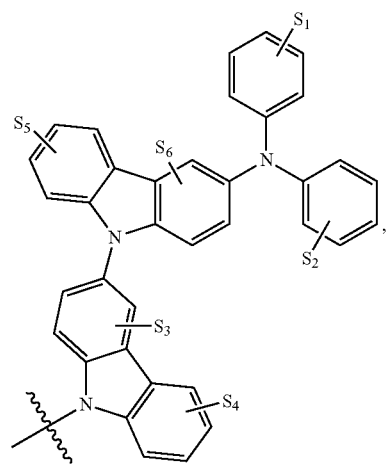
D19
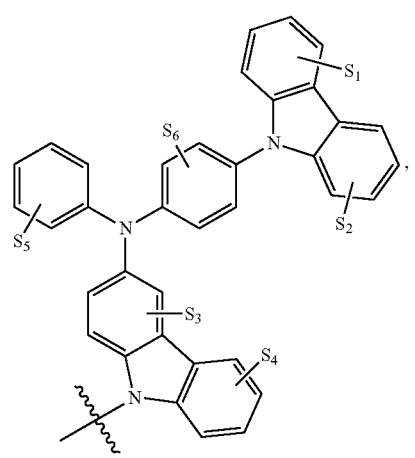
D17
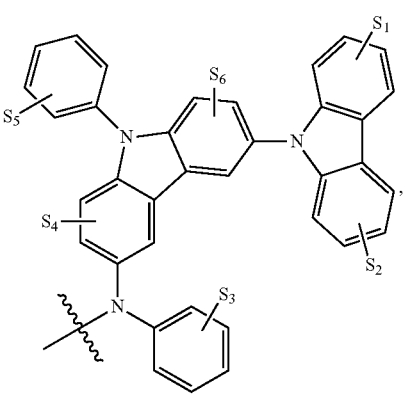
D20

-continued
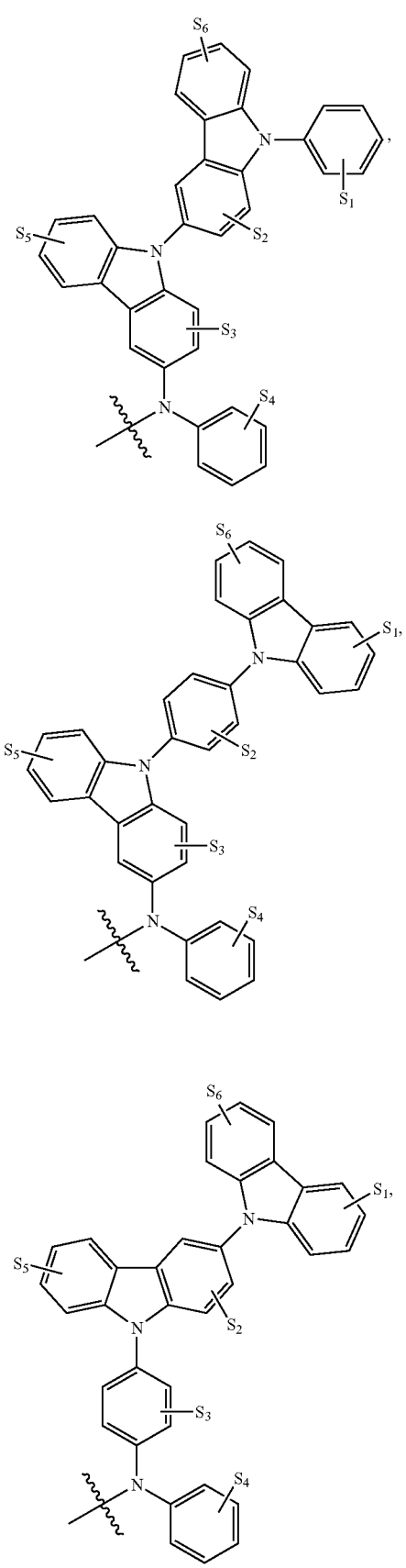
D21
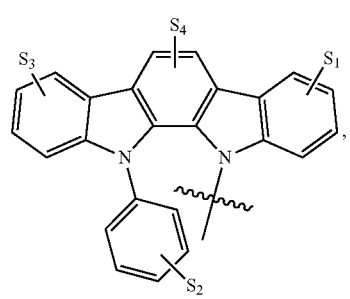
D24
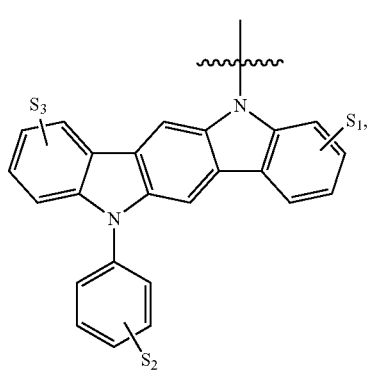
D25
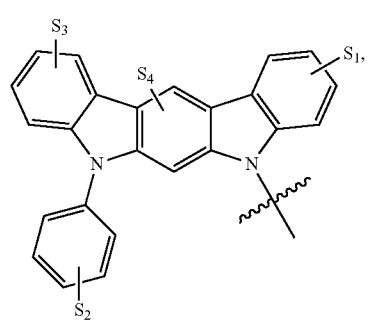
D26
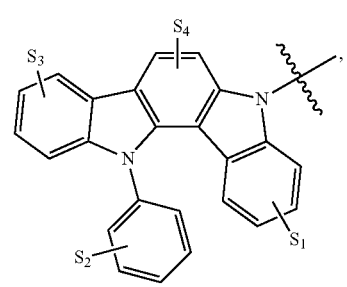
D27
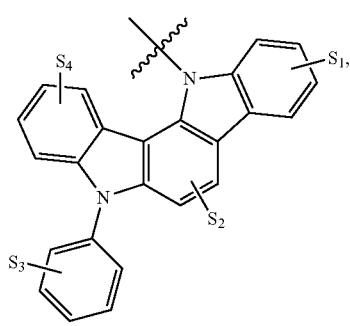
D28

D29
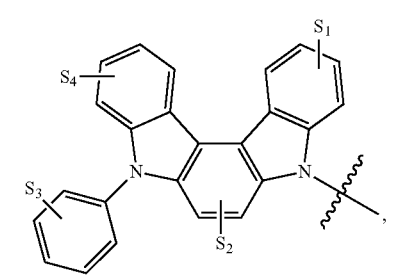
D30
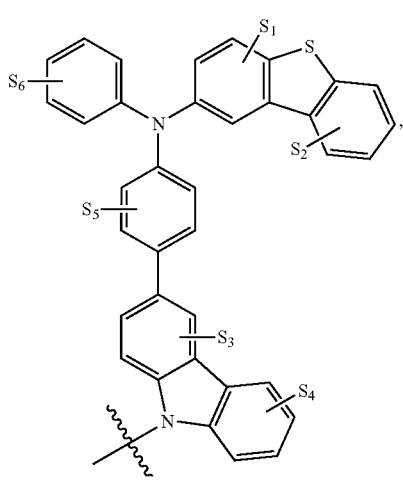
D31
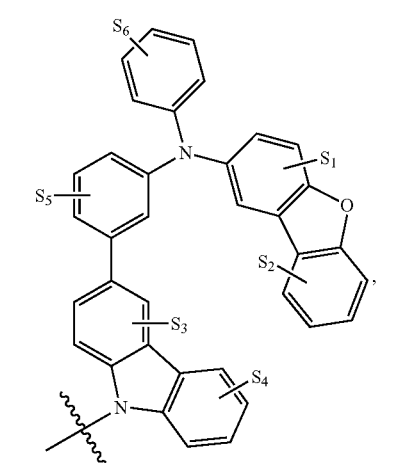
D32
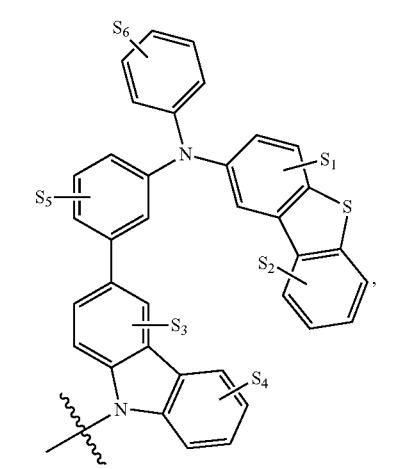
D33
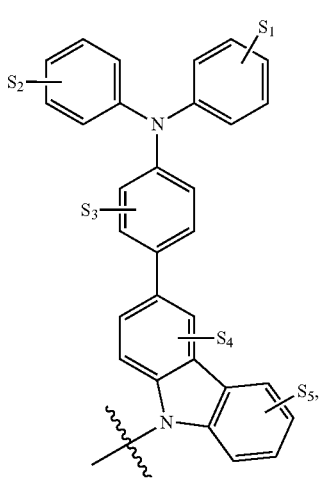
D34
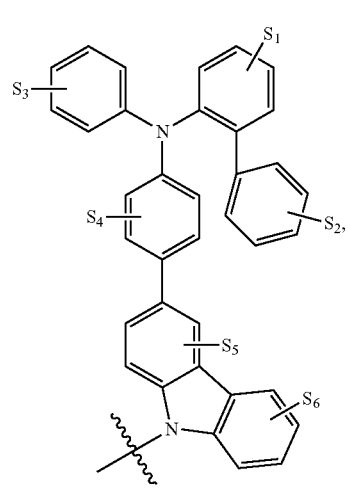
D35
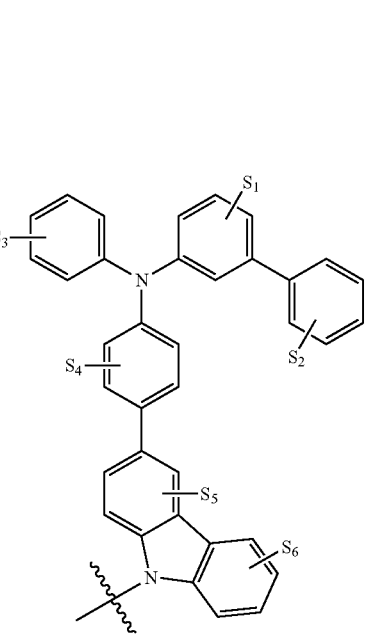

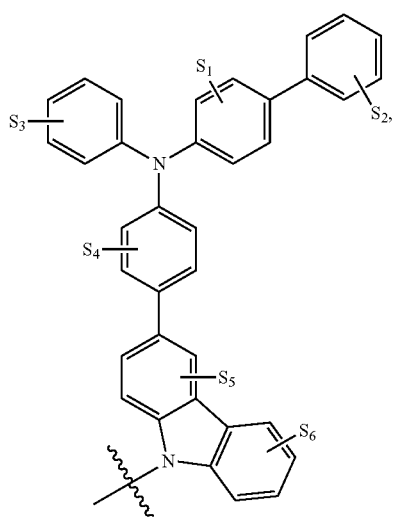
D36
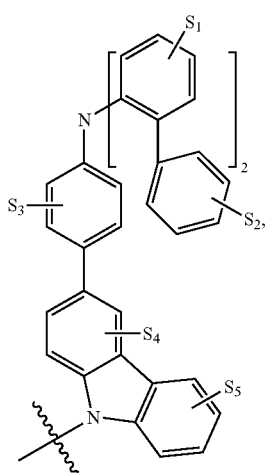
D37
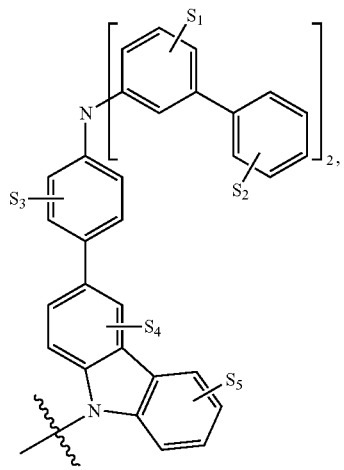
D38
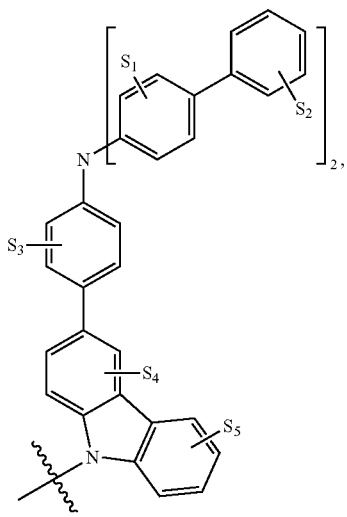
D39
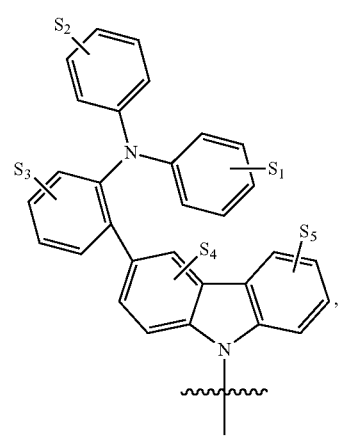
D40
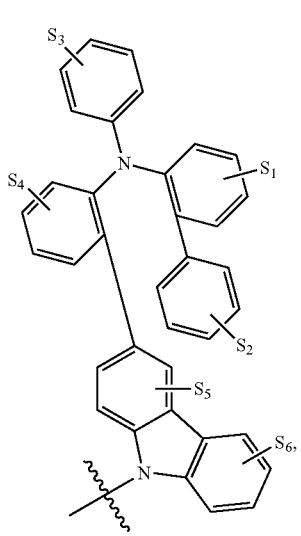
D41

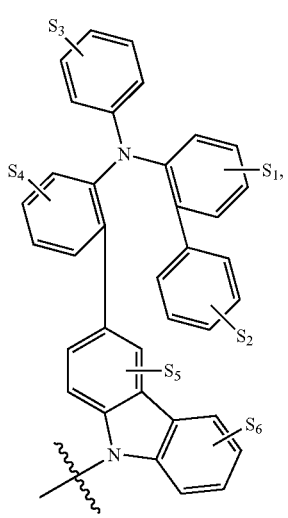
D42
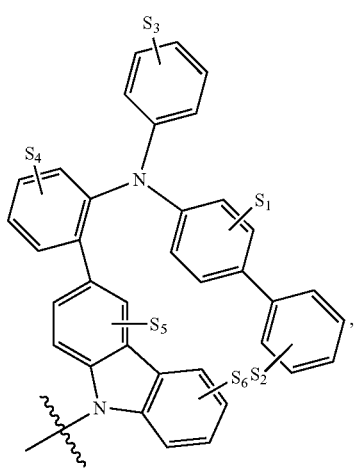
D43
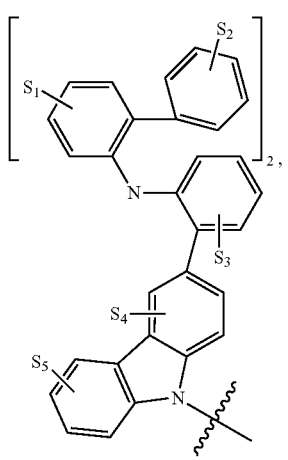
D44
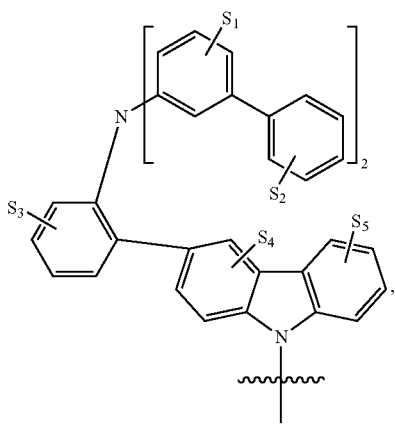
D45
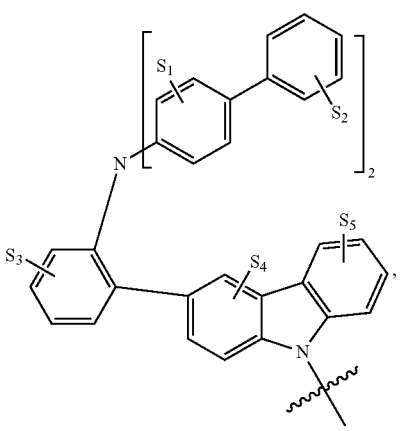
D46
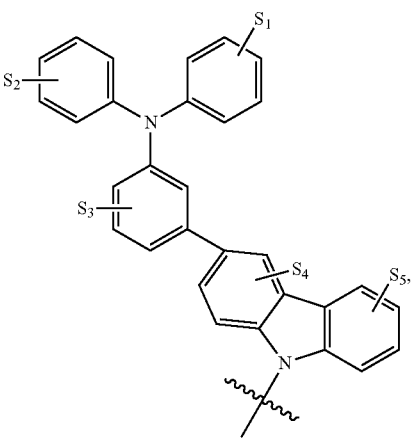
D47

D48
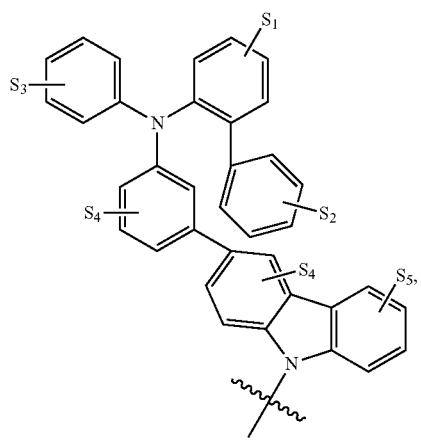
D49
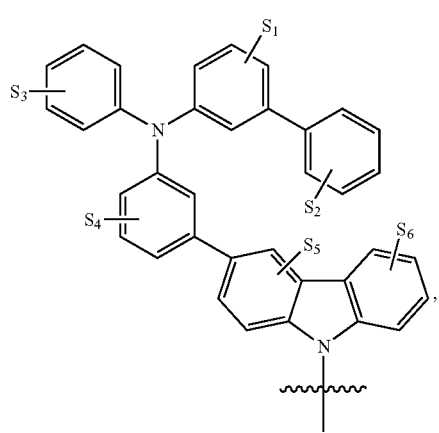
D50
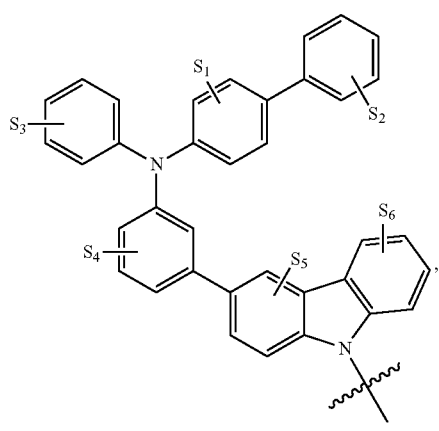
D51
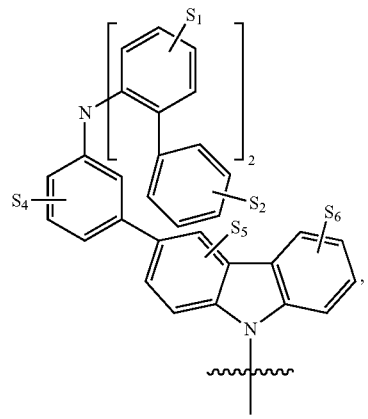
D52
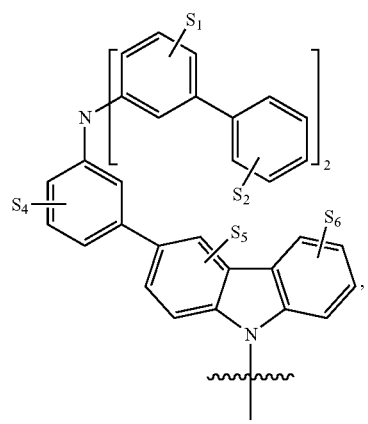
D53
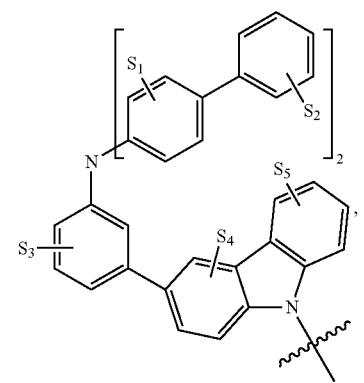

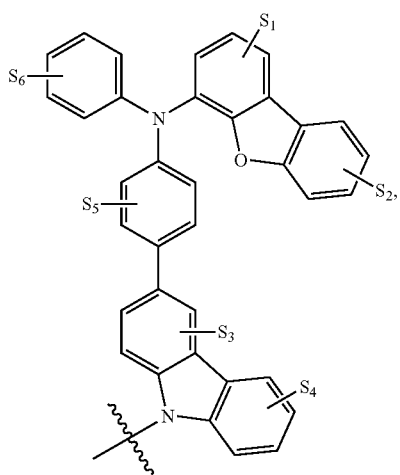 D54
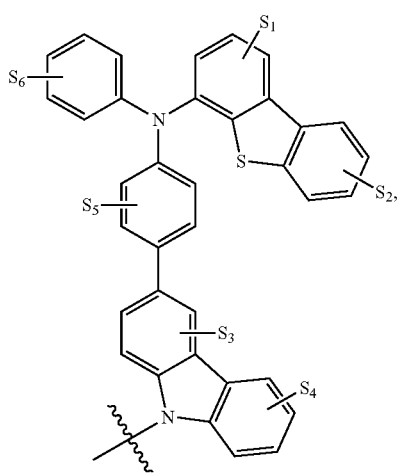 D55
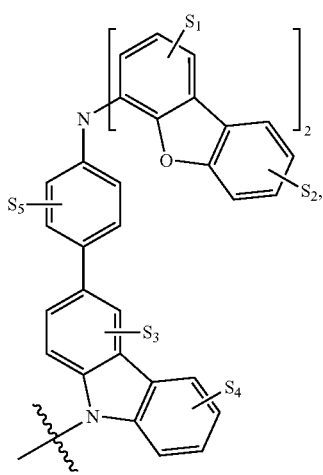 D56
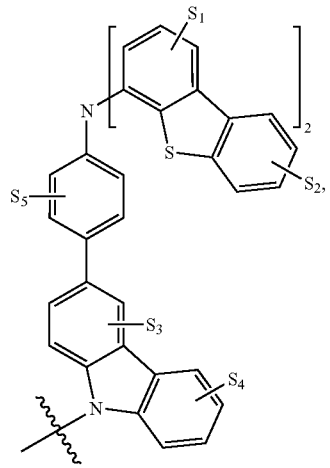 D57
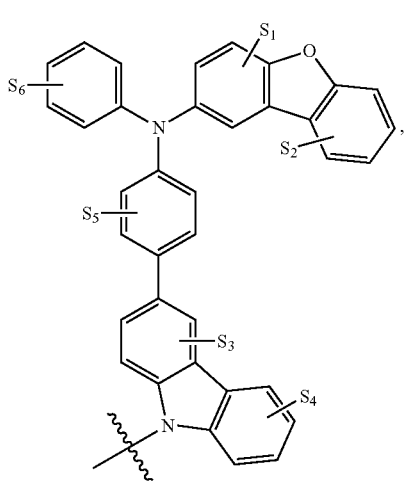 D58
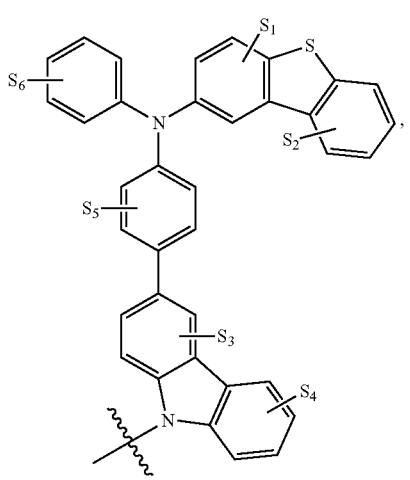 D59

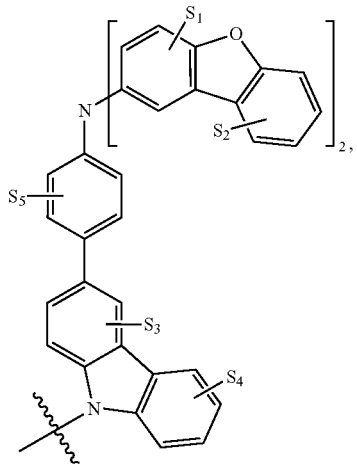 D60
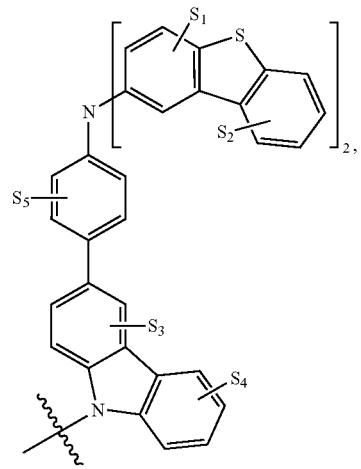 D61
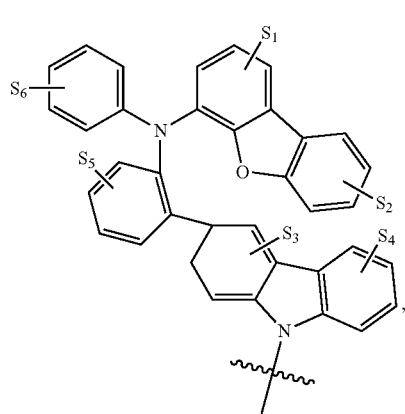 D62
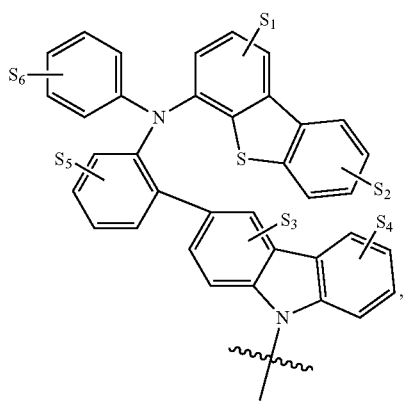 D63
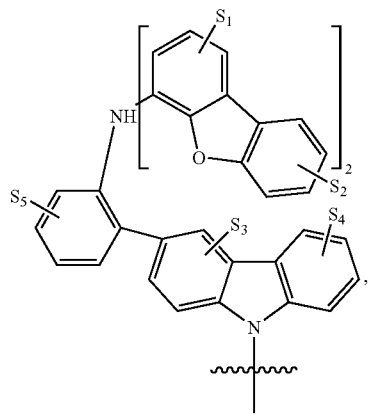 D64
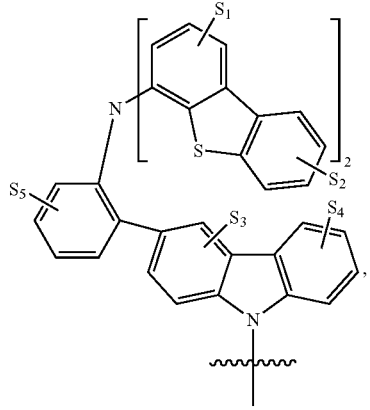 D65

-continued
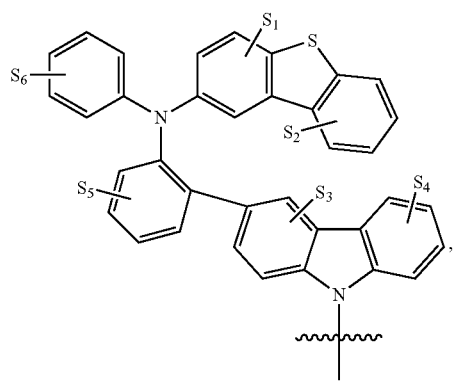
D67
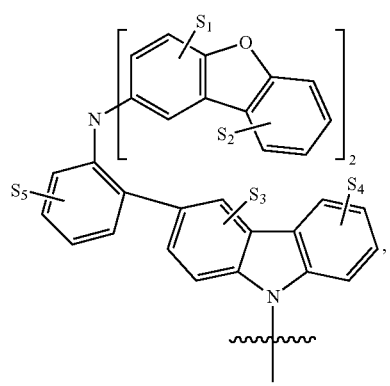
D68
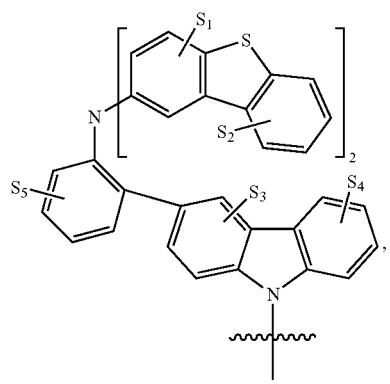
D69
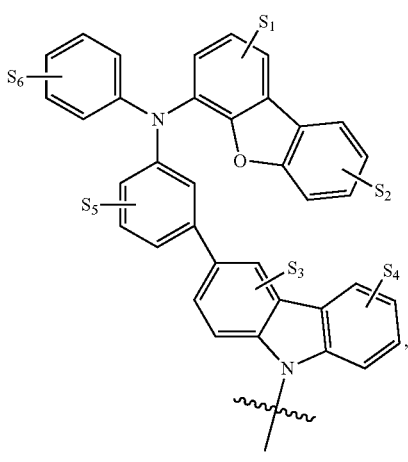
D70
-continued
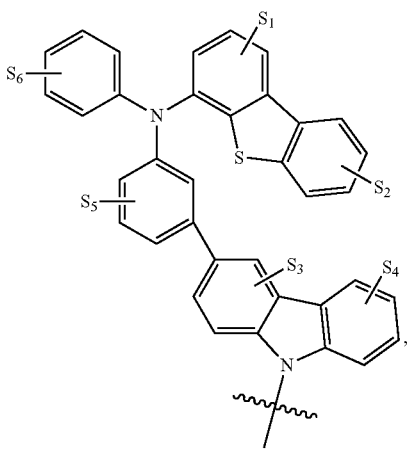
D71
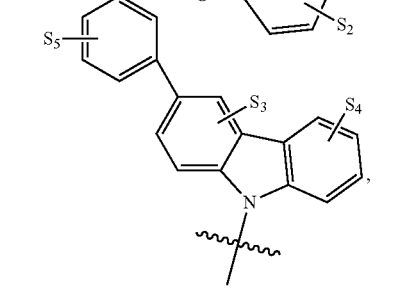
D72
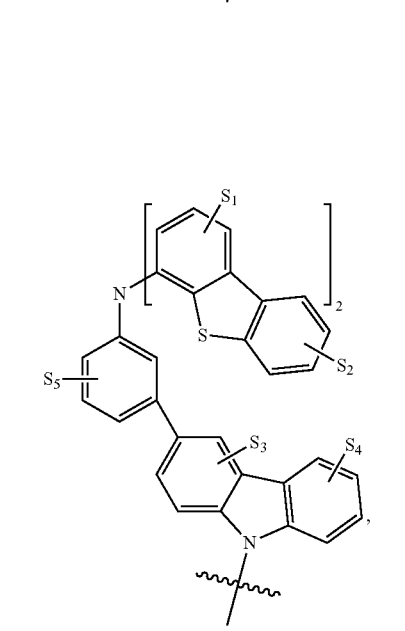
D73

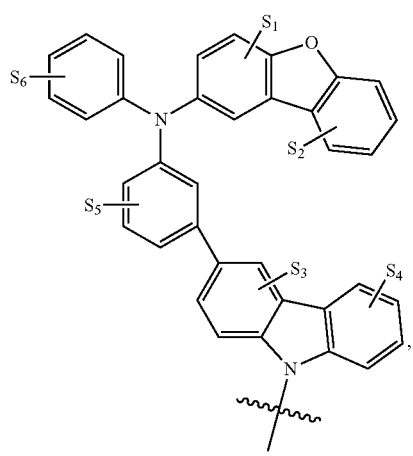
D74
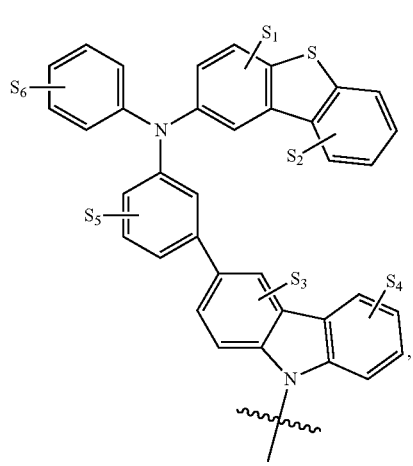
D75
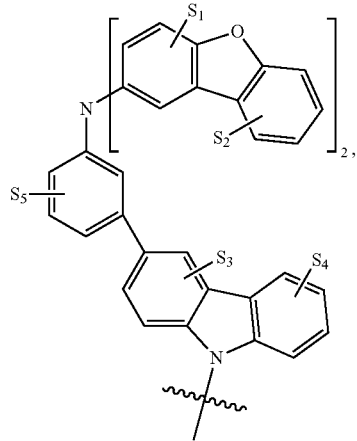
D76
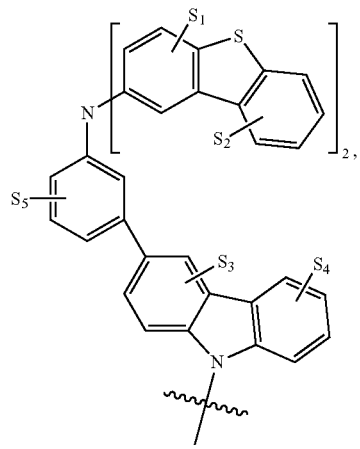
D77
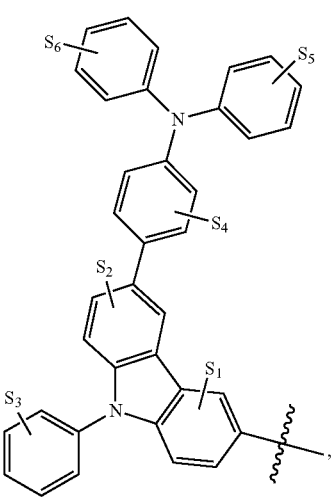
D78
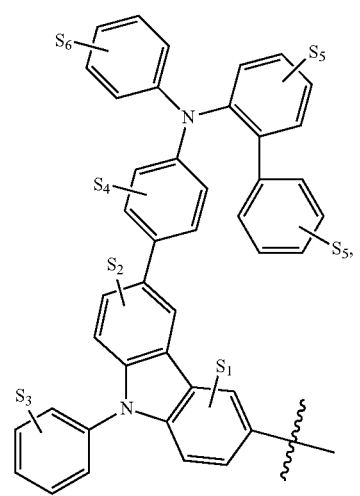
D79

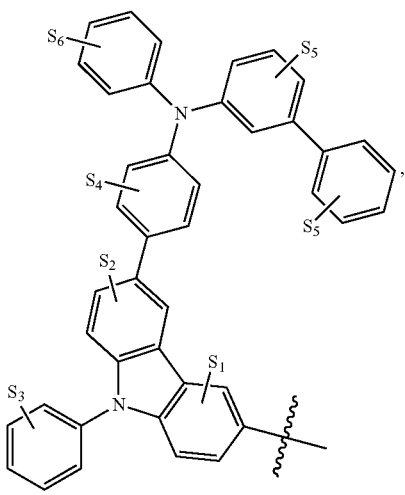 D80
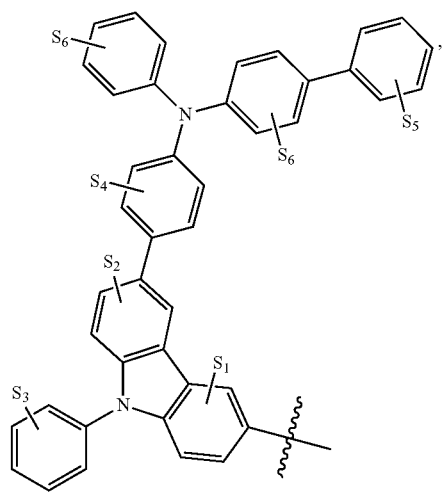 D81
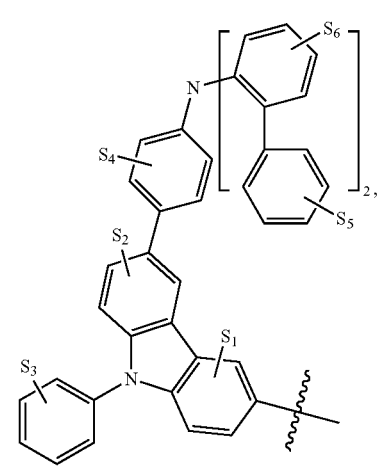 D82
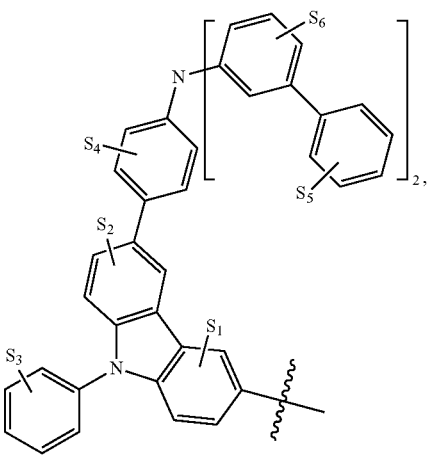 D83
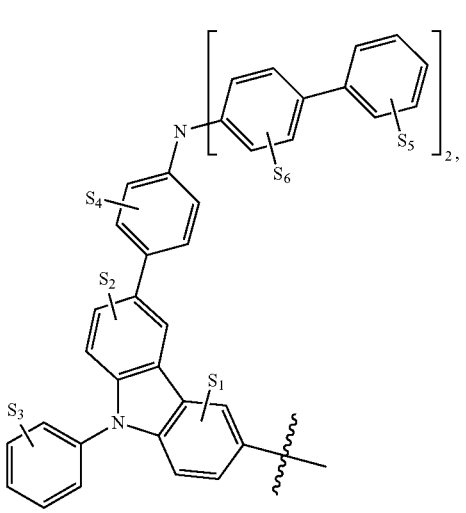 D84
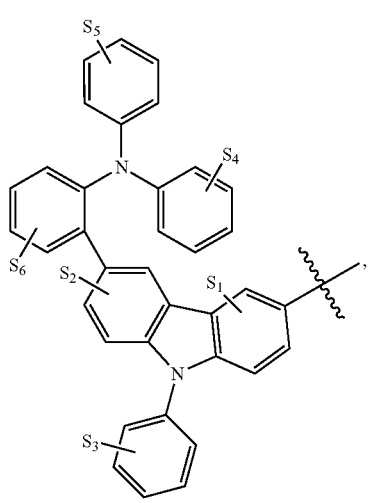 D85

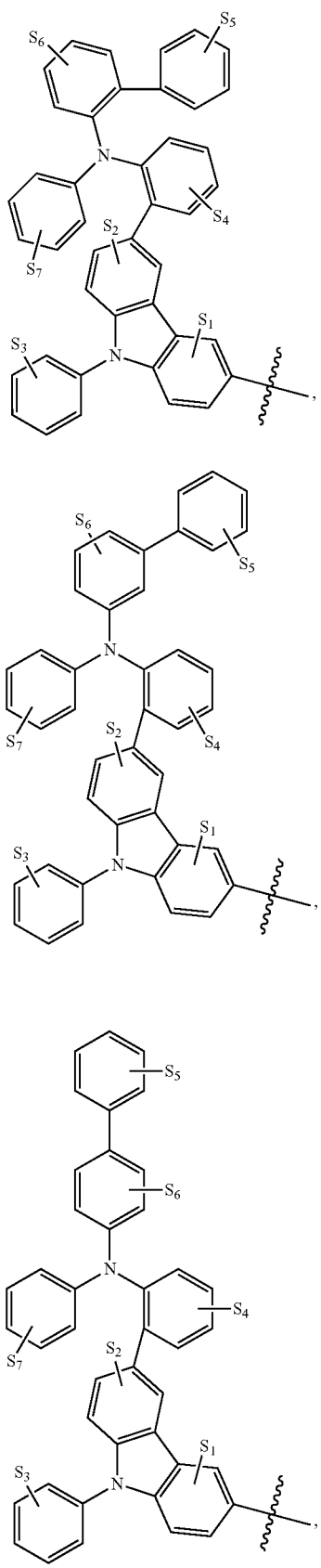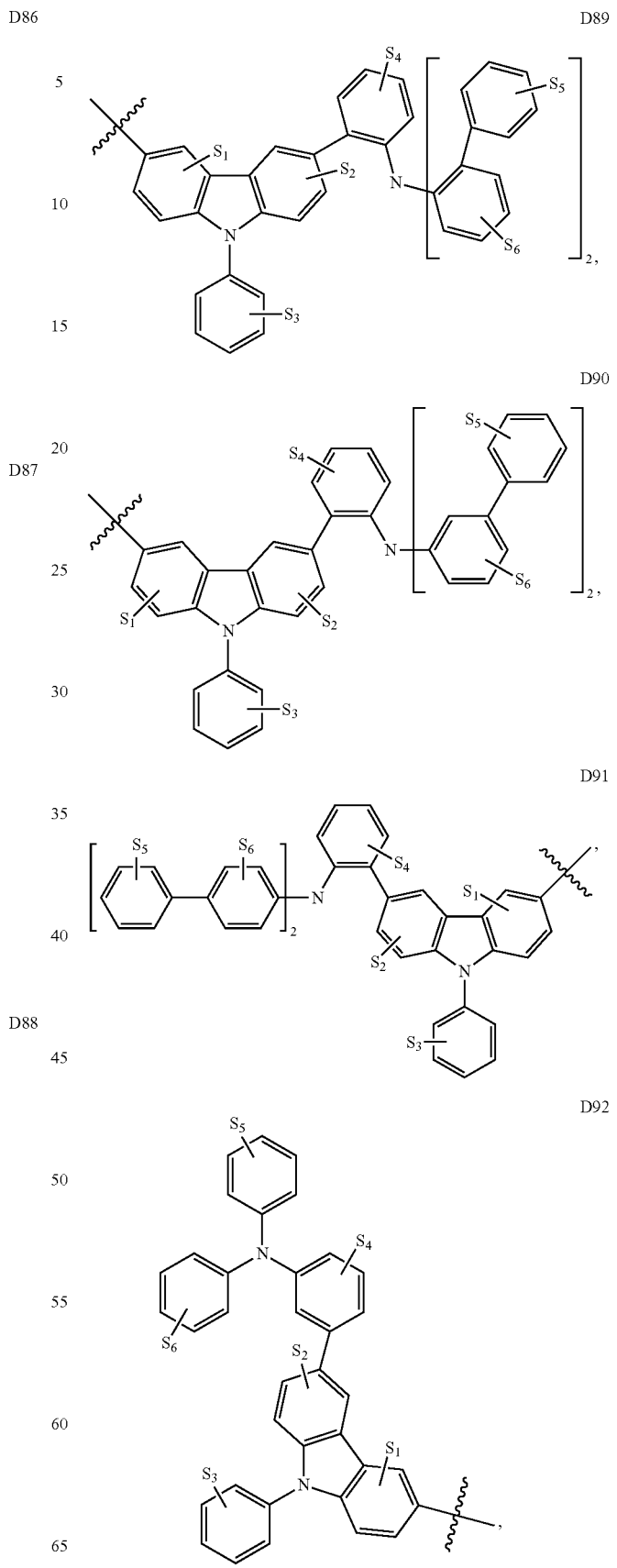

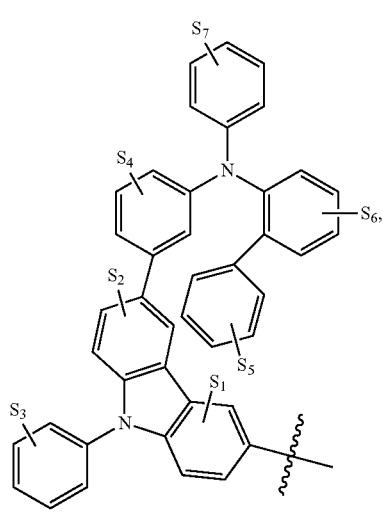
D93
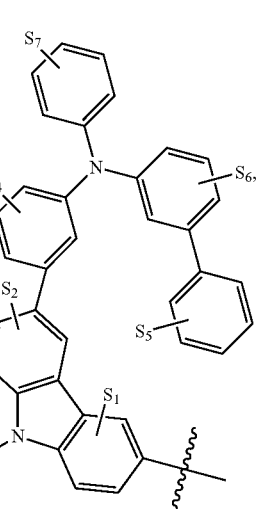
D94
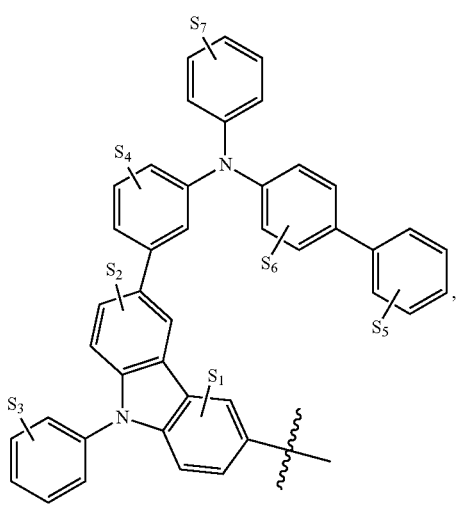
D95
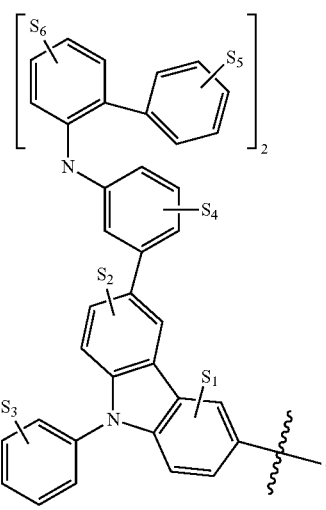
D96
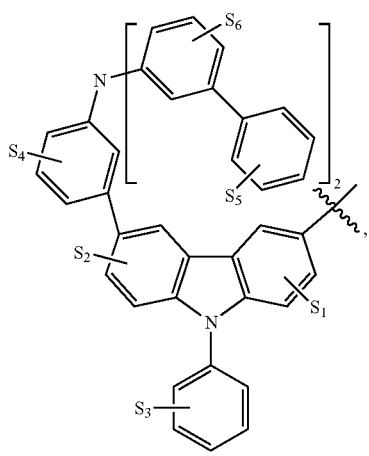
D97
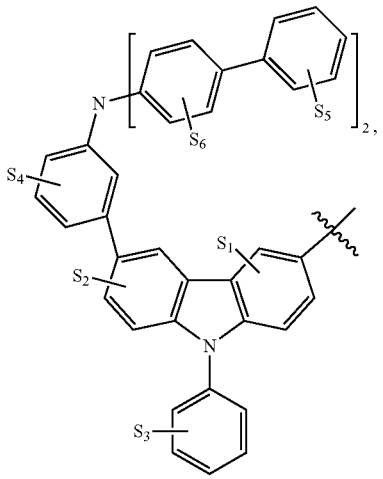
D98

D99
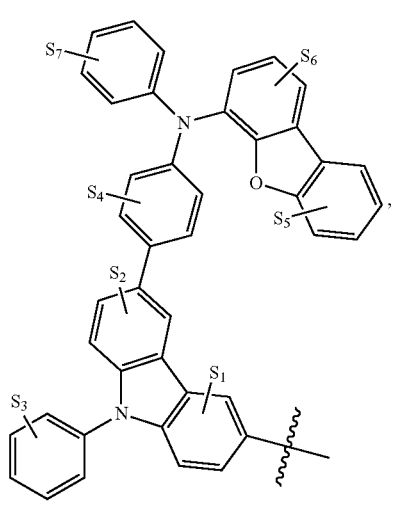
D100
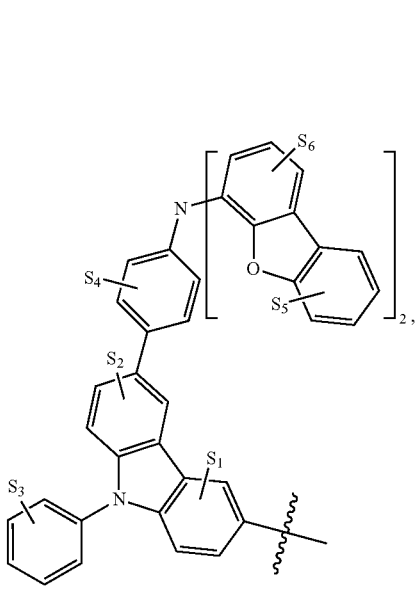
D101
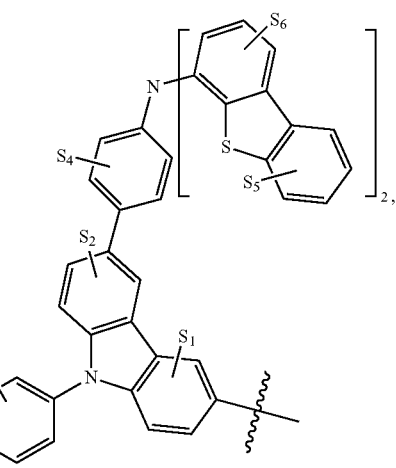
D102
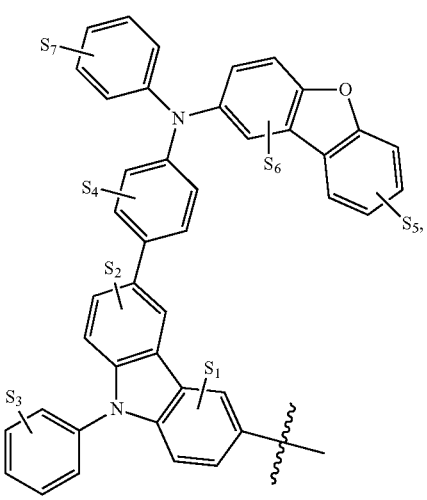
D103
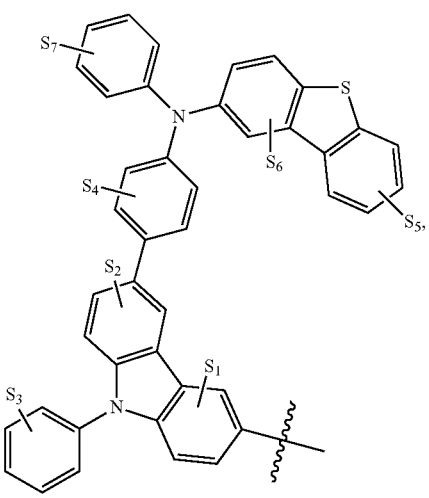
D104

-continued
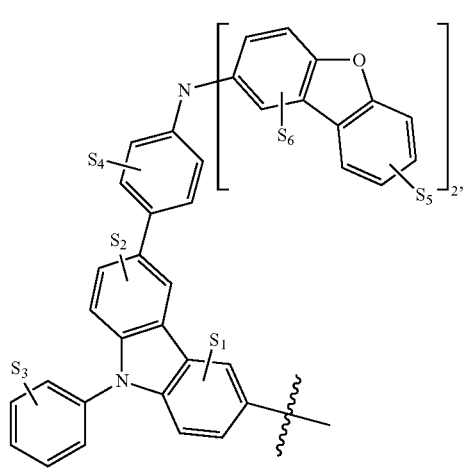
D105
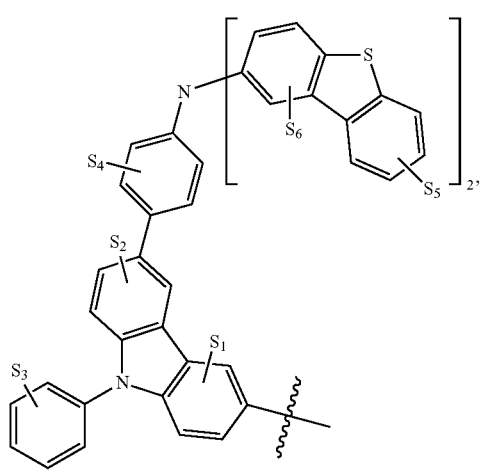
D106
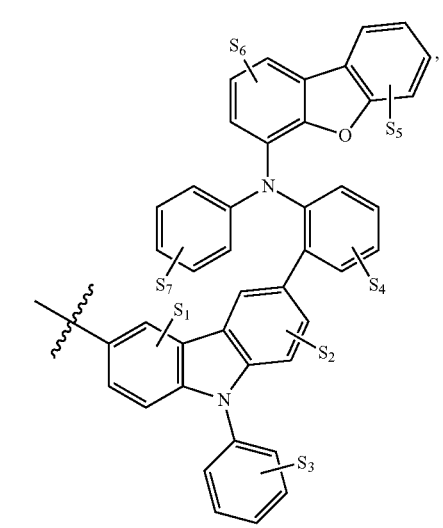
D107
-continued
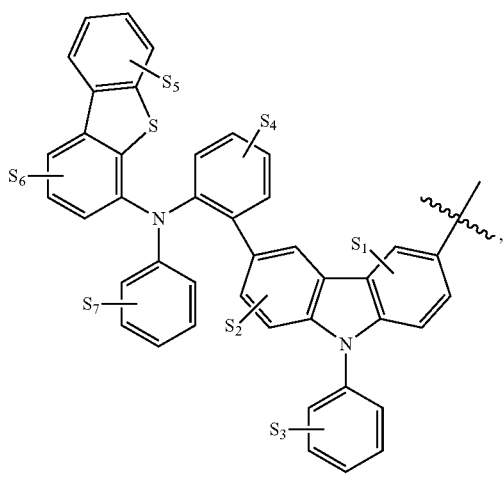
D108
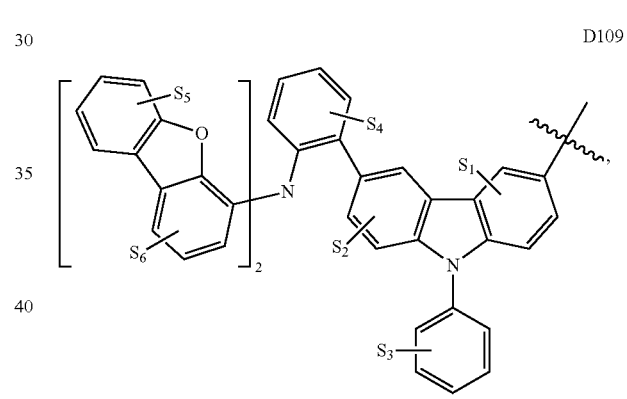
D109
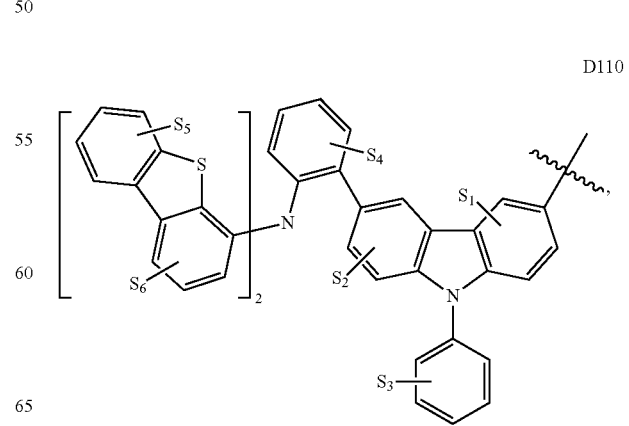
D110

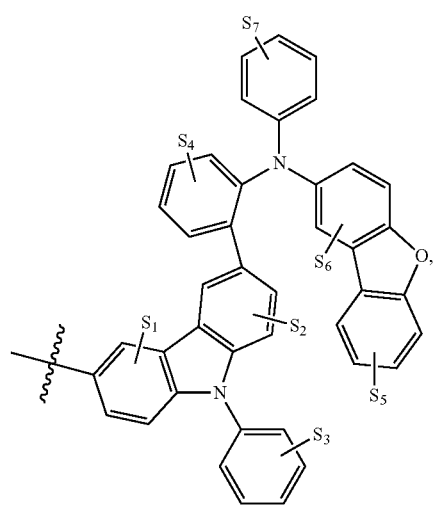
D111
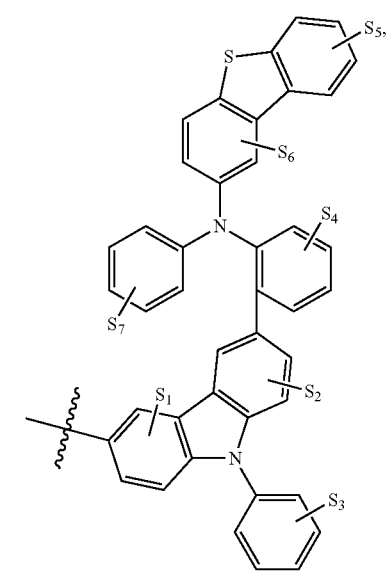
D112
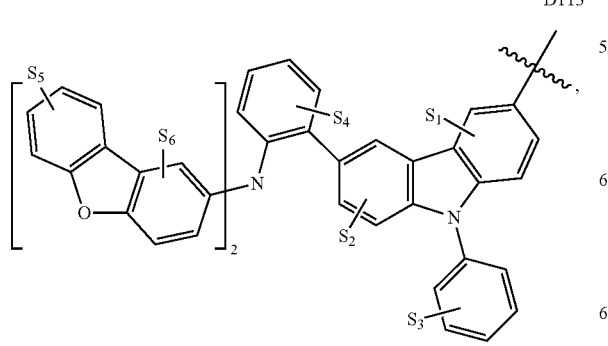
D113
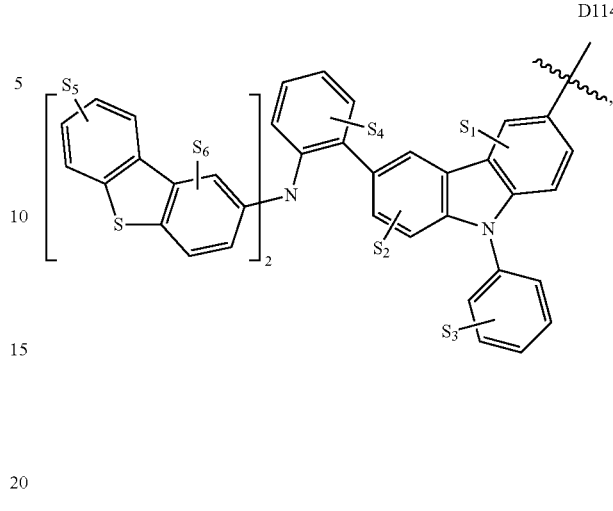
D114
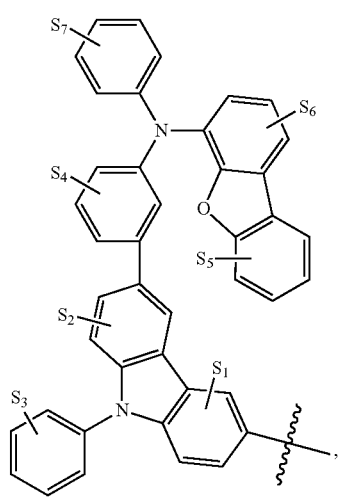
D115
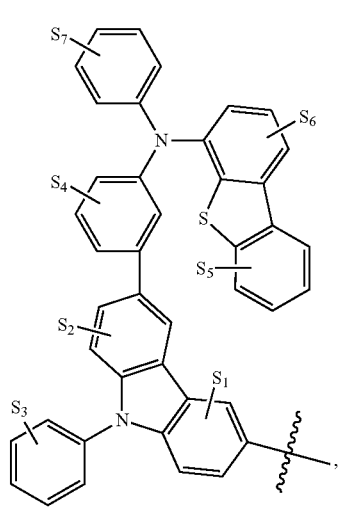
D116

-continued
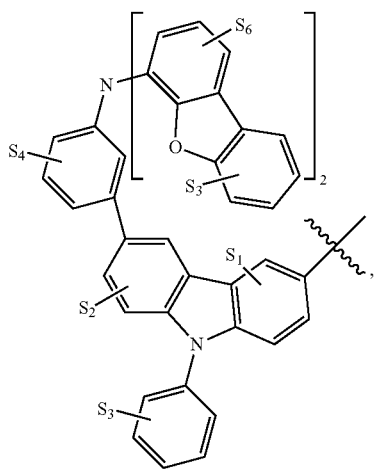
D117
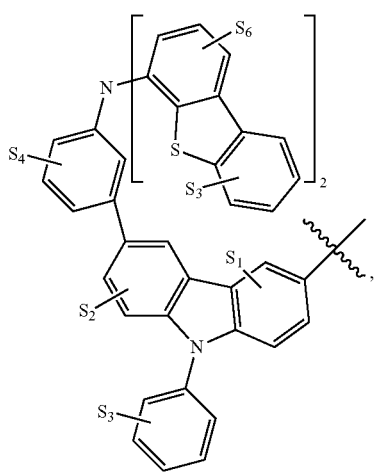
D118
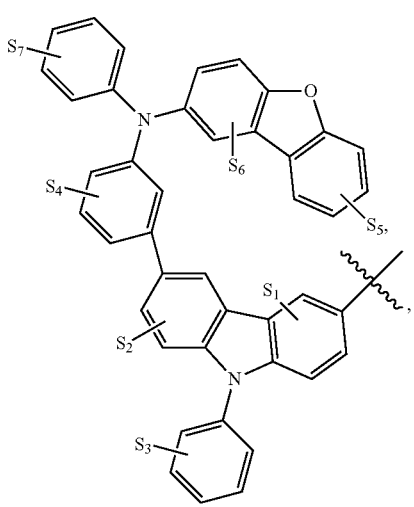
D119
-continued
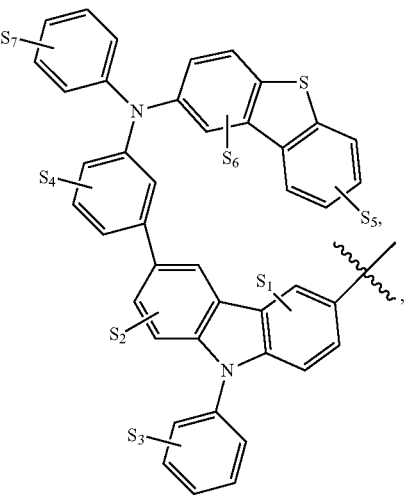
D120
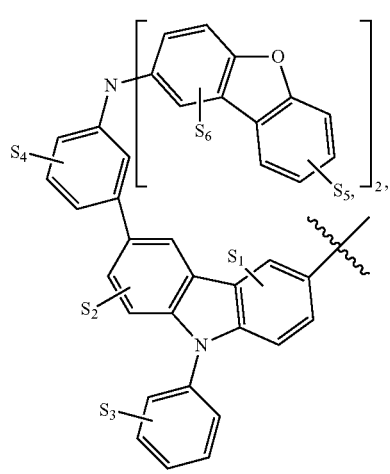
D121
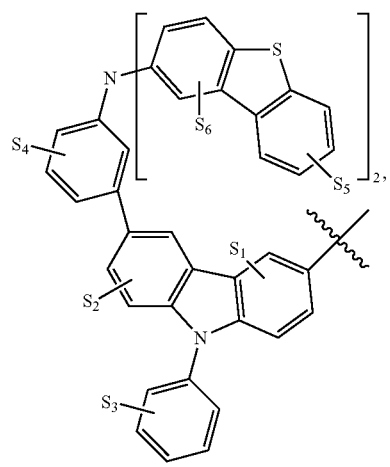
D122

-continued
D123
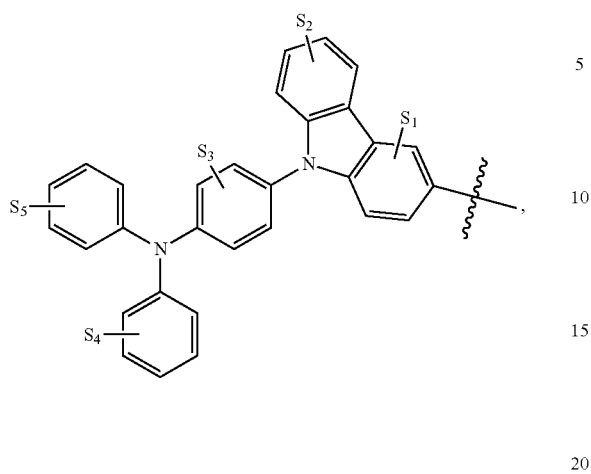
D124
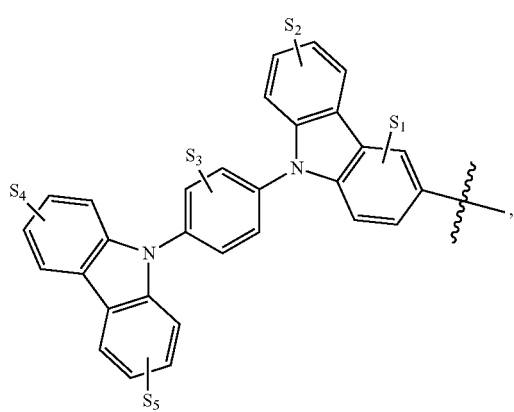
D125
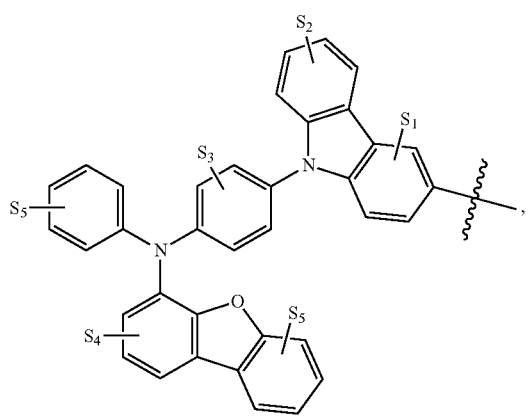
-continued
D126
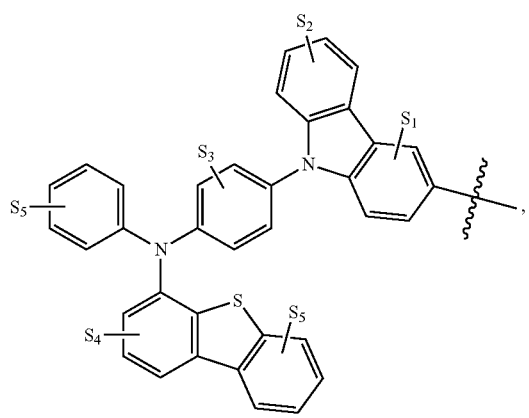
D127
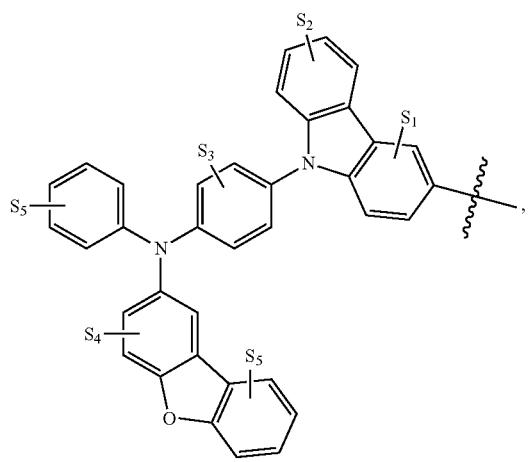
D128
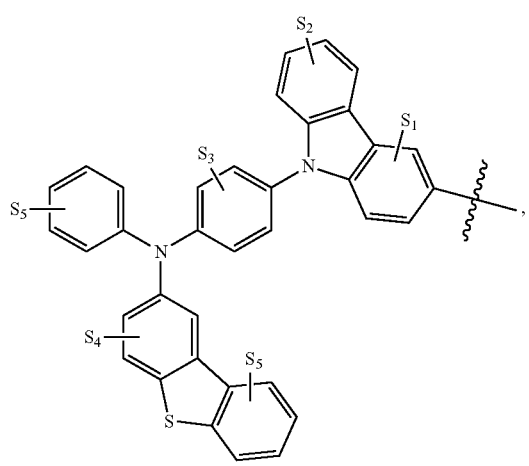

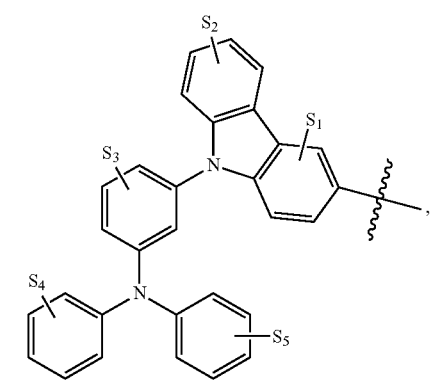 D129
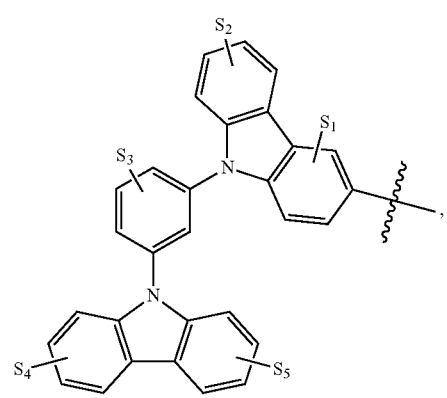 D130
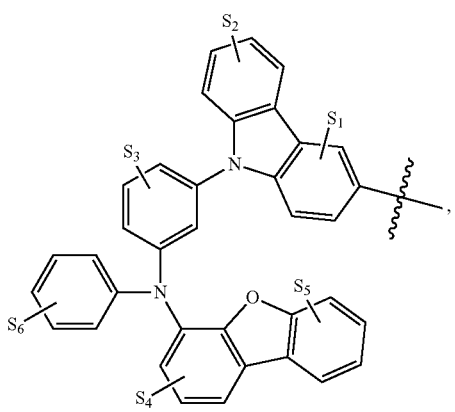 D131
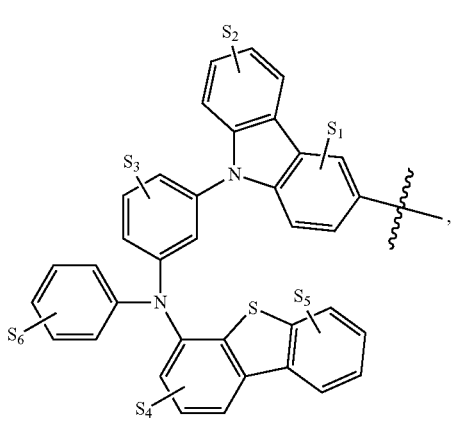 D132
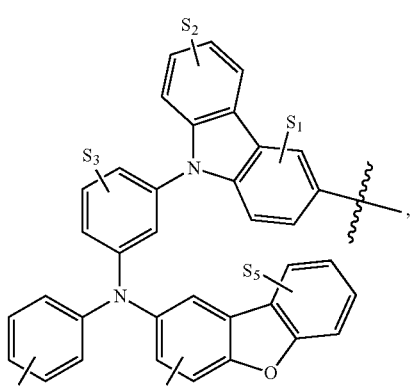 D133
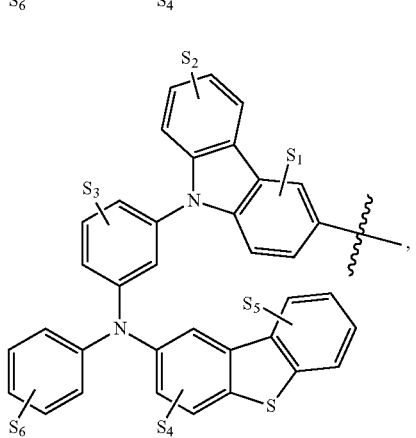 D134
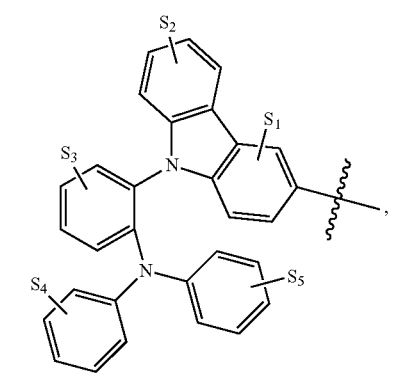 D135
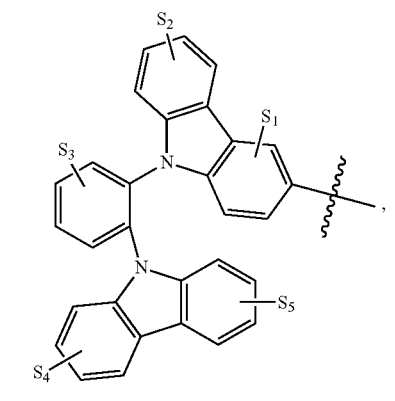 D136

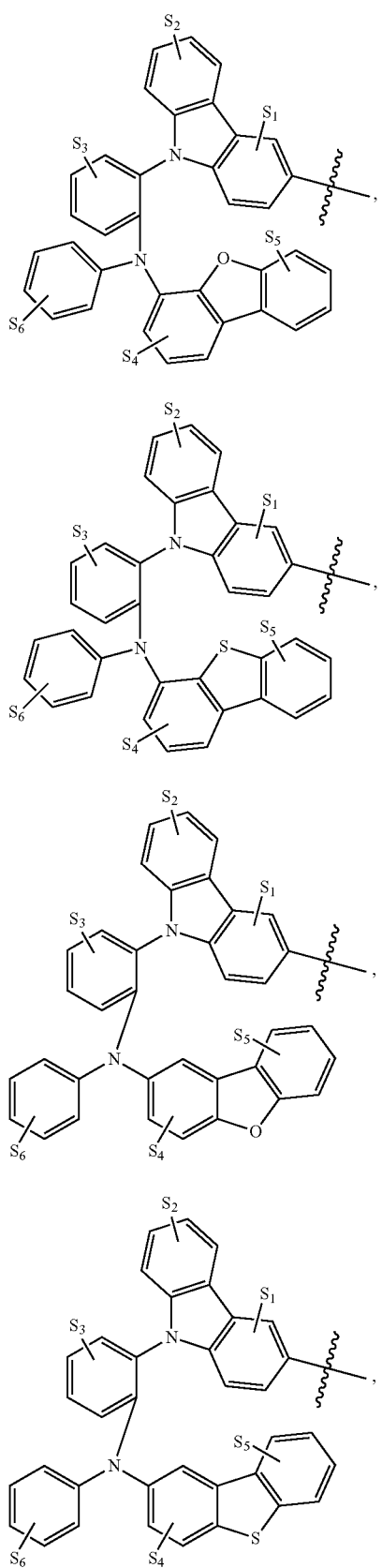

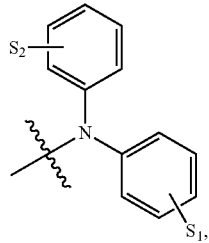

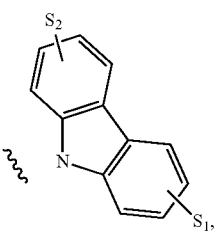

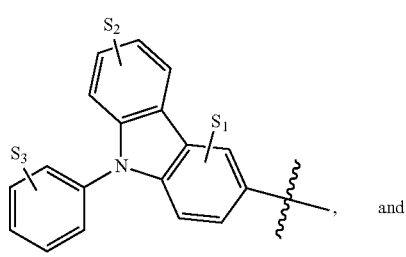

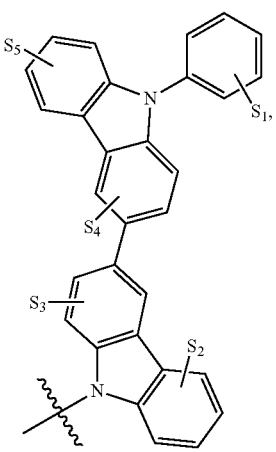

wherein $S_1$ to $S_7$ represent mono, di, tri, tetra or penta substitutions with hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

10. The first device of claim 5, wherein the first emitting compound is selected from the group consisting of:
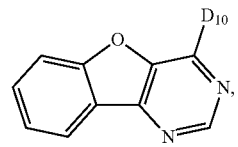
Compound O-10-10
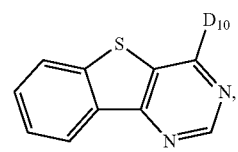
Compound S-10-10
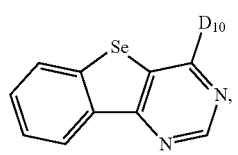
Compound Se-10-10
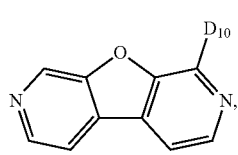
Compound O-13-10
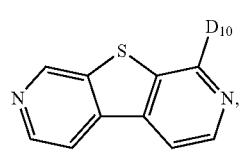
Compound S-13-10
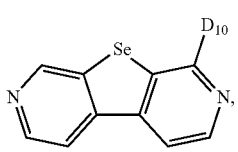
Compound Se-13-10
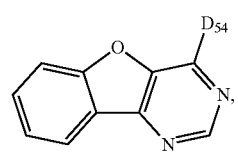
Compound O-10-54
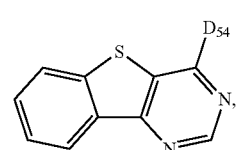
Compound S-10-54
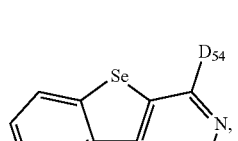
Compound Se-10-54
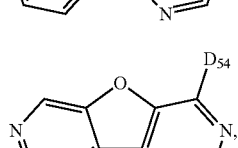
Compound O-13-54
-continued
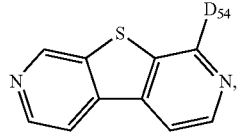
Compound S-13-54
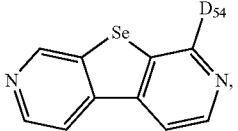
Compound Se-13-54
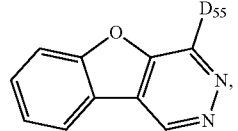
Compound O-10-55
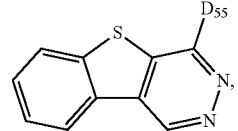
Compound S-10-55
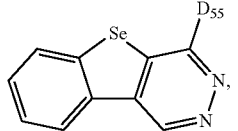
Compound Se-10-55
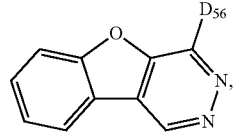
Compound O-10-56
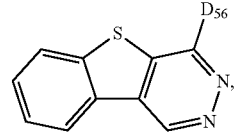
Compound S-10-56
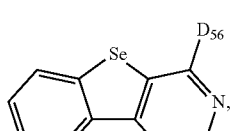
Compound Se-10-56
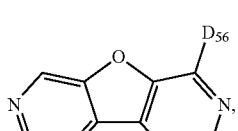
Compound O-13-56
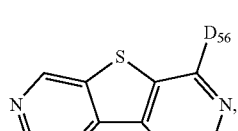
Compound S-13-56

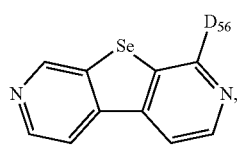
Compound Se-13-56
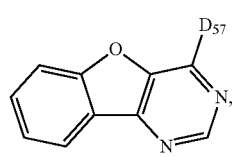
Compound O-10-57
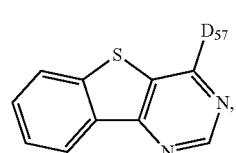
Compound S-10-57
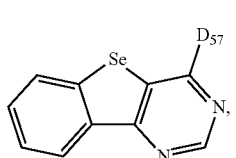
Compound Se-10-57
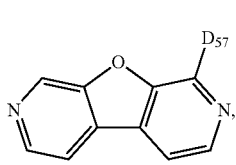
Compound O-13-57
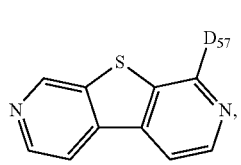
Compound S-13-57
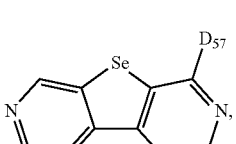
Compound Se-13-57
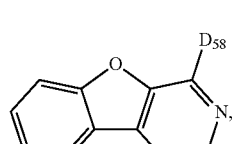
Compound O-10-58
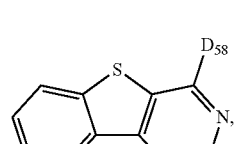
Compound S-10-58
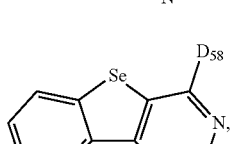
Compound Se-10-58
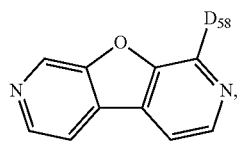
Compound O-13-58
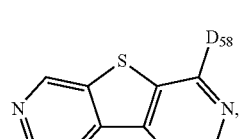
Compound S-13-58
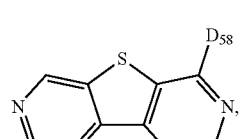
Compound Se-13-58
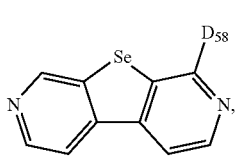
Compound O-10-59
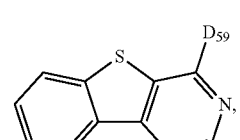
Compound S-10-59
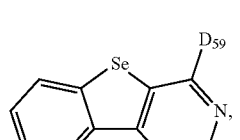
Compound Se-10-59
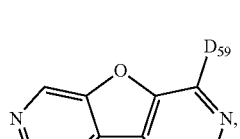
Compound O-13-59
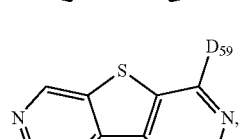
Compound S-13-59
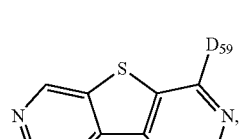
Compound Se-13-59
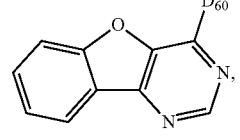
Compound O-10-60

Compound S-10-60
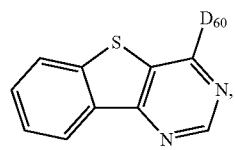
Compound Se-10-60
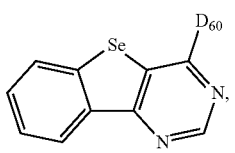
Compound O-13-60
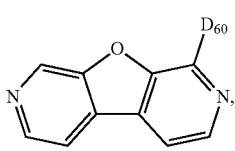
Compound S-13-60
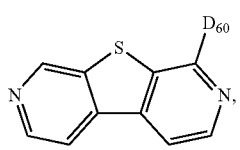
Compound Se-13-60
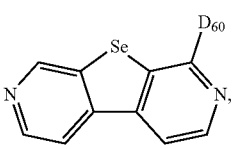
Compound O-10-61
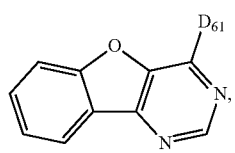
Compound S-10-61
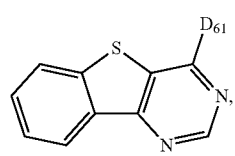
Compound Se-10-61
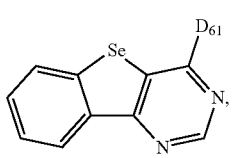
Compound O-13-61
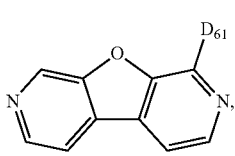
Compound S-13-61
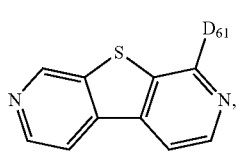
Compound Se-13-61
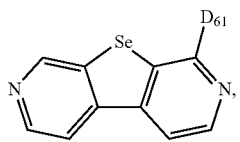
Compound O-17-10
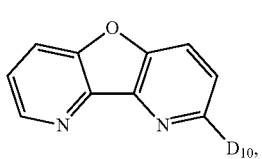
Compound S-17-10
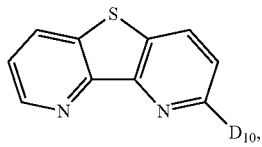
Compound Se-17-10
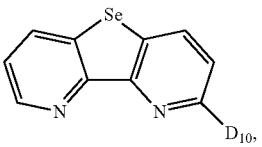
Compound O-10-144
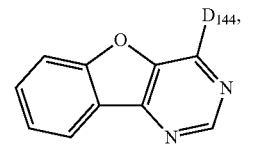
Compound S-10-144
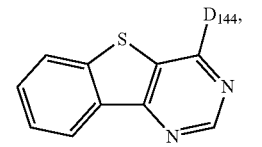
Compound Se-10-144
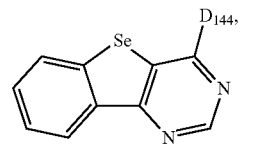
Compound O-20-10
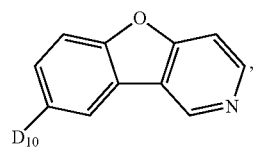
Compound O-20-7
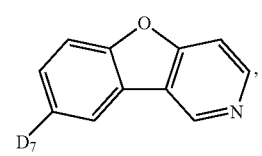
Compound O-10-31
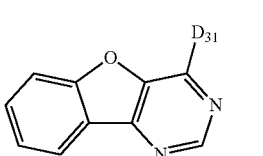
and Compound O-10-70
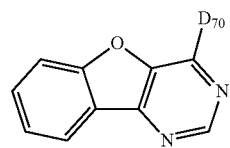
wherein D7, D10, D31, D54, D55, D56, D57, D58, D59, D60, D61, D70 and D144 are
D7
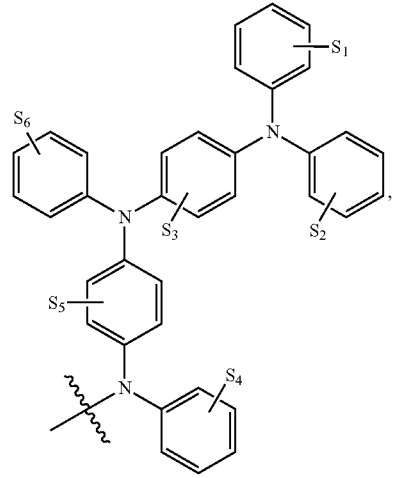
D10
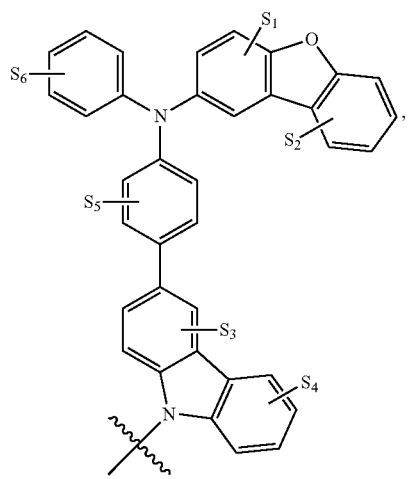
D31
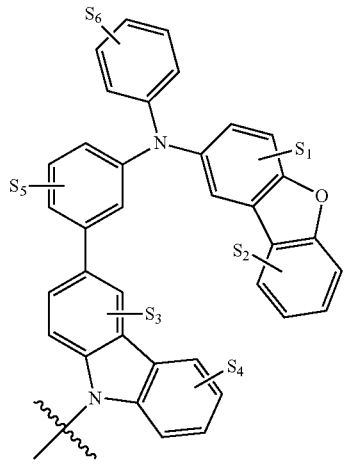
D54
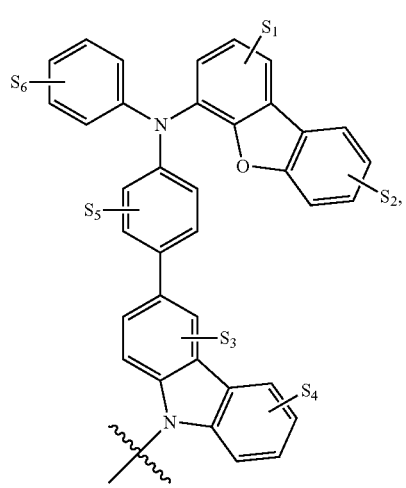
D55
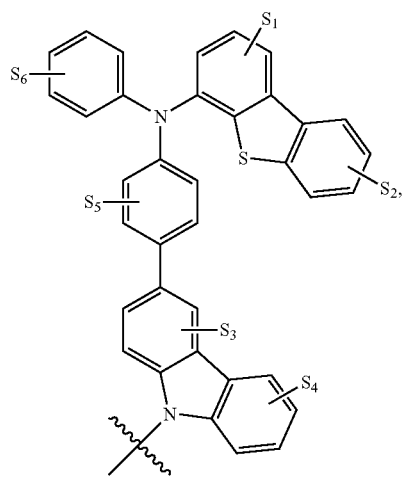

D56
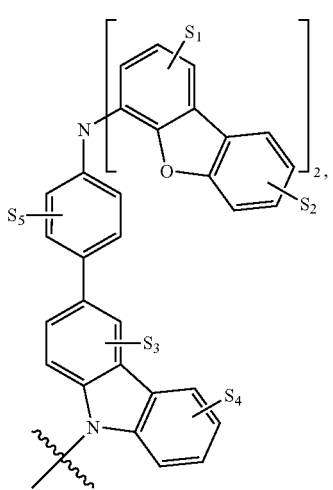
D57
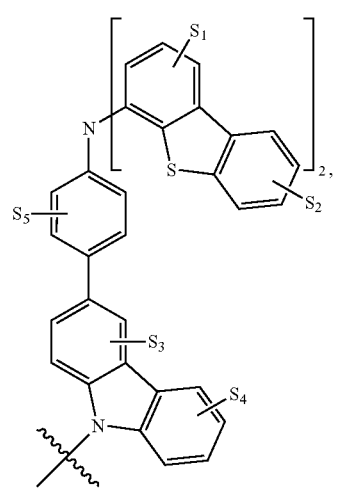
D58
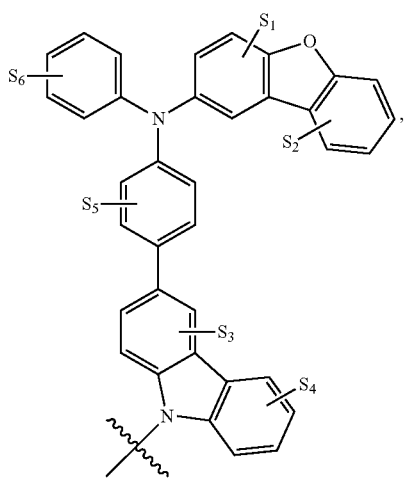
D59
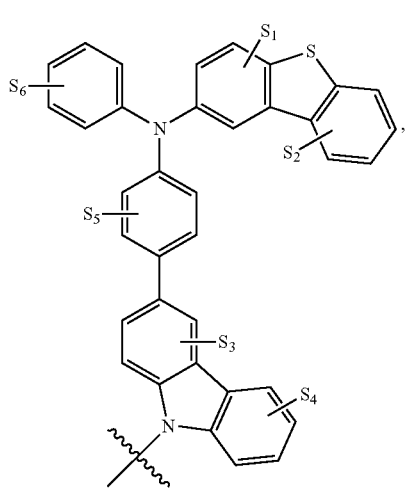
D60
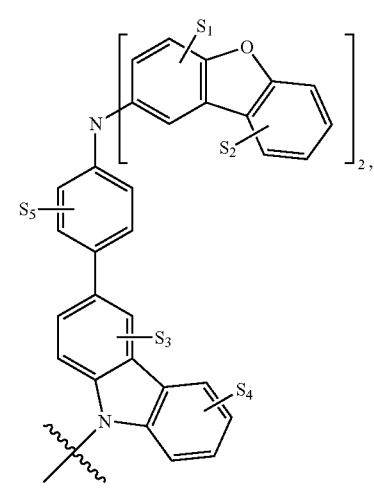
D61
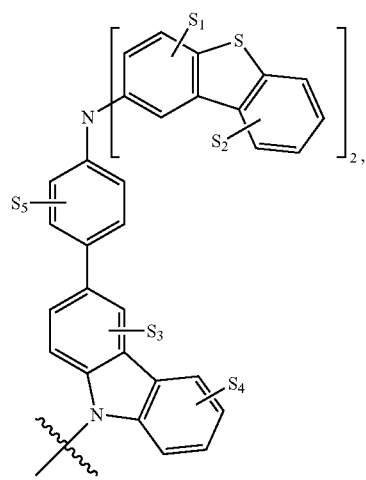

-continued

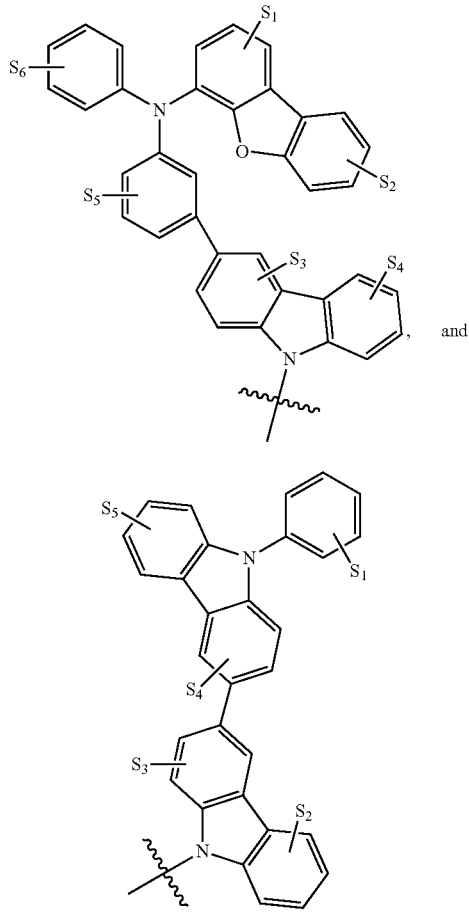

wherein $S_1$ to $S_6$ represent mono, di, tri, tetra or penta substitutions with hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

11. The first device of claim 10, wherein $S_1$ to $S_6$ are H.

12. The first device of claim 5, wherein the first device emits a luminescent radiation at room temperature when a voltage is applied across the organic light emitting device; wherein the luminescent radiation comprises a delayed fluorescence process.

13. The first device of claim 5, wherein the emissive layer further comprises a first phosphorescent emitting material.

14. The first device of claim 13, wherein the emissive layer further comprises a second phosphorescent emitting material.

15. The first device of claim 5, wherein the emissive layer further comprises a host material.

16. The first device of claim 13, wherein the first device emits a white light at room temperature when a voltage is applied across the organic light emitting device.

17. The first device of claim 16, wherein the first emitting compound emits a blue light with a peak wavelength of about 400 nm to about 500 nm.

18. The first device of claim 16, wherein the first emitting compound emits a yellow light with a peak wavelength of about 530 nm to about 580 nm.

19. The first device of claim 5, wherein the first device comprises a second organic light emitting device; wherein the second organic light emitting device is stacked on the first organic light emitting device.

20. The first device of claim 5, wherein the first device is a consumer product.

21. The first device of claim 5, wherein the first device is an organic light-emitting device.

22. The first device of claim 5, wherein the first device is a lighting panel.

23. The first device of claim 5, wherein at least one of the R comprises a donor group with at least two electron-donating nitrogens.

* * * * *